US012439819B2

(12) United States Patent
Lee et al.

(10) Patent No.: US 12,439,819 B2
(45) Date of Patent: Oct. 7, 2025

(54) ORGANIC ELECTROLUMINESCENT COMPOUND AND ORGANIC ELECTROLUMINESCENT DEVICE COMPRISING THE SAME

(71) Applicant: ROHM AND HAAS ELECTRONIC MATERIALS KOREA LTD., Chungcheongnam-do (KR)

(72) Inventors: Ga-Won Lee, Gyeonggi-do (KR); Ji-Song Jun, Gyeonggi-do (KR); Jeong-Eun Yang, Gyeonggi-do (KR); Kyoung-Jin Park, Gyeonggi-do (KR)

(73) Assignee: DuPont Specialty Materials Korea Ltd. (KR)

( * ) Notice: Subject to any disclaimer, the term of this patent is extended or adjusted under 35 U.S.C. 154(b) by 773 days.

(21) Appl. No.: 17/043,293

(22) PCT Filed: Mar. 27, 2019

(86) PCT No.: PCT/KR2019/003537
§ 371 (c)(1),
(2) Date: Sep. 29, 2020

(87) PCT Pub. No.: WO2019/190184
PCT Pub. Date: Oct. 3, 2019

(65) Prior Publication Data

US 2021/0036239 A1 Feb. 4, 2021

(30) Foreign Application Priority Data

Mar. 29, 2018 (KR) ........................ 10-2018-0036243
Mar. 19, 2019 (KR) ........................ 10-2019-0031140

(51) Int. Cl.
*H01L 51/50* (2006.01)
*H10K 85/60* (2023.01)
*H10K 50/16* (2023.01)

(52) U.S. Cl.
CPC ....... *H10K 85/6572* (2023.02); *H10K 85/631* (2023.02); *H10K 85/654* (2023.02);
(Continued)

(58) Field of Classification Search
None
See application file for complete search history.

(56) References Cited

U.S. PATENT DOCUMENTS

| | | | | |
|---|---|---|---|---|
| 8,368,062 B2 | 2/2013 | Lee et al. | | |
| 2011/0127513 A1* | 6/2011 | Lee | .................... | C07D 401/14 546/52 |
| 2012/0007069 A1* | 1/2012 | Lee | .................... | H10K 85/6572 257/E51.026 |

FOREIGN PATENT DOCUMENTS

| | | |
|---|---|---|
| CN | 102286278 A | 12/2011 |
| CN | 103755702 A | 4/2014 |

(Continued)

OTHER PUBLICATIONS

Banerji et., al., Expedient synthesis of a phenanthro-imidazo-pyridine fused heteropolynuclear framework via CDC coupling: a new class of luminophorest, Org. Biomol. Chem.,2017, 15,4130-4134 (Year: 2017).*

(Continued)

*Primary Examiner* — Gregory D Clark
(74) *Attorney, Agent, or Firm* — G. Creston Campbell

(57) ABSTRACT

The present disclosure relates to an organic electroluminescent compound and an organic electroluminescent device comprising the same. By comprising the organic electroluminescent compound, an organic electroluminescent device having low driving voltage and/or a high luminous efficiency can be provided.

10 Claims, 1 Drawing Sheet

(52) U.S. Cl.
CPC ..... *H10K 85/6574* (2023.02); *H10K 85/6576* (2023.02); *H10K 50/16* (2023.02)

(56) References Cited

FOREIGN PATENT DOCUMENTS

| | | | |
|---|---|---|---|
| KR | 20160067034 | A | 6/2016 |
| KR | 20180097994 | A | 9/2018 |
| KR | 20190079975 | A | 7/2019 |

OTHER PUBLICATIONS

Hua et al., Modular Assembly of Ring-Fused and π-Extended Phenanthroimidazoles via C—H Activation and Alkyne Annulation; J. Org. Chem. 2014, 79, 3930-3936 (Year: 2014).*

Banerji et al., Expedient synthesis of a phenanthro-imidazopyridine fused heteropolynuclear framework via CDC coupling: a new class of luminophores; 2017; Org. Biomol. Chem., 2017, 15, 4130-4134 (Year: 2017).*

Biswadip B. et al., "Expedient synthesis of a phenanthro-imidazo-pyridine fused heteropolynuclear framework via CDC coupling: a new class of luminophores", Organic & Biomolecular Chemistry, 2017, vol. 15, No. 19, pp. 4130-4134.

J. Org. Chem. Liyao Zheng , et al, Modular Assembly of Ring-Fused and π-Extended Phenanthroimidazoles via C—H Activation and Alkyne Annulation, 2014,79, 3930-3936.

Search Report from China National Intellectual Property Administration for China Patent Application No. 201980016644.0; Application Date: Mar. 27, 2019.

Search Report from Korea Patent Office for Korea Patent Application No. 10-2019-0031140; Application Date: Mar. 19, 2019.

* cited by examiner

ORGANIC ELECTROLUMINESCENT COMPOUND AND ORGANIC ELECTROLUMINESCENT DEVICE COMPRISING THE SAME

TECHNICAL FIELD

The present disclosure relates to an organic electroluminescent compound and an organic electroluminescent device comprising the same.

BACKGROUND ART

An electroluminescent device (EL device) is a self-light-emitting display device which has advantages in that it provides a wider viewing angle, a greater contrast ratio, and a faster response time. The first organic EL device was developed by Eastman Kodak in 1987, by using small aromatic diamine molecules and aluminum complexes as materials for forming a light-emitting layer [Appl. Phys. Lett. 51, 913, 1987].

The most important factor determining luminous efficiency in an organic electroluminescent device is light-emitting materials. Until now, fluorescent materials have been widely used as the light-emitting material. However, in view of electroluminescent mechanisms, since phosphorescent light-emitting materials theoretically enhance luminous efficiency by four (4) times compared to fluorescent light-emitting materials, phosphorescent light-emitting materials have been widely researched. Iridium(III) complexes have been widely known as phosphorescent light-emitting materials, including bis(2-(2'-benzothienyl)-pyridinato-N,C-3') iridium(acetylacetonate) [(acac)Ir(btp)$_2$], tris(2-phenylpyridine)iridium [Ir(ppy)$_3$], and bis(4,6-difluorophenylpyridinato-N,C2)picolinato iridium (Firpic) as red-, green-, and blue-emitting materials, respectively.

In conventional technology, 4,4'-N,N'-dicarbazol-biphenyl (CBP) is the most widely known phosphorescent host material. Recently, Pioneer (Japan) et al., developed a high performance organic electroluminescent device using bathocuproine (BCP) and aluminum(III) bis(2-methyl-8-quinolinate)(4-phenylphenolate) (BAlq), etc., as host materials, which were known as hole blocking materials.

Although these materials provide good luminous characteristics, they have the following disadvantages: (1) Due to their low glass transition temperature and poor thermal stability, their degradation may occur during a high-temperature deposition process in a vacuum, and the lifespan of the device may be shortened. (2) The power efficiency of the organic electroluminescent device is given by [(π/voltage)× current efficiency], and the power efficiency is inversely proportional to the voltage. Although the organic electroluminescent device comprising phosphorescent host materials provides higher current efficiency (cd/A) than one comprising fluorescent materials, a significantly high driving voltage is necessary. Thus, there is no merit in terms of power efficiency (lm/W). (3) Also, the operational lifespan of the organic electroluminescent device is short, and luminous efficiency is still necessary to improve.

In addition, an electron transport material actively transports electrons from a cathode to a light-emitting layer and inhibits transport of holes which are not recombined in the light-emitting layer to increase recombination opportunity of holes and electrons in the light-emitting layer. Thus, electron-affinitive materials are used as an electron transport material. Organic metal complexes having light-emitting function such as Alq$_3$ have been conventionally used as an electron transport material. However, Alq$_3$ has problems in that it moves to other layers and shows reduction of color purity when used in blue light-emitting devices. Therefore, new electron transport materials have been required, which do not have the above problems, are highly electron-affinitive, and quickly transport electrons in organic EL devices to provide organic EL devices having high luminous efficiency.

In order to improve the luminous efficiency, the driving voltage and/or the lifespan, various materials or concepts in the organic layer of the organic electroluminescent device have been proposed; however, they have not been satisfactory for practical use.

Korean Patent No. 1052973 B1 discloses fused benzimidazole derivatives as an organic electroluminescent compound. However, the above document does not disclose fused azaindolizine derivatives, and does not specifically disclose the organic electroluminescent device comprising the above compound.

DISCLOSURE OF THE INVENTION

Problems to be Solved

The object of the present disclosure is firstly, to provide an organic electroluminescent compound which is effective for producing an organic electroluminescent device having low driving voltage and/or high luminous efficiency, and secondly, to provide an organic electroluminescent device comprising the organic electroluminescent compound.

Solution to Problems

The thin film composed of a material having a low glass transition temperature may cause morphological deformation even at a low temperature due to the heat generated in driving the device, and may decrease the charge mobility in the thin film, thereby degrading the performance of the OLED device. In this regard, as a result of intensive studies, the present inventors have found that the organic electroluminescent compound of the present disclosure can provide excellent structural and thermal stability by reducing internal steric hindrance. The compound according to the present disclosure has a high glass transition temperature (Tg) to molecular weight due to their high fused ring structure. Materials with a high glass transition temperature in OLEDs may be advantageous due to good morphological stability. Specifically, the present inventors found that the above objective can be achieved by an organic electroluminescent compound represented by the following formula 1:

(1)

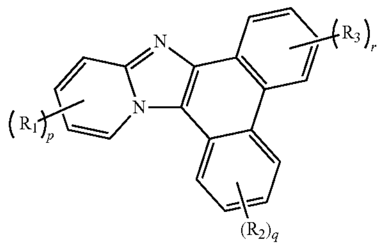

wherein, at least one of $R_1$, $R_2$ and $R_3$ is represented by the following formula 2:

(2)

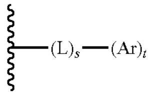

wherein,

L represents a single bond, a substituted or unsubstituted (C6-C30)arylene, a substituted or unsubstituted (3- to 30-membered)heteroarylene, or a substituted or unsubstituted (C3-C30)cycloalkylene;

Ar represents hydrogen, deuterium, halogen, cyano, a substituted or unsubstituted (C1-C30)alkyl, a substituted or unsubstituted (C6-C30)aryl, a substituted or unsubstituted (3- to 30-membered)heteroaryl, a substituted or unsubstituted (C3-C30)cycloalkyl, a substituted or unsubstituted (C1-C30)alkoxy, a substituted or unsubstituted tri(C1-C30)alkylsilyl, a substituted or unsubstituted di(C1-C30)alkyl(C6-C30)arylsilyl, a substituted or unsubstituted (C1-C30)alkyldi(C6-C30) arylsilyl, or a substituted or unsubstituted tri(C6-C30) arylsilyl, a substituted or unsubstituted mono- or di-(C1-C30)alkylamino, a substituted or unsubstituted mono- or di-(C6-C30)arylamino, or a substituted or unsubstituted (C1-C30)alkyl(C6-C30)arylamino;

$R_1$ to $R_3$ each independently, are represented by formula 2, or represent hydrogen, deuterium, halogen, cyano, a substituted or unsubstituted (C1-C30)alkyl, a substituted or unsubstituted (C6-C30)aryl, a substituted or unsubstituted (3- to 30-membered)heteroaryl, a substituted or unsubstituted (C3-C30)cycloalkyl, a substituted or unsubstituted (C1-C30)alkoxy, a substituted or unsubstituted tri(C1-C30)alkylsilyl, a substituted or unsubstituted di(C1-C30)alkyl(C6-C30)arysiyl, a substituted or unsubstituted (C1-C30)alkyldi(C6-C30)arylsiyl, or a substituted or unsubstituted tri(C6-C30) arylsilyl, a substituted or unsubstituted mono- or di-(C1-C30)alkylamino, a substituted or unsubstituted mono- or di-(C6-C30)arylamino, or a substituted or unsubstituted (C1-C30)alkyl(C6-C30)arylamino; or may be linked to adjacent substituents to form a ring;

p to r each independently represent an integer of 1 to 4;

s and t each independently represent an integer of 1 to 3; and when p to t are 2 or more, each of $R_1$, each of $R_2$, each of $R_3$, each of L, or each of Ar may be the same or different.

Effects of the Invention

By using the organic electroluminescent compound according to the present disclosure, an organic electroluminescent device having a low driving voltage and/or a high luminous efficiency can be prepared.

EMBODIMENTS OF THE INVENTION

Figure 1:
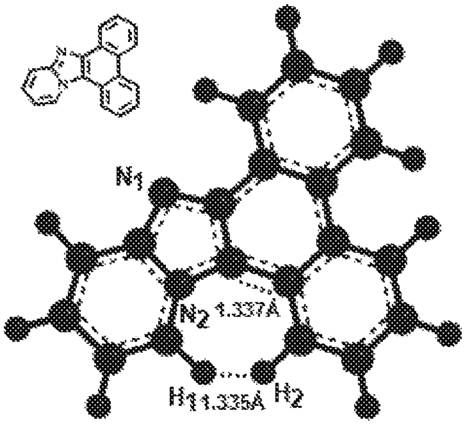
FIG. 1 shows the molecular structure of a main core of the compound represented by formula 1 of the present disclosure in 3D form.

Hereinafter, the present disclosure will be described in detail. However, the following description is intended to explain the invention, and is not meant in any way to restrict the scope of the invention.

The term "organic electroluminescent compound" in the present disclosure means a compound that may be used in an organic electroluminescent device, and may be comprised in any material layer constituting an organic electroluminescent device, as necessary.

The term "organic electroluminescent material" in the present disclosure means a material that may be used in an organic electroluminescent device, and may comprise at least one compound. The organic electroluminescent material may be comprised in any layer constituting an organic electroluminescent device, as necessary. For example, the organic electroluminescent material may be a hole injection material, a hole transport material, a hole auxiliary material, a light-emitting auxiliary material, an electron blocking material, a light-emitting material, an electron buffer material, a hole blocking material, an electron transport material, or an electron injection material, etc.

The organic electroluminescent material of the present disclosure may comprise at least one species of compound represented by formula 1 above. The organic electroluminescent compound of formula 1 may be comprised in a light-emitting layer and/or an electron transport layer, but is not limited thereto. When used in the light-emitting layer, the organic electroluminescent compound of formula 1 may be comprised as a host, and when used in the electron transport layer, the organic electroluminescent compound of formula 1 may be comprised as an electron transport material.

Herein, "(C1-C30)alkyl" is meant to be a linear or branched alkyl having 1 to 30 carbon atoms constituting the chain, in which the number of carbon atoms is preferably 1 to 20, and more preferably 1 to 10. The above alkyl may include methyl, ethyl, n-propyl, isopropyl, n-butyl, isobutyl, tert-butyl, etc. "(C2-C30)alkenyl" is meant to be a linear or branched alkenyl having 2 to 30 carbon atoms constituting the chain, in which the number of carbon atoms is preferably 2 to 20, and more preferably 2 to 10. The above alkenyl may include vinyl, 1-propenyl, 2-propenyl, 1-butenyl, 2-butenyl, 3-butenyl, 2-methylbut-2-enyl, etc. "(C2-C30)alkynyl" is meant to be a linear or branched alkynyl having 2 to 30 carbon atoms constituting the chain, in which the number of carbon atoms is preferably 2 to 20, and more preferably 2 to 10. The above alkynyl may include ethynyl, 1-propynyl, 2-propynyl, 1-butynyl, 2-butynyl, 3-butynyl, 1-methylpent-2-ynyl, etc. "(C3-C30)cycloalkyl(ene)" is a mono- or polycyclic hydrocarbon having 3 to 30 ring backbone carbon atoms, in which the number of carbon atoms is preferably 3 to 20, and more preferably 3 to 7. The above cycloalkyl may include cyclopropyl, cyclobutyl, cyclopentyl, cyclohexyl, etc. "(3- to 7-membered) heterocycloalkyl" is a cycloalkyl having 3 to 7, preferably 5 to 7, ring backbone atoms, including at least one heteroatom selected from B, N, O, S, Si, and P, and preferably O, S, and N. The above heterocycloalkyl may include tetrahydrofuran, pyrrolidine, thiolan, tetrahydropyran, etc.

"(C6-C30)aryl(ene)" is a monocyclic or fused ring radical derived from an aromatic hydrocarbon having 6 to 30 ring backbone carbon atoms, in which the number of the ring backbone carbon atoms is preferably 6 to 25, more preferably 6 to 18, may be partially saturated, and may comprise a spiro structure. Examples of the aryl specifically include phenyl, biphenyl, terphenyl, quaterphenyl, naphthyl, binaphthyl, phenylnaphthyl, naphthylphenyl, fluorenyl, phenylfluorenyl, dimethylfluorenyl, diphenylfluorenyl, benzofluorenyl, diphenylbenzofluorenyl, dibenzofluorenyl, phenanthrenyl, benzophenanthrenyl, phenylphenanthrenyl, anthracenyl, benzanthracenyl, indenyl, triphenylenyl, pyrenyl, tetracenyl, perylenyl, chrysenyl, benzochrysenyl, naphthacenyl, fluoranthenyl, benzofluoranthenyl, toyly, xylyl, mesityl, cumenyl, spiro[fluorene-fluorene]yl, spiro[fluorene-benzofluorene]yl, azulenyl, etc. More specifically, the aryl may be o-toyl, m-tolyl, p-tolyl, 2,3-xytyl, 3,4-xylyl, 2,5-xylyl, mesityl, o-cumenyl, m-cumenyl, p-cumenyl, p-t-butylphenyl, p-(2-phenylpropyl)phenyl, 4'-methylbiphenyl, 4"-t-butyl-p-terphenyl-4-yl, o-biphenyl, m-biphenyl, p-biphenyl, o-terphenyl, m-terphenyl-4-yl, m-terphenyl-3-yl, m-terphenyl-2-yl, p-terphenyl-4-yl, p-terphenyl-3-yl, p-terphenyl-2-yl, m-quaterphenyl, 1-naphthyl, 2-naphthyl, 1-fluorenyl, 2-fluorenyl, 3-fluorenyl, 4-fluorenyl, 9-fluorenyl, 9,9-dimethyl-1-fluorenyl, 9,9-dimethyl-2-fluorenyl, 9,9-dimethyl-3-fluorenyl, 9,9-dimethyl-4-fluorenyl, 9,9-diphenyl-1-fluorenyl, 9,9-diphenyl-2-fluorenyl, 9,9-diphenyl-3-fluorenyl, 9,9-diphenyl-4-fluorenyl, 1-anthryl, 2-anthryl, 9-anthryl, 1-phenanthryl, 2-phenanthryl, 3-phenanthryl, 4-phenanthryl, 9-phenanthryl, 1-chrysenyl, 2-chrysenyl, 3-chrysenyl, 4-chrysenyl, 5-chrysenyl, 6-chrysenyl, benzo[c]phenanthryl, benzo[g]chrysenyl, 1-triphenylenyl, 2-triphenylenyl, 3-triphenylenyl, 4-triphenylenyl, 3-fluoranthenyl, 4-fluoranthenyl, 8-fluoranthenyl, 9-fluoranthenyl, benzofluoranthenyl, etc.

"(3- to 30-membered)heteroaryl(ene)" is an aryl having 3 to 30 ring backbone atoms, including at least one, preferably 1 to 4 heteroatoms selected from the group consisting of B, N, O, S Si, P. and Ge. The above heteroaryl may be a monocyclic ring, or a fused ring condensed with at least one benzene ring; and may be partially saturated. The above heteroatom may be linked with at least one substituent selected from the group consisting of hydrogen, deuterium, halogen, cyano, a substituted or unsubstituted (C1-C30) alkyl, a substituted or unsubstituted (C6-C30)aryl, a substituted or unsubstituted (5- to 30-membered)heteroaryl, a substituted or unsubstituted (C3-C30)cycloalkyl, a substituted or unsubstituted (C1-C30)alkoxy, a substituted or unsubstituted tri(C1-C30)alkylsilyl, a substituted or unsubstituted di(C1-C30)alkyl(C6-C30)arylsilyl, a substituted or unsubstituted (C1-C30)alkyldi(C6-C30)arylsiyl, a substituted or unsubstituted tri(C6-C30)arylsiyl, a substituted or unsubstituted mono- or di-(C1-C30)alkylamino, a substituted or unsubstituted mono- or di-(C6-C30)arylamino, and a substituted or unsubstituted (C1-C30)alkyl(C6-30)arylamino. Also, the above heteroaryl may be one formed by linking at least one heteroaryl or aryl group to a heteroaryl group via a single bond(s); and may comprise a spiro structure. Examples of the heteroaryl specifically may include a monocyclic ring-type heteroaryl including furyl, thiophenyl, pyrroyl, imidazolyl, pyrazolyl, thiazolyl, thiadiazolyl, isothiazolyl, isoxazolyl, oxazolyl, oxadiazolyl, triazinyl, tetrazinyl, triazolyl, tetrazolyl, furazanyl, pyridyl, pyrazinyl, pyrimidinyl, pyridazinyl, etc., and a fused ring-type heteroaryl including benzofuranyl, benzothiophenyl, isobenzofuranyl, dibenzofuranyl, dibenzothiophenyl, benzoimidazolyl, benzothiazolyl, benzoisothiazolyl, benzoisoxazoyl, benzoxazolyl, imidazopyridinyl, isoindolyl, indolyl, benzoindolyl, indazolyl, benzothiadiazoyl, quinolyl, isoquinoyl, cinnolinyl, quinazolinyl, quinoxalinyl, carbazoyl, azacarbazolyl, benzocarbazolyl, dibenzocarbazolyl, phenoxazinyl, phenanthridinyl, benzodioxolyl, indolizidinyl, acrylidinyl, silafluorenyl, germafluorenyl, etc. More specifically, the heteroaryl may be 1-pyrroyl, 2-pyrroyl, 3-pyrroyl, 2-pyridinyl, 3-pyridinyl, 4-pyridinyl, 2-pyrimidinyl, 4-pyrimidinyl, 5-pyrimidinyl, 6-pyrimidinyl, 1,2,3-triazin-4-yl, 1,2,4-triazin-3-yl, 1,3,5-triazin-2-yl, 1-imidazolyl, 2-imidazolyl, 1-pyrazolyl, 1-indolizidinyl, 2-indolizidinyl, 3-indolizidinyl, 5-indolizidinyl, 6-indolizidinyl, 7-indolizidinyl, 8-indolizidinyl, 2-imidazopyridinyl, 3-imidazopyridinyl, 5-imidazopyridinyl, 6-imidazopyridinyl, 7-imidazopyridinyl, 8-imidazopyridinyl, 1-indoyl, 2-indolyl, 3-indoyl, 4-indoyl, 5-indoyl, 6-indolyl, 7-indolyl, 1-isoindolyl, 2-isoindolyl, 3-isoindolyl, 4-isoindolyl, 5-isoindolyl, 6-isoindolyl, 7-isoindoyl, 2-furyl, 3-furyl, 2-benzofuranyl, 3-benzofuranyl, 4-benzofuranyl, 5-benzofuranyl, 6-benzofuranyl, 7-benzofuranyl, 1-isobenzofuranyl, 3-isobenzofuranyl, 4-isobenzofuranyl, 5-isobenzofuranyl, 6-isobenzofuranyl, 7-isobenzofuranyl, 2-quinolyl, 3-quinoyl, 4-quinoyl, 5-quinoyl, 6-quinoyl, 7-quinolyl, 8-quinolyl, 1-isoquinolyl, 3-isoquinolyl, 4-isoquinolyl, 5-isoquinoyl, 6-isoquinoyl, 7-isoquinolyl, 8-isoquinolyl, 2-quinoxalinyl, 5-quinoxalinyl, 6-quinoxalinyl, 1-carbazolyl, 2-carbazolyl, 3-carbazolyl, 4-carbazolyl, 9-carbazolyl, azacarbazole-1-yl, azacarbazole-2-yl, azacarbazole-3-yl, azacarbazole-4-yl, azacarbazole-5-yl, azacarbazole-6-yl, azacarbazole-7-yl, azacarbazole-8-yl, azacarbazole-9-yl, 1-phenanthridinyl, 2-phenanthridinyl, 3-phenanthridinyl, 4-phenanthridinyl, 6-phenanthridinyl, 7-phenanthridinyl, 8-phenanthridinyl, 9-phenanthridinyl, 10-phenanthridinyl, 1-acrylidinyl, 2-acrylidinyl, 3-acrylidinyl, 4-acrylidinyl, 9-acrylidinyl, 2-oxazolyl, 4-oxazolyl, 5-oxazolyl, 2-oxadiazolyl, 5-oxadiazolyl, 3-furazanyl, 2-thienyl, 3-thienyl, 2-methylpyrrole-1-yl, 2-methylpyrrole-3-yl, 2-methylpyrrole-4-yl, 2-methylpyrrole-5-yl, 3-methylpyrrole-1-yl, 3-methylpyrrole-2-yl, 3-methylpyrrole-4-yl, 3-methylpyrrole-5-yl, 2-t-butylpyrrole-4-yl, 3-(2-phenylpropyl)pyrrole-1-yl, 2-methyl-1-indolyl, 4-methyl-1-indolyl, 2-methyl-3-indolyl, 4-methyl-3-indolyl, 2-t-butyl-1-indoyl, 4-t-butyl-1-indolyl, 2-t-butyl-3-indolyl, 4-t-butyl-3-indolyl, 1-dibenzofuranyl, 2-dibenzofuranyl, 3-dibenzofuranyl, 4-dibenzofuranyl, 1-dibenzothiophenyl, 2-dibenzothiophenyl, 3-dibenzothiophenyl, 4-dibenzothiophenyl, 1-silafluorenyl, 2-silafluorenyl, 3-silafluorenyl, 4-silafluorenyl, 1-germafluorenyl, 2-germafluorenyl, 3-germafluorenyl, and 4-germafluorenyl, etc.

"Halogen" includes F, Cl, Br, and I.

In addition, "ortho (o)," "meta (m)," and "para (p)" are meant to signify the substitution position of all substituents. Ortho position is a compound with substituents, which are adjacent to each other, e.g., at the 1 and 2 positions on benzene. Meta position is the next substitution position of the immediately adjacent substitution position, e.g., a compound with substituents at the 1 and 3 positions on benzene. Para position is the next substitution position of the meta position, e.g., a compound with substituents at the 1 and 4 positions on benzene.

Herein, "ring formed in linked to an adjacent substituent" means a substituted or unsubstituted (3- to 30-membered) mono- or polycyclic, alicyclic, aromatic ring, or a combination thereof, formed by linking or fusing two or more adjacent substituents; preferably, may be a substituted or unsubstituted (3- to 26-membered) mono- or polycyclic, alicyclic, aromatic ring, or a combination thereof. In addition, at least one of the carbon atoms in the formed ring may be replaced with at least one heteroatom selected from the group consisting of B, N, O, S, Si, and P, preferably, N, O, and S. According to one embodiment, the ring formed in linking to an adjacent substituent may be a (5- to 20-membered) polycyclic aromatic ring, which may contain at least one heteroatom selected from the group consisting of N, O, and S.

In addition, "substituted" in the expression "substituted or unsubstituted" means that a hydrogen atom in a certain functional group is replaced with another atom or functional group, i.e., a substituent. The substituents of the substituted (C1-C30)alkyl, the substituted (C6-C30)aryl(ene), the substituted (3- to 30-membered)heteroaryl(ene), the substituted (C3-C30)cycloalkyl(ene), the substituted (C1-C30)alkoxy, the substituted tri(C1-C30)alkylsilyl, the substituted di(C1-C30)alkyl(C6-C30)arylsilyl, the substituted (C1-C30)alkyldi(C6-C30)arylsilyl, the substituted tri(C6-C30)arylsilyl, the substituted mono- or di-(C1-C30)alkylamino, the substituted mono- or di-(C6-C30)arylamino, and the substituted (C1-C30)alkyl(C6-C30)arylamino in L, Ar, and $R_1$ to $R_6$ each independently, are at least one selected from the group consisting of deuterium, halogen, cyano, carboxyl, nitro, hydroxyl, (C1-C30)alkyl, halo(C1-C30)alkyl, (C2-C30)alkenyl, (C2-C30)alkynyl, (C1-C30)alkoxy, (C1-C30)alkylthio, (C3-C30)cycloalkyl, (C3-C30)cycloalkenyl, (3- to 7-membered)heterocycloalkyl, (C6-C30)aryloxy, (C6-C30)arylthio, (C6-C30)aryl-substituted or unsubstituted (3- to 30-membered)heteroaryl, (3- to 30-membered)heteroaryl-substituted or unsubstituted (C6-C30)aryl, tri(C1-C30)alkylsilyl, tri(C6-C30)arylsiyl, di(C1-C30)alkyl(C6-C30)arylsilyl, (C1-C30)alkyldi(C6-C30)arylsiyl, amino, mono- or di-(C1-C30)alkylamino, (C1-C30)alkyl-substituted or unsubstituted mono- or di-(C6-C30)arylamino, (C1-C30)alkyl(C6-C30)arylamino, (C1-C30)alkylcarbonyl, (C1-C30)alkoxycarbonyl, (C6-C30)arylcarbonyl, di(C6-C30)arylboronyl, di(C1-C30)alkylboronyl, (C1-C30)alkyl(C6-C30)arylboronyl, (C6-C30)ar(C1-C30)alkyl, and (C1-C30)alkyl(C6-C30)aryl. According to one embodiment, the substituents are each independently at least one of (C1-C6)alkyl, (C6-C15)aryl, and (5- to 15-membered)heteroaryl. Specifically, the substituents each independently may be at least one of methyl, phenyl, naphthyl, biphenyl, dibenzothiophenyl, and dibenzofuranyl.

The organic electroluminescent compound of formula 1 may be represented by any one of the following formulae 1-1 to 1-3:

(1-1)

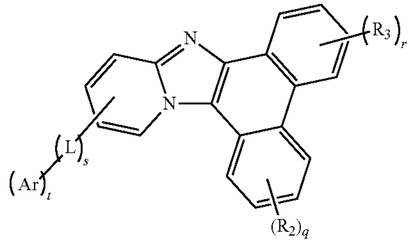

(1-2)

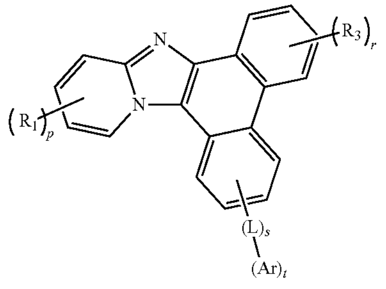

-continued (1-3)

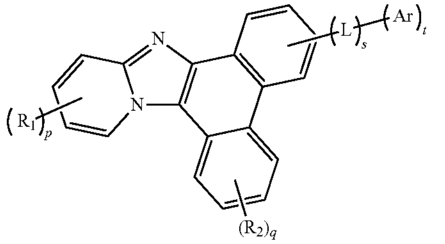

In formulae 1-1 to 1-3,

L, Ar, $R_1$ to $R_3$, and p to t are as defined in formula 1.

In formula 1, at least one of $R_1$, $R_2$ and $R_3$ are represented by the following formula 2:

(2)

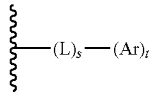

In formula 2, L represents a single bond, a substituted or unsubstituted (C6-C30)arylene, a substituted or unsubstituted (3- to 30-membered)heteroarylene, or a substituted or unsubstituted (C3-C30)cycloalkylene. In one embodiment of the present disclosure, L represents a single bond, a substituted or unsubstituted (C6-C15)arylene, or a substituted or unsubstituted (5- to 15-membered)heteroarylene. In another embodiment of the present disclosure, L represents a single bond, an unsubstituted (C6-C15)arylene, or an unsubstituted (5- to 15-membered)heteroarylene. Specifically, L represents a single bond, phenylene, naphthylene, biphenylene, pyridylene, pyrimidinylene, triazinylene, quinazolinylene, quinoxalinylene, benzoquinoxalinylene, etc.

In formula 2, Ar represents hydrogen, deuterium, halogen, cyano, a substituted or unsubstituted (C1-C30)alkyl, a substituted or unsubstituted (C6-C30)aryl, a substituted or unsubstituted (3- to 30-membered)heteroaryl, a substituted or unsubstituted (C3-C30)cycloalkyl, a substituted or unsubstituted (C1-C30)alkoxy, a substituted or unsubstituted tri(C1-C30)alkylsilyl, a substituted or unsubstituted di(C1-C30)alkyl(C6-C30)arylsilyl, a substituted or unsubstituted (C1-C30)alkyldi(C6-C30)arylsiyl, or a substituted or unsubstituted tri(C6-C30)arylsiyl, a substituted or unsubstituted mono- or di-(C1-C30)alkylamino, a substituted or unsubstituted mono- or di-(C6-C30)arylamino, or a substituted or unsubstituted (C1-C30)alkyl(C6-C30)arylamino. In one embodiment of the present disclosure, Ar represents a substituted or unsubstituted (C6-C20)aryl, a substituted or unsubstituted (5- to 15-membered)heteroaryl, or a substituted or unsubstituted di(C6-C15)arylamino. In another embodiment of the present disclosure, Ar represents (C1-C6)alkyl-substituted or unsubstituted (C6-C20)aryl, an unsubstituted (5- to 15-membered)heteroaryl, or (C1-C6)alkyl-substituted or unsubstituted di(C6-C15)arylamino. Specifically, Ar may be a substituted or unsubstituted phenyl, a substituted or unsubstituted naphthyl, a substituted or unsubstituted biphenyl, a substituted or unsubstituted terphenyl, a substituted or unsubstituted naphthylphenyl, a substituted or unsubstituted fluorenyl, a substituted or unsubstituted fluoranthenyl, a substituted or unsubstituted triazinyl, a substituted or unsubstituted pyridyl, a substituted or unsubstituted pyrimidinyl, a substituted or unsubstituted benzothienopyrimidinyl, a substituted or unsubstituted acenaphthopyrimidinyl, a substituted or unsubstituted quinazolinyl, a substituted or unsubstituted benzoquinazolinyl, a substituted or unsubstituted quinoxalinyl, a substituted or unsubstituted benzoquinoxalinyl, a substituted or unsubstituted dibenzoquinoxalinyl, a substituted or unsubstituted quinoyl, a substituted or unsubstituted benzoquinolyl, a substituted or unsubstituted isoquinolyl, a substituted or unsubstituted benzoisoquinolyl, a substituted or unsubstituted benzothienoquinoyl, a substituted or unsubstituted benzofuroquinolyl, a substituted or unsubstituted triazolyl, a substituted or unsubstituted pyrazolyl, a substituted or unsubstituted carbazoyl, a substituted or unsubstituted dibenzothiophenyl, a substituted or unsubstituted benzothiophenyl, a substituted or unsubstituted dibenzofuranyl, a substituted or unsubstituted benzofuranyl, a substituted or unsubstituted naphthyridinyl, a substituted or unsubstituted benzothiazolinyl, a substituted or unsubstituted phenanthroidimidazolyl, a substituted or unsubstituted diphenylamino, a substituted or unsubstituted phenylbiphenylamino, a substituted or unsubstituted fluorenylphenylamino, a substituted or unsubstituted dibenzothiophenylphenylamino, or a substituted or unsubstituted dibenzofuranylphenylamino, etc.

In formula 1, $R_1$ to $R_3$ each independently, are represented by formula 2, or represent hydrogen, deuterium, halogen, cyano, a substituted or unsubstituted (C1-C30)alkyl, a substituted or unsubstituted (C6-C30)aryl, a substituted or unsubstituted (3- to 30-membered)heteroaryl, a substituted or unsubstituted (C3-C30)cycloalkyl, a substituted or unsubstituted (C1-C30)alkoxy, a substituted or unsubstituted tri(C1-C30)alkylsilyl, a substituted or unsubstituted di(C1-C30)alkyl(C6-C30)arylsilyl, a substituted or unsubstituted (C1-C30)alkyldi(C6-C30)arylsilyl, or a substituted or unsubstituted tri(C6-C30)arylsilyl, a substituted or unsubstituted mono- or di-(C1-C30)alkylamino, a substituted or unsubstituted mono- or di-(C6-C30)arylamino, or a substituted or unsubstituted (C1-C30)alkyl(C6-C30)arylamino; or may be linked to adjacent substituents to form a ring. In one embodiment of the present disclosure, $R_1$ to $R_3$ each independently, are represented by formula 2, or represent hydrogen, a substituted or unsubstituted (C6-C15)aryl, or a substituted or unsubstituted (5- to 15-membered)heteroaryl; or may be linked to adjacent substituents to form a ring. In another embodiment of the present disclosure, $R_1$ to $R_3$ each independently are represented by formula 2, or represent hydrogen, an unsubstituted (C6-C15)aryl, or an unsubstituted (5- to 15-membered)heteroaryl; or may be linked to adjacent substituents to form a ring. Specifically, $R_1$ to $R_3$ each independently may be hydrogen, phenyl, pyridyl, or dibenzofuranyl; or may be linked to adjacent substituents to form a ring. For example, two adjacent $R_1$s, two adjacent $R_2$s, two adjacent $R_3$s, $R_1$ and $R_2$, $R_2$ and $R_3$, and/or $R_1$ and $R_3$ may be linked to each other to form fused ring(s) with an adjacent substituent.

When at least one of $R_1$ to $R_3$ may be linked to adjacent substituents to form a ring, at least one ring of the following formulae 3 to 7 may be formed.

(3)

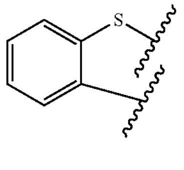

-continued (4)

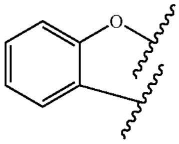

(5)

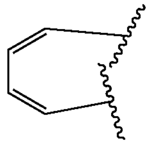

(6)

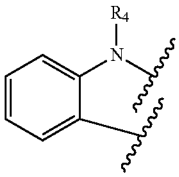

(7)

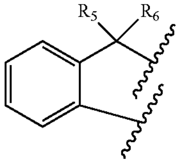

In formulae 6 and 7, $R_4$ to $R_6$ each independently represent hydrogen, deuterium, a substituted or unsubstituted (C1-C30)alkyl, a substituted or unsubstituted (C6-C30)aryl, or a substituted or unsubstituted (3- to 30-membered)heteroaryl; and $R_5$ and $R_6$ may be linked to form a ring.

In formula 1, p to r each independently represent an integer of 1 to 4; In formula 2, s and t each independently represent an integer of 1 to 3. When p to t are 2 or more, each of $R_1$, each of $R_2$, each of $R_3$, each of L or each of Ar may be the same or different. In one embodiment of the present disclosure, p to s each independently represent 1 or 2; t represents 1 to 3.

According to one embodiment of the present disclosure, in formulae 1 and 2, L represents a single bond, a substituted or unsubstituted (C6-C15)arylene, or a substituted or unsubstituted (5- to 15-membered)heteroarylene; Ar represents a substituted or unsubstituted (C6-C20)aryl, a substituted or unsubstituted (5- to 15-membered)heteroaryl, or a substituted or unsubstituted di(C6-C15)arylamino; $R_1$ to $R_3$ each independently, are represented by formula 2, or represent hydrogen, a substituted or unsubstituted (C6-C15)aryl, or a substituted or unsubstituted (5-15-membered)heteroaryl; or may be linked to an adjacent substituent to form a ring.

According to another embodiment of the present disclosure, in formulae 1 and 2, L represents a single bond, an unsubstituted (C6-C15)arylene, or an unsubstituted (5- to 15-membered)heteroarylene; Ar represents (C1-C6)alkyl-substituted or an unsubstituted (C6-C20)aryl, an unsubstituted (5- to 15-membered)heteroaryl, or (C1-C6)alkyl-substituted or an unsubstituted di(C6-C15)arylamino; $R_1$ to $R_3$ each independently, are represented by formula 2, or represent hydrogen, an unsubstituted (C6-C15)aryl, or an unsubstituted (5- to 15-membered)heteroaryl; or may be linked to an adjacent substituent to form a ring.

In the formula of the present disclosure, when adjacent substituents are linked to each other to form a ring, the ring may be a substituted or unsubstituted (3- to 30-membered) mono- or polycyclic alicyclic or aromatic ring, or the combination thereof. Also, the formed ring may contain at least one heteroatom selected from nitrogen, oxygen, and sulfur.

In the formula of the present disclosure, heteroaryl(ene) each independently may contain at least one heteroatom selected from B, N, O, S. Si, and P. In addition, the heteroatom may be linked with at least one substituent selected from the group consisting of hydrogen, deuterium, halogen, cyano, a substituted or unsubstituted (C1-C30) alkyl, a substituted or unsubstituted (C6-C30)aryl, a substituted or unsubstituted (5- to 30-membered)heteroaryl, a substituted or unsubstituted (C3-C30)cycloalkyl, a substituted or unsubstituted (C1-C30)alkoxy, a substituted or unsubstituted tri(C1-C30)alkylsilyl, a substituted or unsubstituted di(C1-C30)alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted mono- or di-(C1-C30)alkylamino, a substituted or unsubstituted mono- or di-(C6-C30)arylamino, and a substituted or unsubstituted (C1-C30)alkyl(C6-30)arylamino.

The compound represented by formula 1 may be more specifically illustrated by the following compounds, but is not limited thereto:

A-1

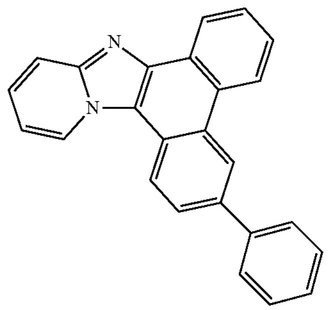

A-2

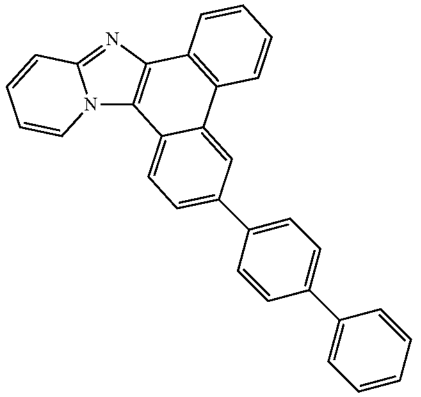

-continued

A-3

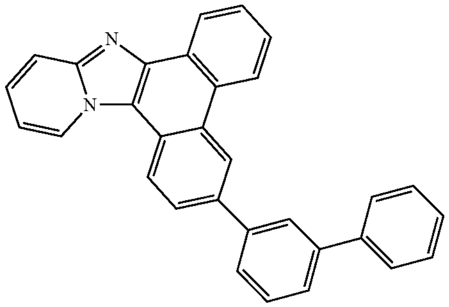

A-4

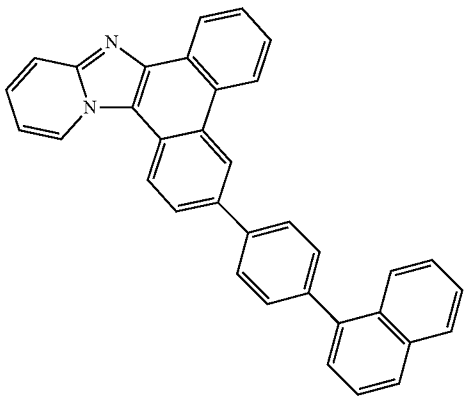

A-5

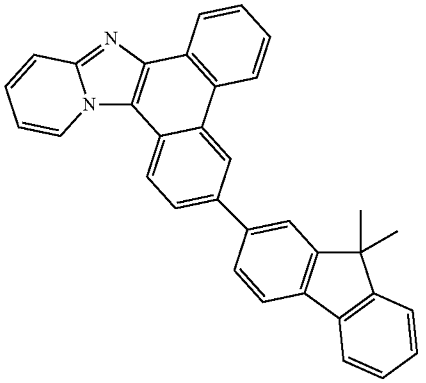

A-6

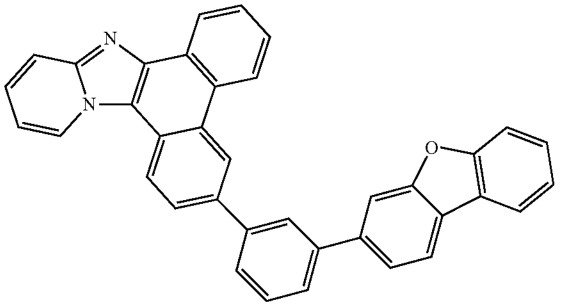

A-7
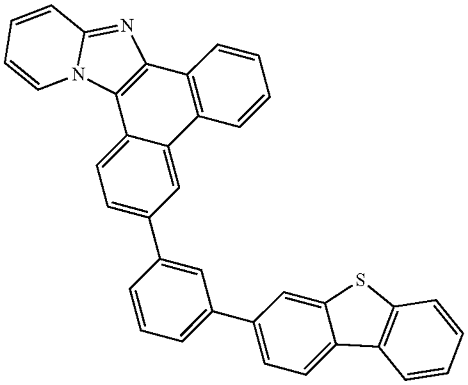
A-8
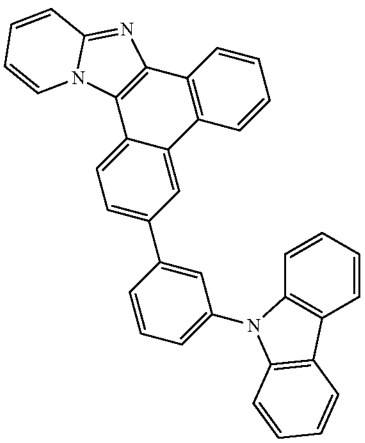
A-9
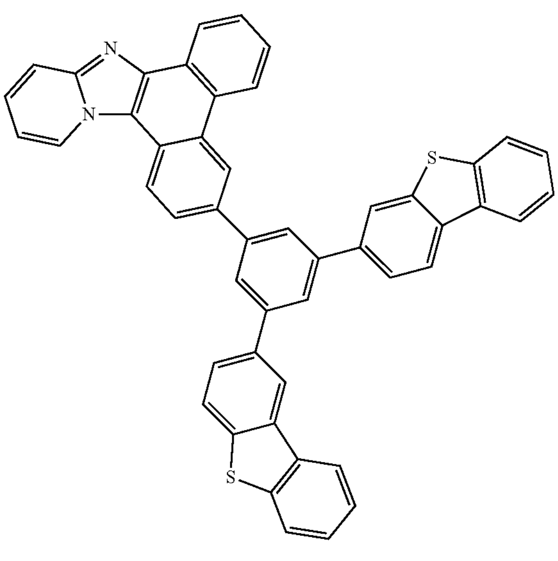
A-10
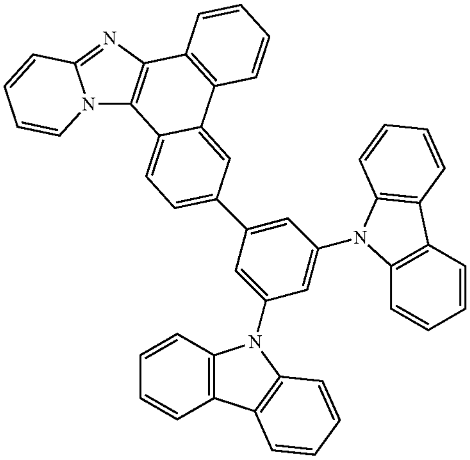
A-11
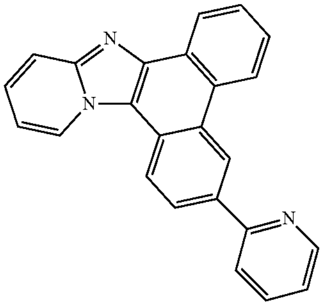
A-12
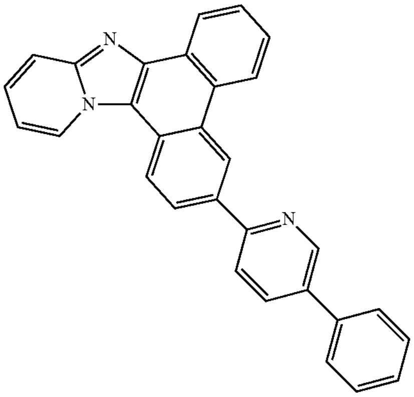
A-13
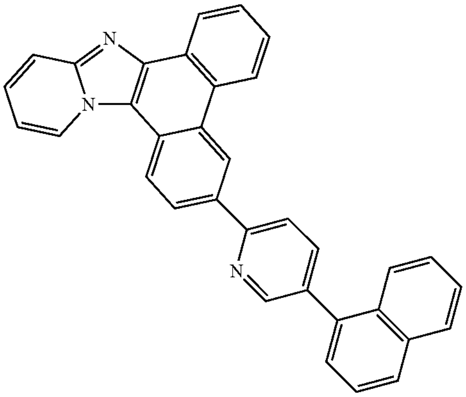

-continued
A-14
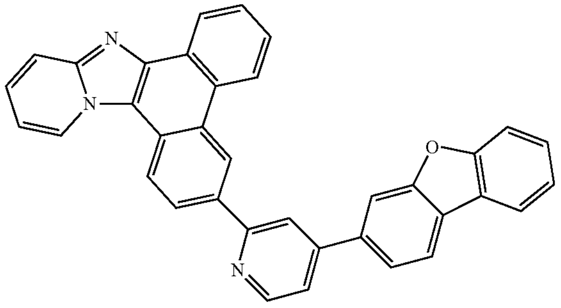
A-15
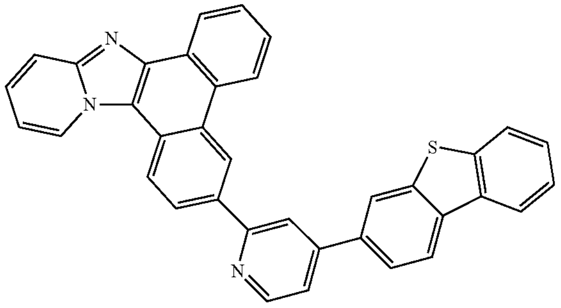
A-16
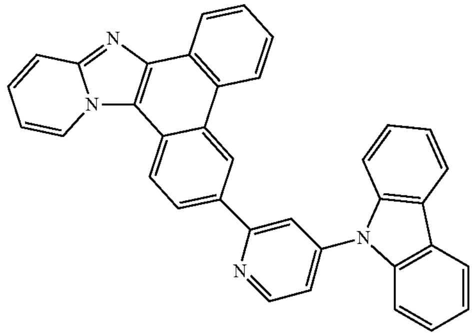
A-17
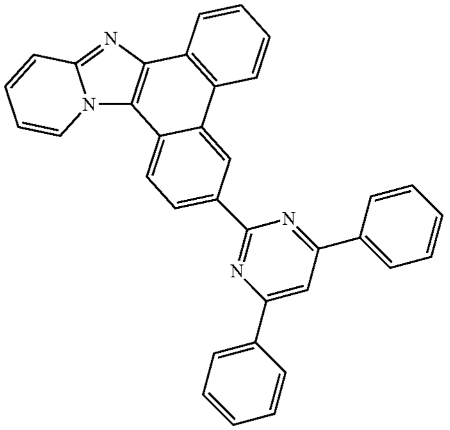
-continued
A-18
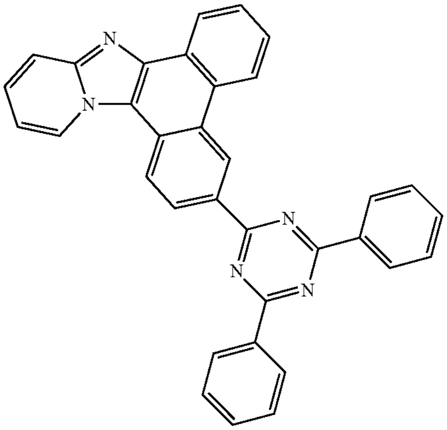
A-19
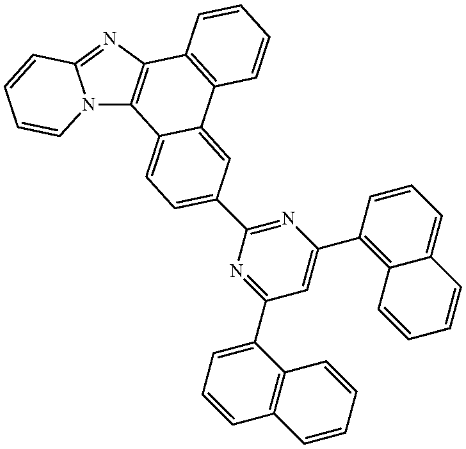
A-20
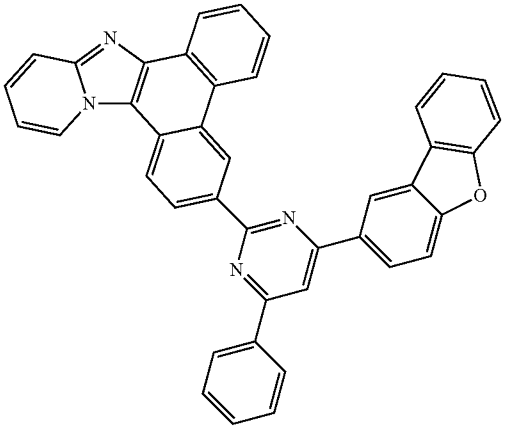

-continued
A-21
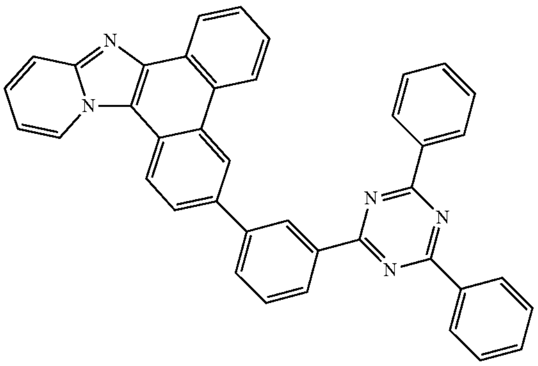
A-22
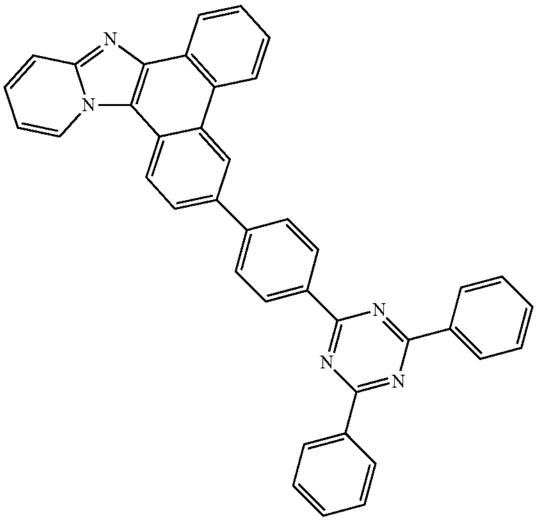
A-23
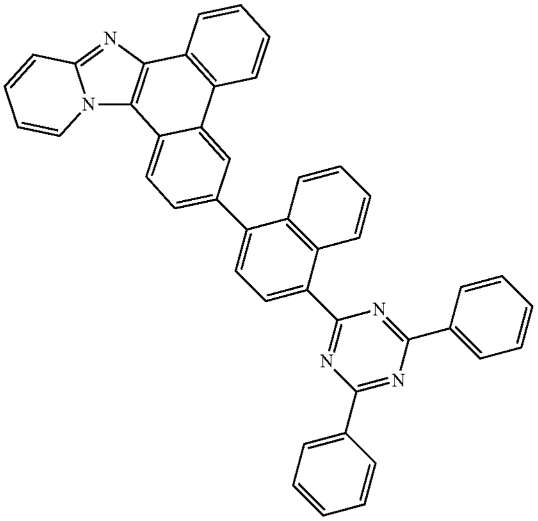
-continued
A-24
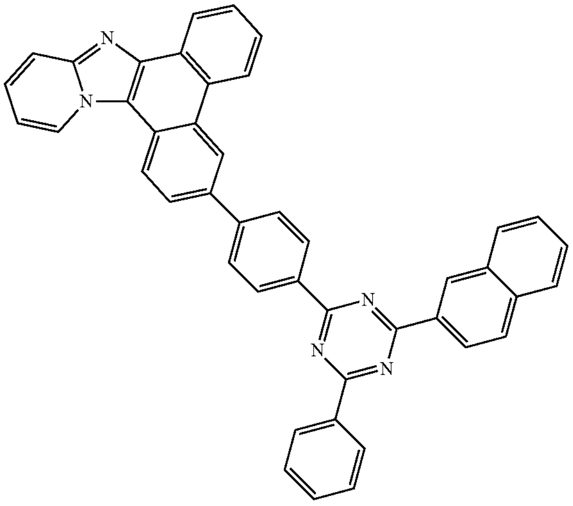
A-25
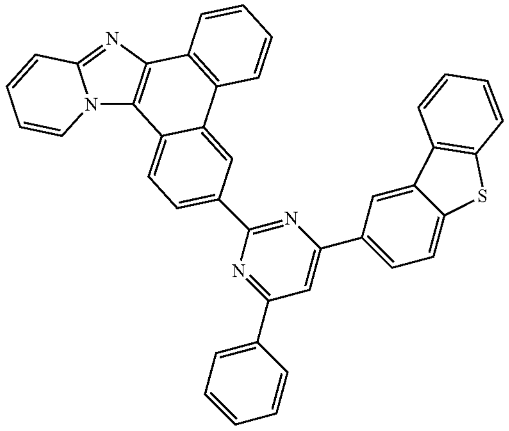
A-26
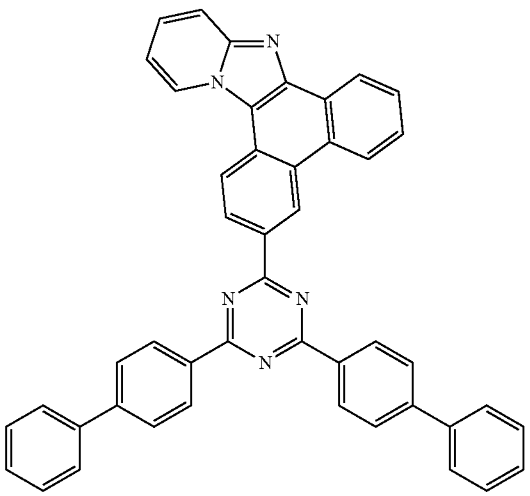

-continued
A-27
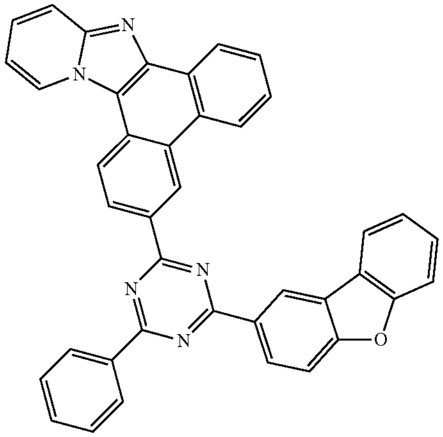
A-28
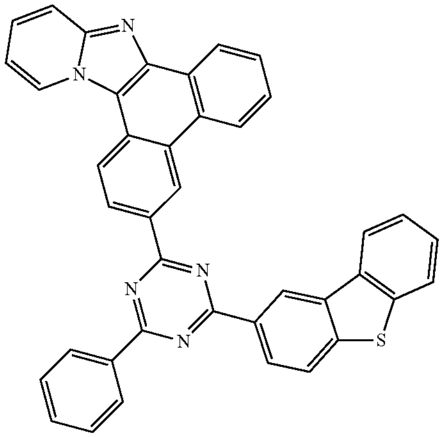
A-29
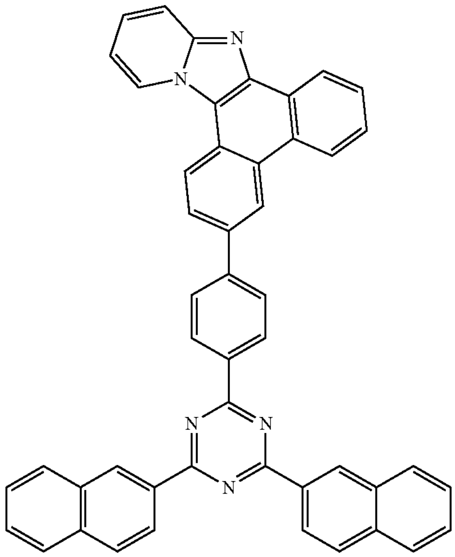
-continued
A-30
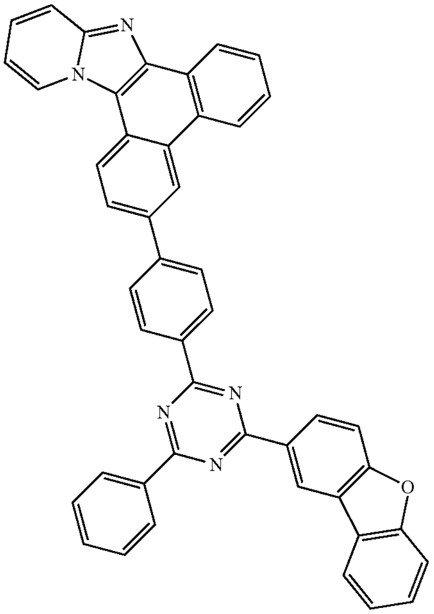
A-31
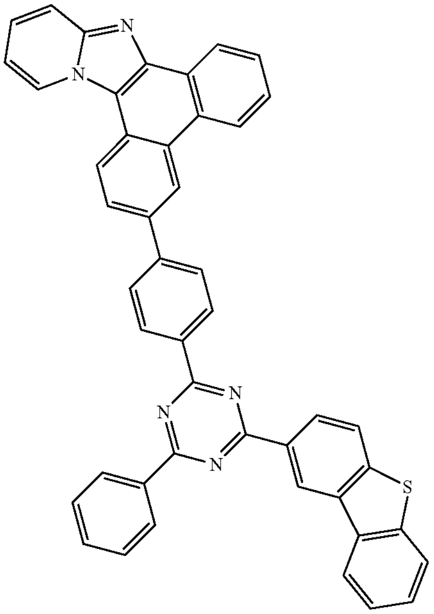

-continued
A-32
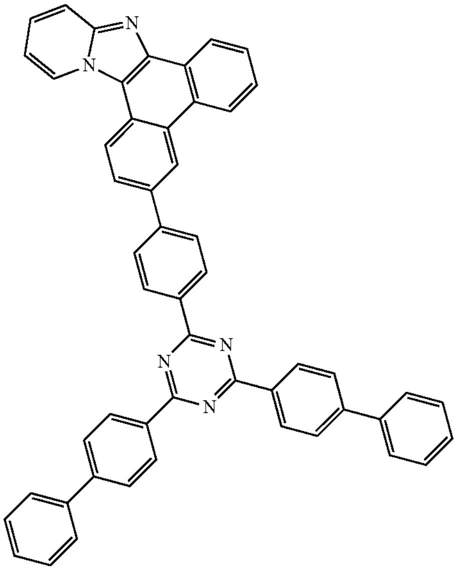
A-33
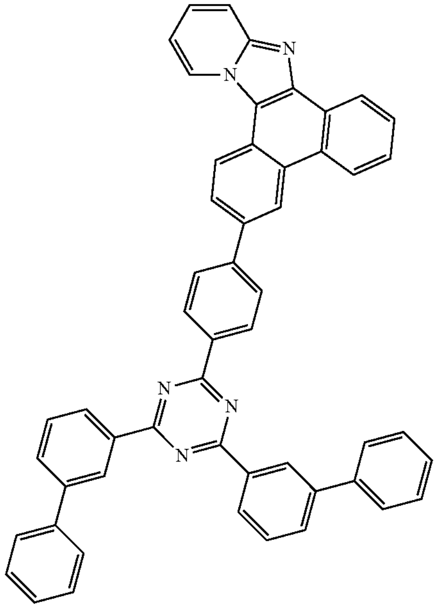
A-34
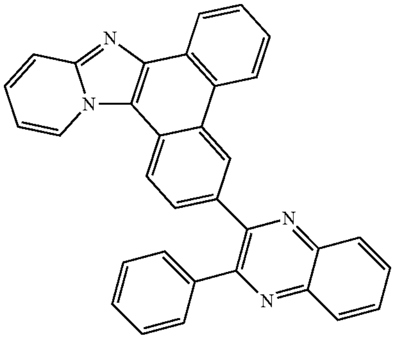
-continued
A-35
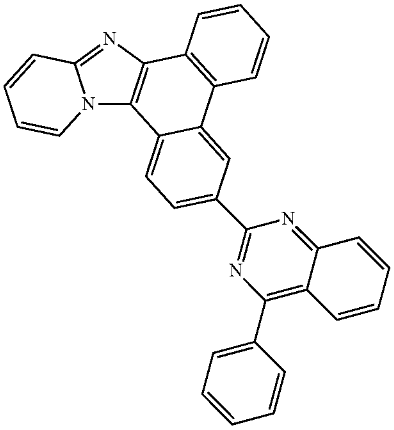
A-36
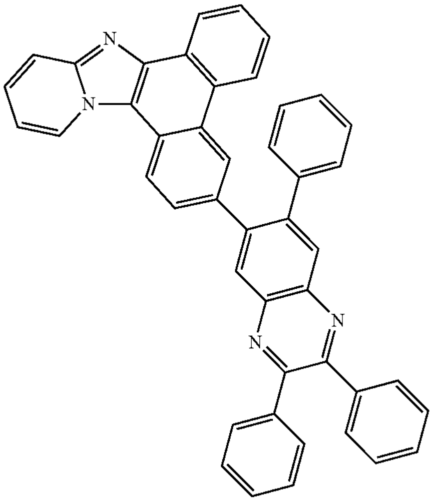
A-37
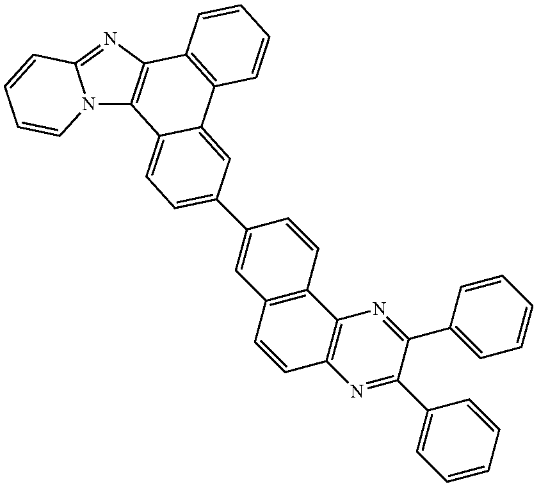

-continued
A-38
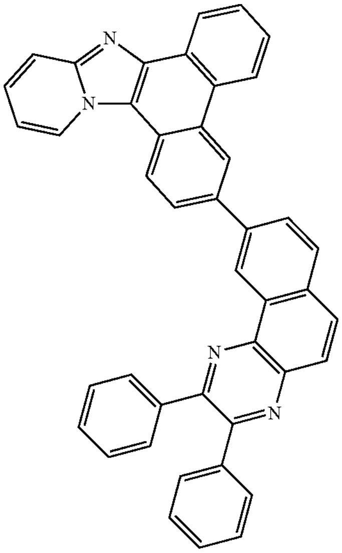
A-39
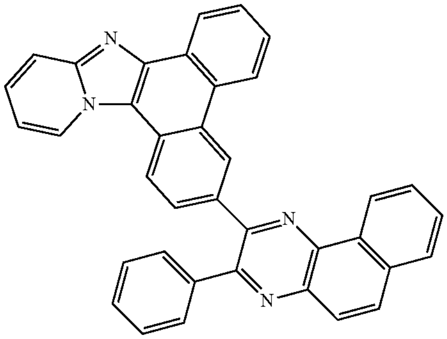
A-40
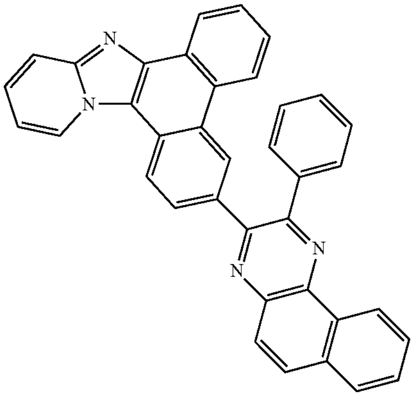
-continued
A-41
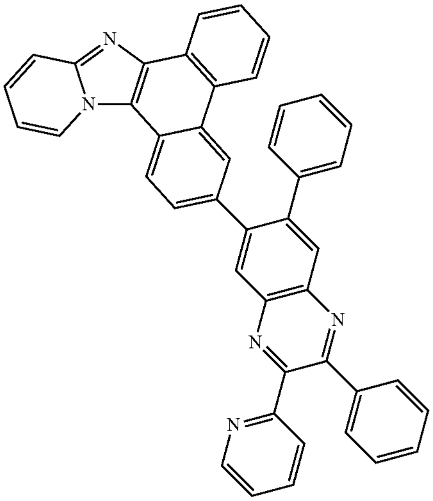
A-42
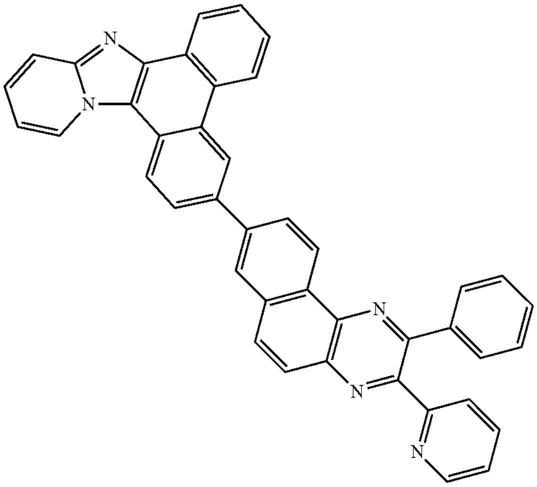
A-43
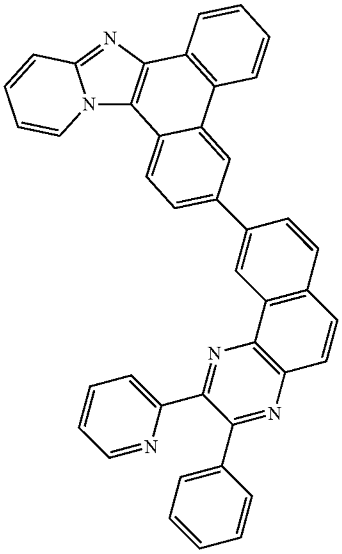

A-44
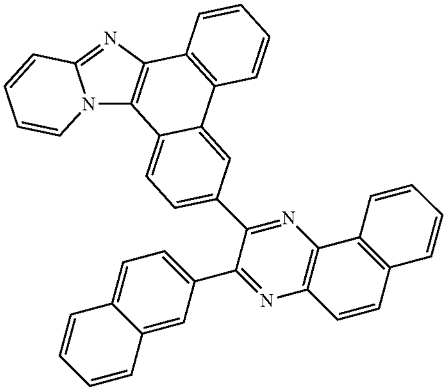
A-45
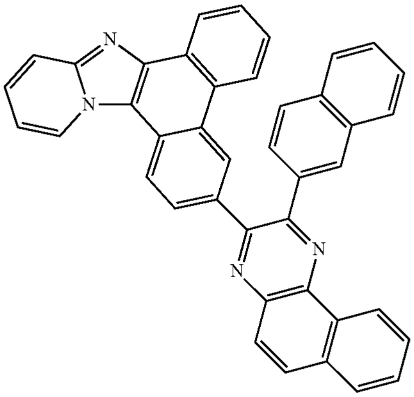
A-46
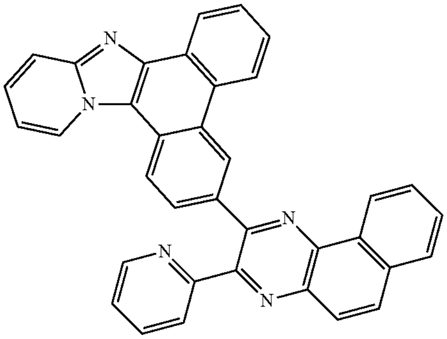
A-47
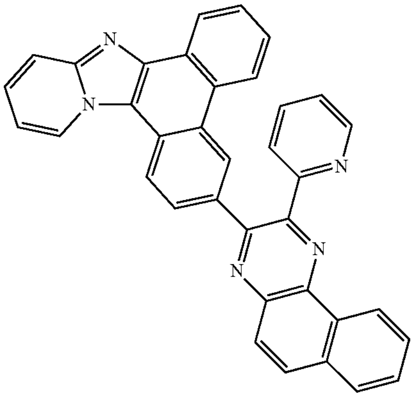
A-48
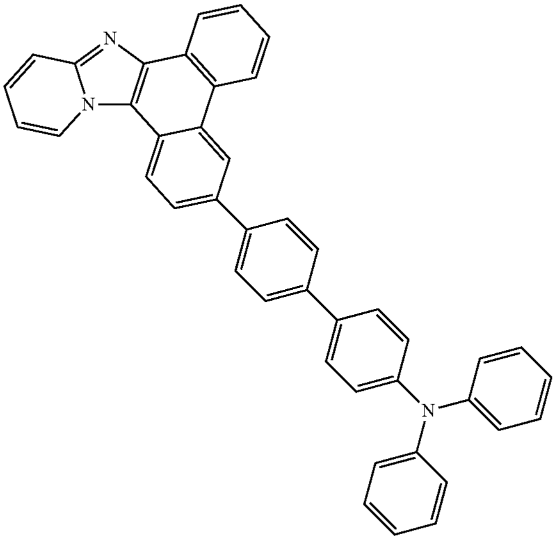
A-49
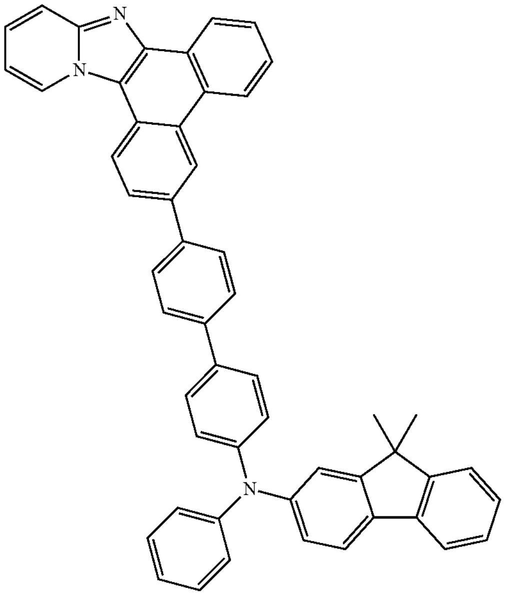

-continued
A-50
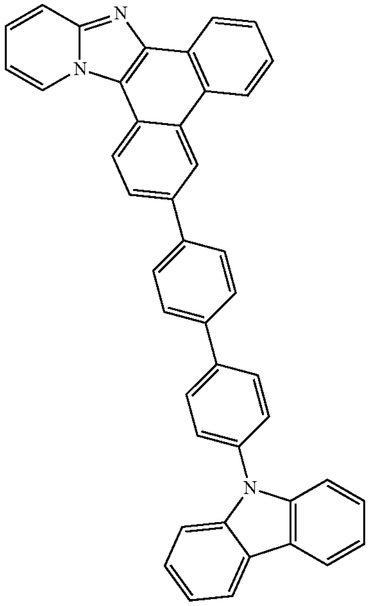
A-51
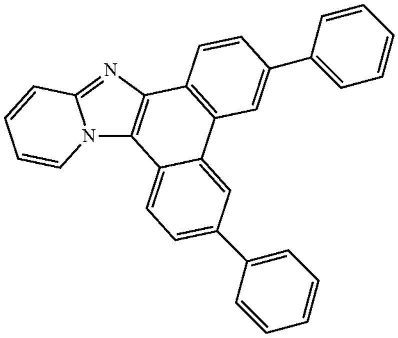
A-52
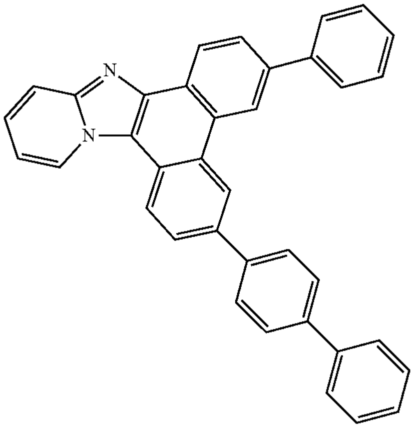
-continued
A-53
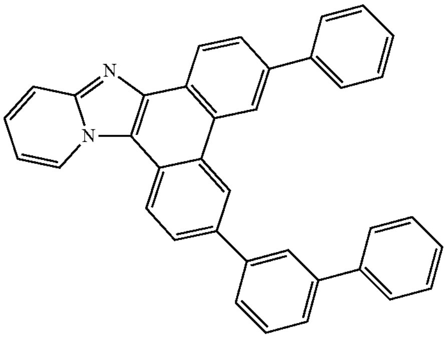
A-54
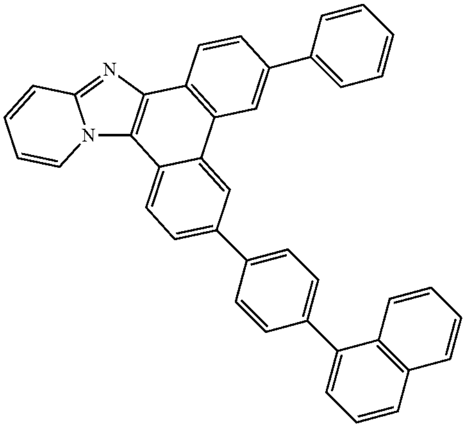
A-55
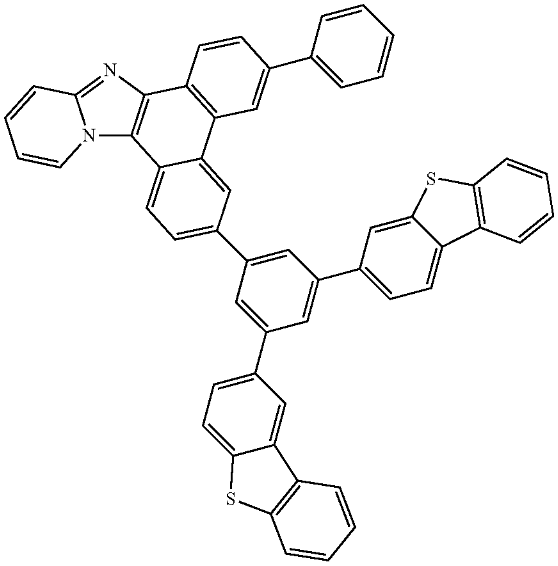

-continued
A-56
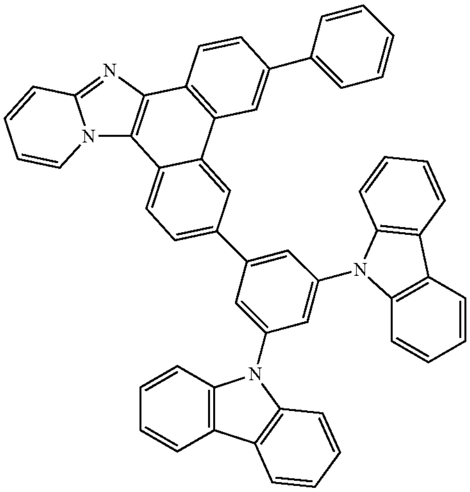
A-57
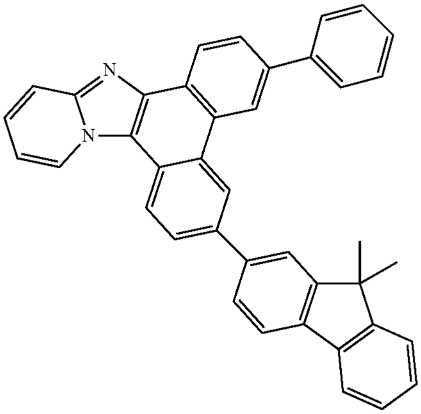
A-58
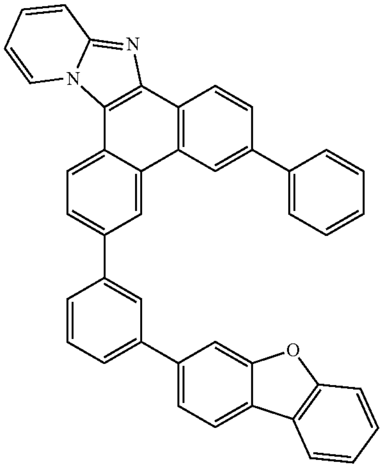
-continued
A-59
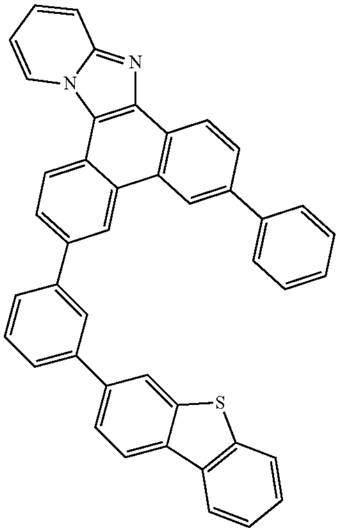
A-60
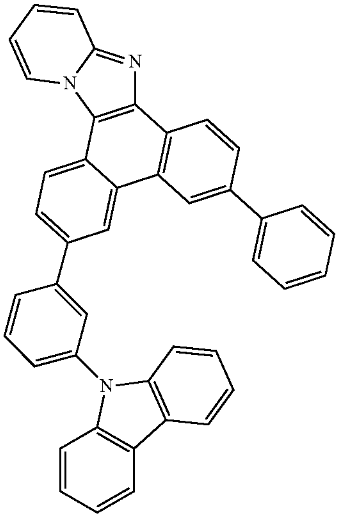
A-61
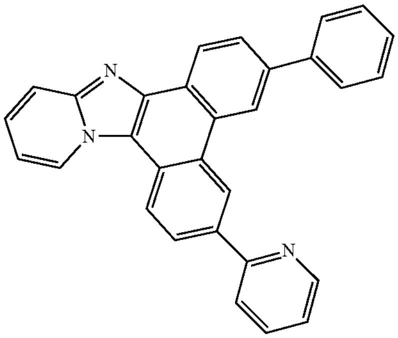

-continued
A-62
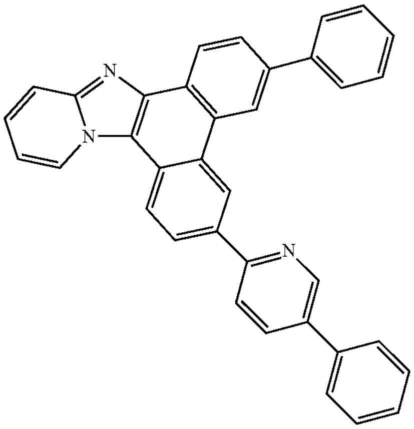
A-63
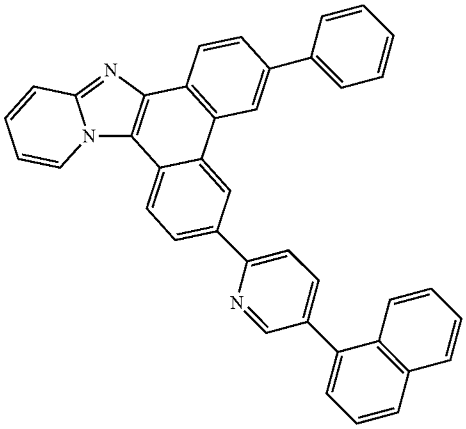
A-64
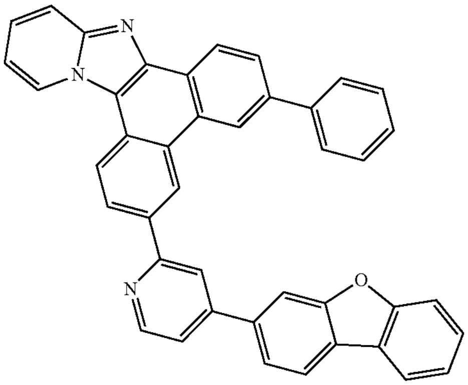
A-65
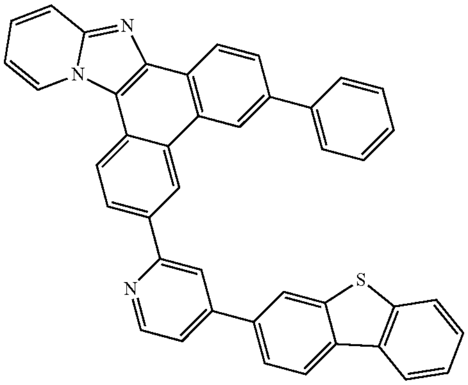
-continued
A-66
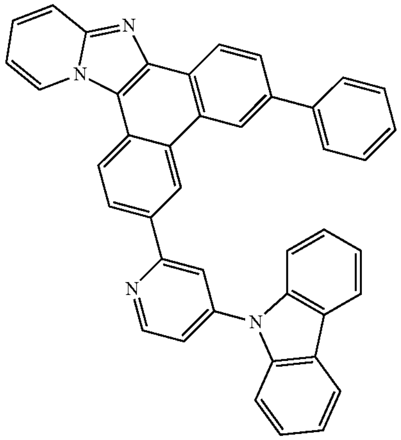
A-67
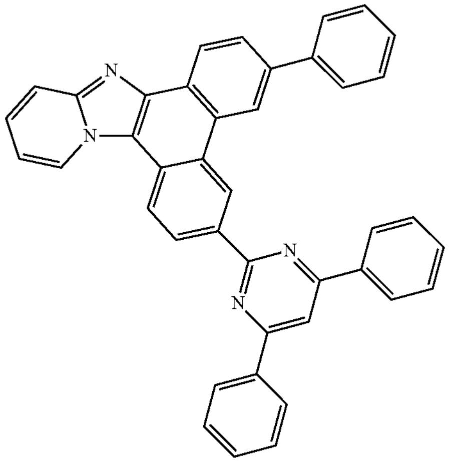
A-68
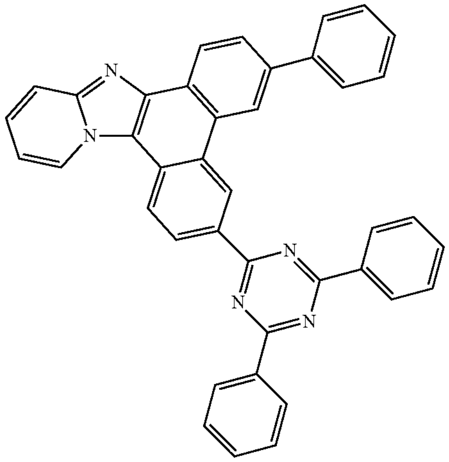

-continued
A-69
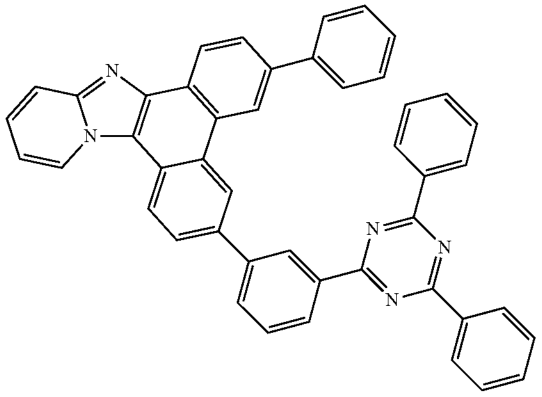
A-70
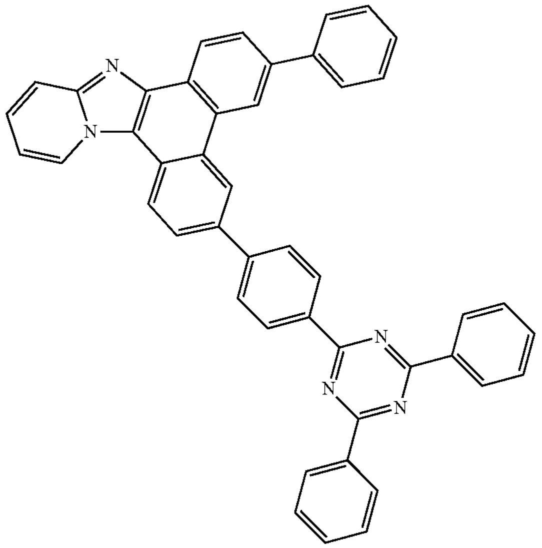
A-71
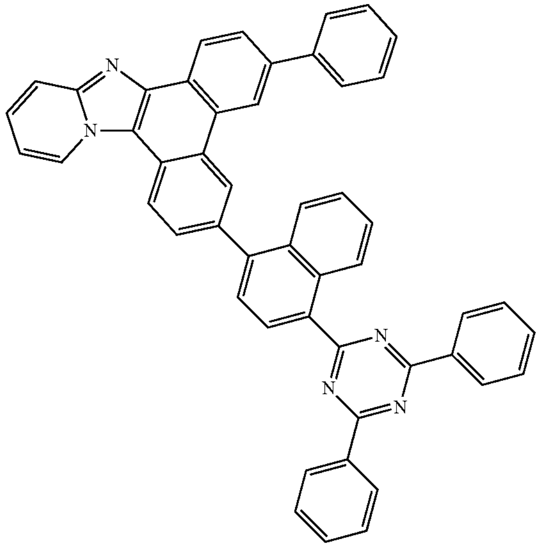
-continued
A-72
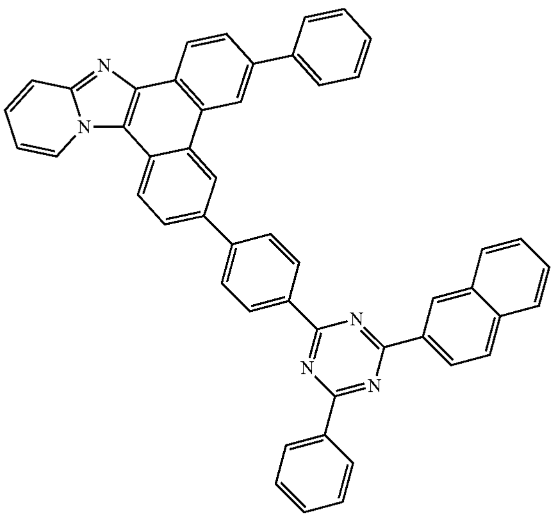
A-73
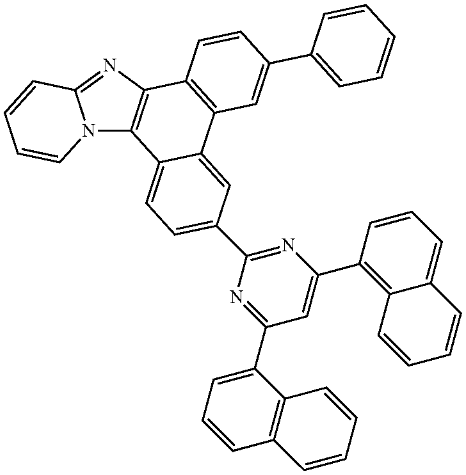
A-74
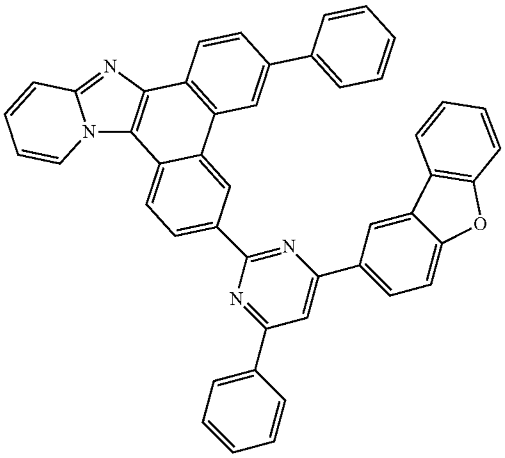

-continued
A-75
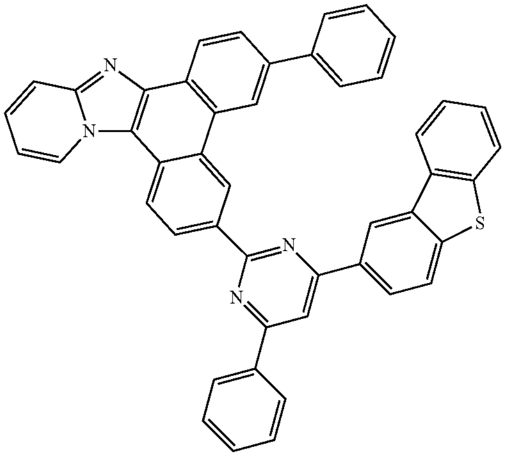
A-76
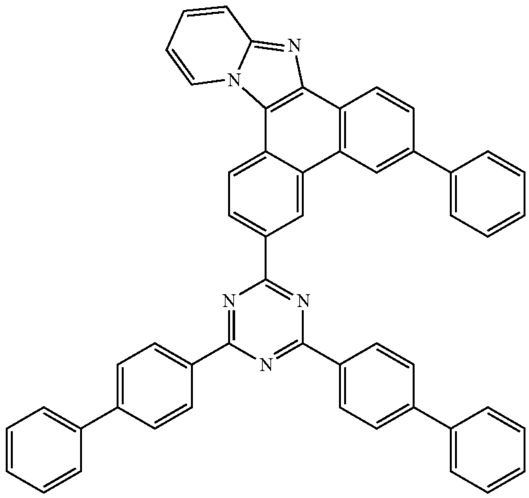
A-77
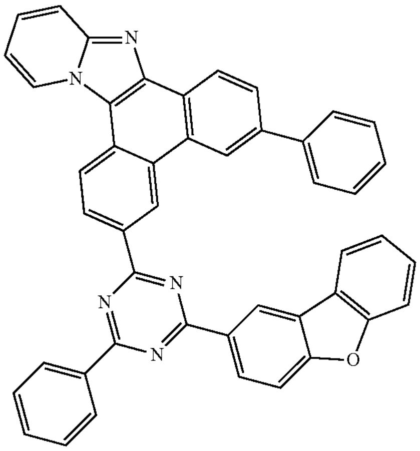
-continued
A-78
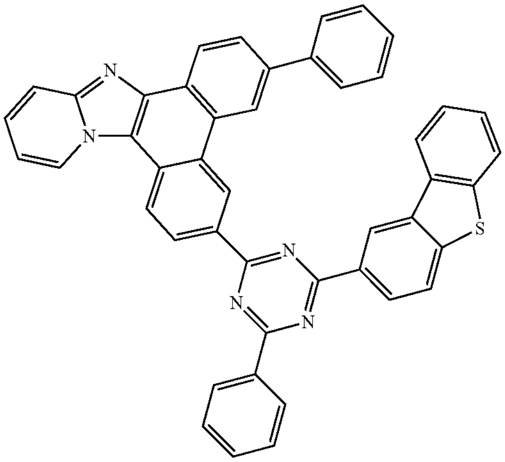
A-79
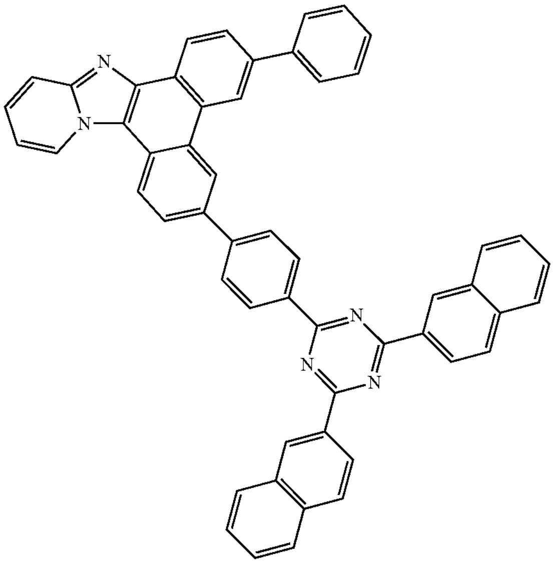
A-80
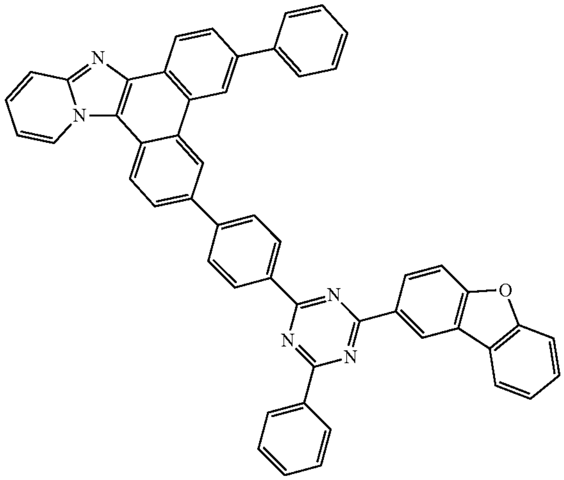

-continued
A-81
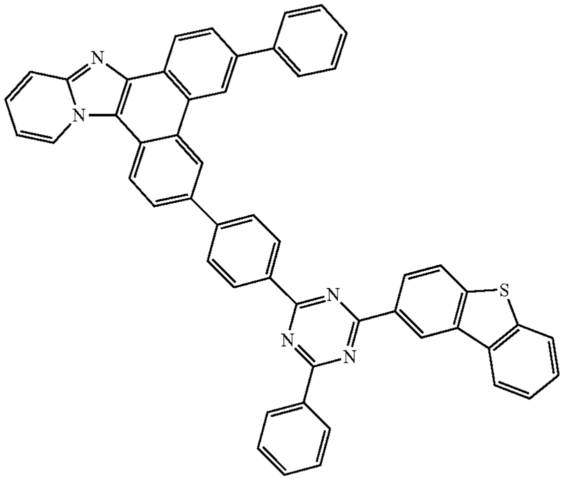
A-82
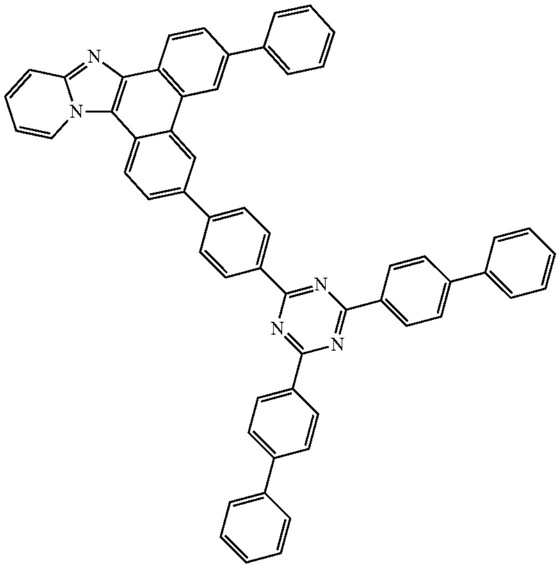
-continued
A-83
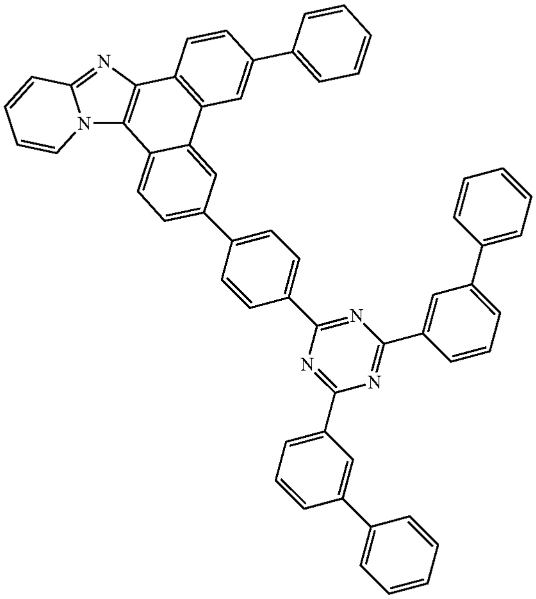
A-84
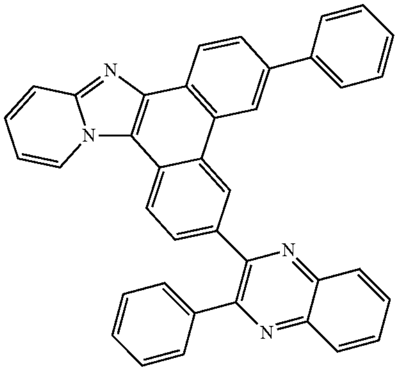
A-85
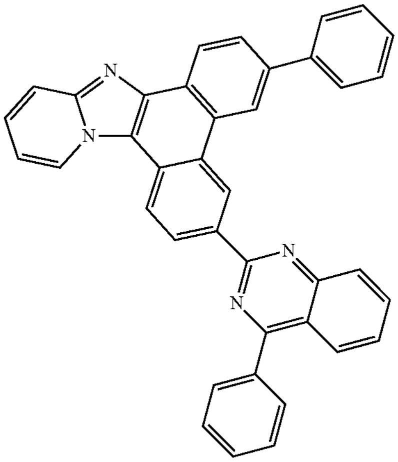

-continued
A-86
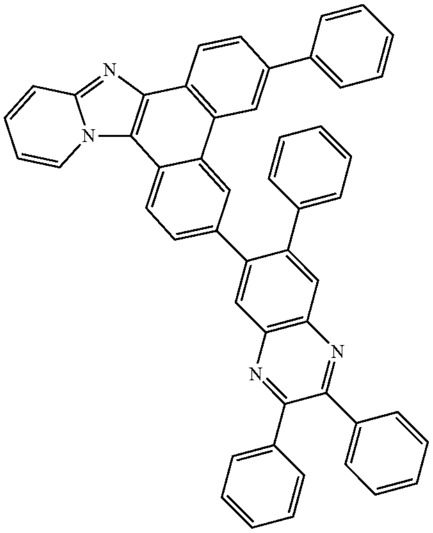
A-87
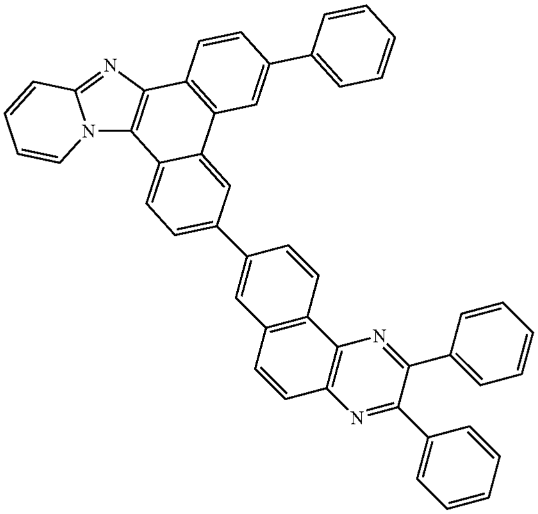
A-88
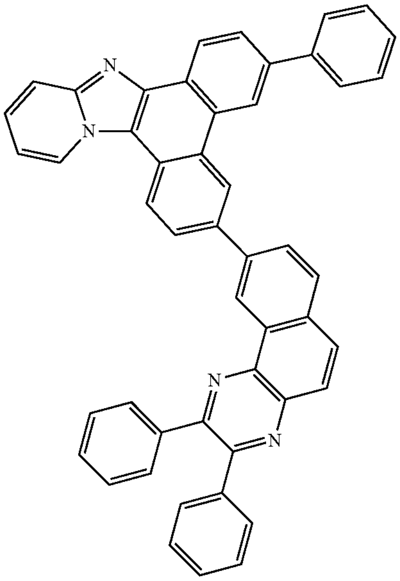
-continued
A-89
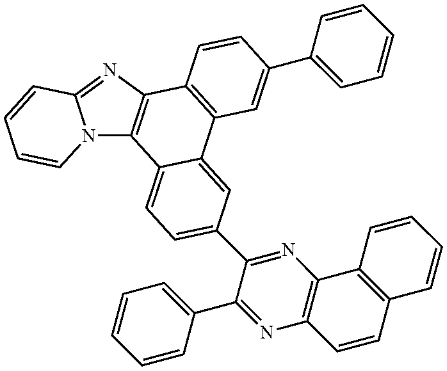
A-90
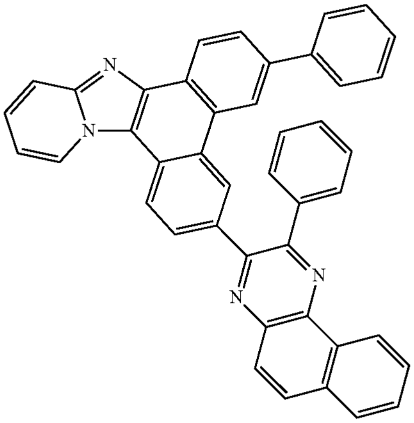
A-91
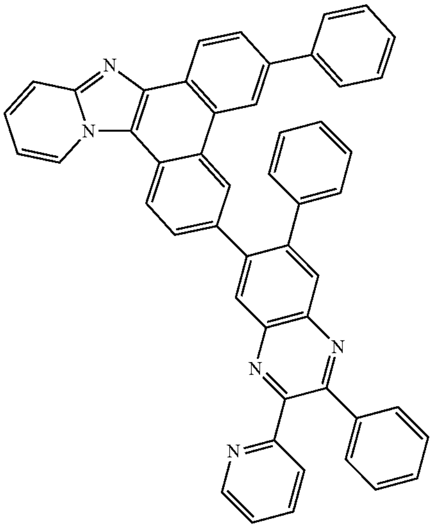

-continued
A-92
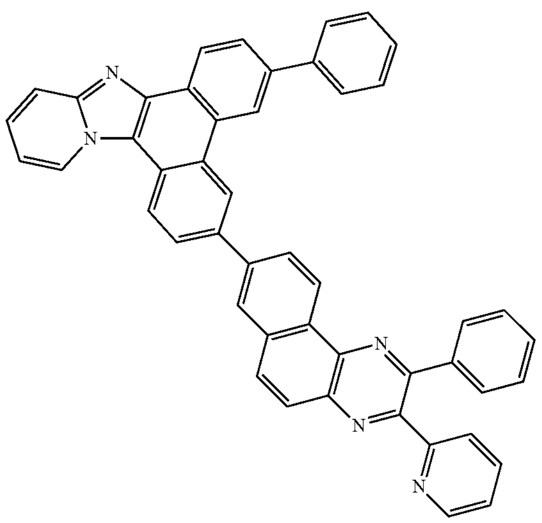
A-93
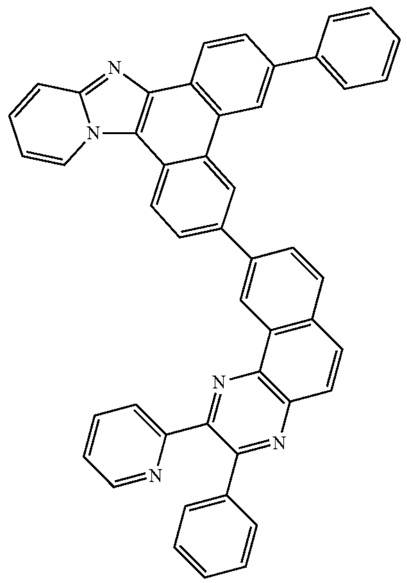
A-94
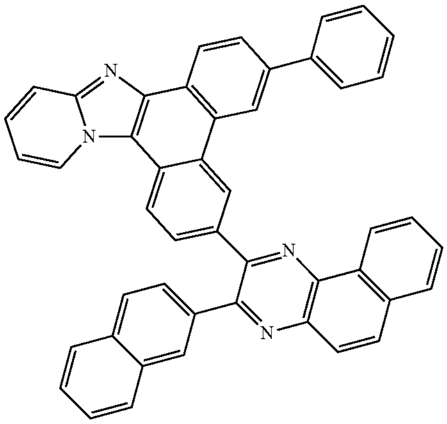
-continued
A-95
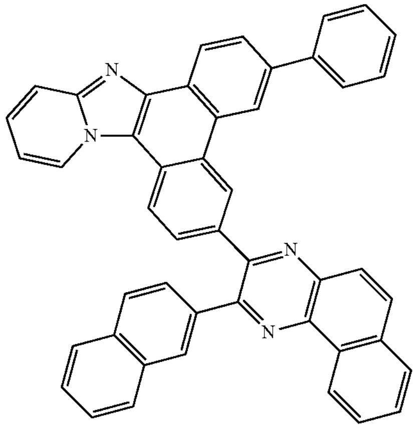
A-96
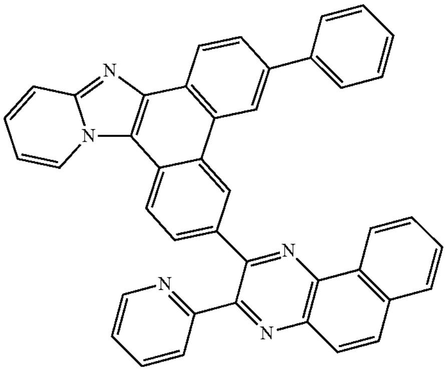
A-97
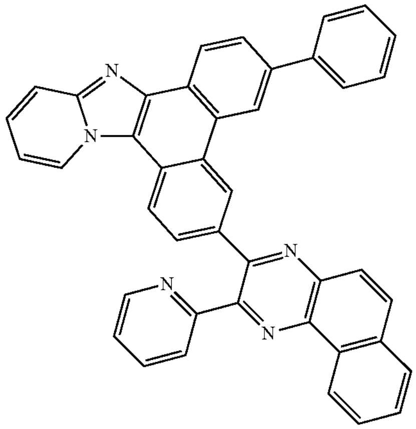

-continued
A-98
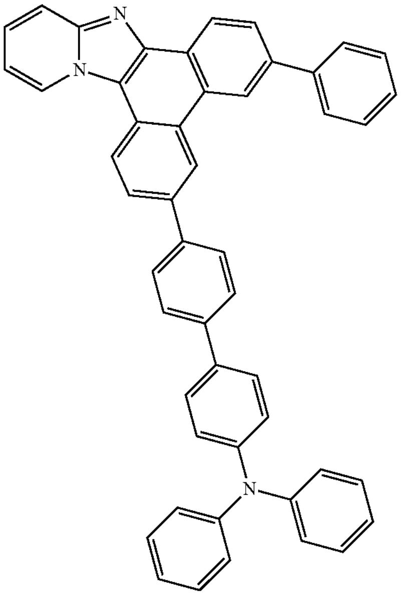
A-99
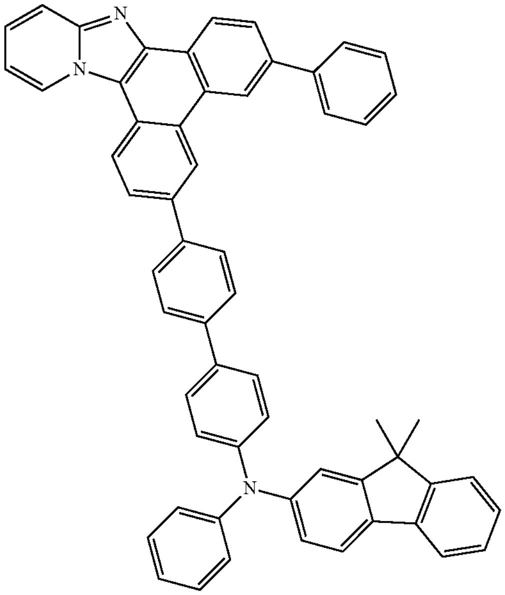
-continued
A-100
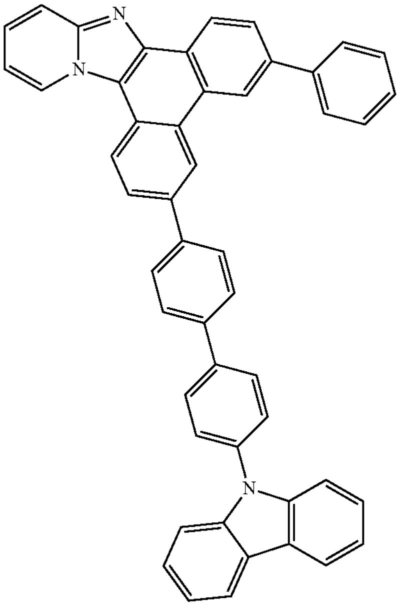
A-101
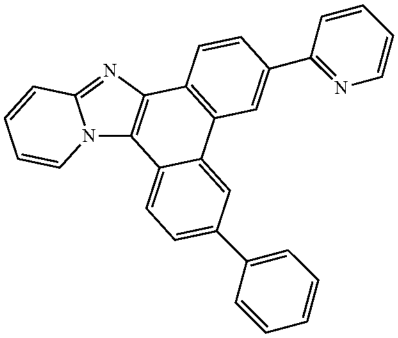
A-102
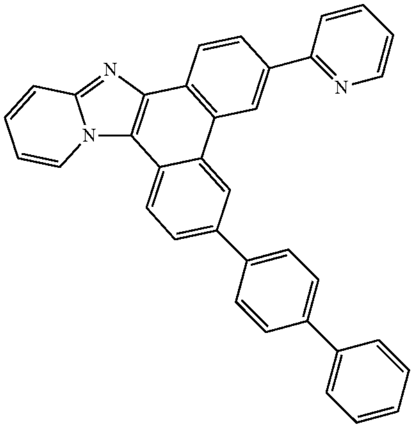

-continued
A-103
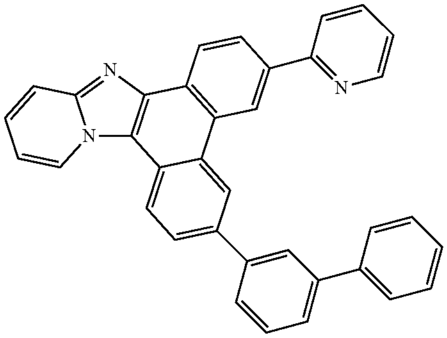
A-104
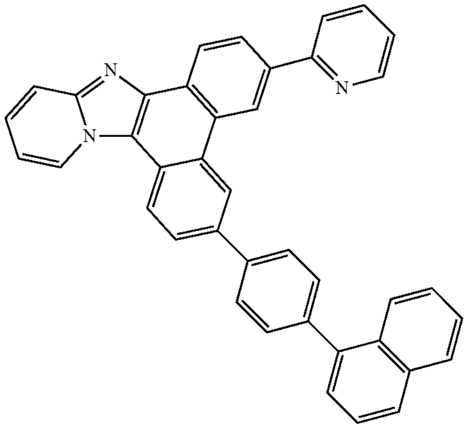
A-105
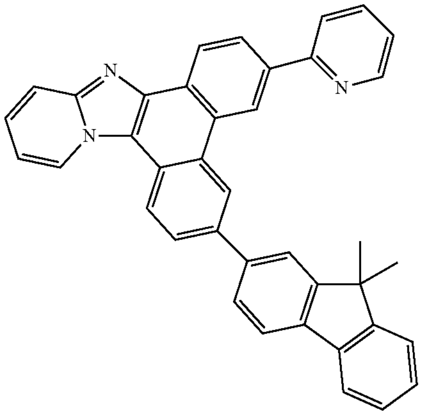
A-106
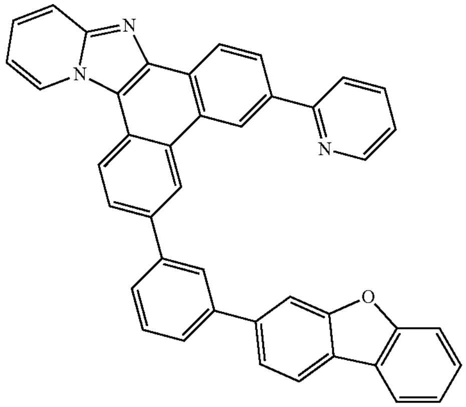
-continued
A-107
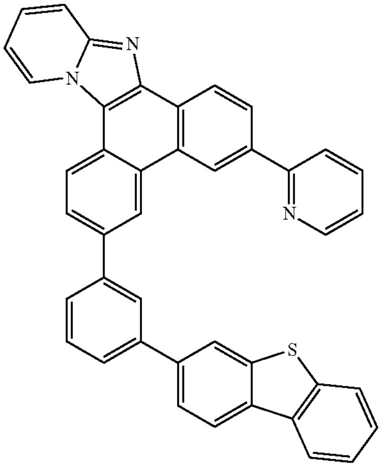
A-108
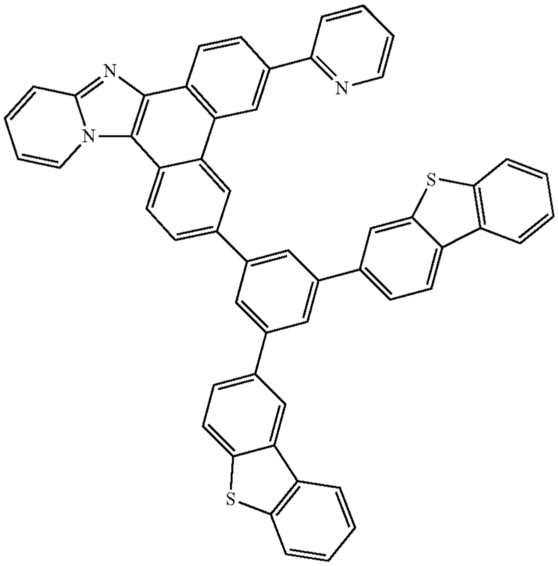
A-109
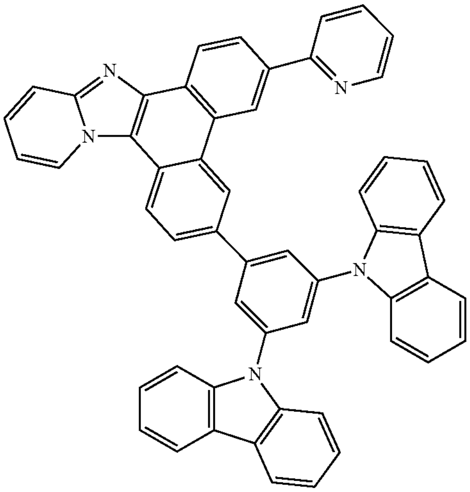

-continued
A-110
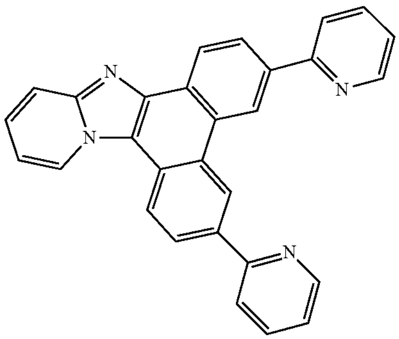
A-111
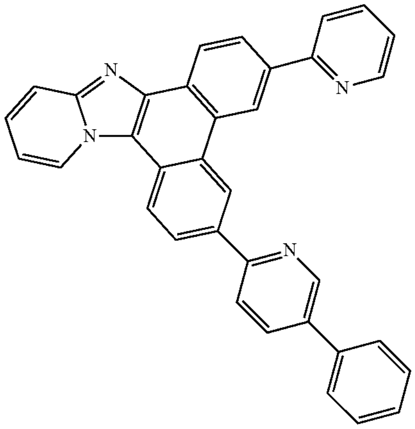
A-112
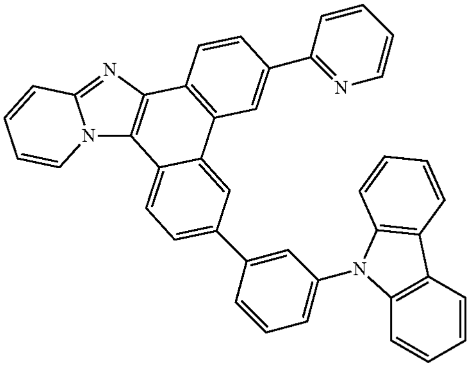
A-113
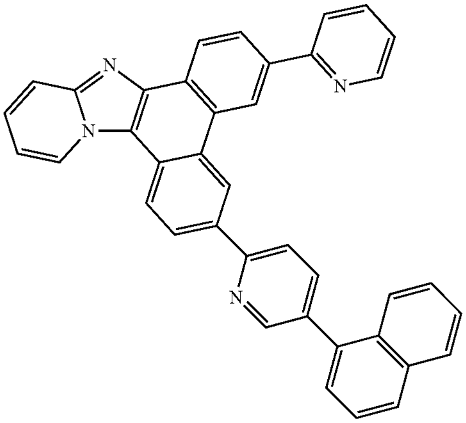
-continued
A-114
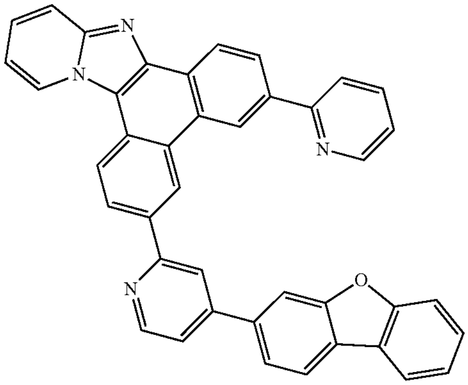
A-115
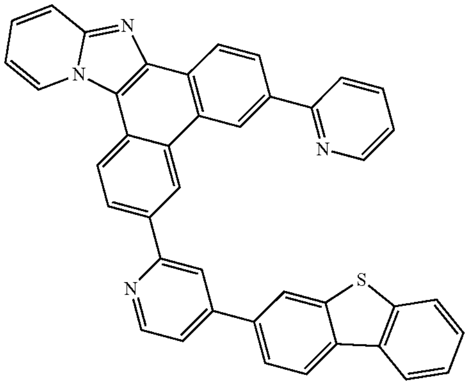
A-116
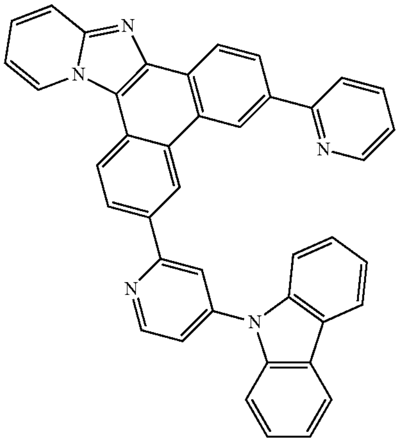

-continued
A-117
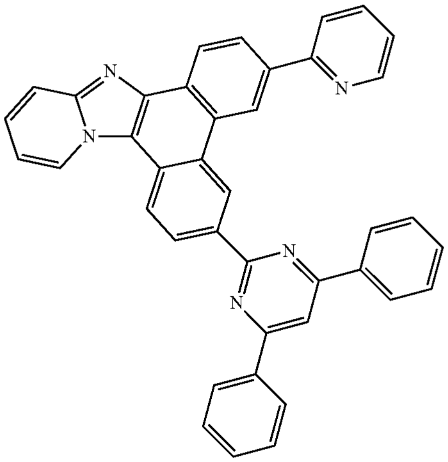
A-118
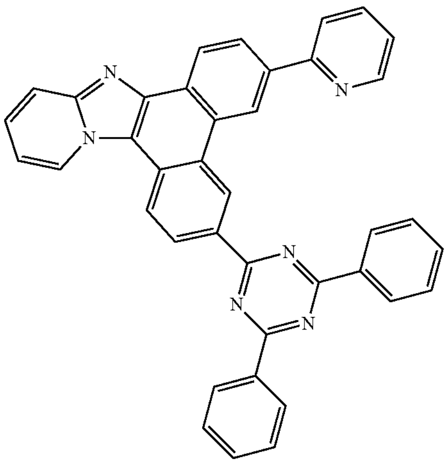
A-119
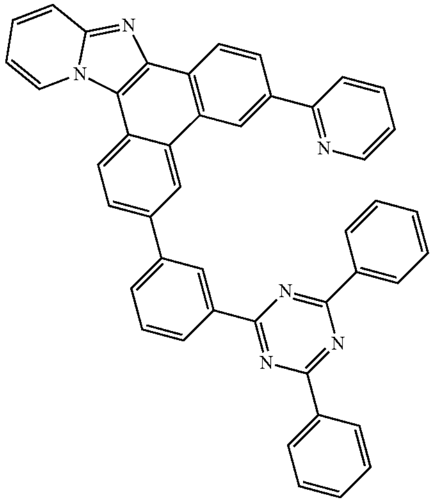
-continued
A-120
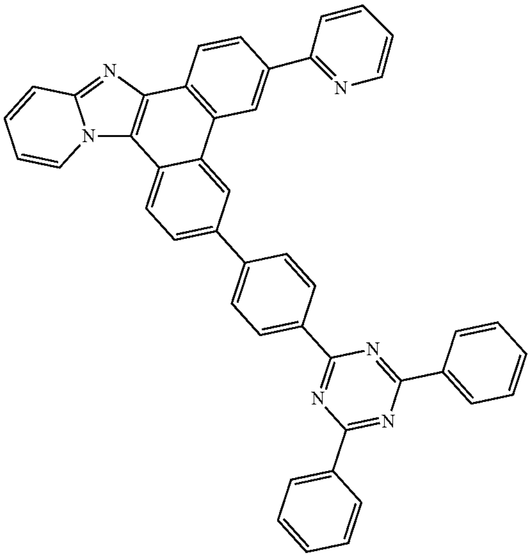
A-121
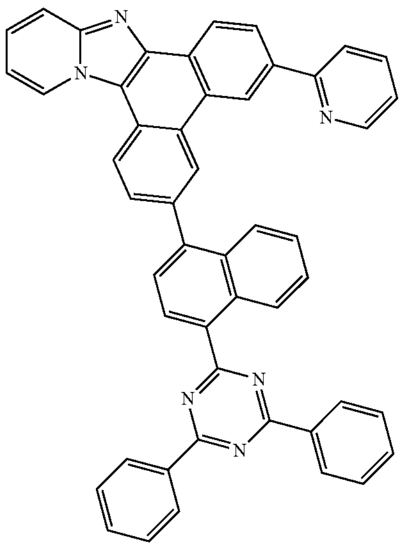

-continued
A-122
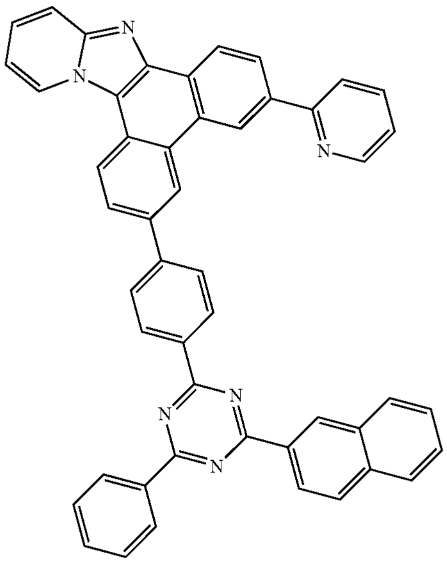
A-123
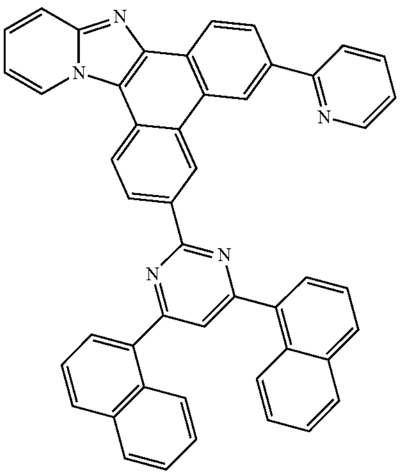
A-124
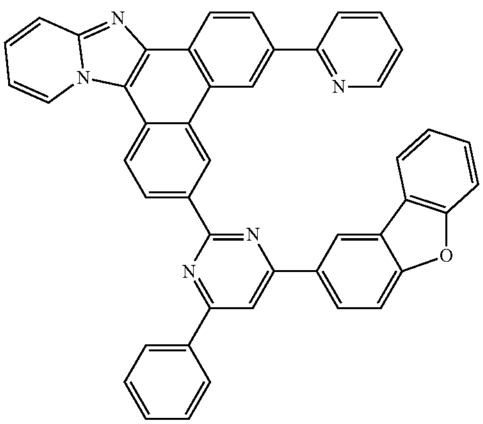
-continued
A-125
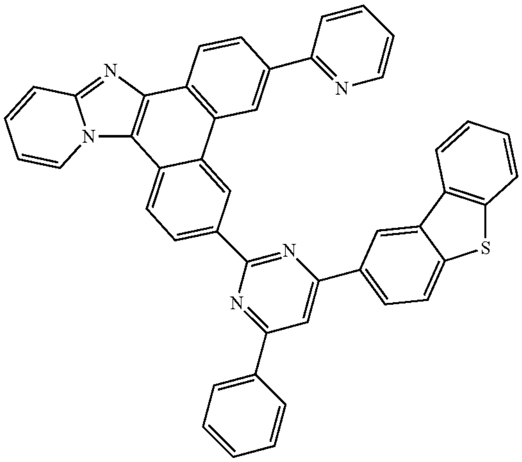
A-126
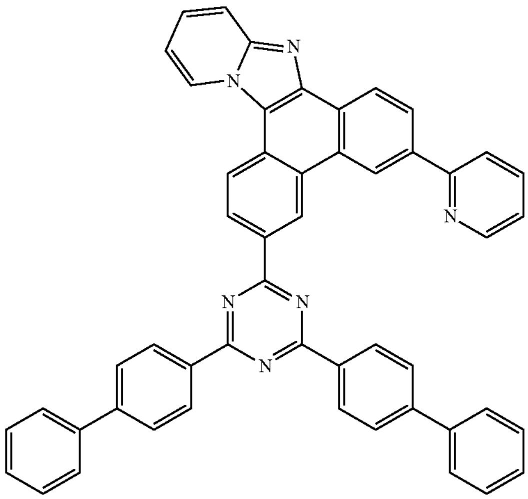
A-127
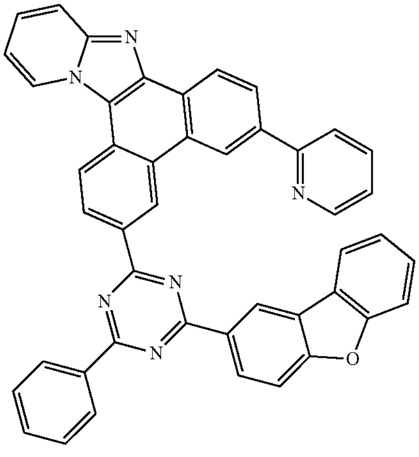

-continued
A-128
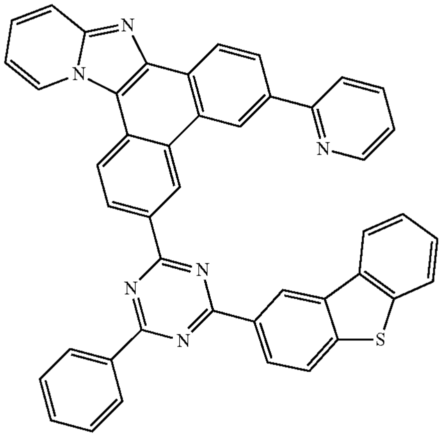
A-129
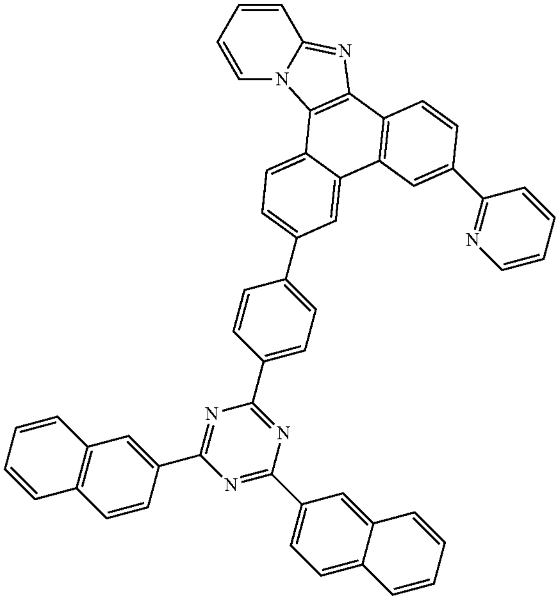
A-130
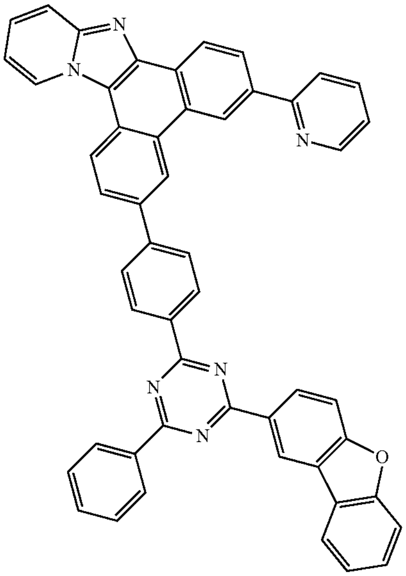
-continued
A-131
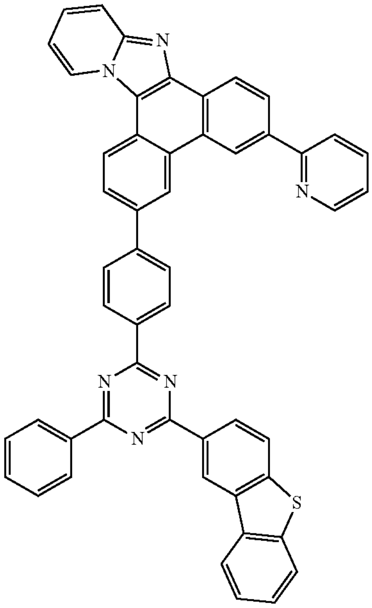
A-132
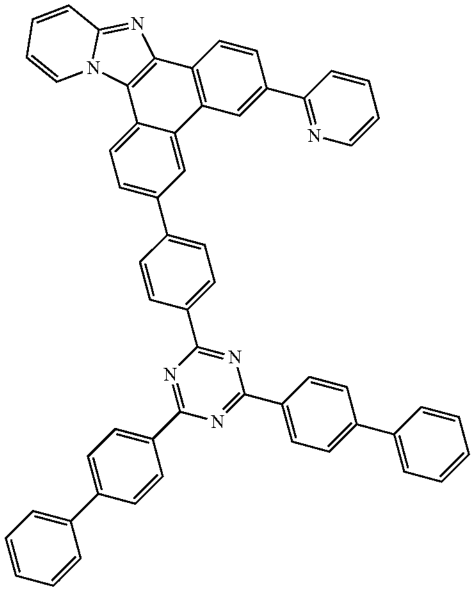

-continued
A-133
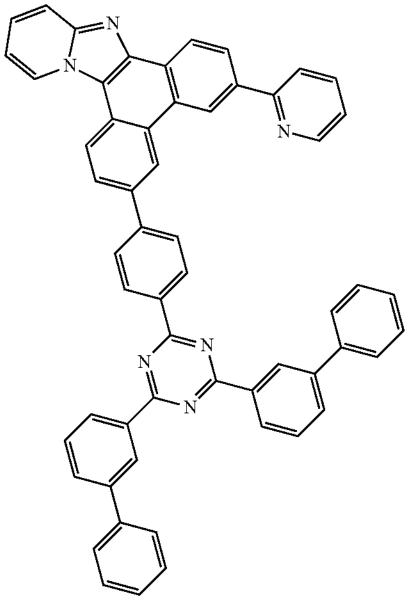
A-134
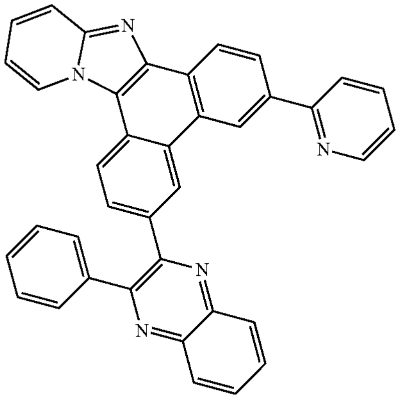
A-135
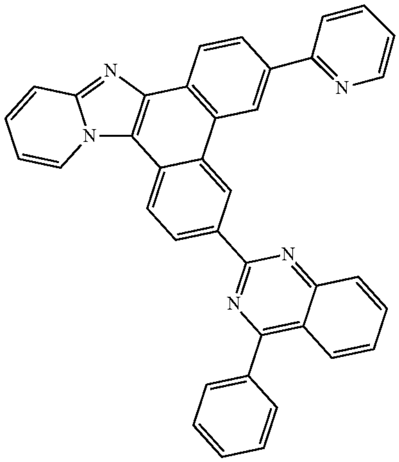
-continued
A-136
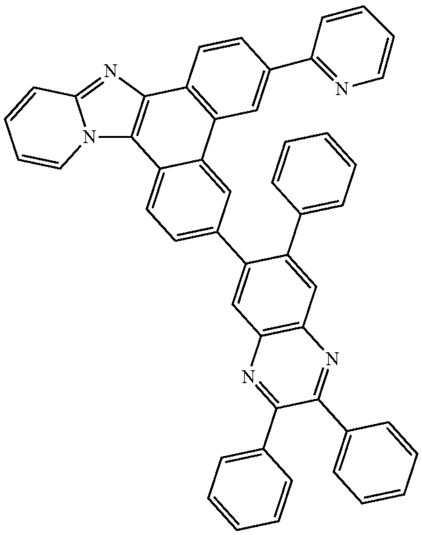
A-137
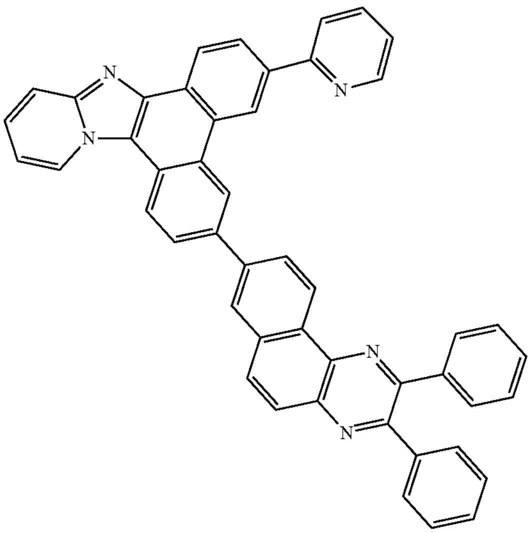
A-138
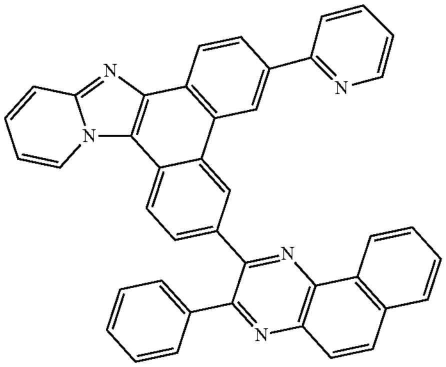

-continued
A-139
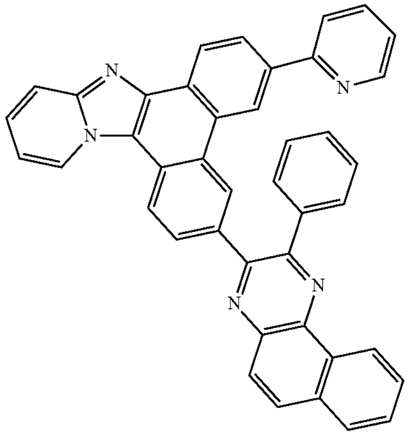
A-140
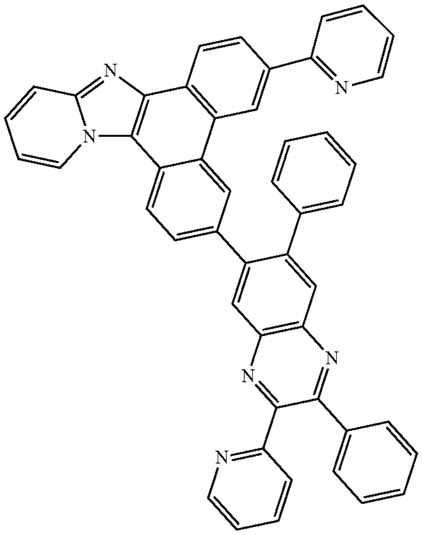
A-141
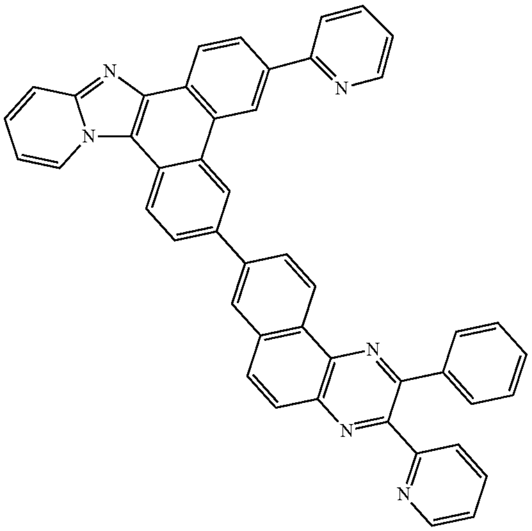
-continued
A-142
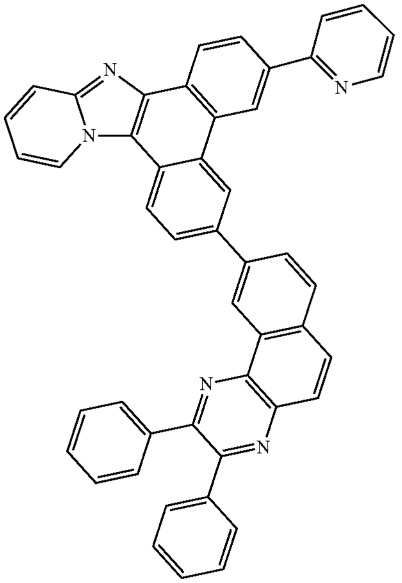
A-143
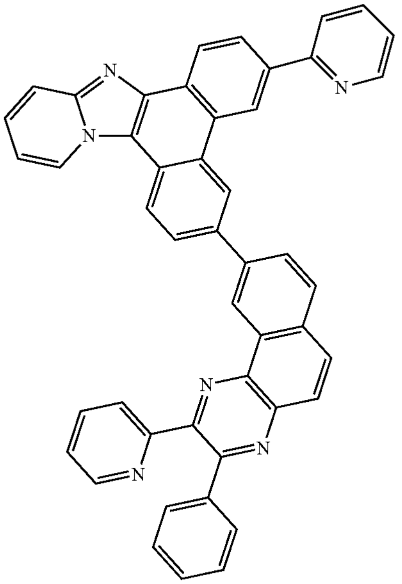
A-144
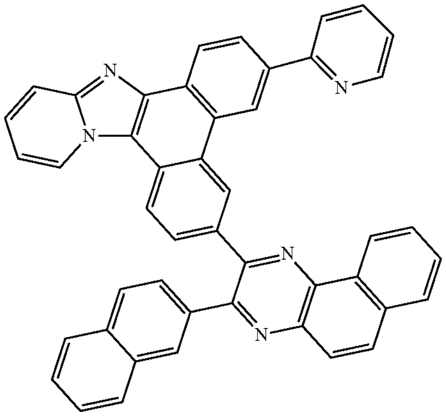

-continued
A-145
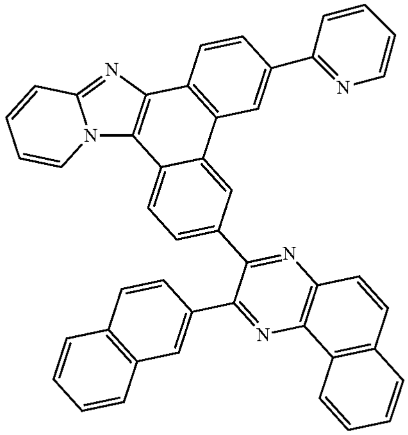
A-146
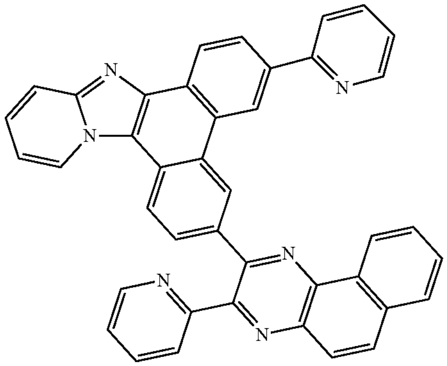
A-147
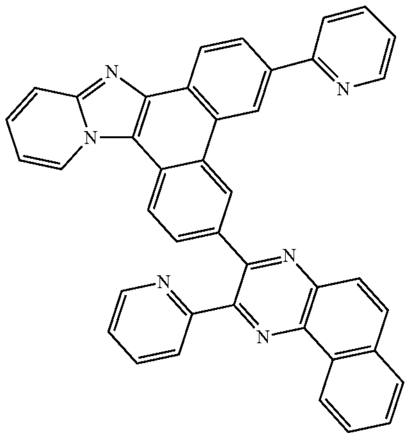
-continued
A-148
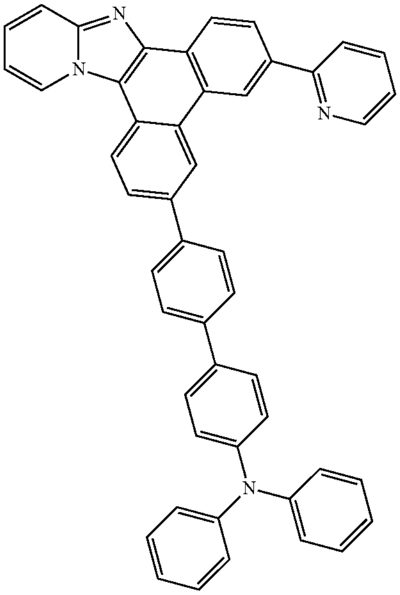
A-149
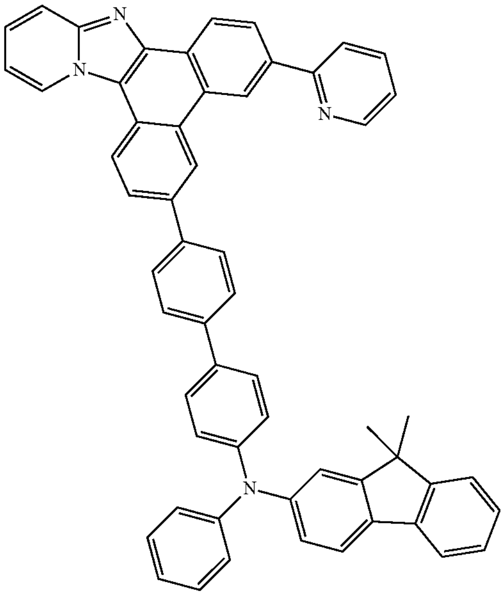

-continued
A-150
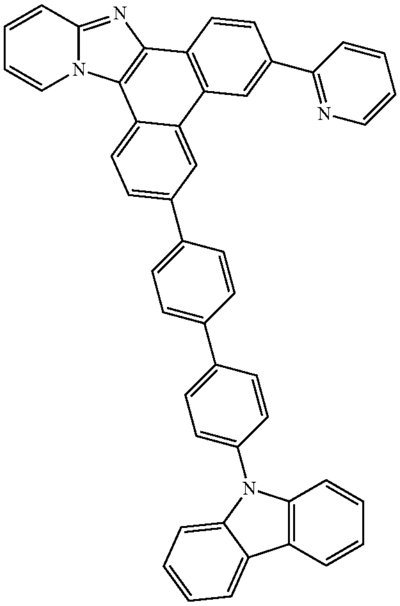
A-151
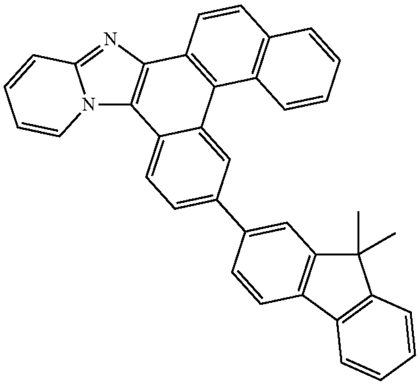
A-152
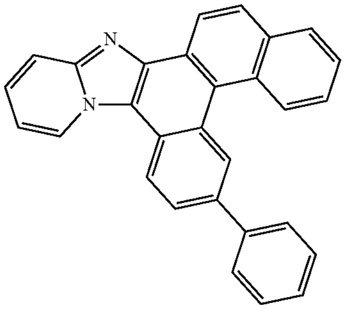
-continued
A-153
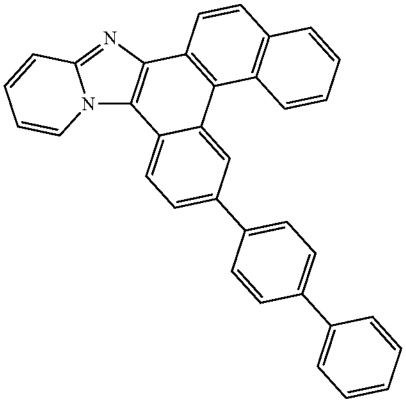
A-154
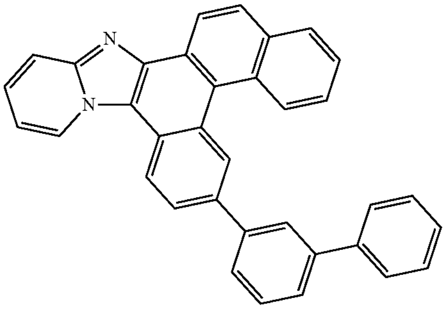
A-155
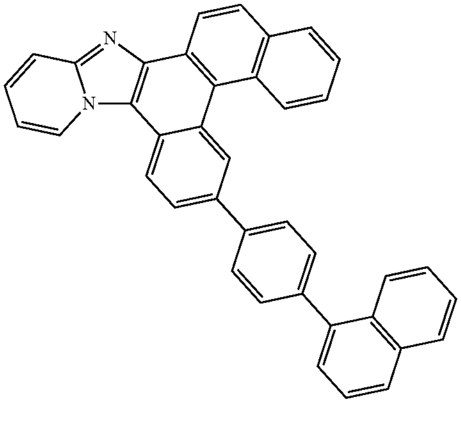
A-156
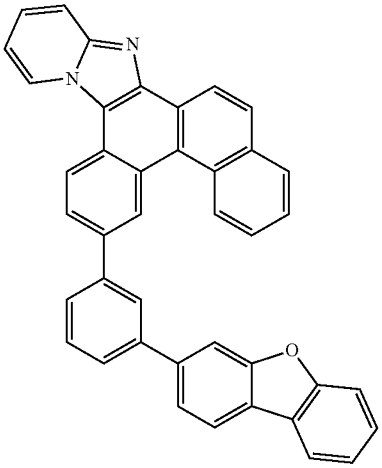

-continued
A-157
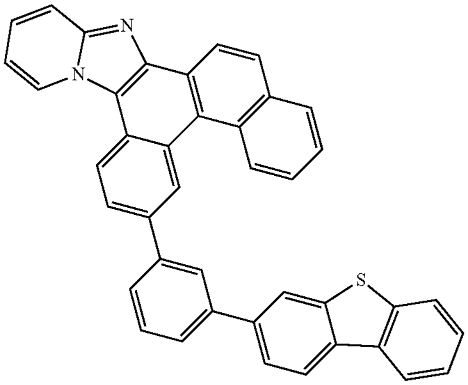
A-158
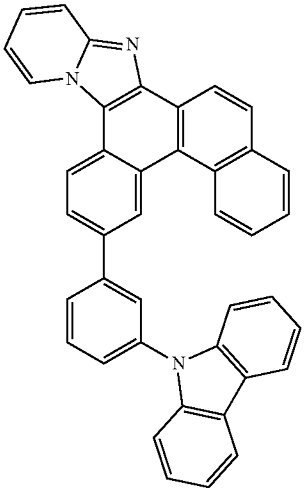
A-159
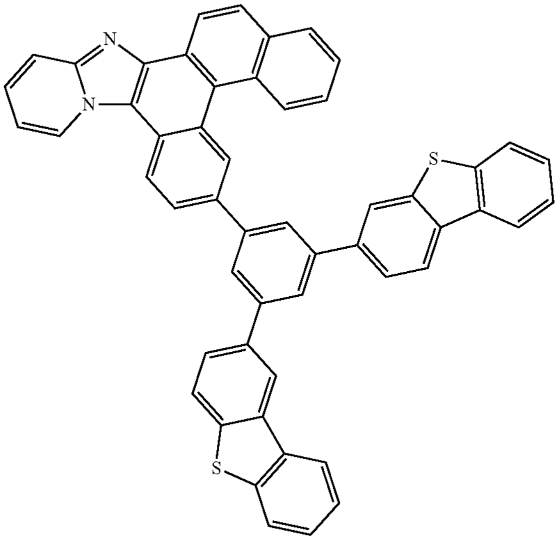
-continued
A-160
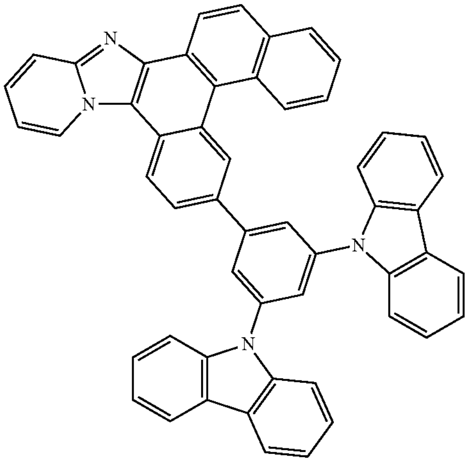
A-161
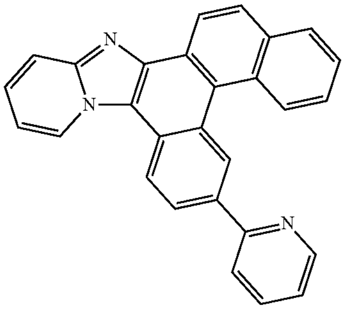
A-162
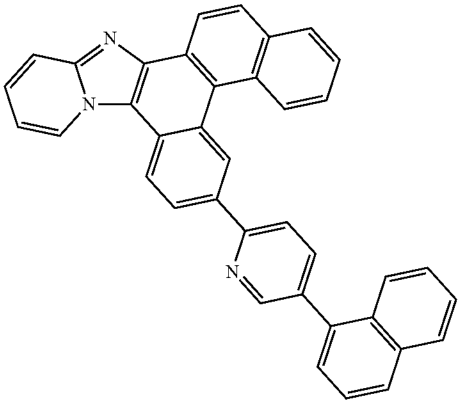
A-163
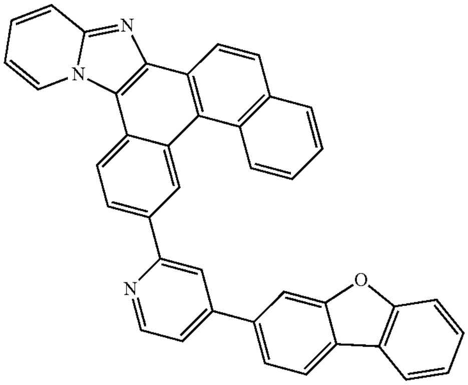

A-164
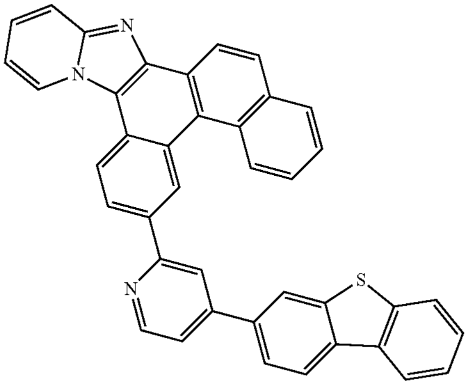
A-165
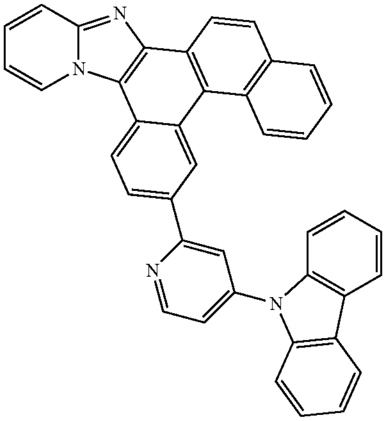
A-166
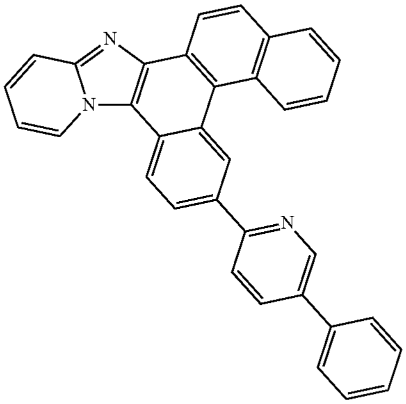
A-167
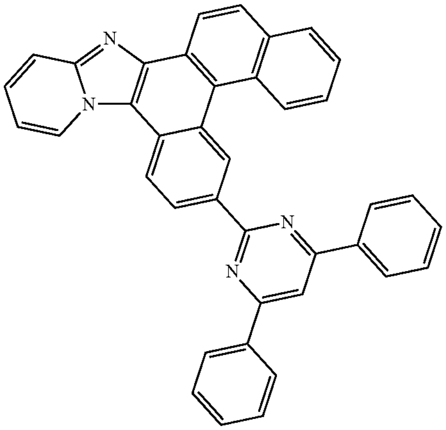
A-168
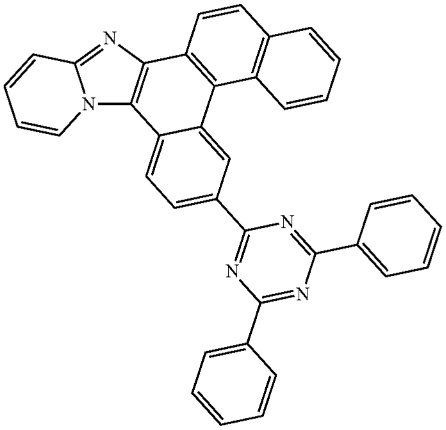
A-169
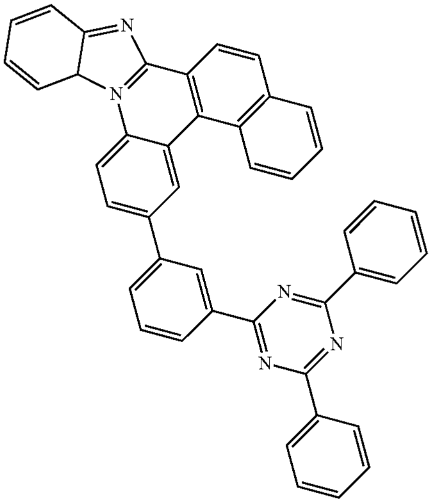
A-170
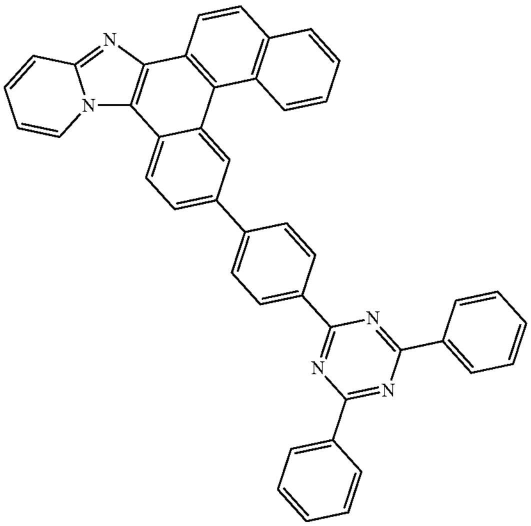

-continued
A-171
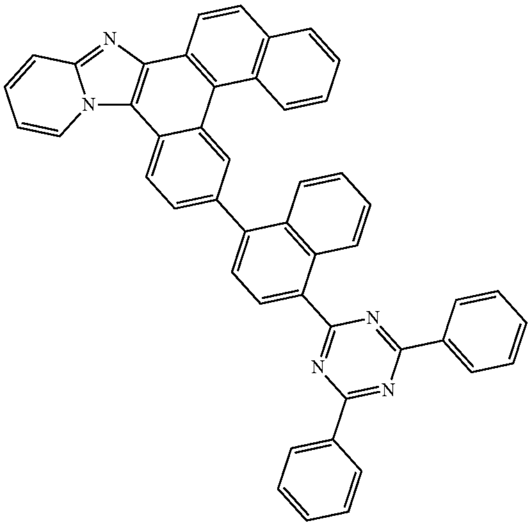
A-172
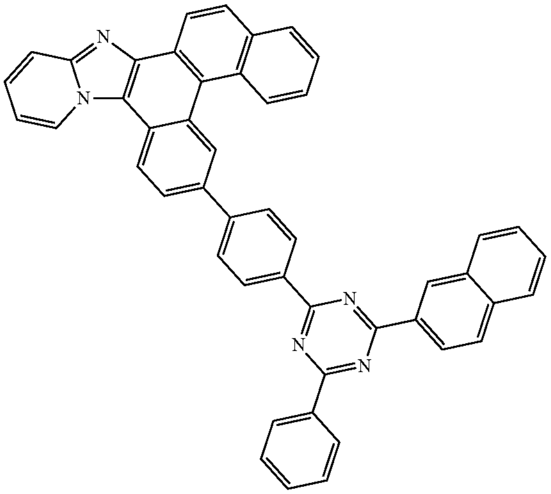
A-173
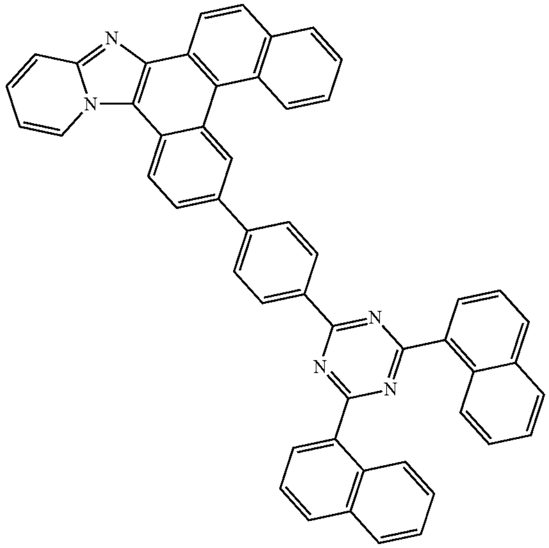
-continued
A-174
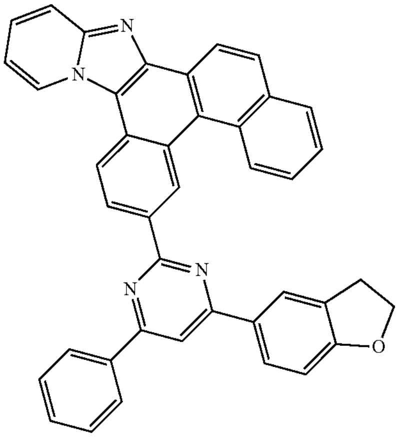
A-175
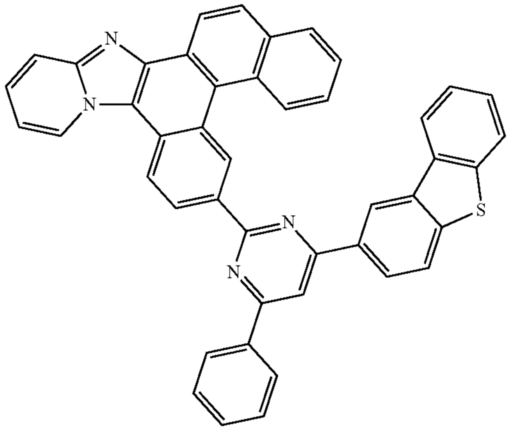
A-176
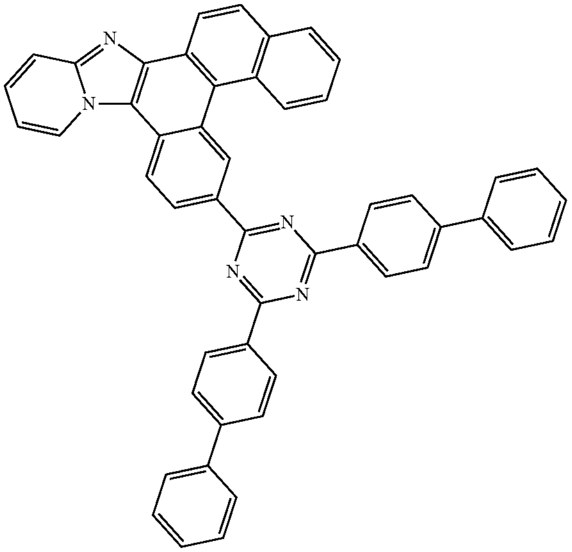

-continued
A-177
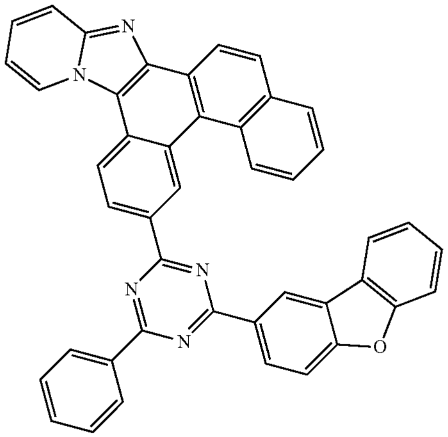
A-178
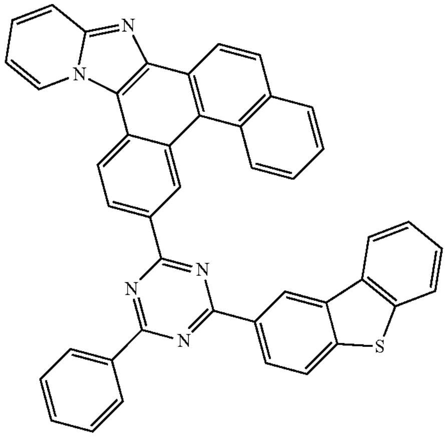
A-179
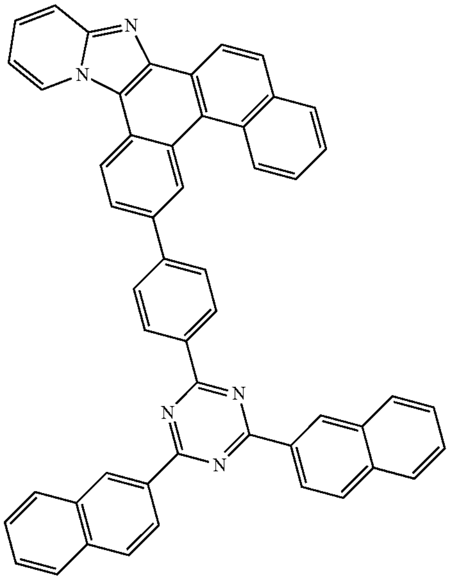
-continued
A-180
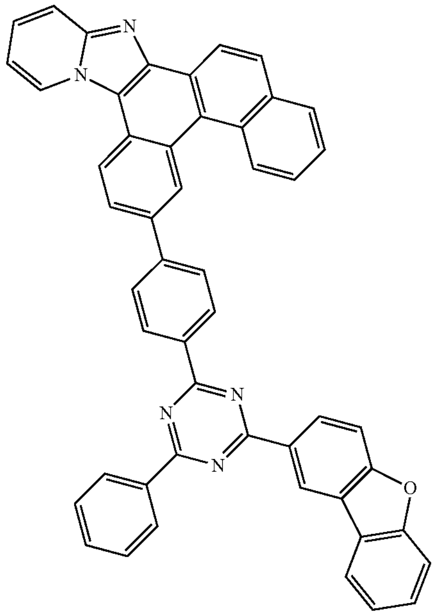
A-181
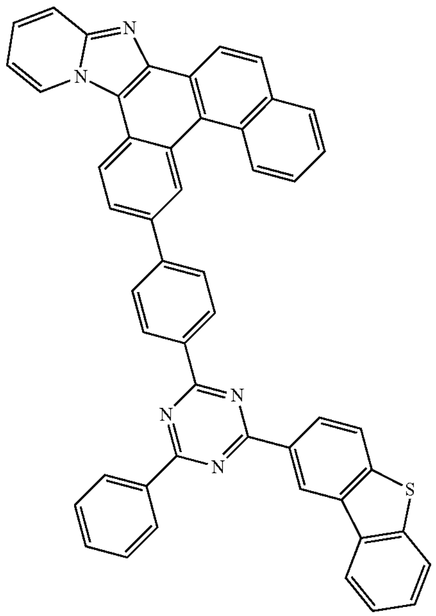

-continued
A-182
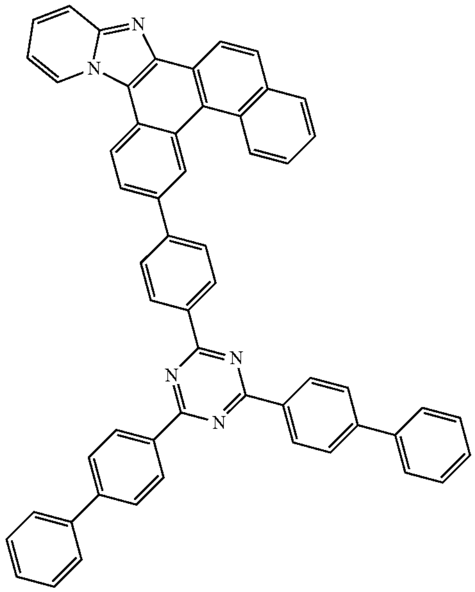
A-183
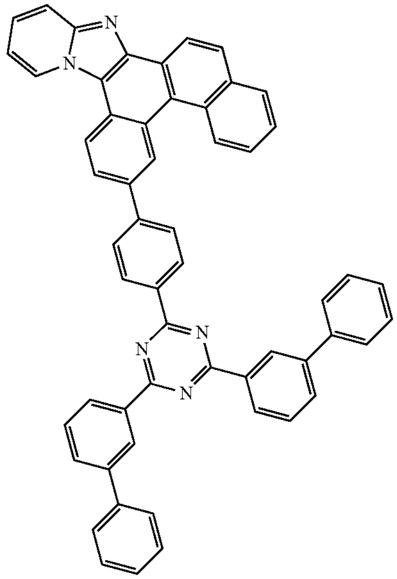
A-184
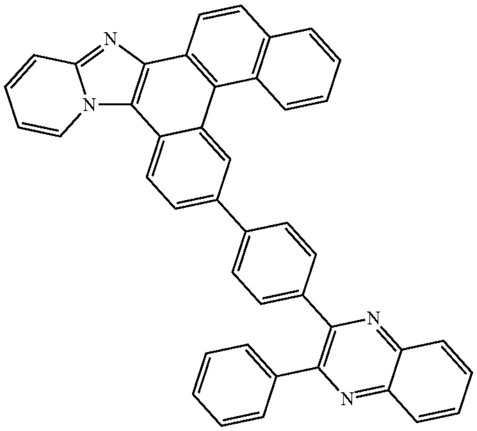
-continued
A-185
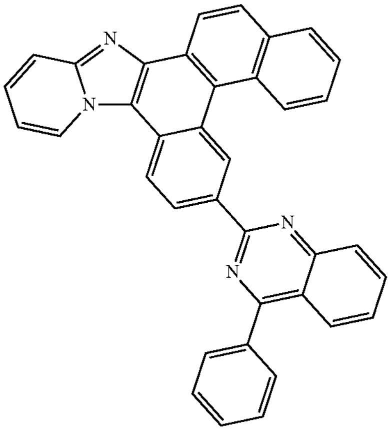
A-186
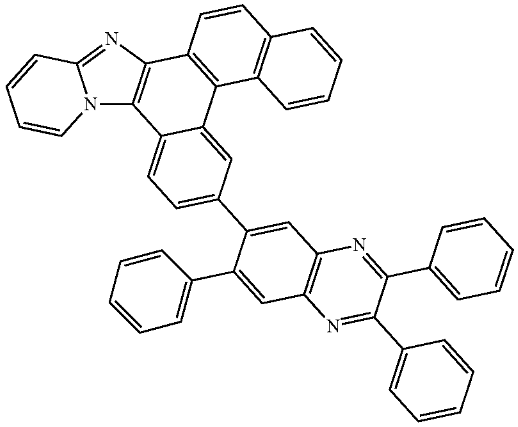
A-187
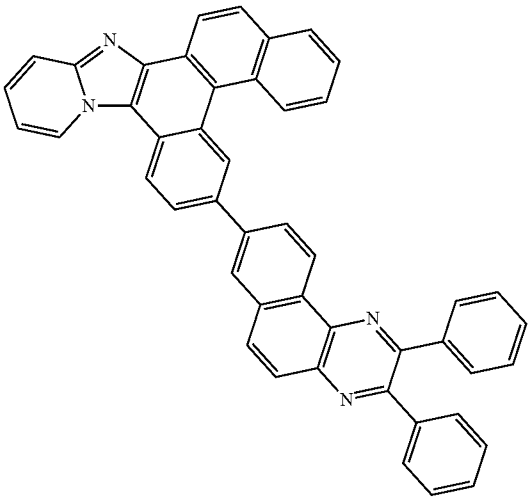

-continued
A-188
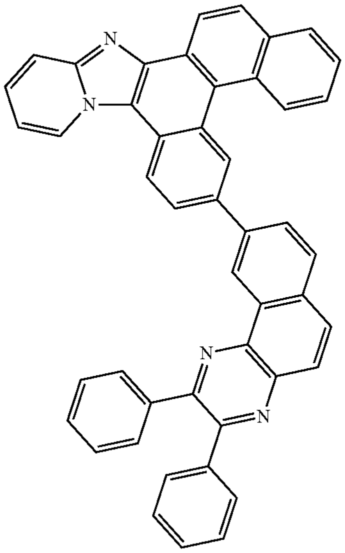
A-189
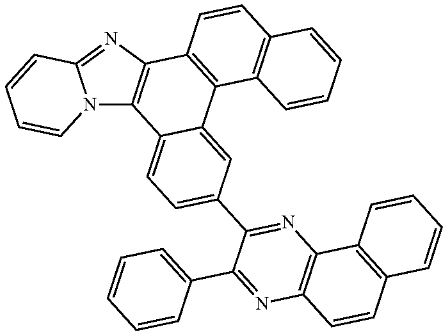
A-190
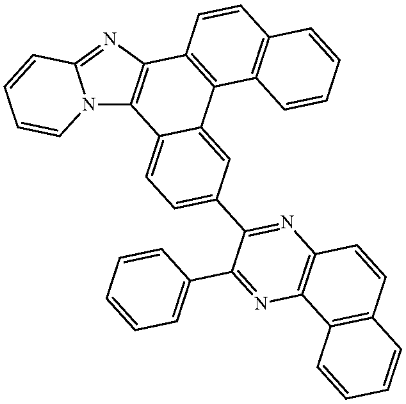
-continued
A-191
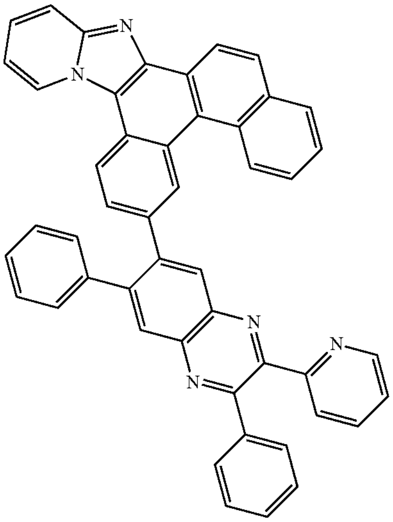
A-192
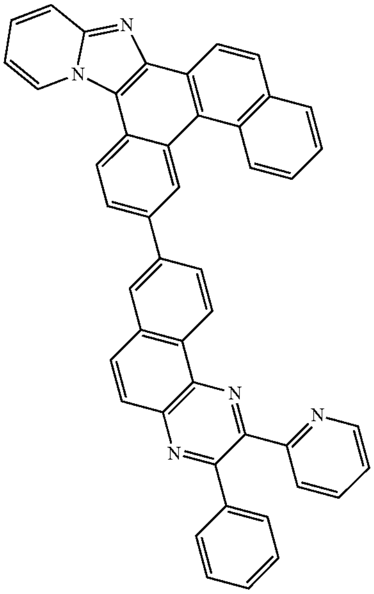
A-193
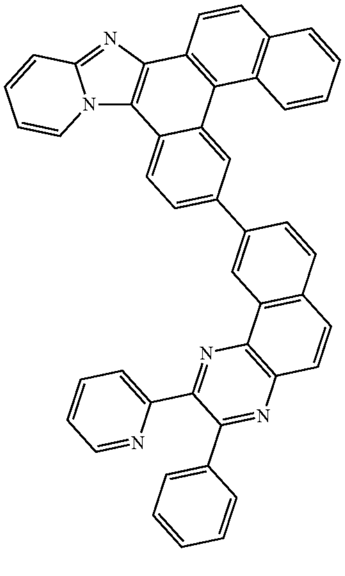

-continued
A-194
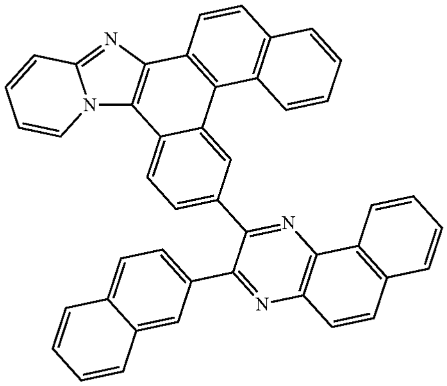
A-195
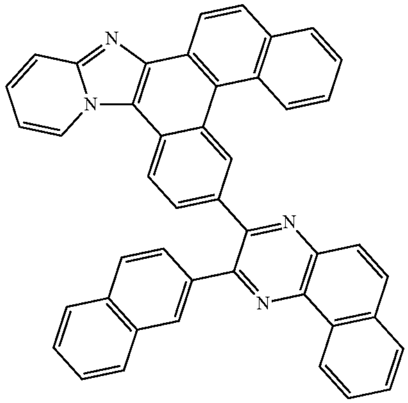
A-196
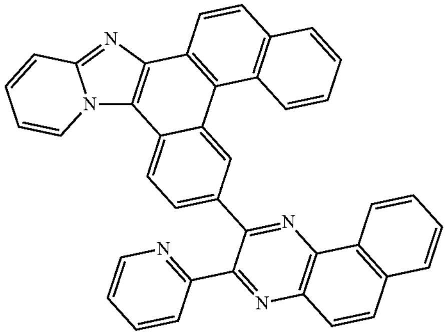
A-197
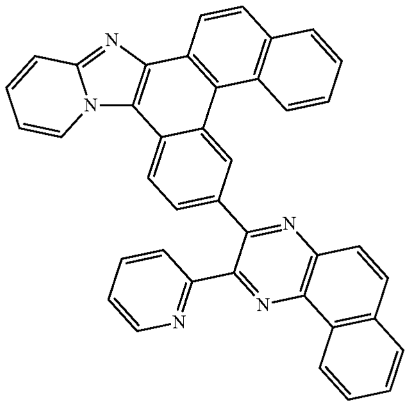
-continued
A-198
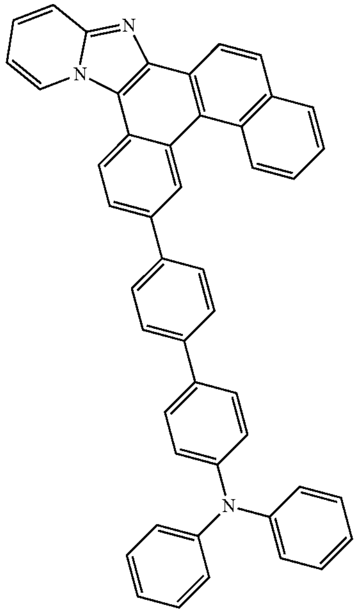
A-199
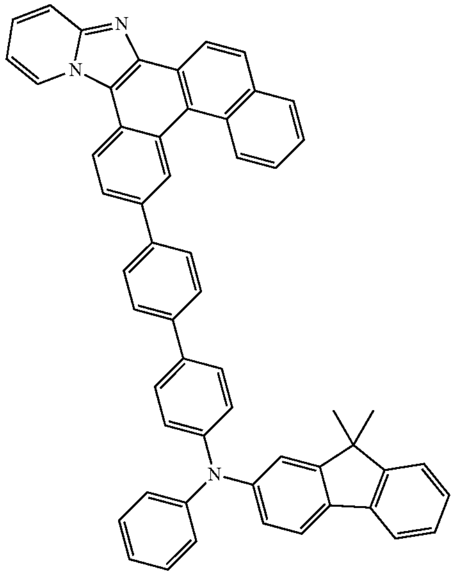

-continued
A-200
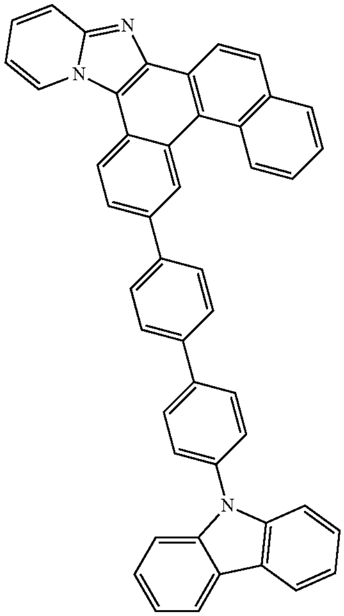
A-201
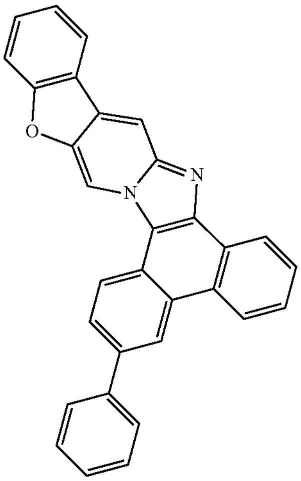
-continued
A-202
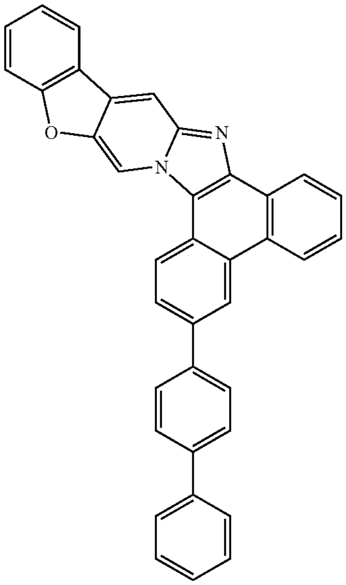
A-203
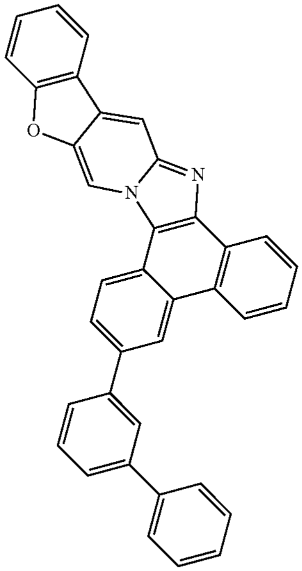

-continued
A-204
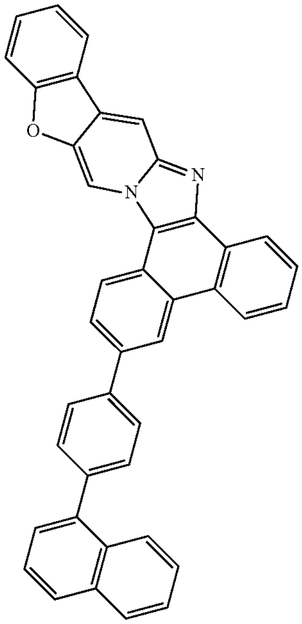
A-205
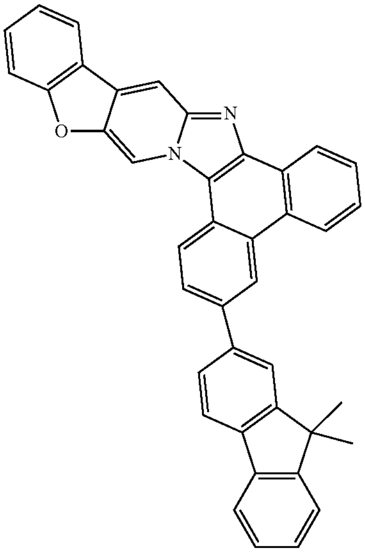
-continued
A-206
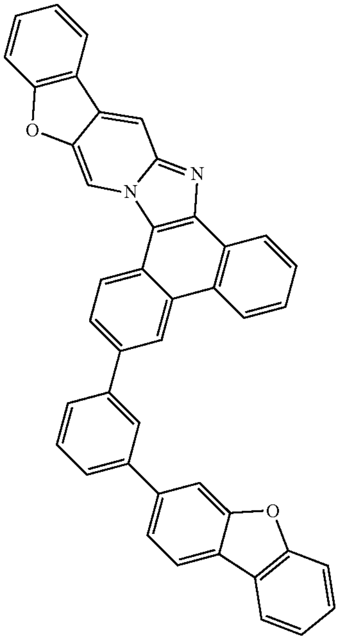
A-207
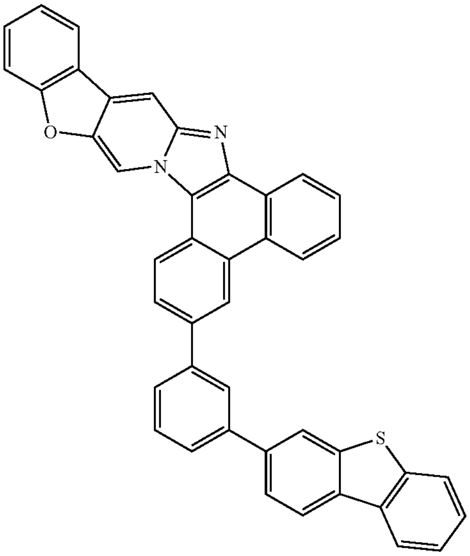

-continued
A-208
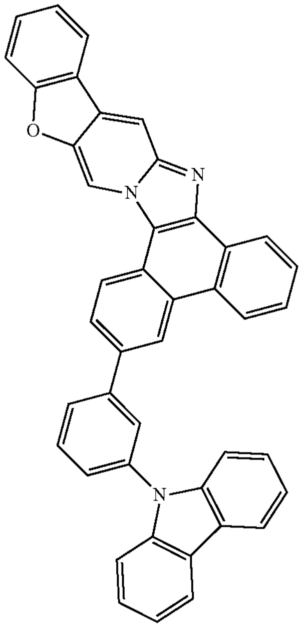
A-209
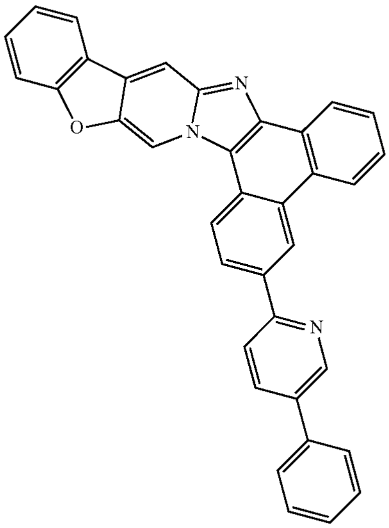
-continued
A-210
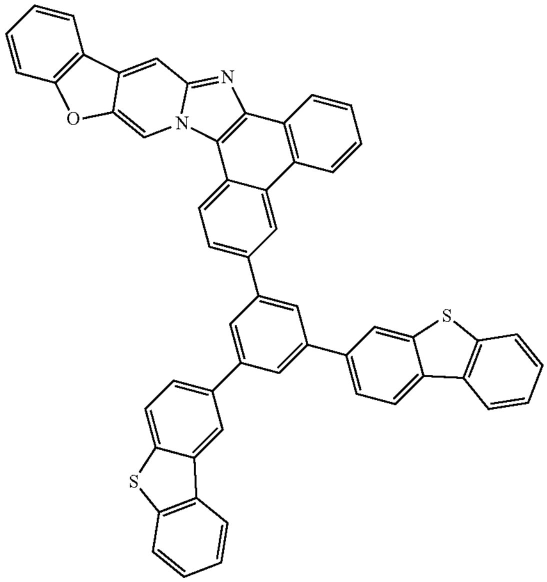
A-211
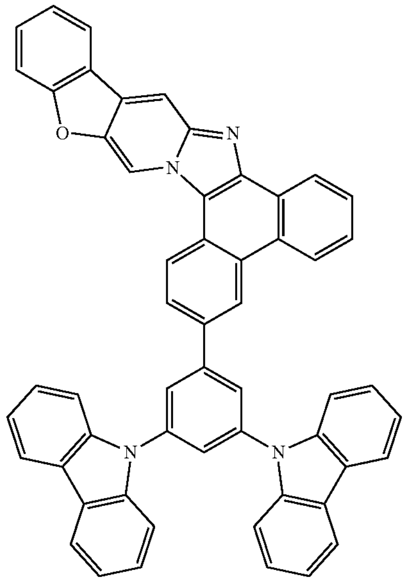
A-212
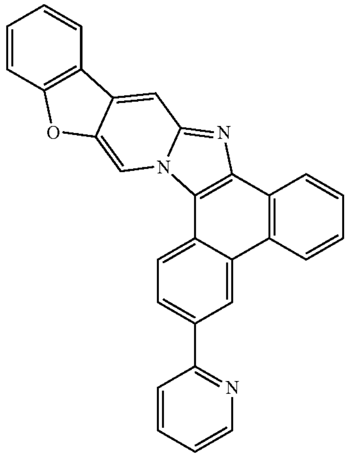

-continued
A-213
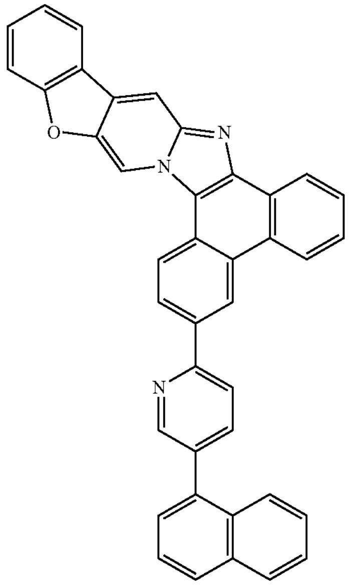
A-214
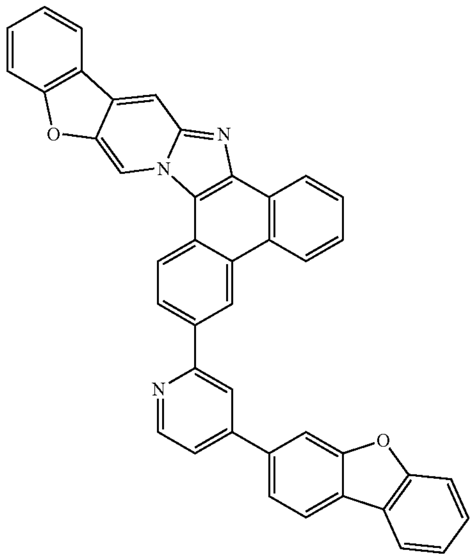
-continued
A-215
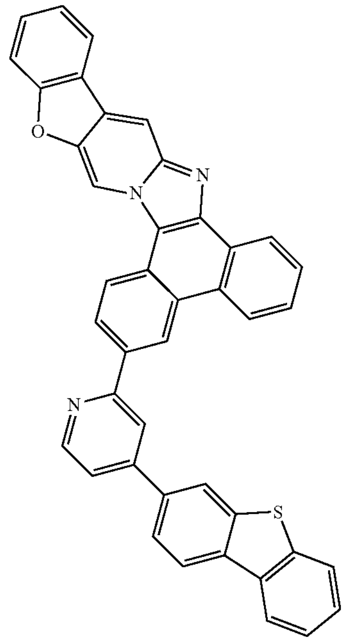
A-216
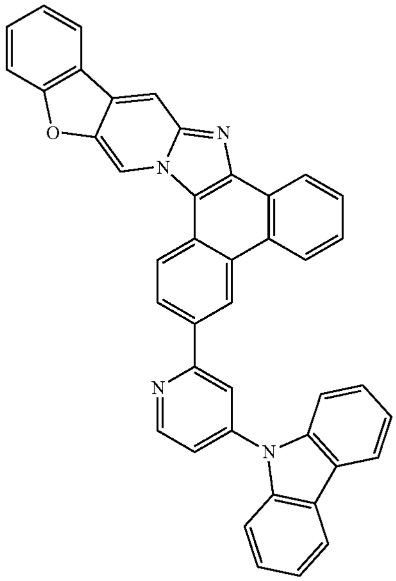

-continued
A-217
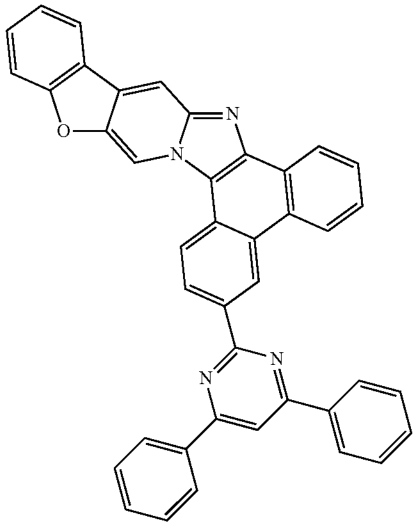
A-219
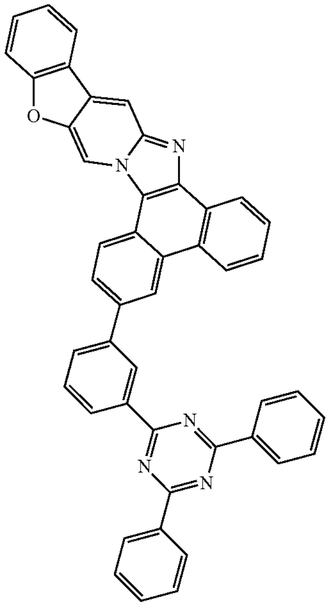
A-218
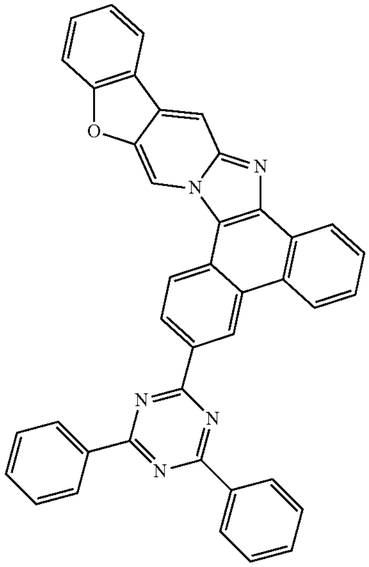
A-220
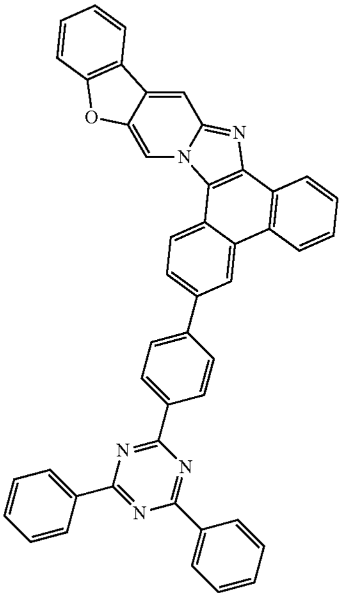

-continued
A-221
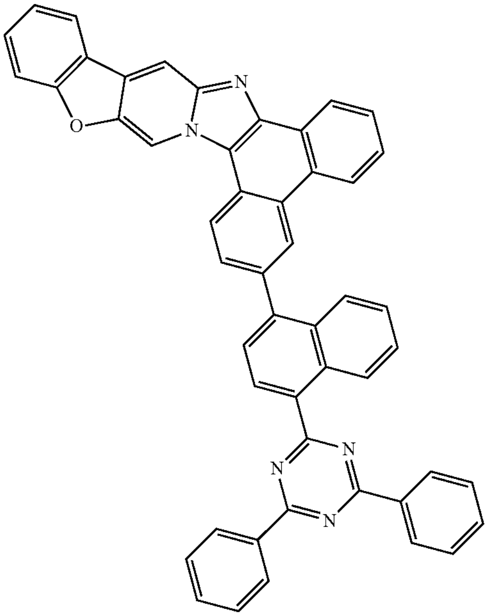
A-222
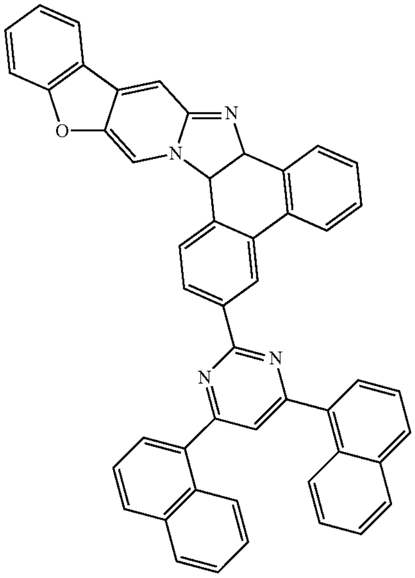
-continued
A-223
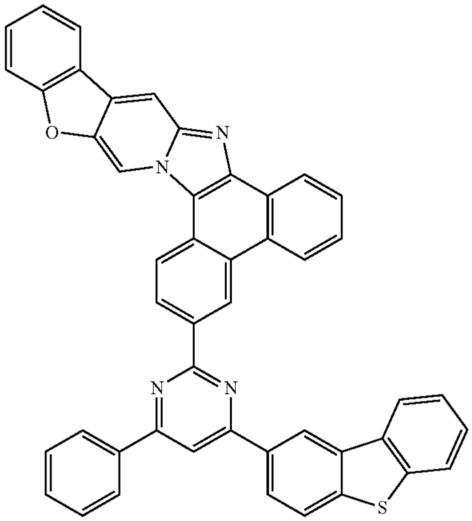
A-224
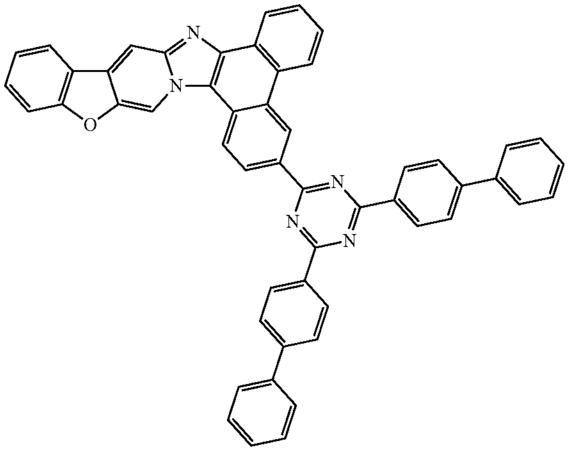
A-225
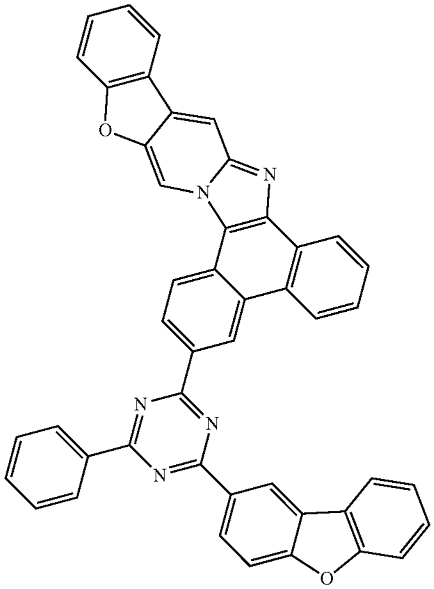

-continued
A-226
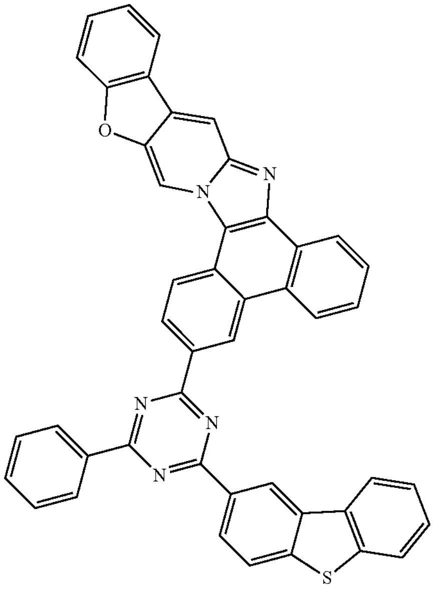
A-227
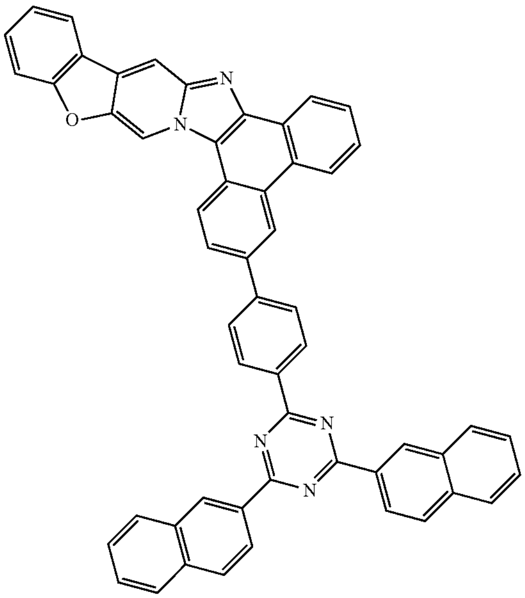
-continued
A-228
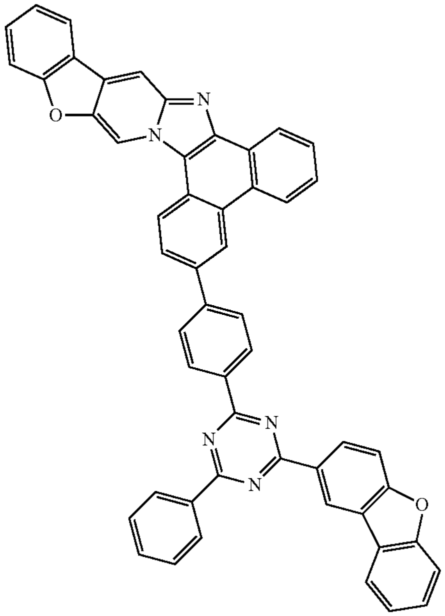
A-229
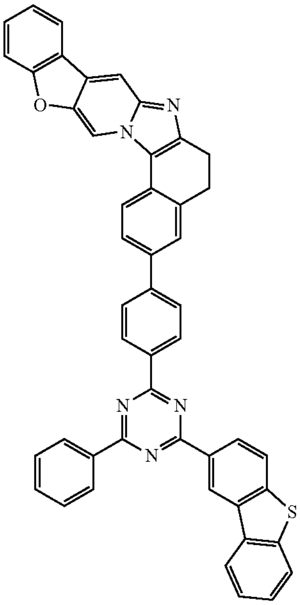

-continued
A-230
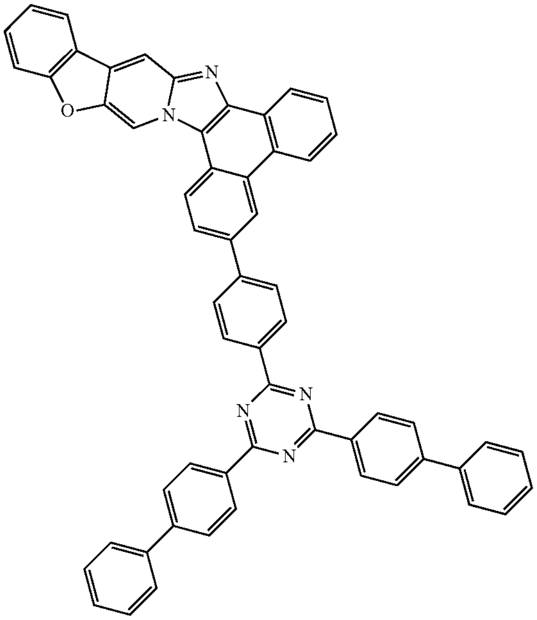
A-231
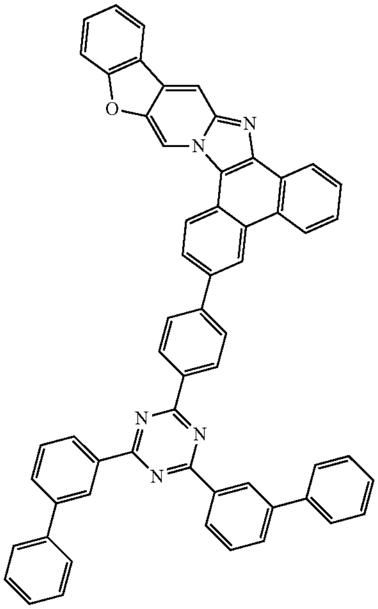
-continued
A-232
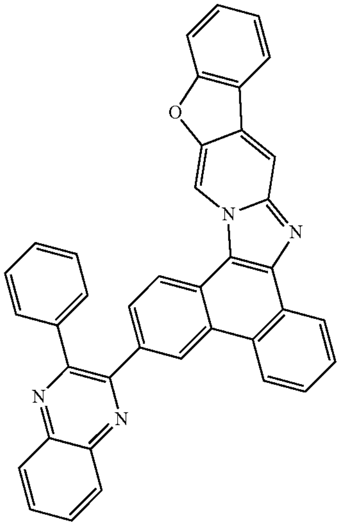
A-233
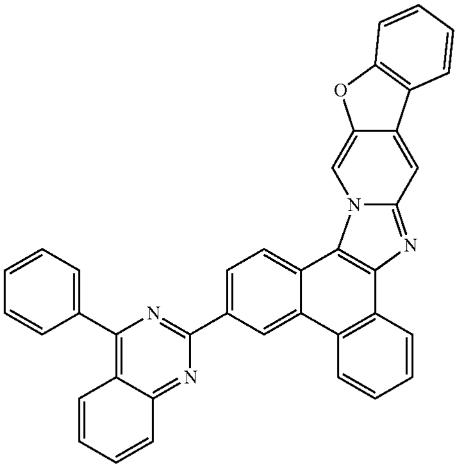
A-234
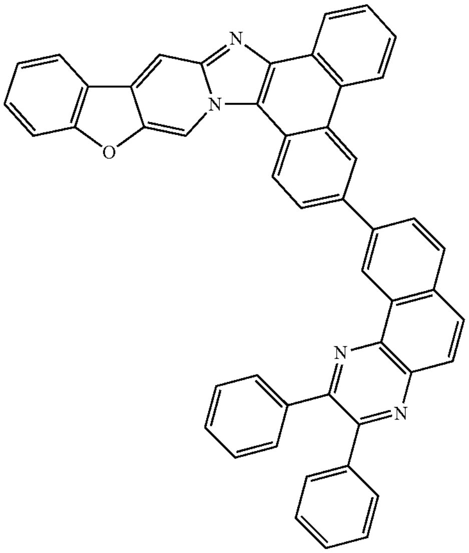

-continued
A-235
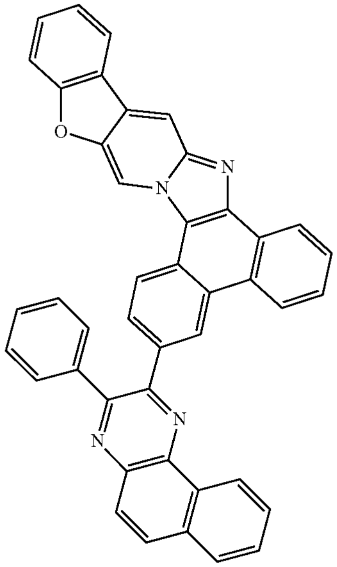
A-236
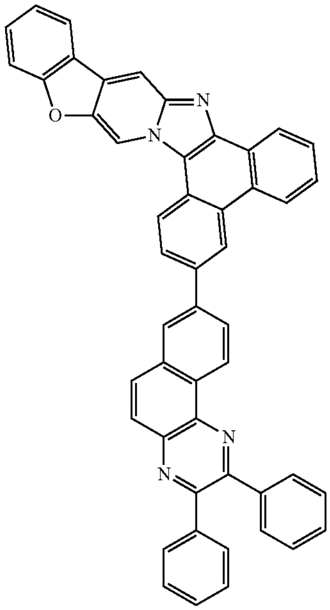
-continued
A-237
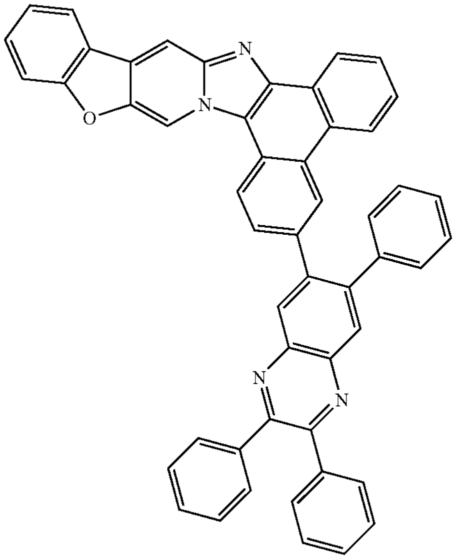
A-238
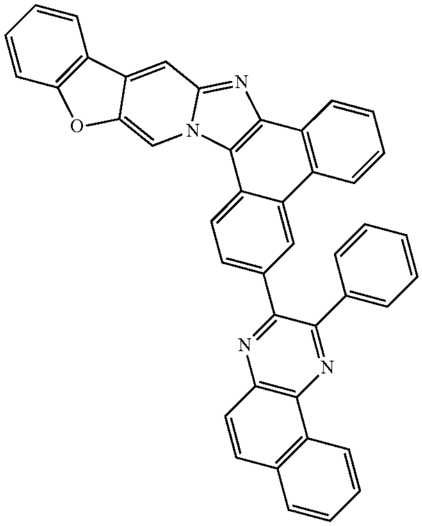
A-239
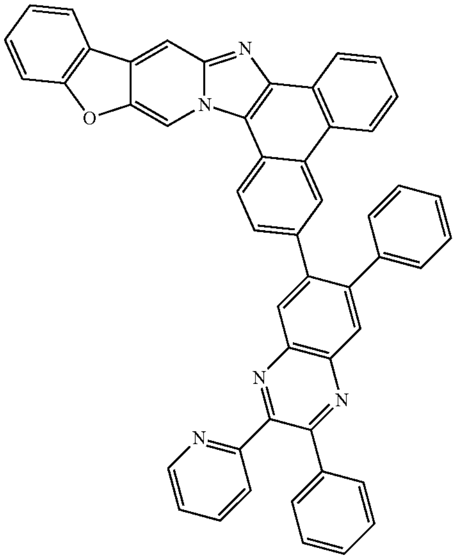

-continued
A-240
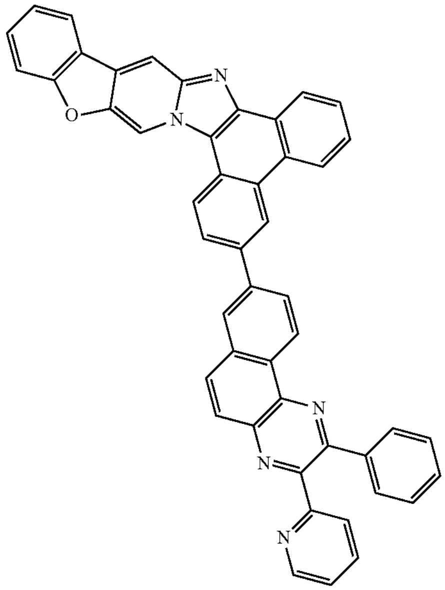
A-241
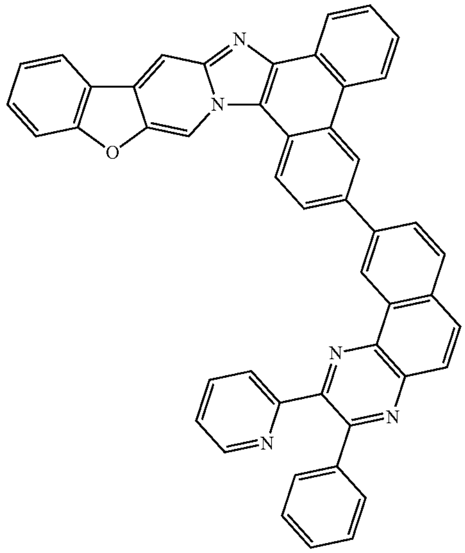
-continued
A-242
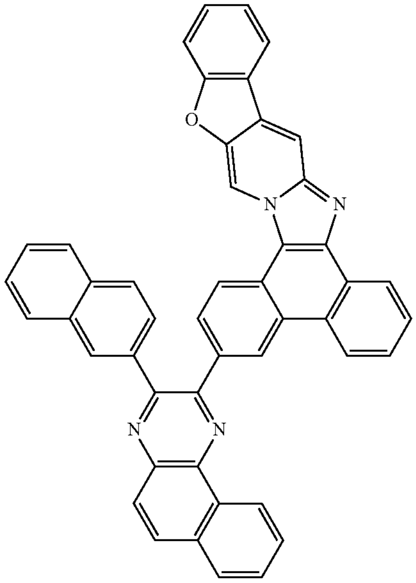
A-243
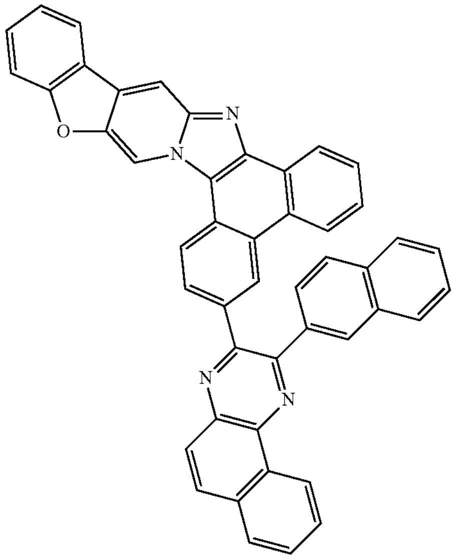
A-244
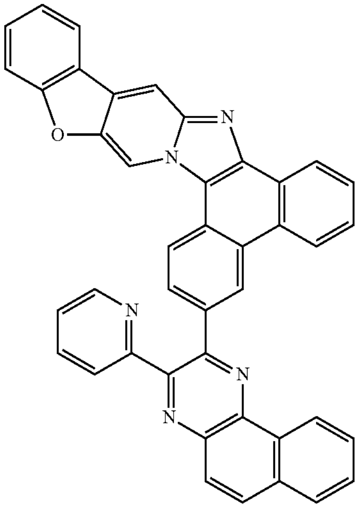

-continued
A-245
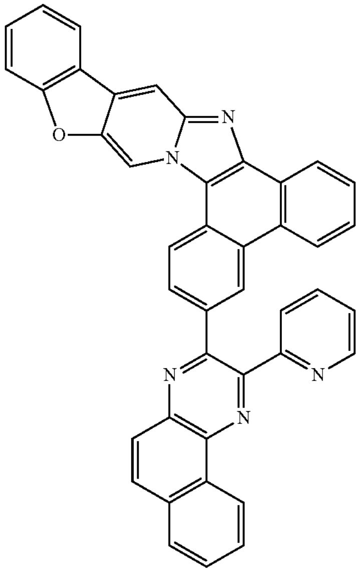
A-246
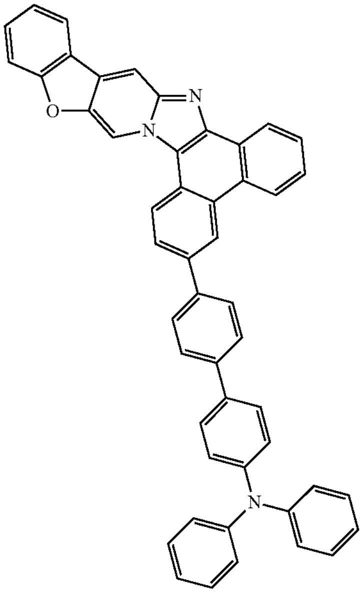
-continued
A-247
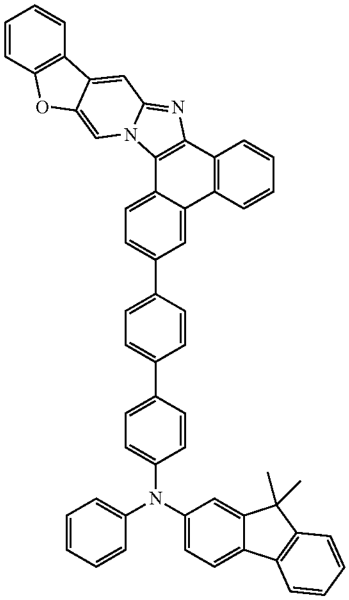
A-248
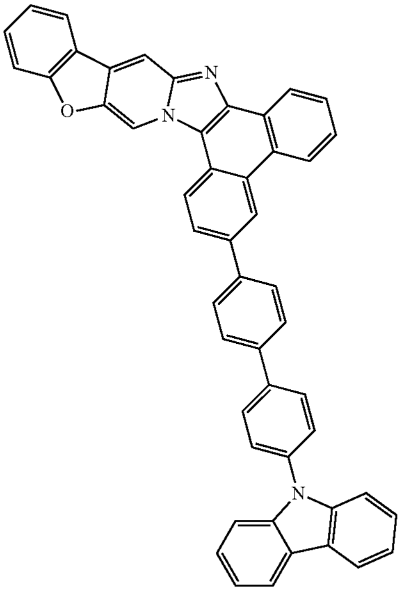

-continued
A-249
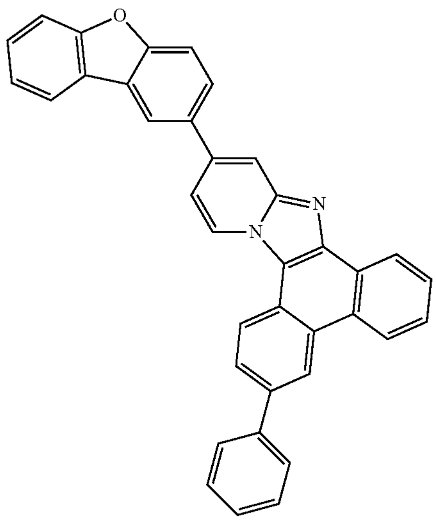
A-250
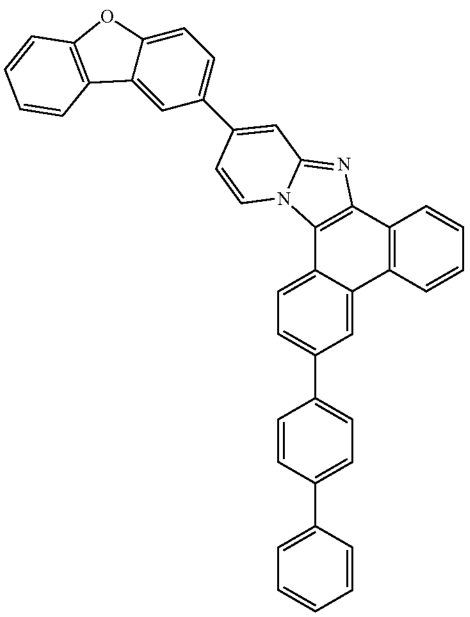
-continued
A-251
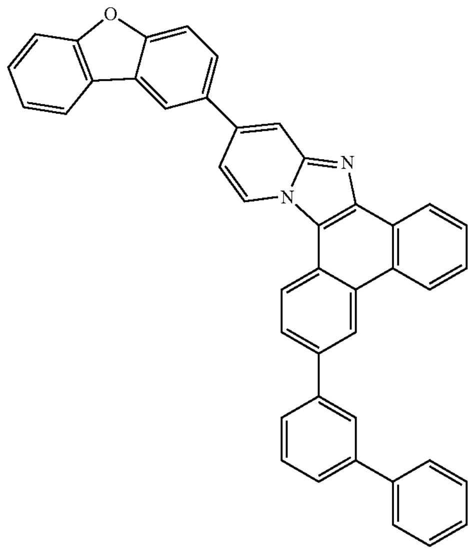
A-252
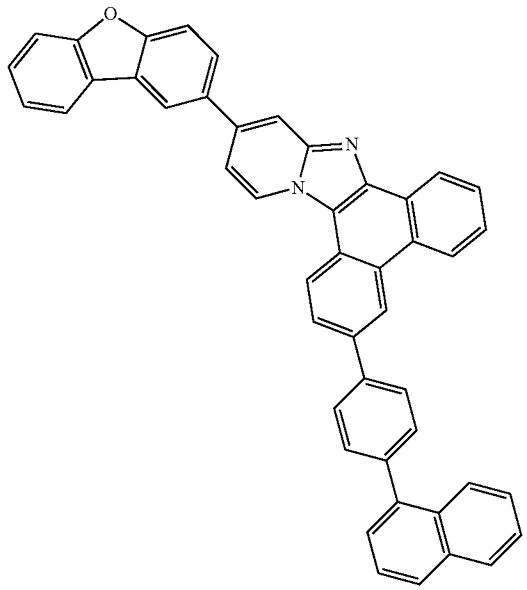

-continued
A-253
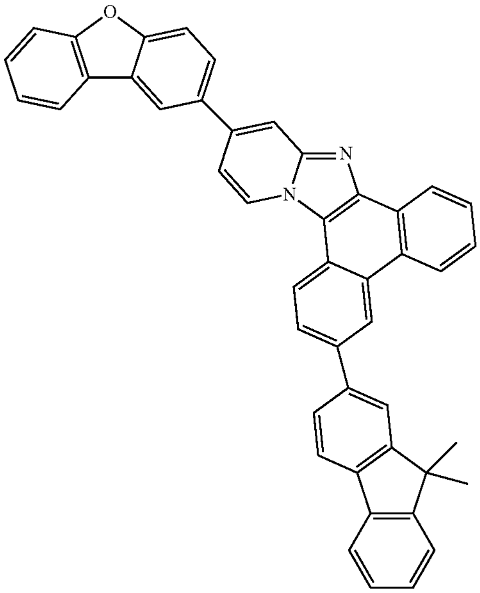
-continued
A-255
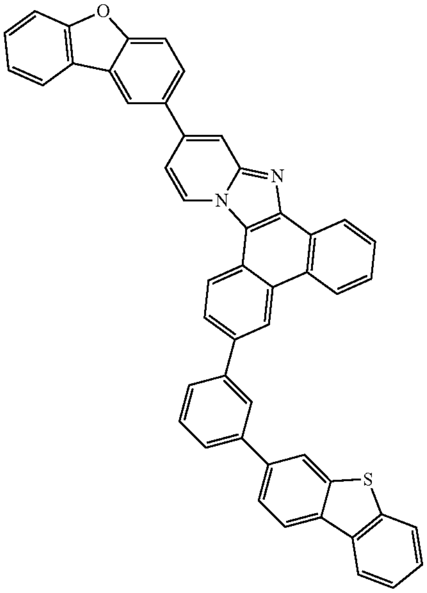
A-254
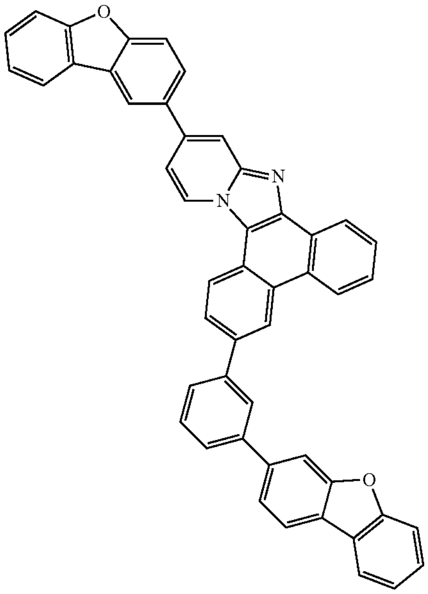
A-256
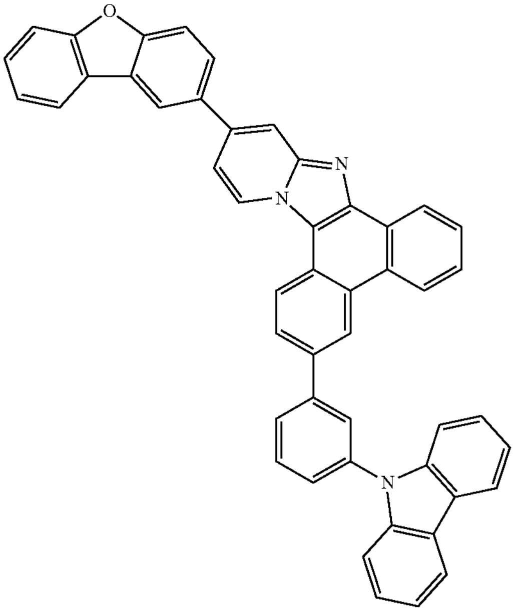

-continued
A-257
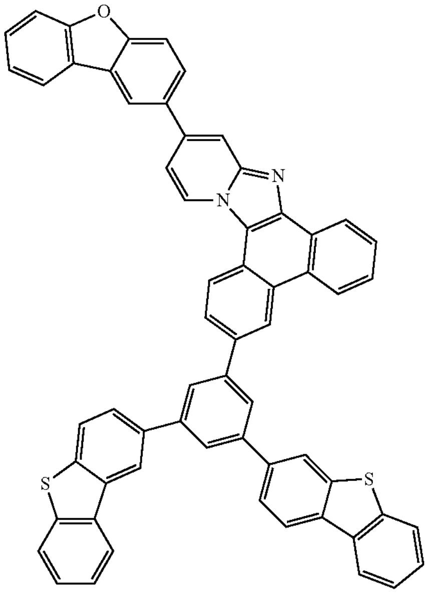
A-258
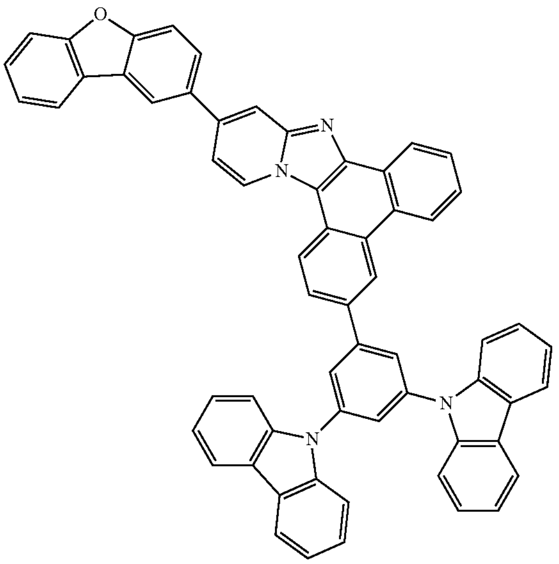
-continued
A-259
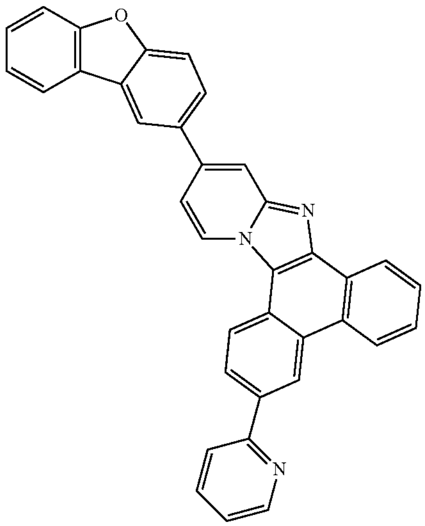
A-260
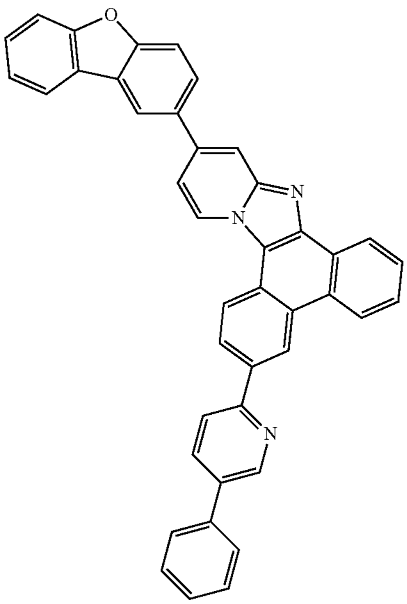

-continued
A-261
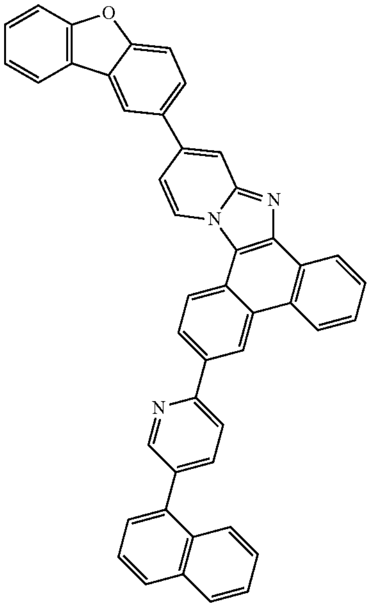
A-262
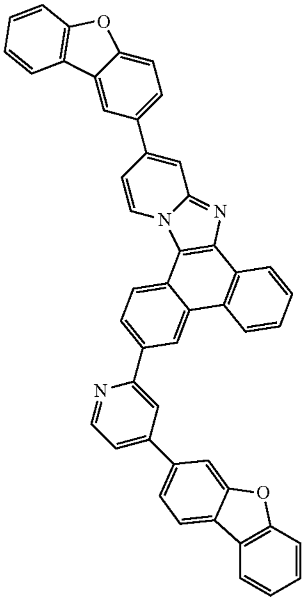
-continued
A-263
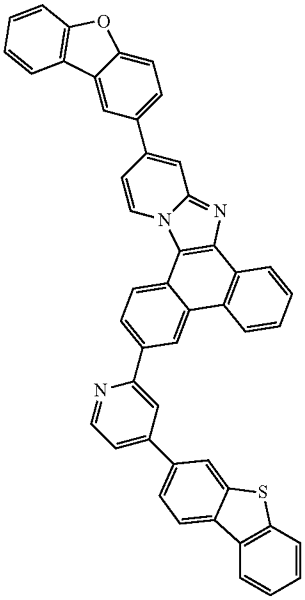
A-264
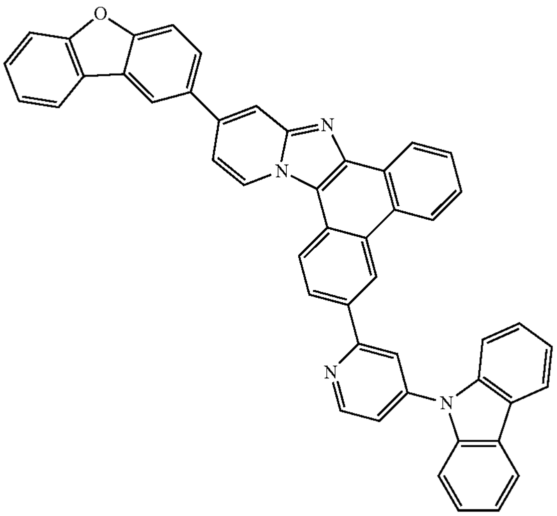

-continued
A-265
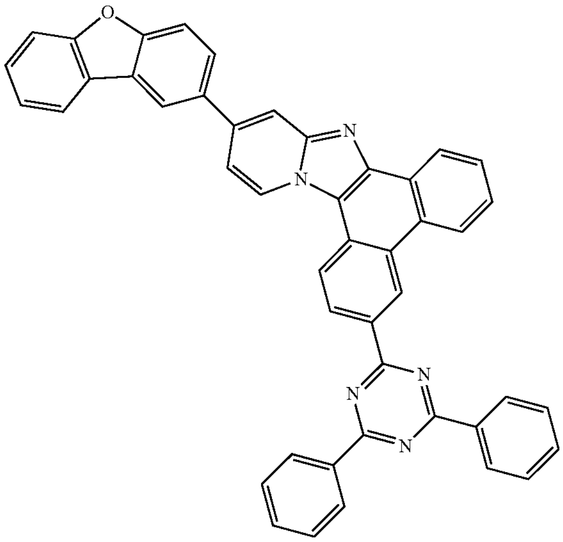
A-266
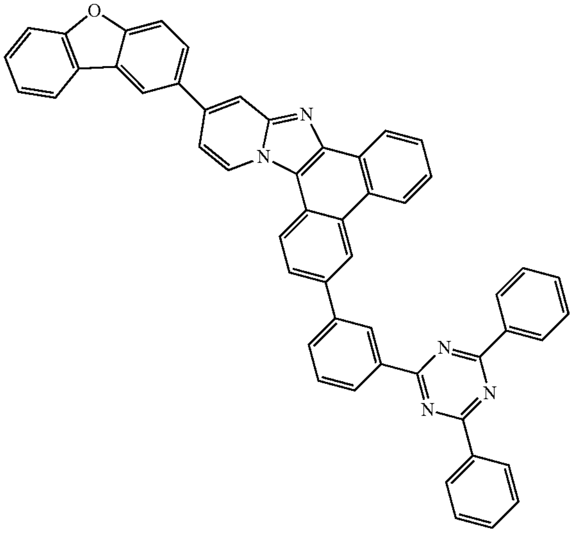
-continued
A-267
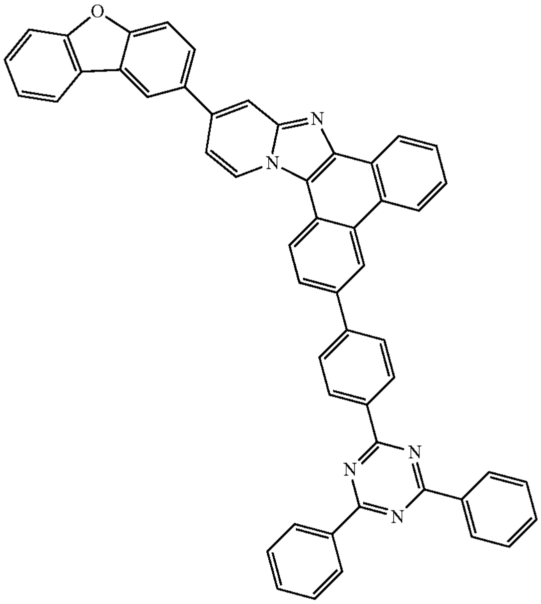
A-268
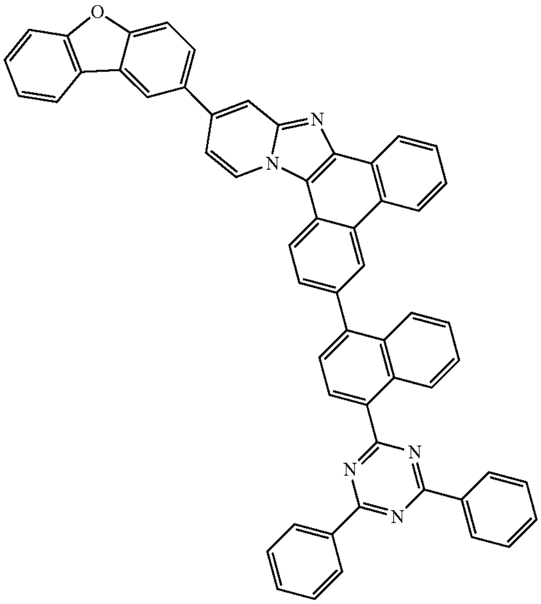

-continued
A-269
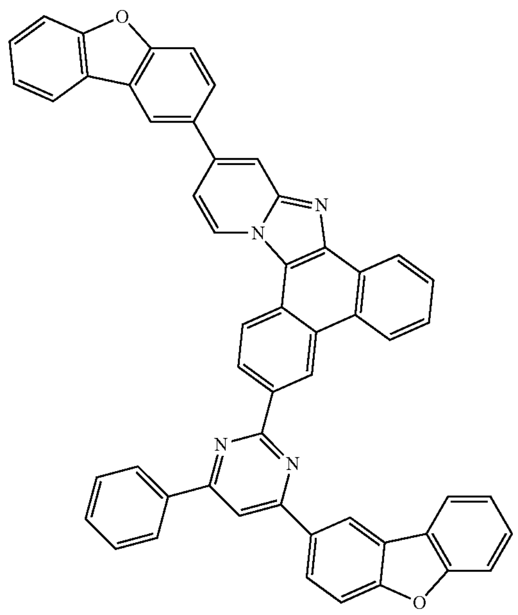
A-270
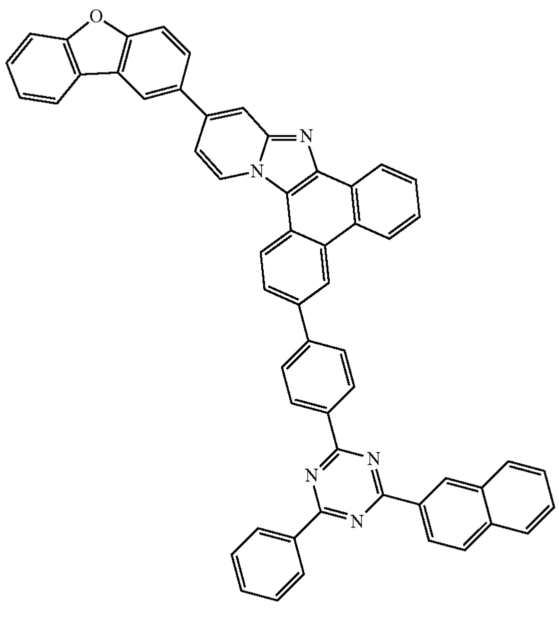
-continued
A-271
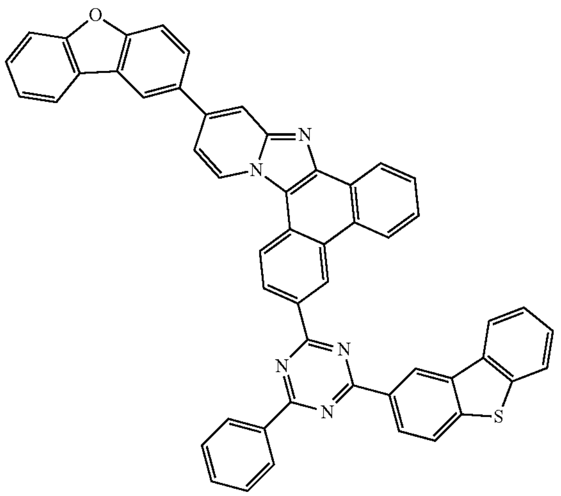
A-272
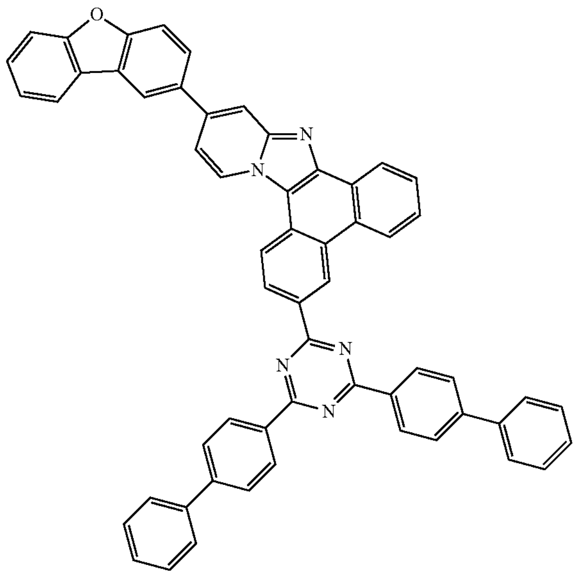
A-273
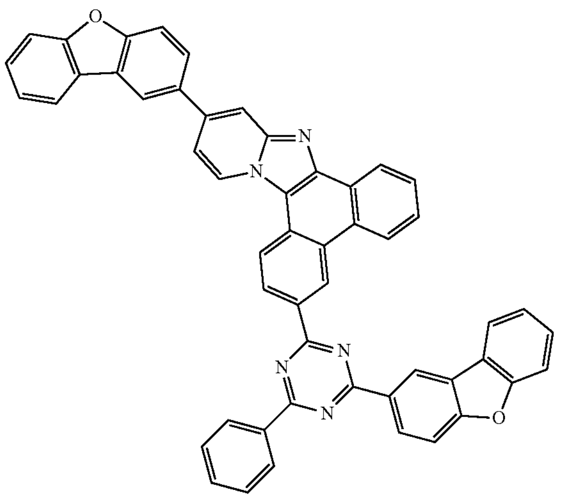

-continued
A-274
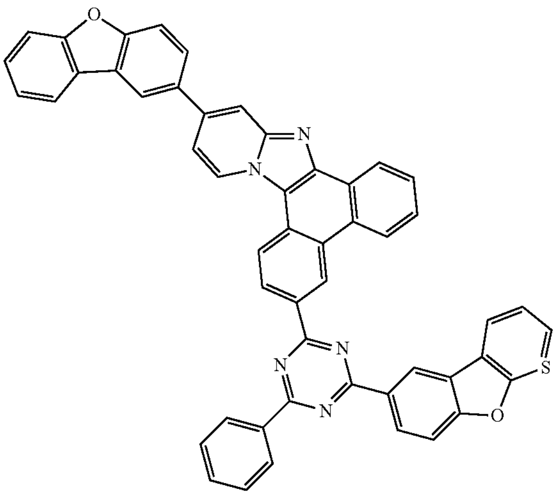
A-275
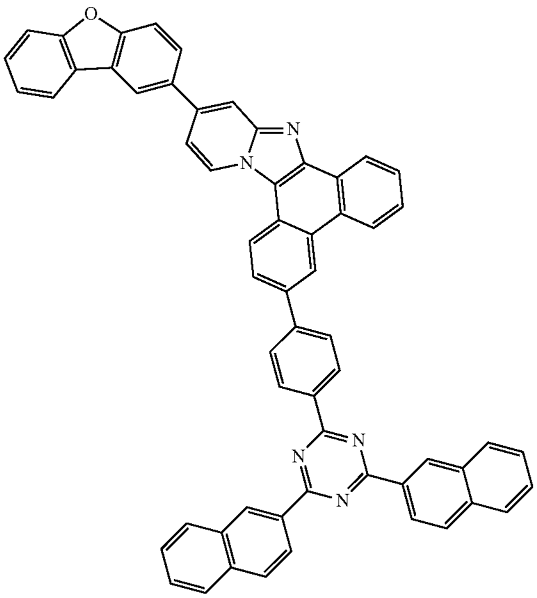
-continued
A-276
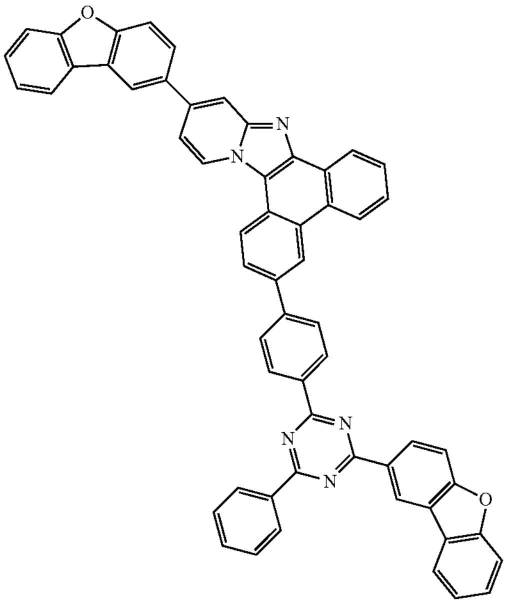
A-277
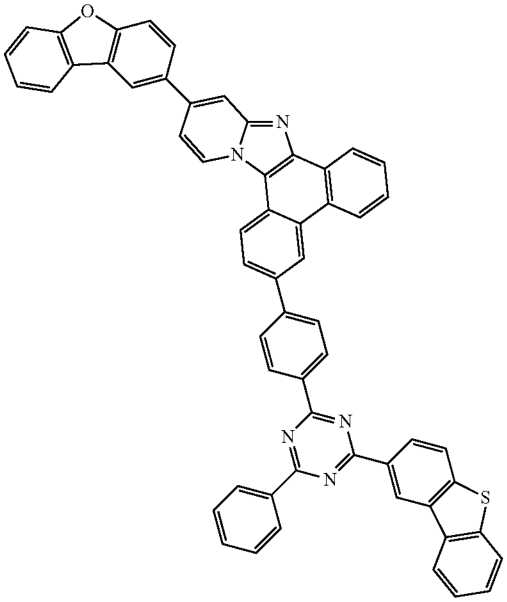

-continued
A-278
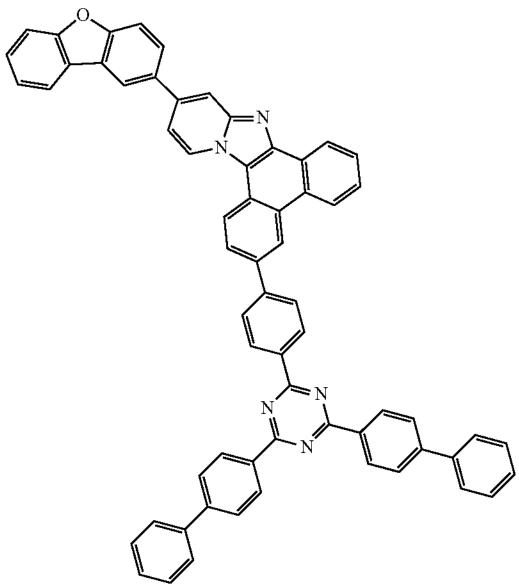
A-279
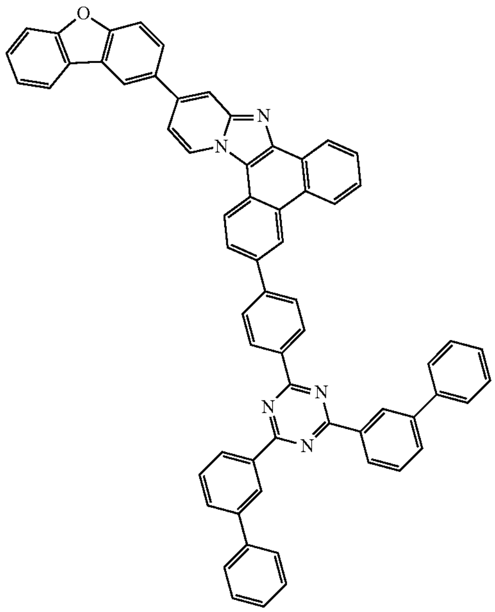
-continued
A-280
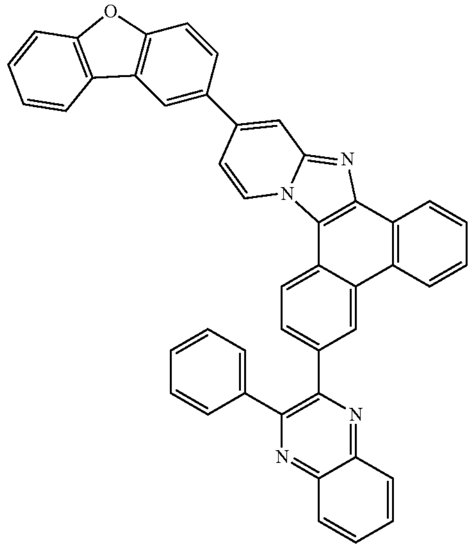
A-281
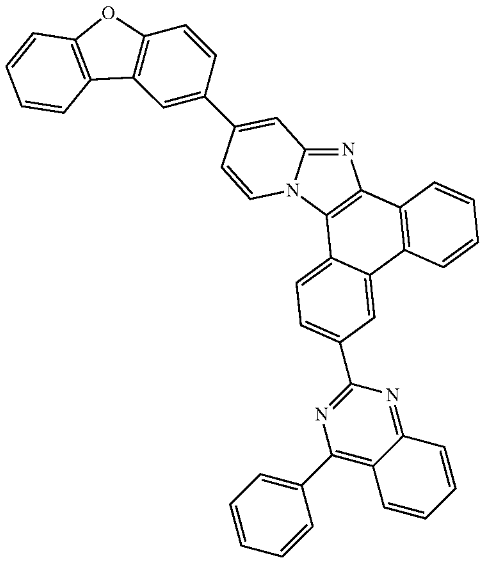

-continued
A-282
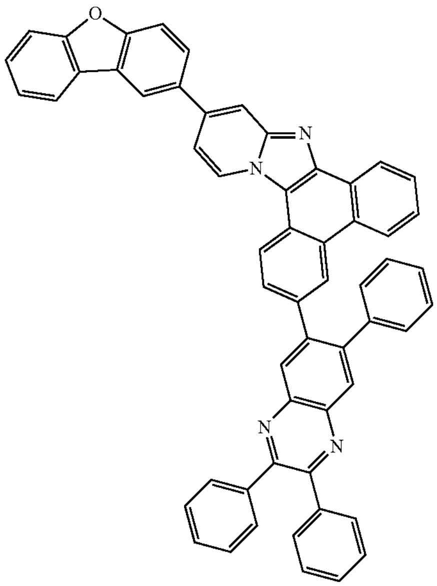
A-283
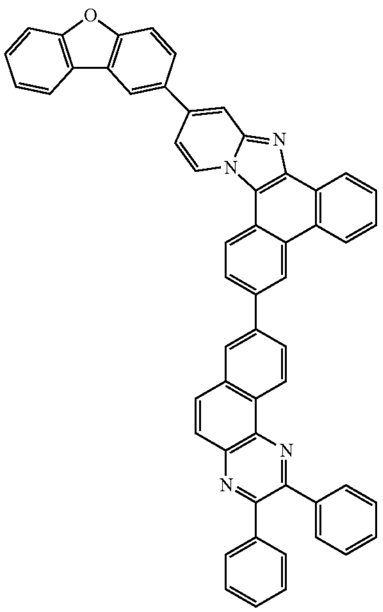
-continued
A-284
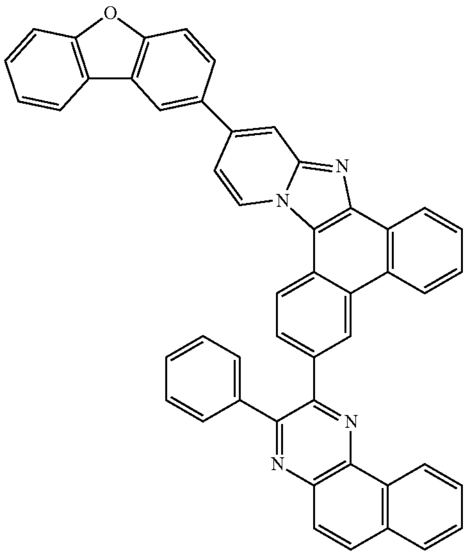
A-285
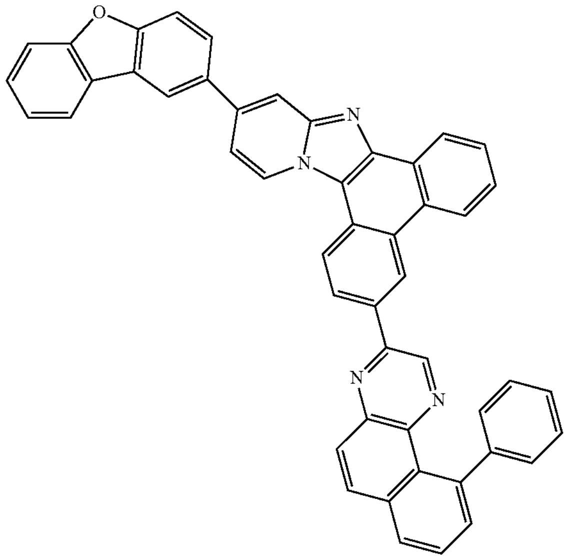

-continued
A-286
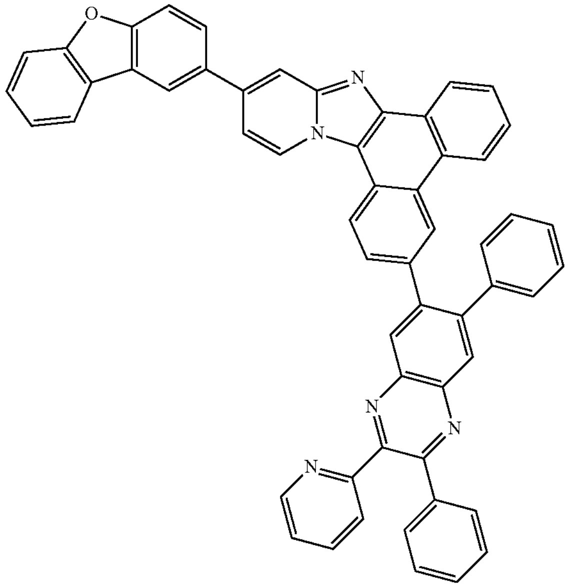
A-287
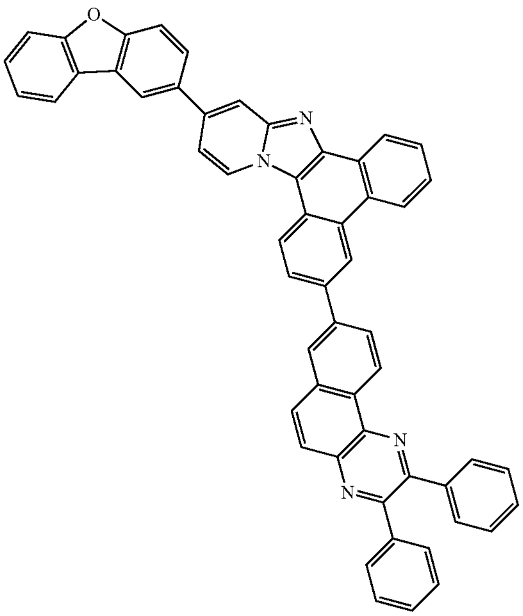
-continued
A-288
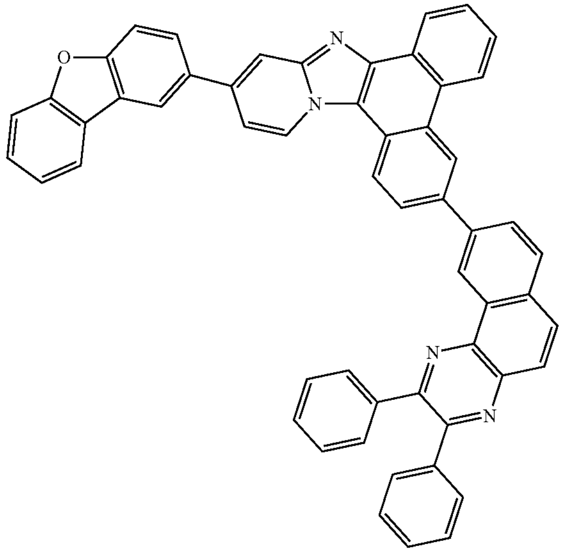
A-289
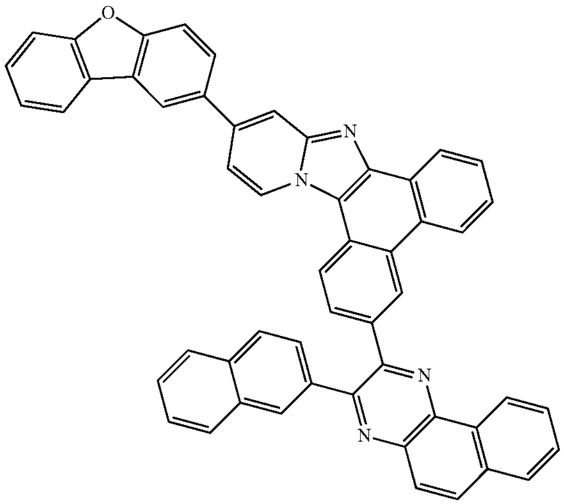
A-290
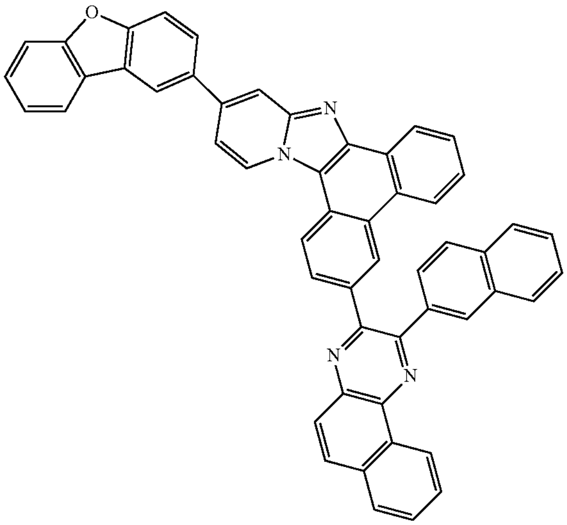

-continued
A-291
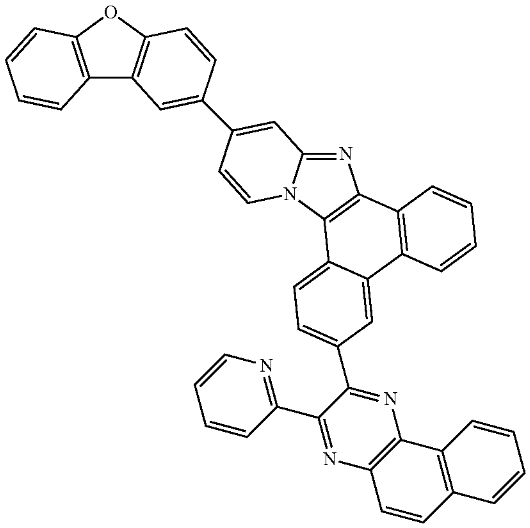
A-292
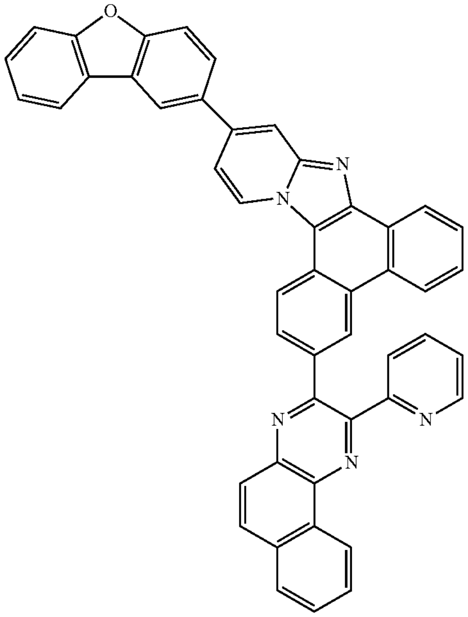
-continued
A-293
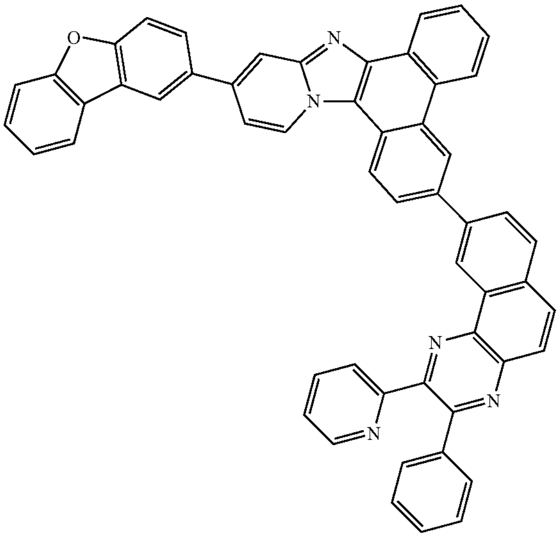
A-294
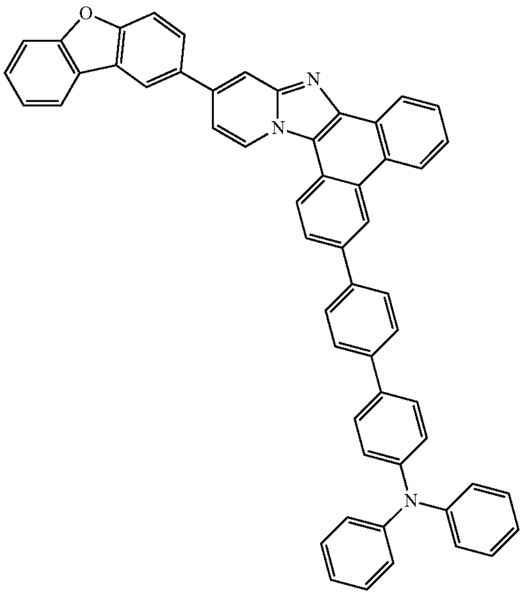

-continued
A-295
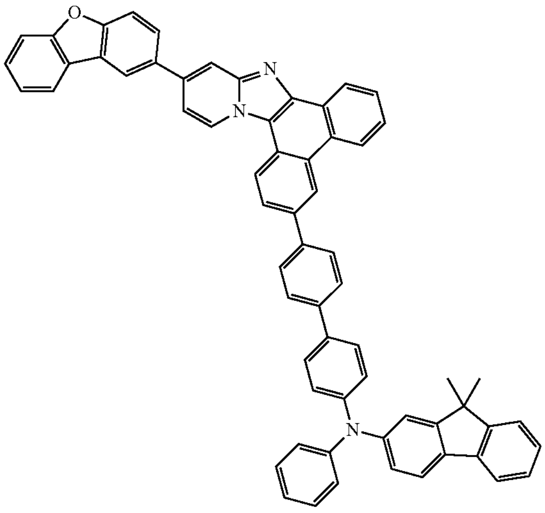
A-296
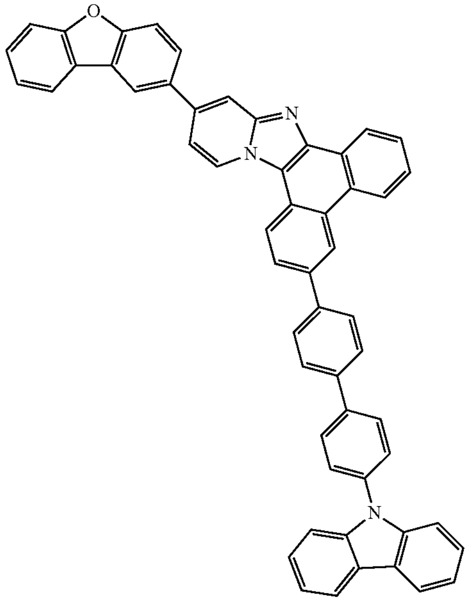
-continued
A-297
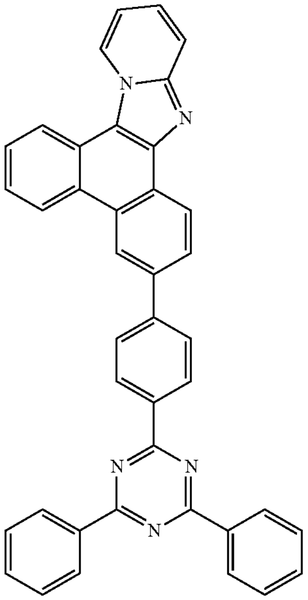
A-298
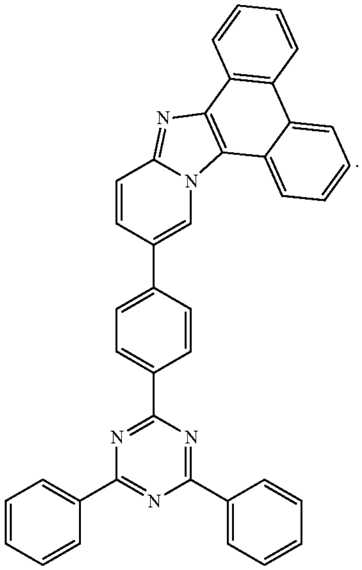
The compound of formula 1 according to the present disclosure may be produced by a synthetic method known to a person skilled in the art, and for example referring to the following reaction schemes, but is not limited thereto:
[Reaction Scheme 1]
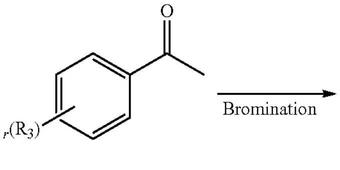

-continued
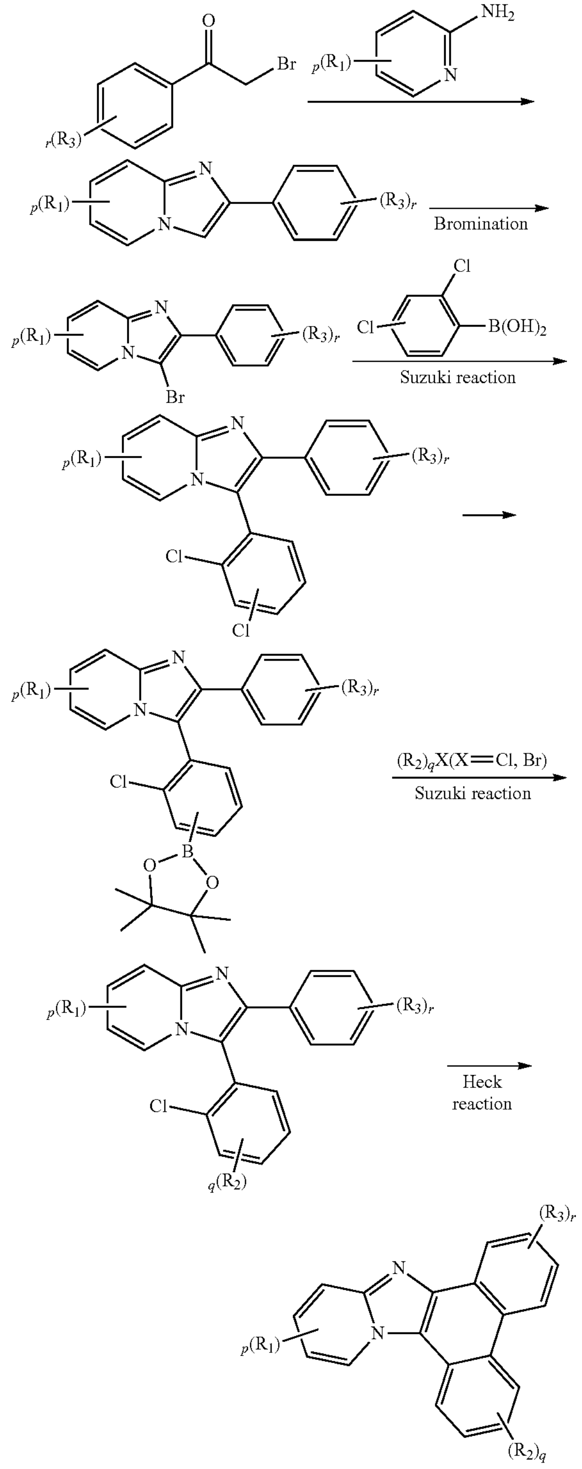
[Reaction Scheme 2]
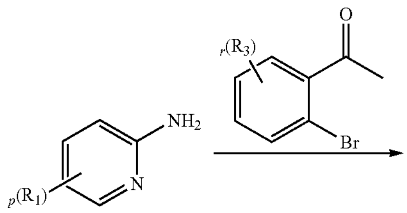
-continued
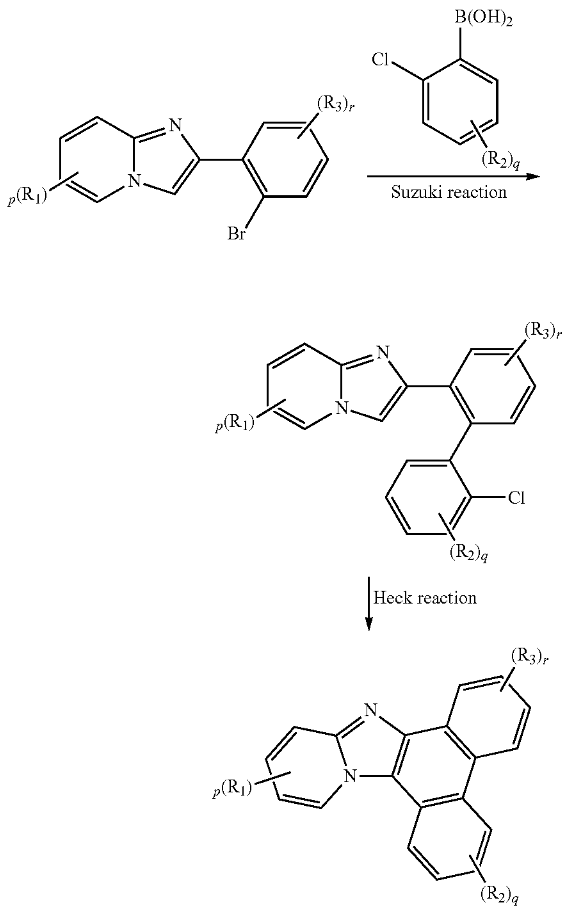
[Reaction Scheme 3]
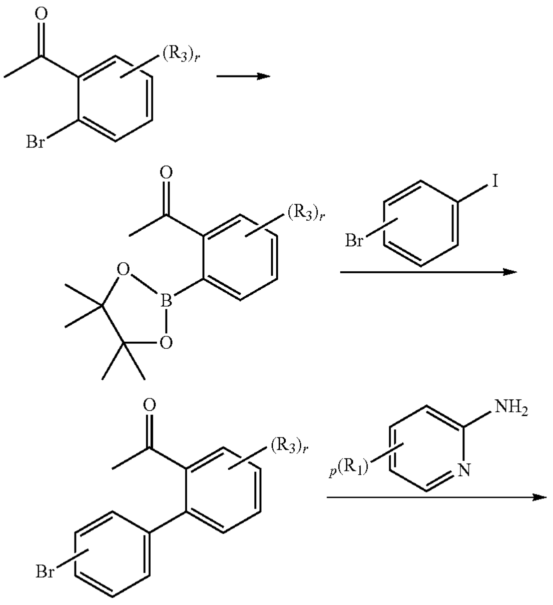

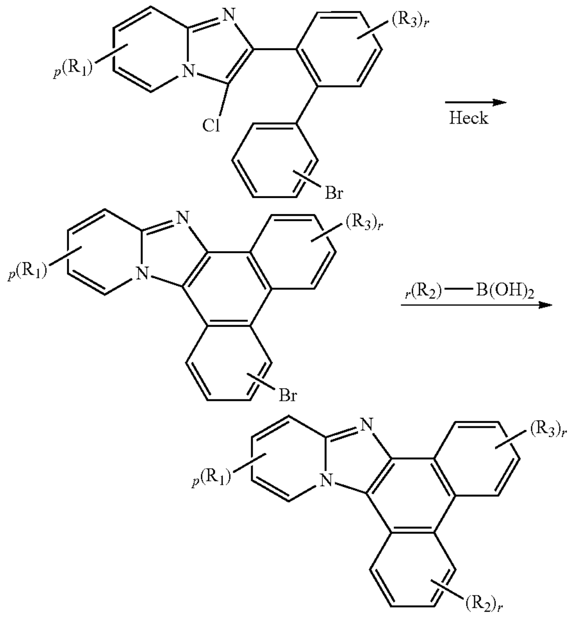
[Reaction Scheme 4]
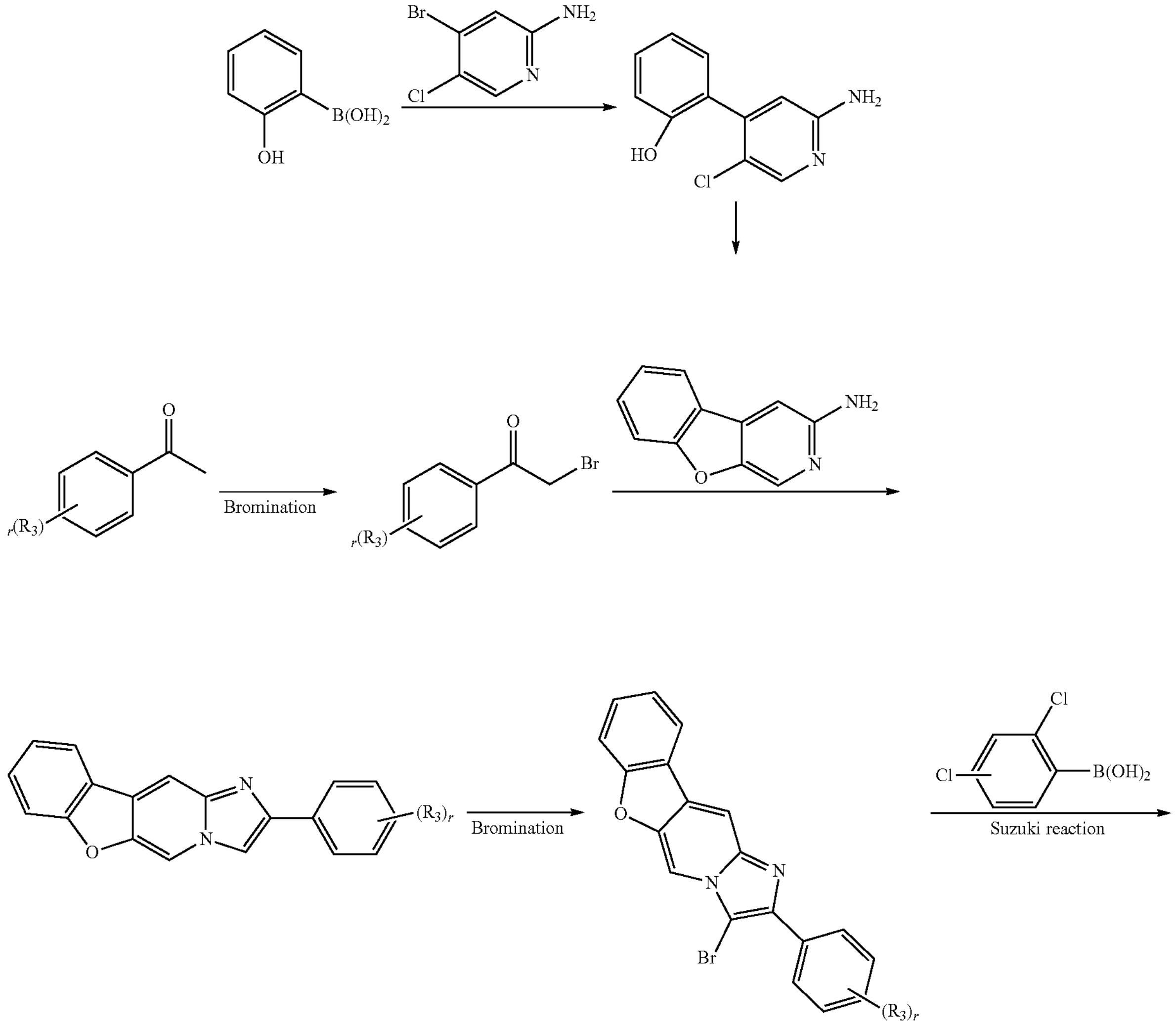

-continued

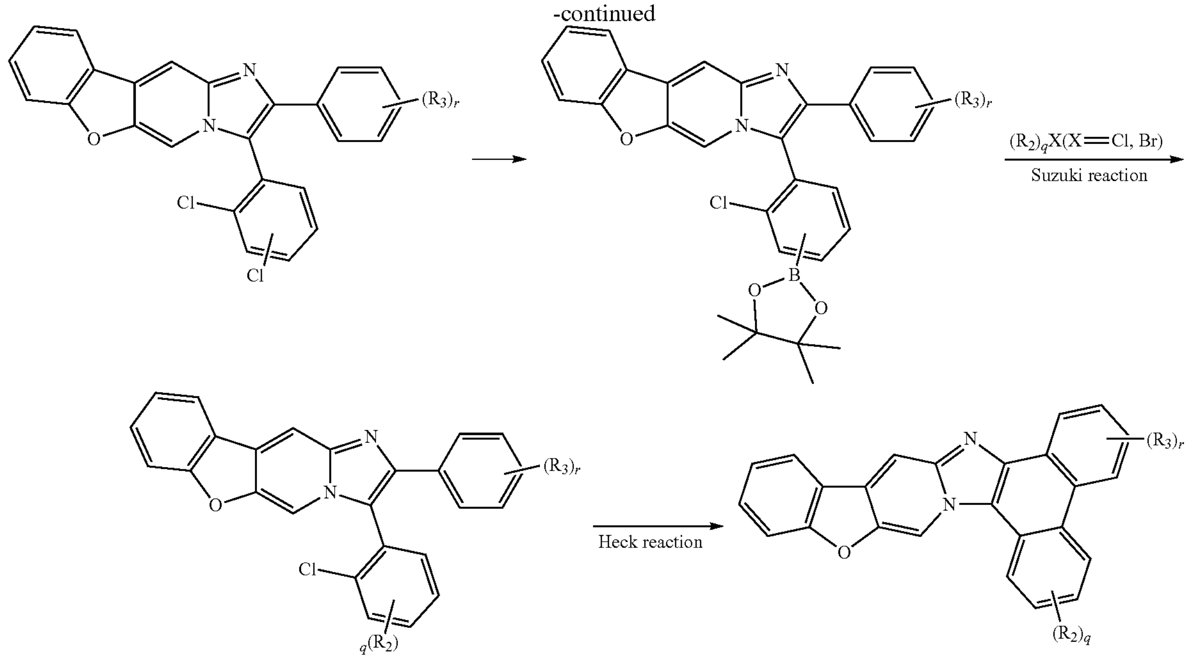

[Reaction Scheme 5]

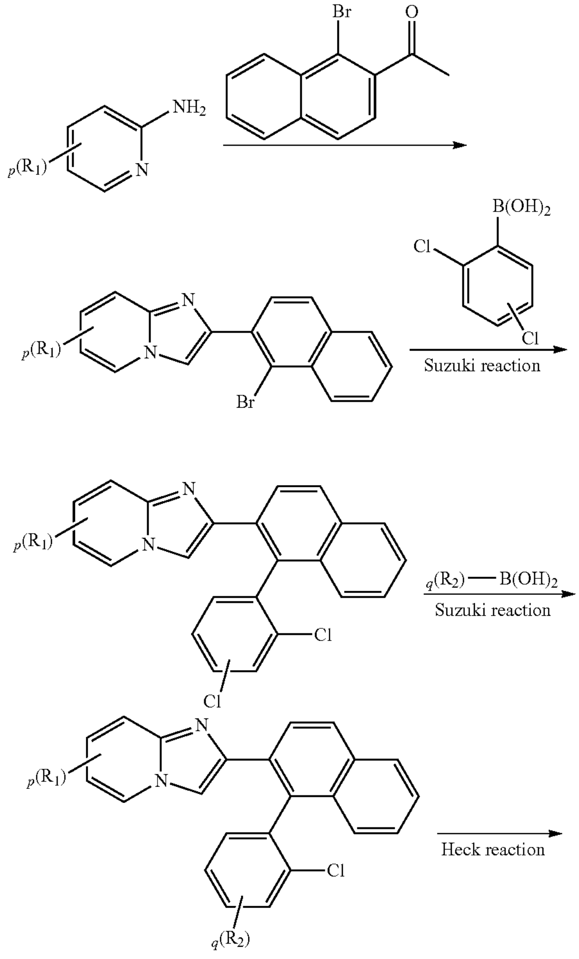

-continued

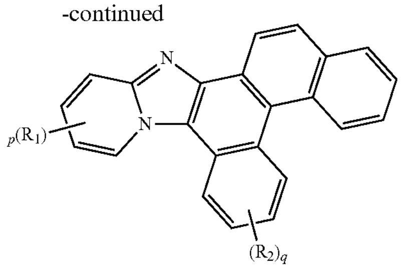

In reaction schemes 1 to 5, $R_1$ to $R_3$ and p to r are as defined in formula 1.

As described above, exemplary synthesis examples of the compounds represented by formula 1 according to one embodiment are described, but they are based on Buchwald-Hartwig cross coupling reaction, N-arylation reaction, H-mont-mediated etherification reaction, Miyaura borylation reaction, Suzuki cross-coupling reaction, Intramolecular acid-induced cyclization reaction, Pd(II)-catalyzed oxidative cyclization reaction, Grignard reaction, Heck reaction, Cyclic Dehydration reaction, $SN_1$ substitution reaction, $SN_2$ substitution reaction, and Phosphine-mediated reductive cyclization reaction, etc. It will be understood by one skilled in the art that the above reaction proceeds even if other substituents defined in the formula 1 other than substituents described in the specific synthesis examples are bonded.

The present disclosure provides an organic electroluminescent material comprising the organic electroluminescent compound of formula 1 and an organic electroluminescent device comprising the organic electroluminescent material. The material may consist of the organic electroluminescent compound of the present disclosure as a sole compound, or may further comprise conventional materials generally used in organic electroluminescent materials.

In addition, the present disclosure provides a complex material for the organic electroluminescent device comprising the compound of formula 1 and at least one species of the organic electroluminescent compound.

The organic electroluminescent device according to the present disclosure includes a first electrode; a second electrode; and at least one organic layer interposed between the first electrode and the second electrode. The organic layer may comprise at least one of the organic electroluminescent compound of formula 1. The organic layer may further comprise at least one compound selected from the group consisting of an arylamine-based compound and a styrylarylamine-based compound. Also, in the organic electroluminescent device of the present disclosure, the organic layer may further comprise at least one metal selected from the group consisting of metals of Group 1, metals of Group 2, transition metals of the $4^{th}$ period, transition metals of the $5^{th}$ period, lanthanides, and organic metals of the d-transition elements of the Periodic Table, or at least one complex compound comprising such a metal.

An organic electroluminescent material according to one embodiment may be used as light-emitting materials for a white organic light-emitting device. The white organic light-emitting device has suggested various structures such as a parallel side-by-side arrangement method, a stacking arrangement method, or CCM (color conversion material) method, etc., according to the arrangement of R (Red), G (Green), B (blue), or YG (yellowish green) light-emitting units. In addition, the organic electroluminescent material according to one embodiment may also be applied to the organic electroluminescent device comprising a QD (quantum dot).

One of the first electrode and the second electrode may be an anode and the other may be a cathode. Wherein, the first electrode and the second electrode may each be formed as a transmissive conductive material, a transflective conductive material, or a reflective conductive material. The organic electroluminescent device may be a top emission type, a bottom emission type, or a both-sides emission type according to the kinds of the material forming the first electrode and the second electrode. The organic layer may comprise a light-emitting layer, and may further comprise at least one layer selected from a hole injection layer, a hole transport layer, a hole auxiliary layer, a light-emitting auxiliary layer, an electron transport layer, an electron buffer layer, an electron injection layer, an interlayer, a hole blocking layer, and an electron blocking layer.

The organic electroluminescent compound of formula 1 may be comprised in at least one layer of the light-emitting layer, the hole injection layer, the hole transport layer, the hole auxiliary layer, the light-emitting auxiliary layer, the electron transport layer, the electron buffer layer, the electron injection layer, the interlayer, the hole blocking layer, and the electron blocking layer. Preferably, the organic electroluminescent compound represented by formula 1 may be comprised in at least one layer of the light-emitting layer and the electron transport layer. When used in the light-emitting layer, the organic electroluminescent compound of formula 1 may be comprised as a host material. When used in the electron transport layer, the organic electroluminescent compound of formula 1 may be comprised as an electron transport material. If necessary, the organic electroluminescent compound of the present disclosure may be used as co-host materials. That is, the light-emitting layer may further contain a compound other than the organic electroluminescent compound of formula 1 (a first host material) of the present disclosure as a second host material. Herein, the weight ratio of the first host material to the second host material is in the range of 1:99 to 99:1.

The second host material can use any of the known hosts, and the second host material may be preferably the compounds represented by the following formulae 21 to 23:

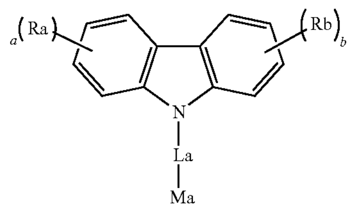

(21)

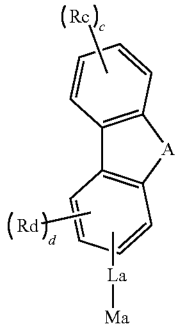

(22)

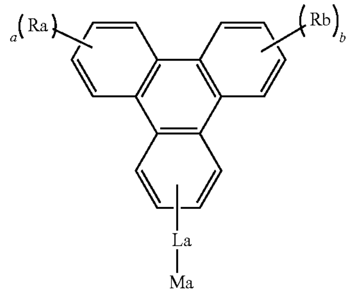

(23)

In formulae 21 to 23,

Ma represents a substituted or unsubstituted (C6-C30)aryl, a substituted or unsubstituted mono- or di-(C6-C30)arylamino, or a substituted or unsubstituted (3- to 30-membered)heteroaryl;

La represents a single bond, a substituted or unsubstituted (C6-C30)arylene, or a substituted or unsubstituted (3- to 30-membered)heteroarylene;

A represents S, O, $NR_7$ or $CR_8R_9$;

Ra to Rd each independently represent hydrogen, deuterium, halogen, cyano, a substituted or unsubstituted (C1-C30)alkyl, a substituted or unsubstituted (C2-C30)alkenyl, a substituted or unsubstituted (C2-C30)alkynyl, a substituted or unsubstituted (C3-C30)cycloalkyl, a substituted or unsubstituted (C6-C30)aryl, a substituted or unsubstituted (3- to 30-membered)heteroaryl, a substituted or unsubstituted tri(C1-C30)alkylsilyl, a substituted or unsubstituted tri(C6-C30)arylsilyl, a substituted or unsubstituted di(C1-C30)alkyl(C6-C30)arylsilyl, a substituted or unsubstituted (C1-C30)alkyldi(C6-C30)arylsilyl, a substituted or unsubstituted (C1-C30)alkyl(C6-C30)arylamino, or a substituted or unsubstituted mono- or di-(C6-C30)arylamino; or may be linked to an adjacent substituent to form a ring;

$R_7$ to $R_9$ each independently represent hydrogen, deuterium, halogen, cyano, a substituted or unsubstituted (C1-C30)alkyl, a substituted or unsubstituted (C6-C30)aryl, a substituted or unsubstituted (3- to 30-membered)

heteroaryl, a substituted or unsubstituted (C3-C30) cycloalkyl, a substituted or unsubstituted (C1-C30) alkoxy, a substituted or unsubstituted tri(C1-C30) alkylsilyl, a substituted or unsubstituted di(C1-C30) alkyl(C6-C30)arylsilyl, a substituted or unsubstituted (C1-C30)alkyldi(C6-C30)arylsilyl, a substituted or unsubstituted tri(C6-C30)arylsiyl, a substituted or unsubstituted mono- or di-(C1-C30)alkylamino, a substituted or unsubstituted mono- or di-(C6-C30)arylamino, or a substituted or unsubstituted (C1-C30)alkyl (C6-C30)arylamino; and $R_8$ and $R_9$ may be linked to each other to form a ring;

a to c each independently represent an integer of 1 to 4, d represents an integer of 1 to 3; and the heteroaryl(ene) contains at least one heteroatom selected from B, N, O, S, Si, and P.

Specifically, the compounds represented by any one of formulae 21 to 23 may be illustrated by the following compounds, but are not limited thereto:

H-1

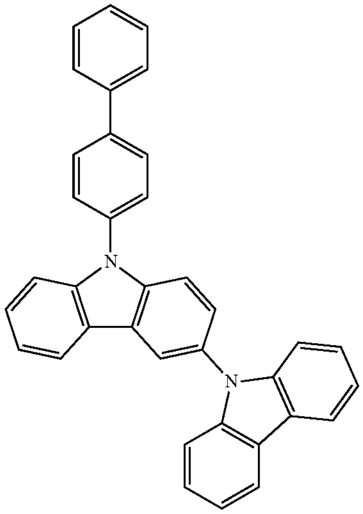

H-2

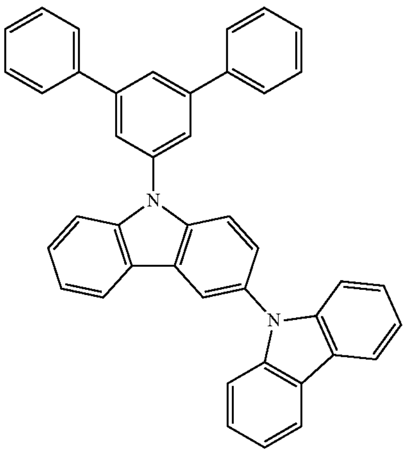

-continued

H-3

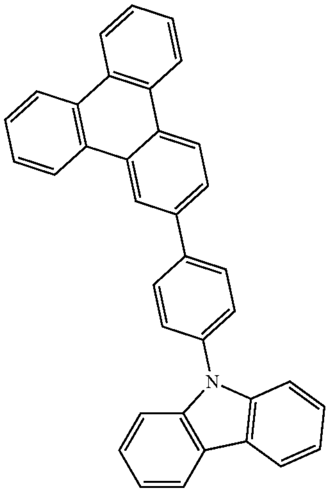

H-4

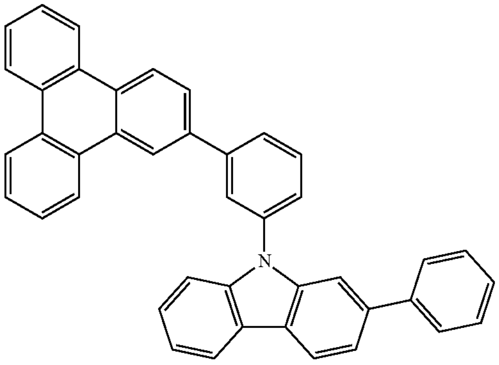

H-5

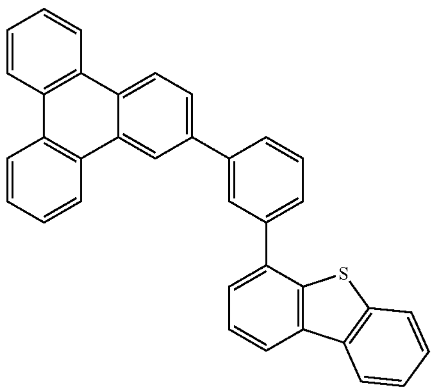

-continued
H-6
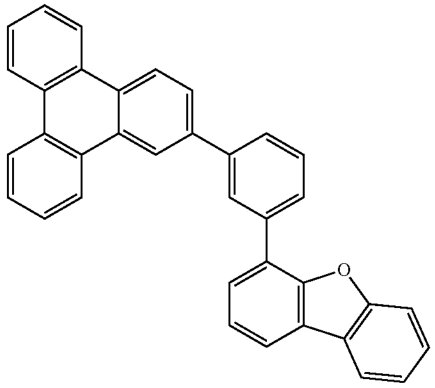
H-7
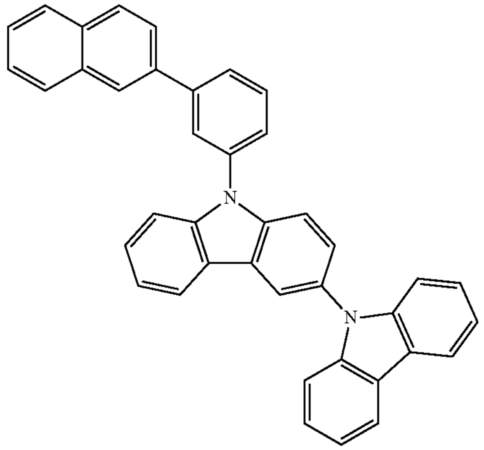
H-8
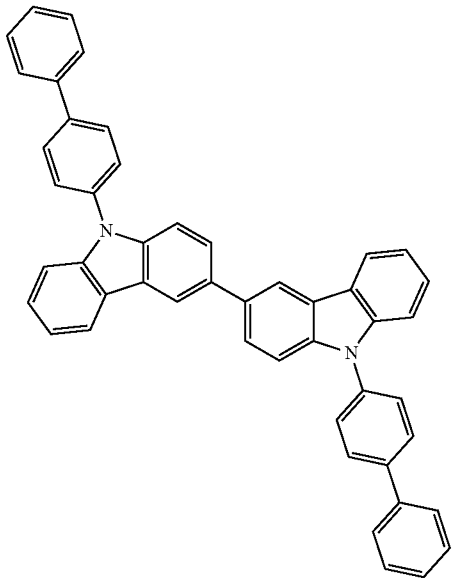
-continued
H-9
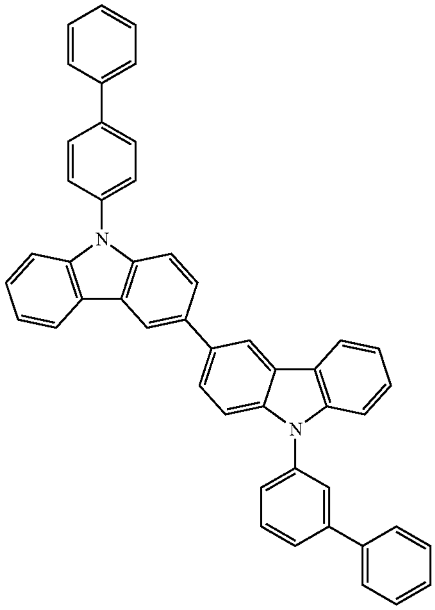
H-10
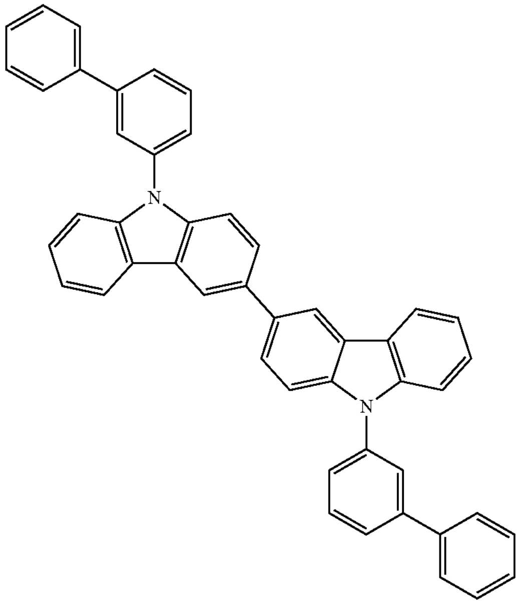

-continued
H-11
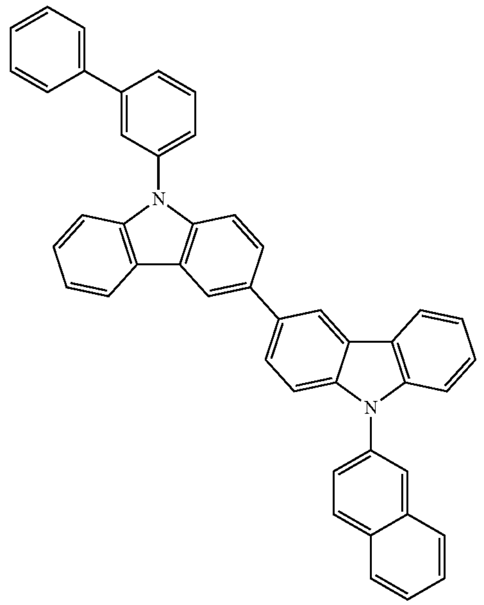
H-12
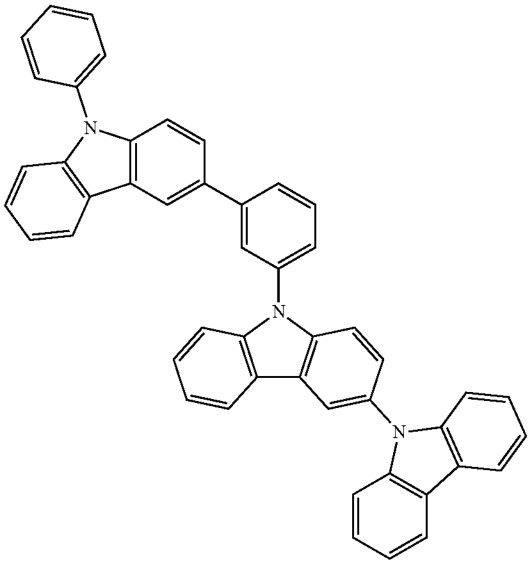
-continued
H-13
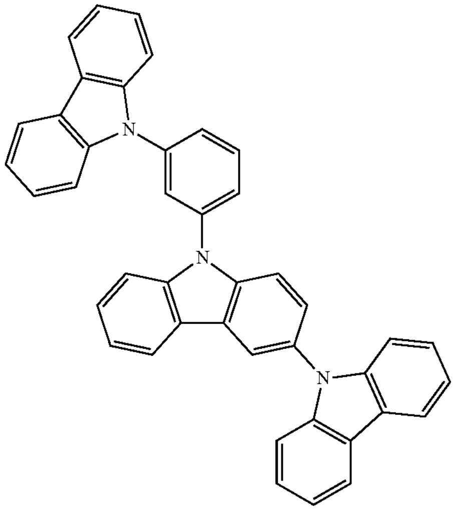
H-14
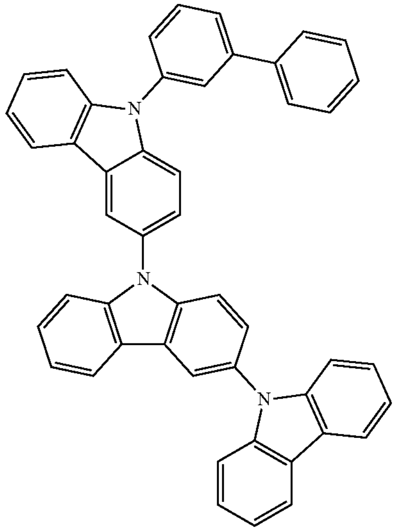
H-15
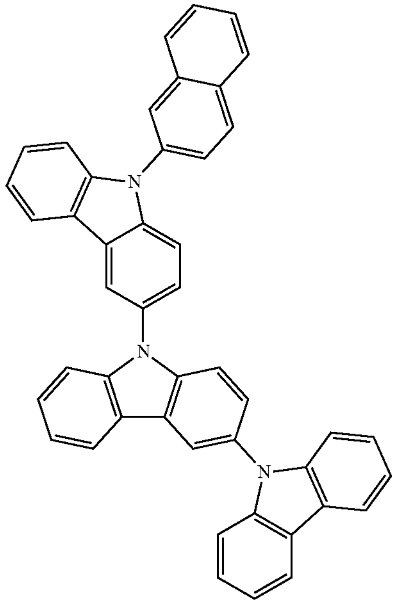

-continued
H-16
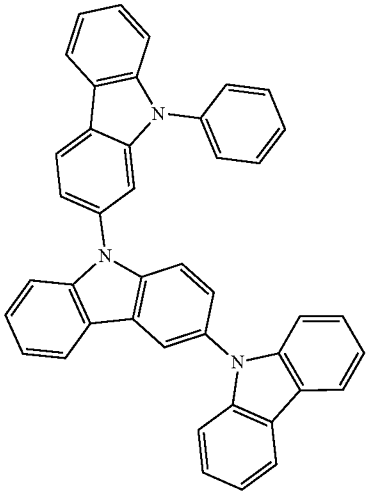
H-17
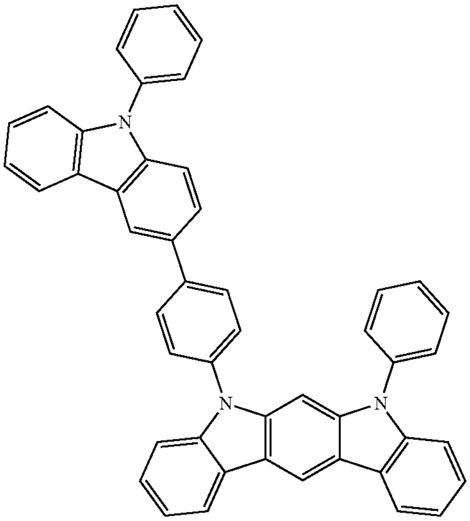
H-18
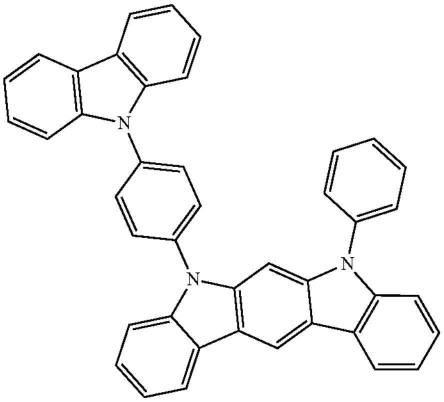
-continued
H-19
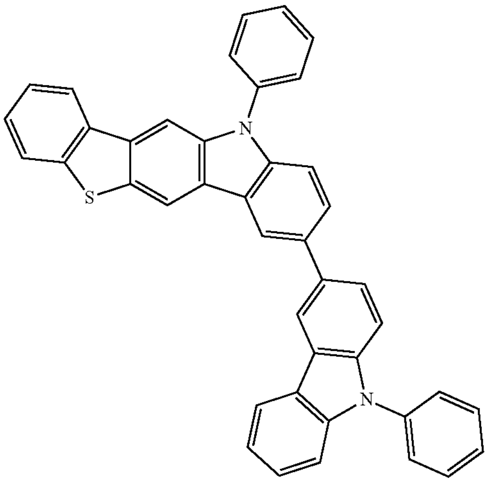
H-20
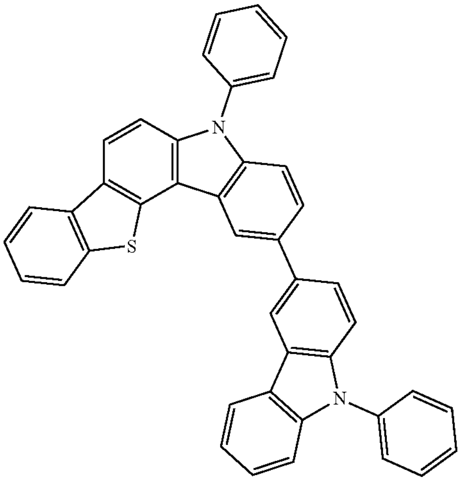
H-21
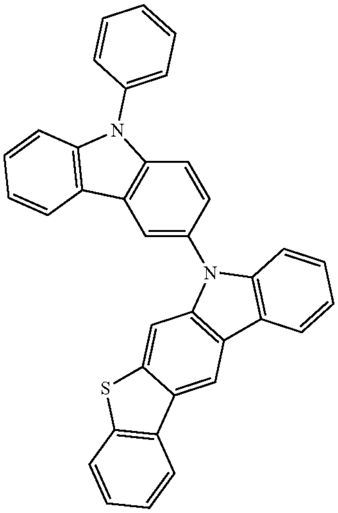

-continued
H-22
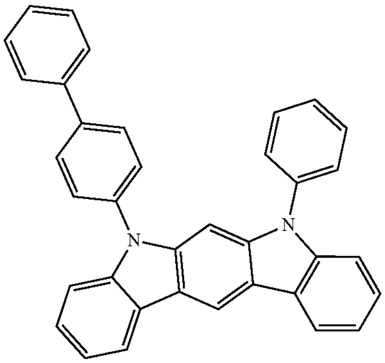
H-23
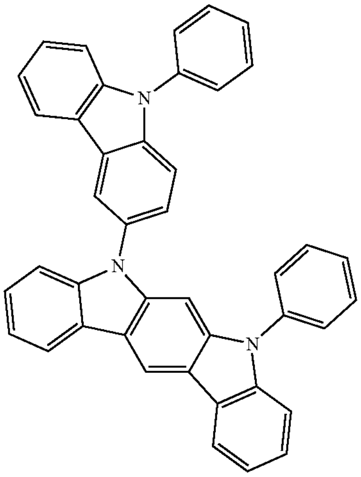
H-24
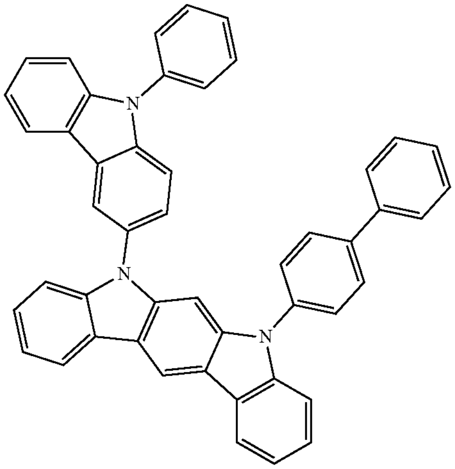
-continued
H-25
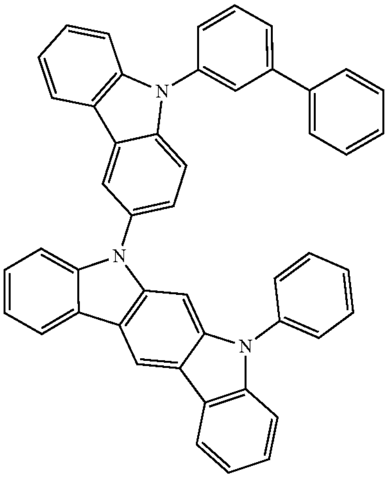
H-26
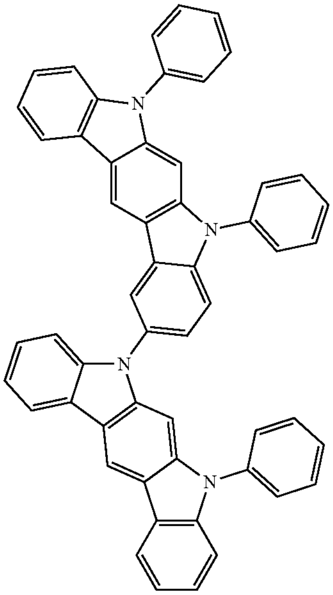
H-27
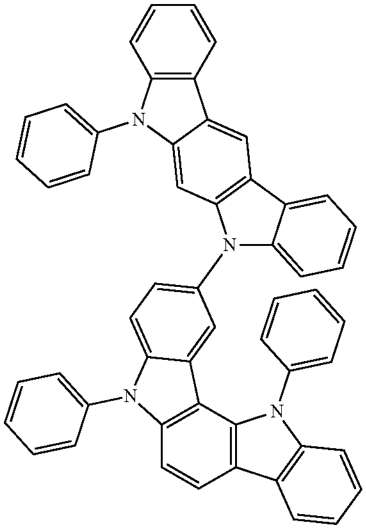

-continued
H-28
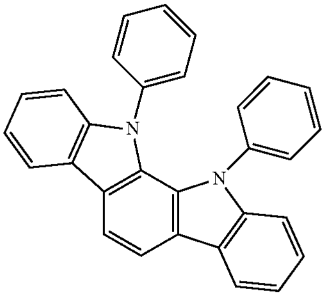
H-29
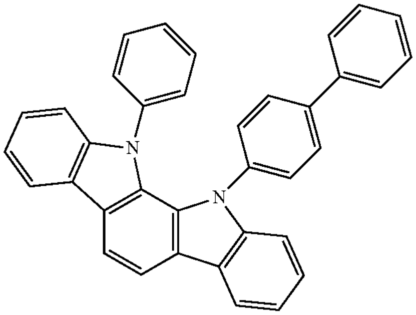
H-30
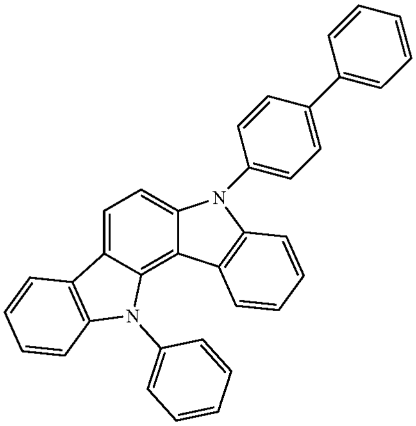
H-31
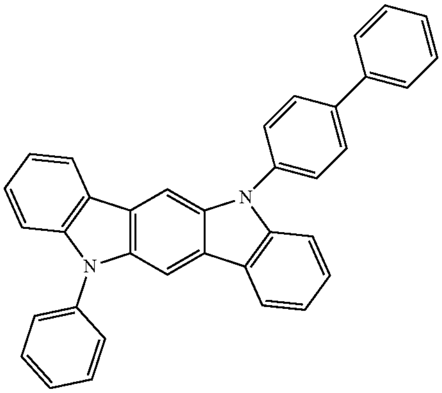
-continued
H-32
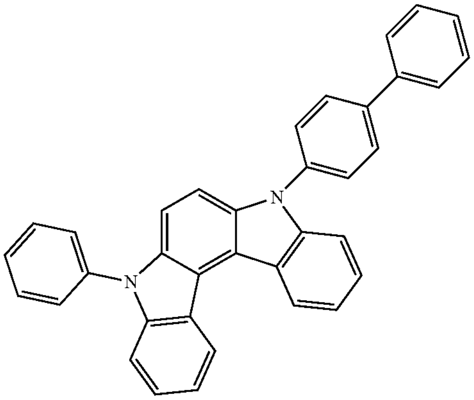
H-33
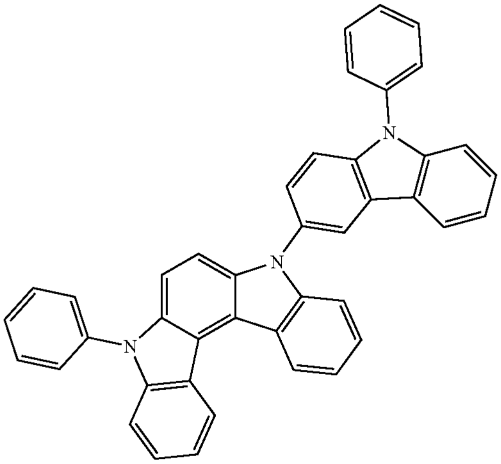
H-34
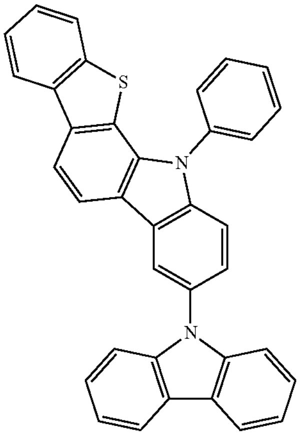

-continued
H-35
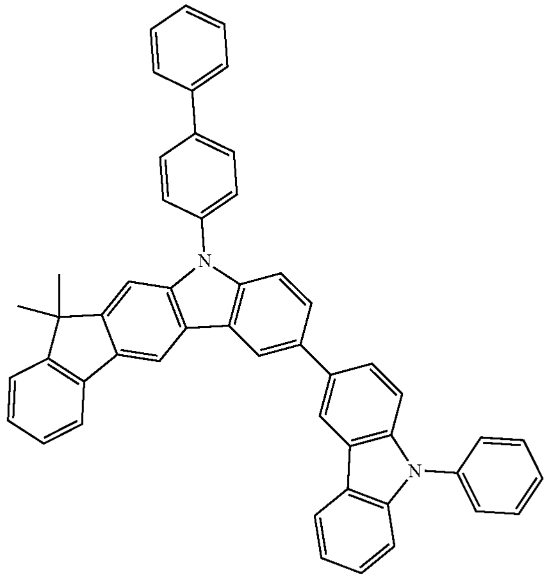
H-36
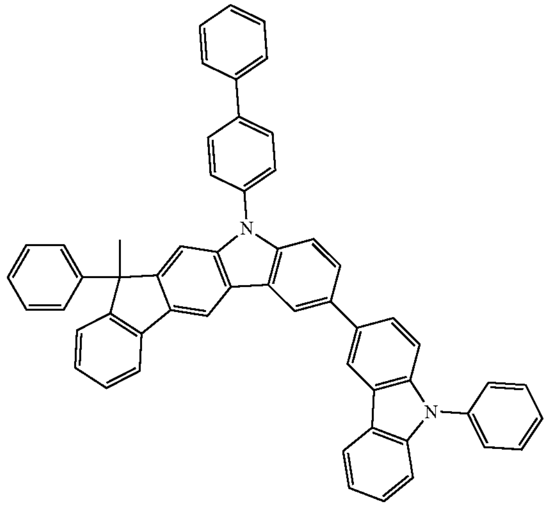
-continued
H-37
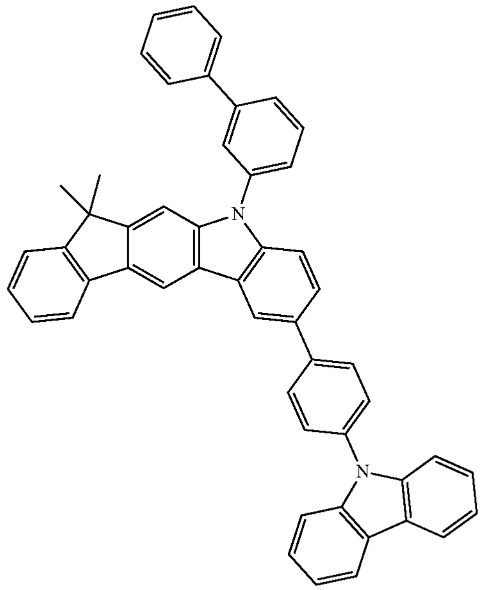
H-38
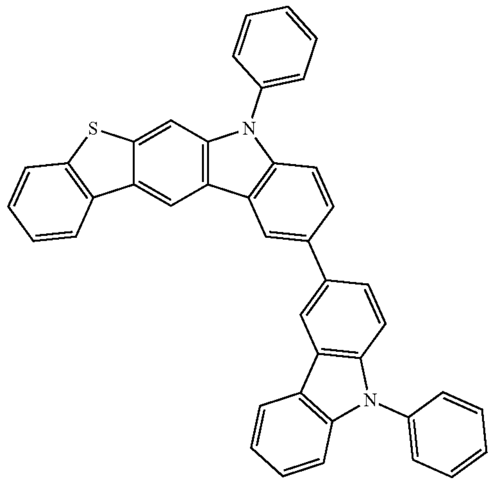
H-39
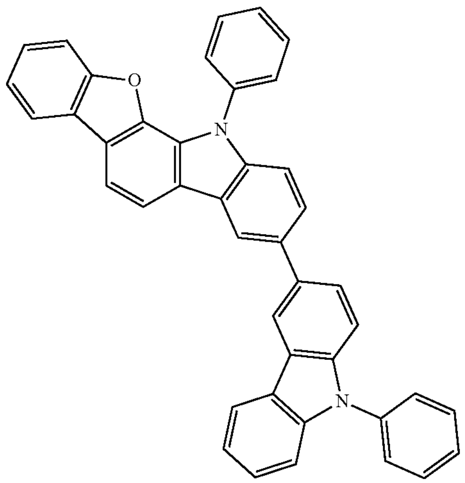

-continued
H-40
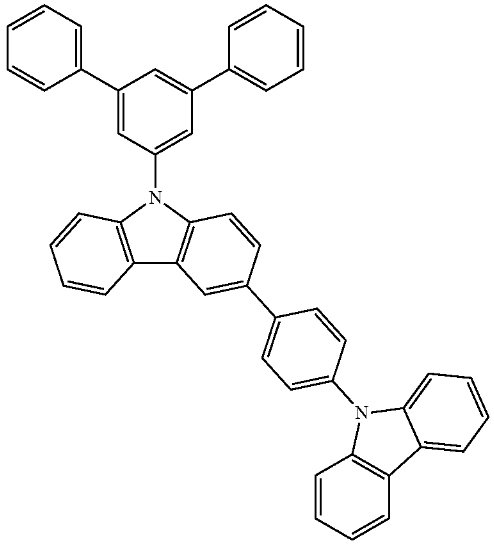
H-41
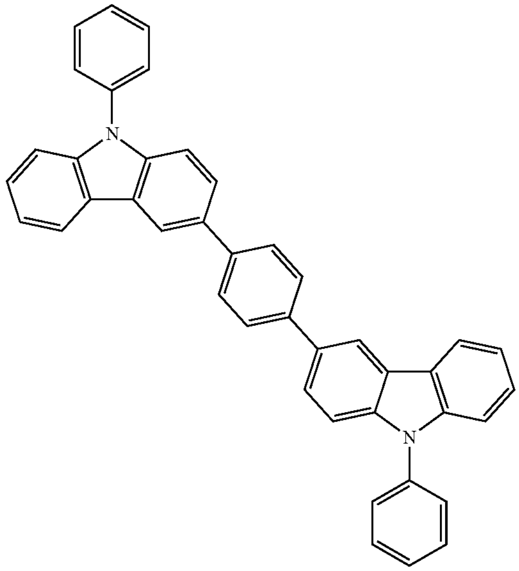
-continued
H-42
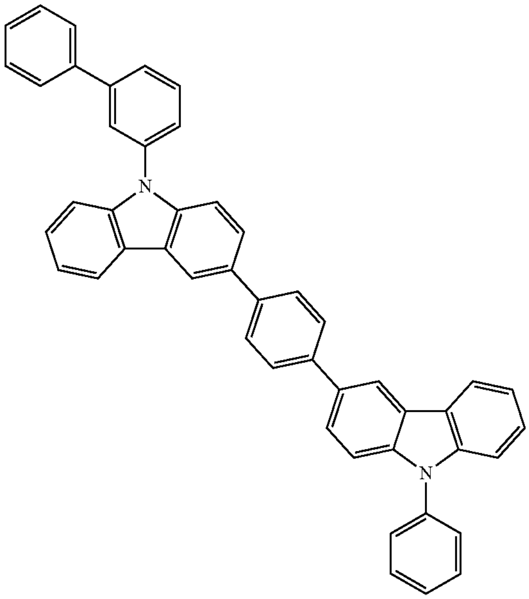
H-43
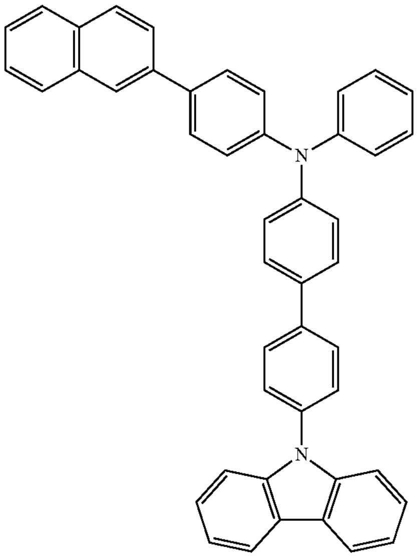

-continued
H-44
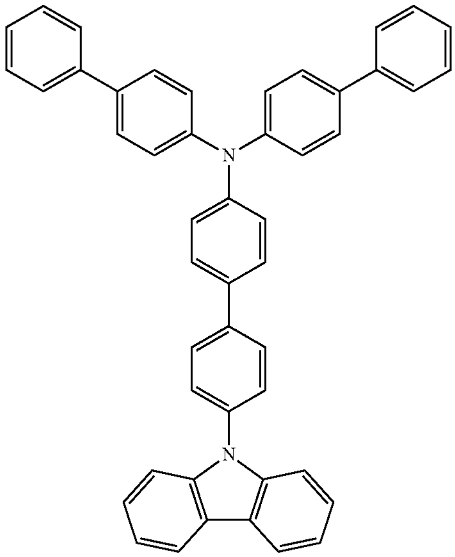
H-45
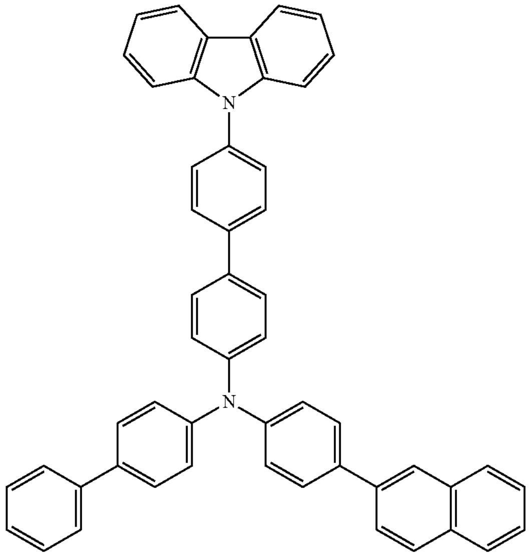
H-46
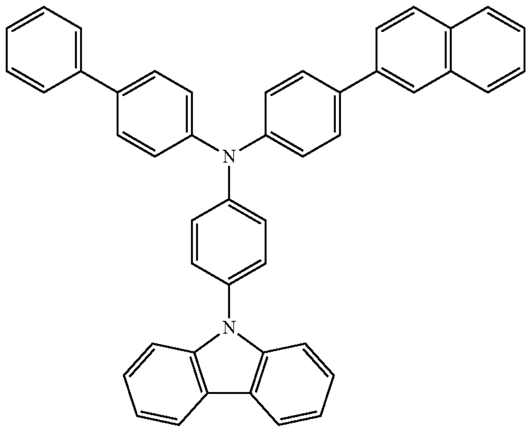
-continued
H-47
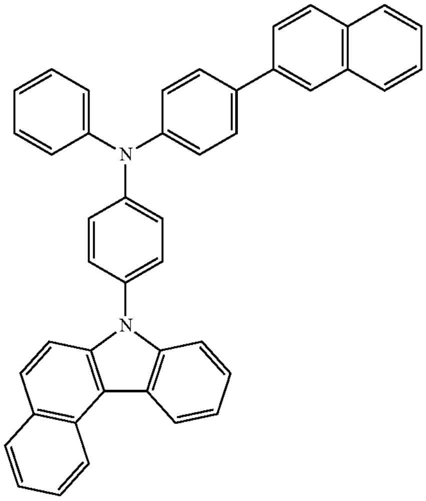
H-48
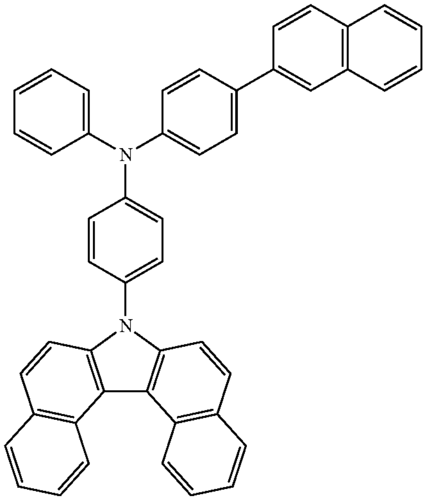
H-49
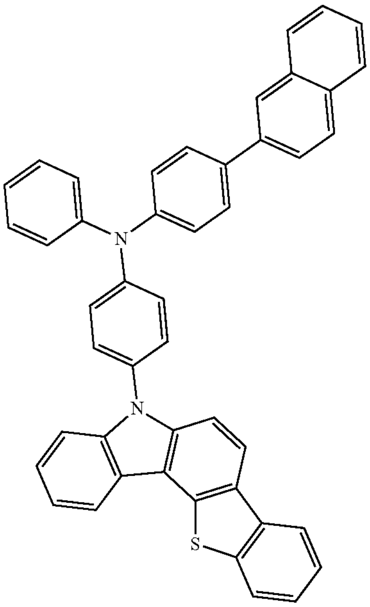

-continued
H-50
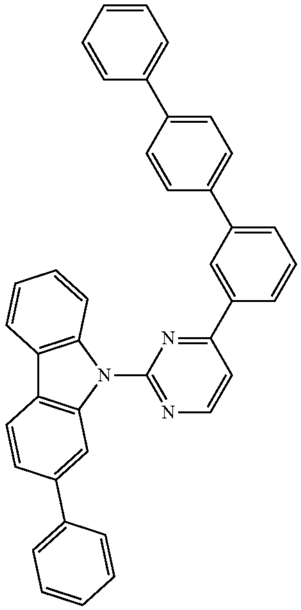
H-51
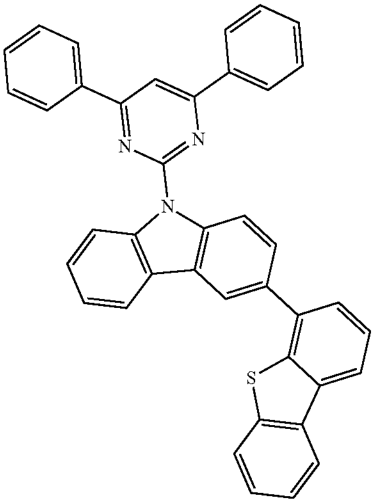
H-52
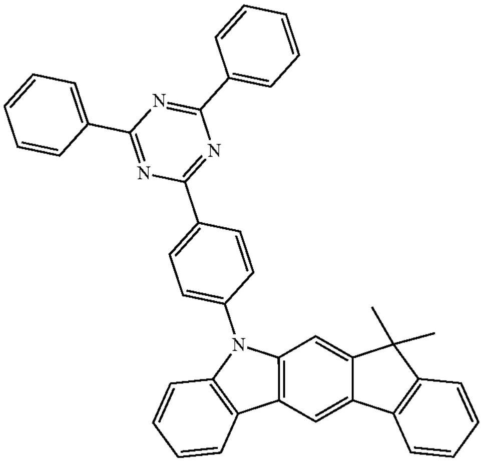
-continued
H-53
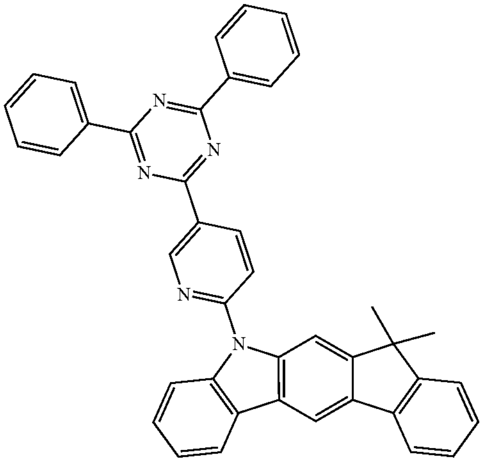
H-54
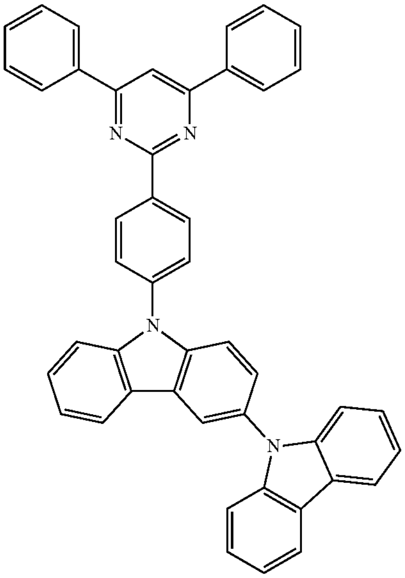
H-55
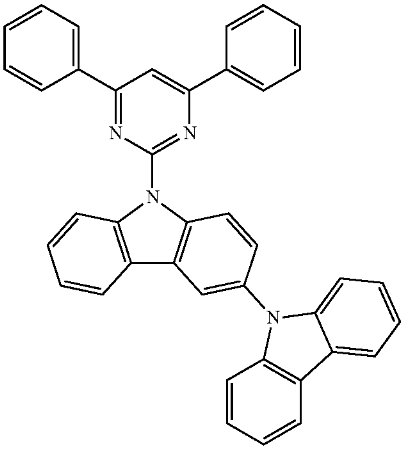

-continued
H-56
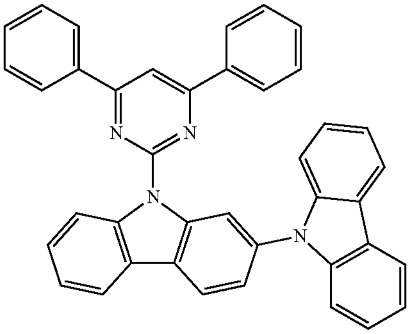
H-57
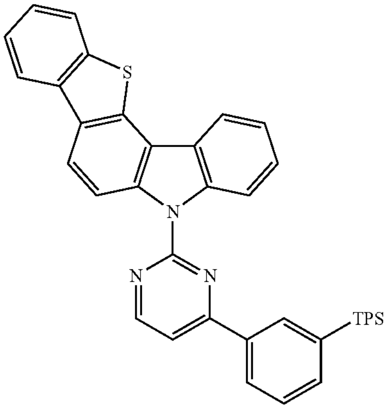
H-58
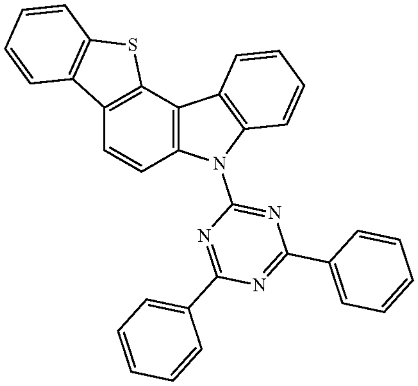
H-59
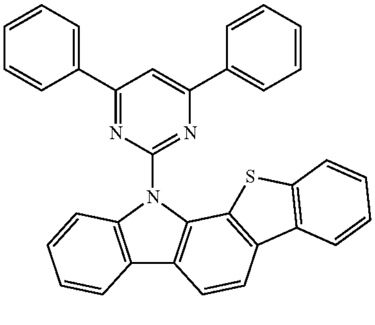
-continued
H-60
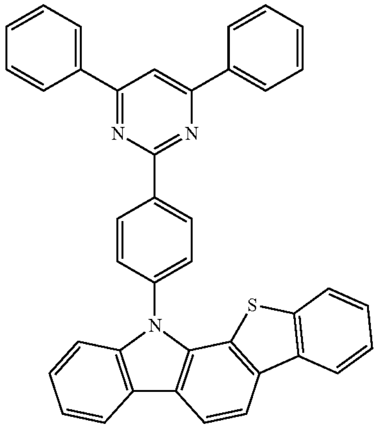
H-61
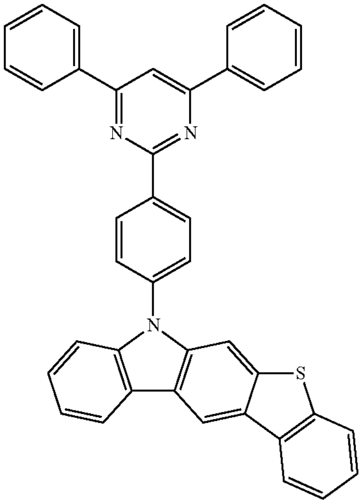
H-62
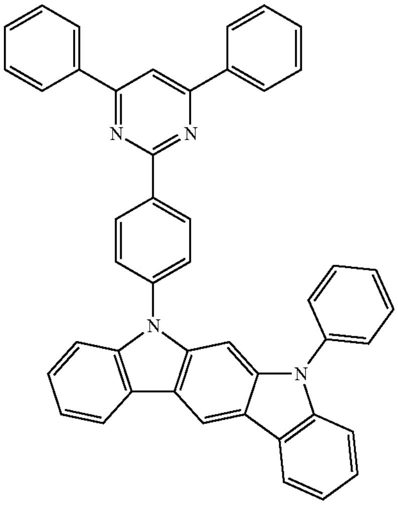

-continued
H-63
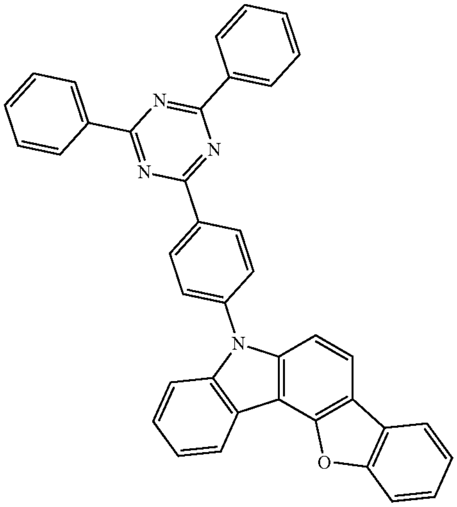
H-64
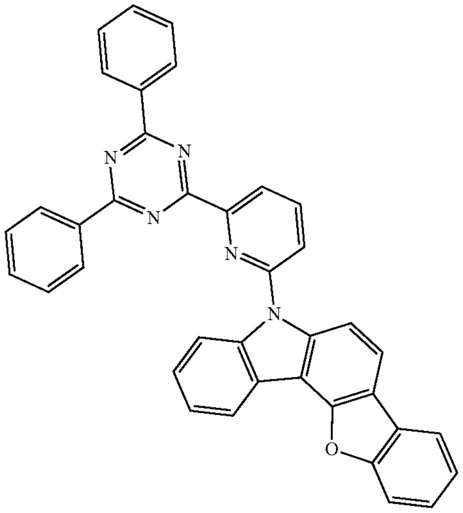
H-65
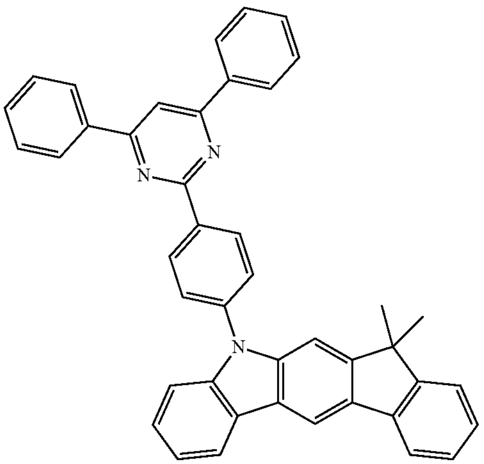
-continued
H-66
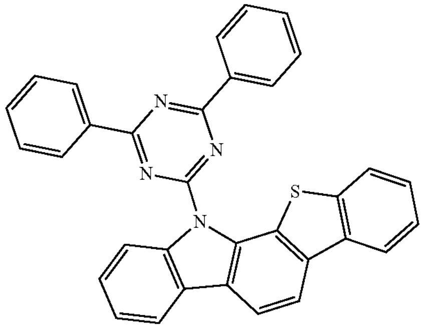
H-67
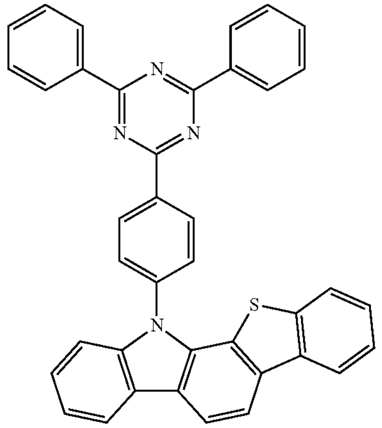
H-68
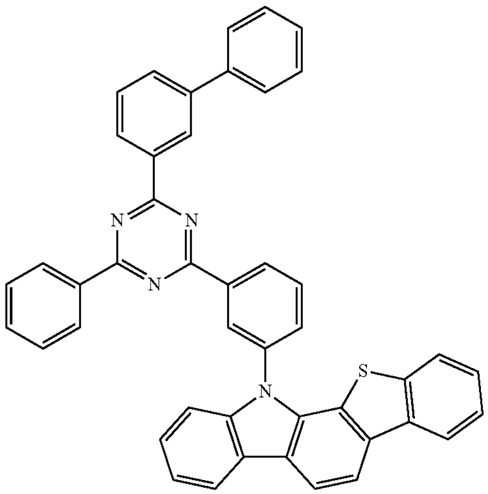

-continued
H-69
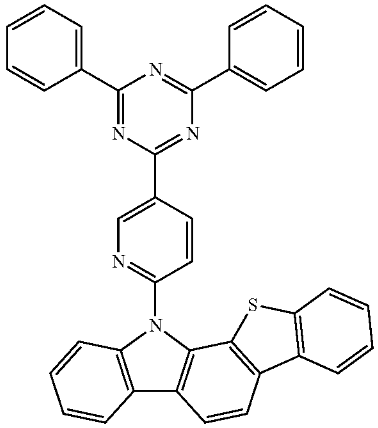
H-70
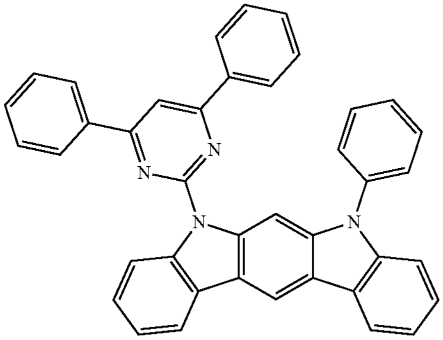
H-71
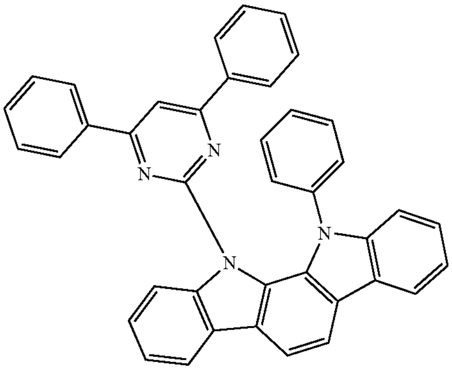
H-72
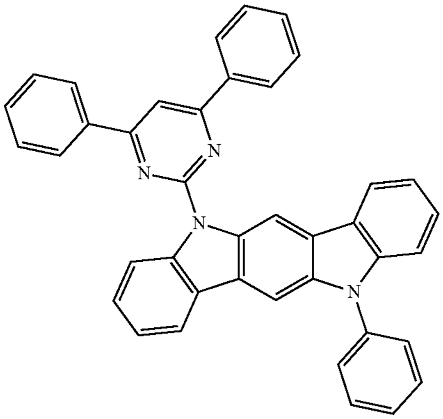
-continued
H-73
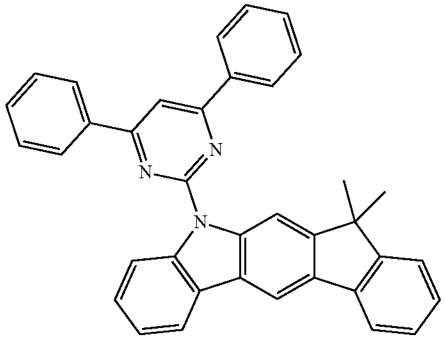
H-74
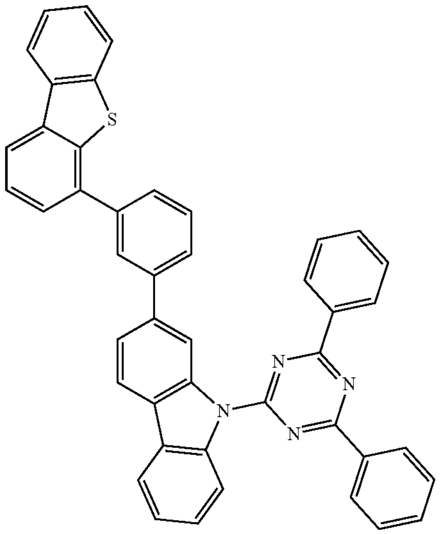
H-75
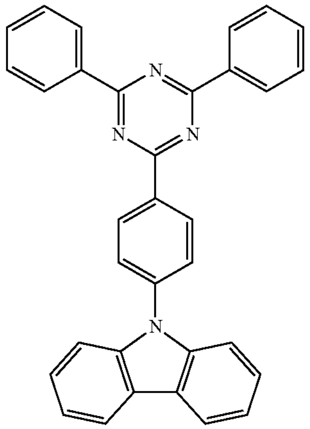

-continued
H-76
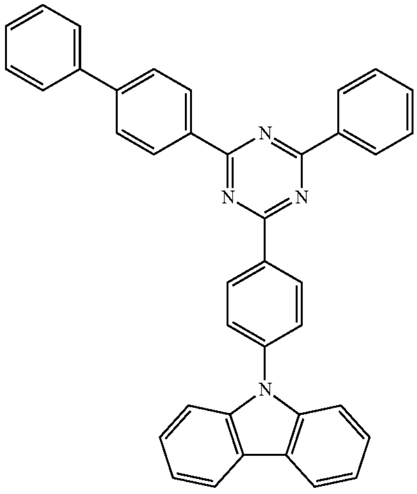
H-77
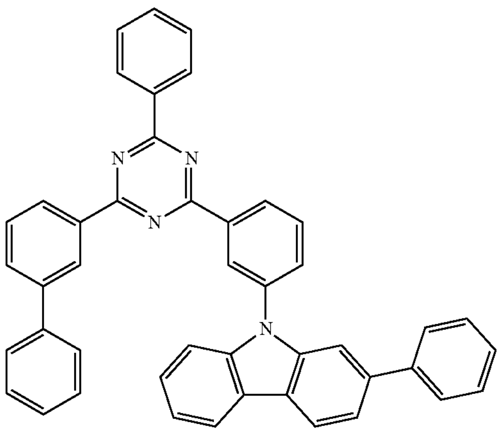
H-78
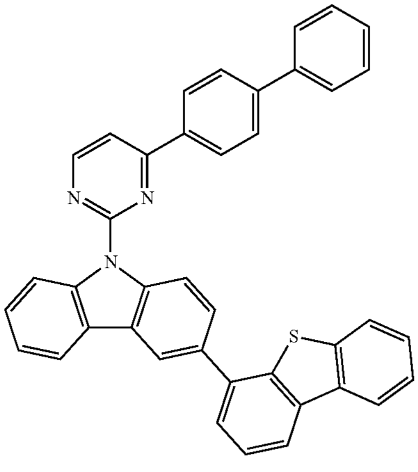
-continued
H-79
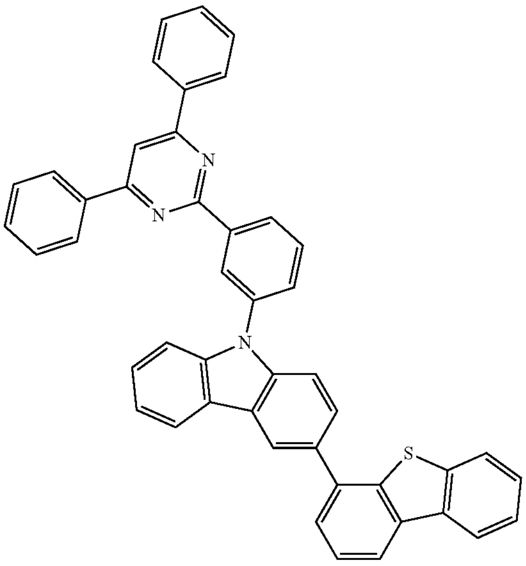
H-80
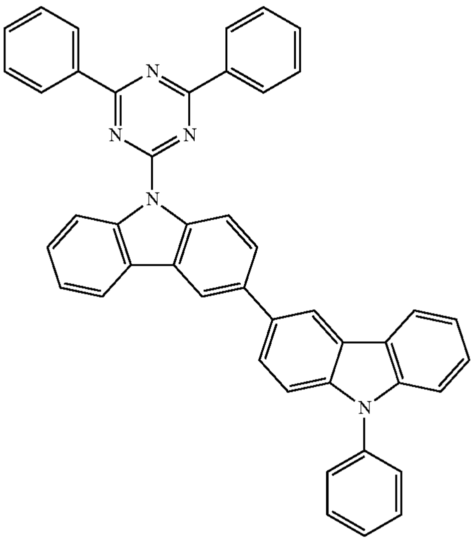
H-81
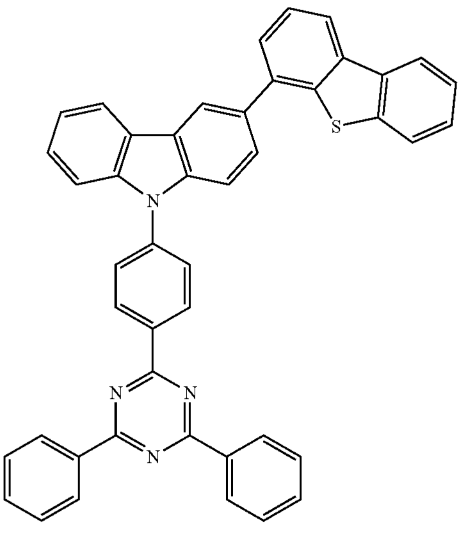

-continued
H-82
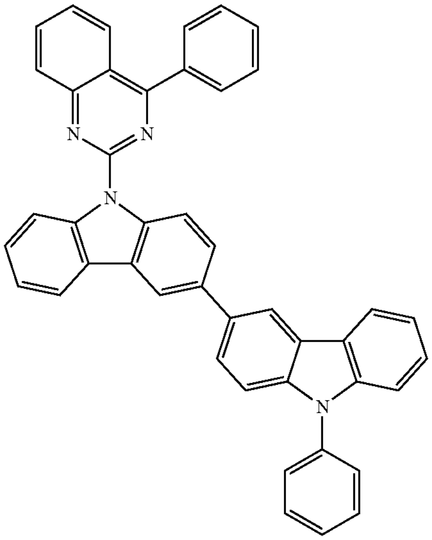
H-83
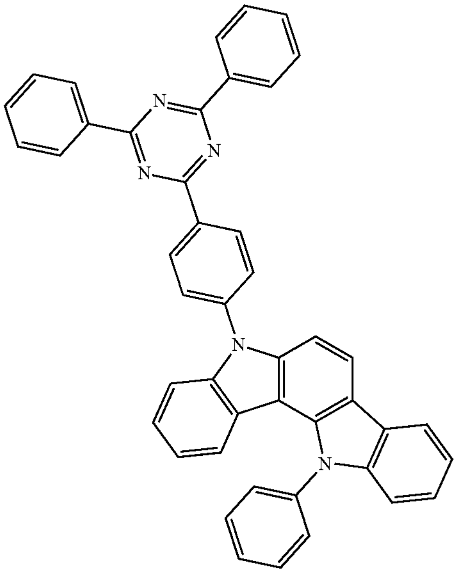
H-84
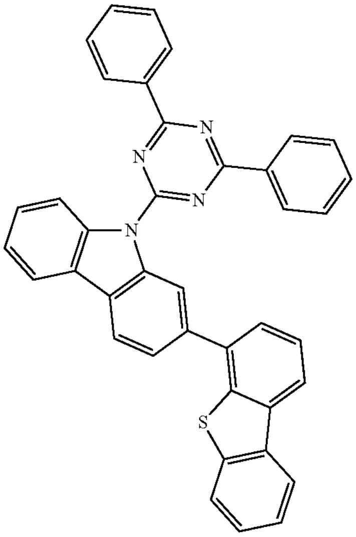
-continued
H-85
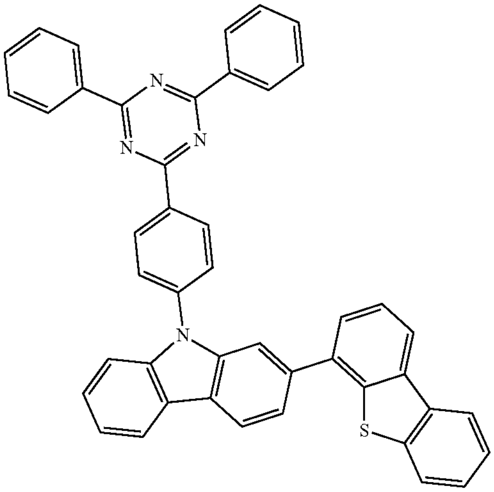
H-86
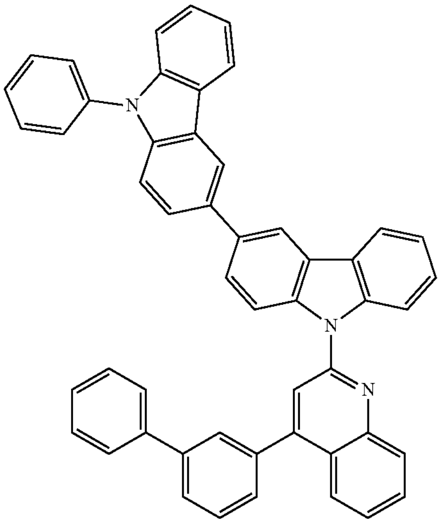
H-87
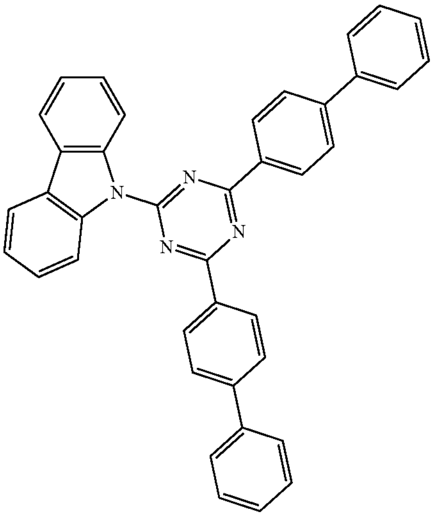

-continued
H-88
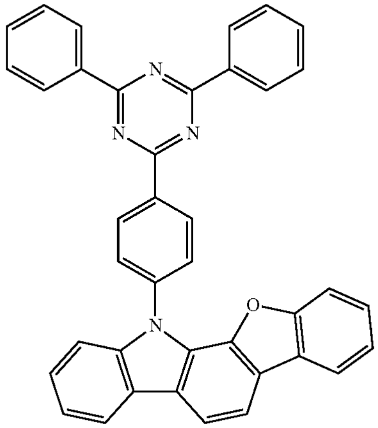
H-89
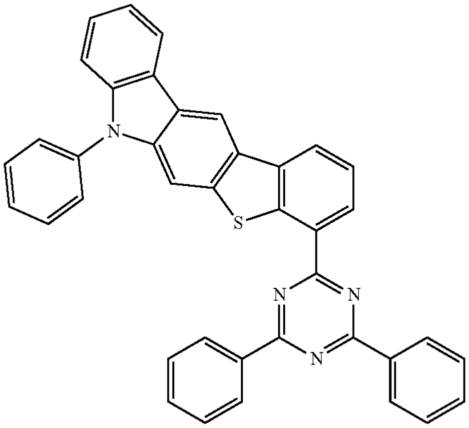
H-90
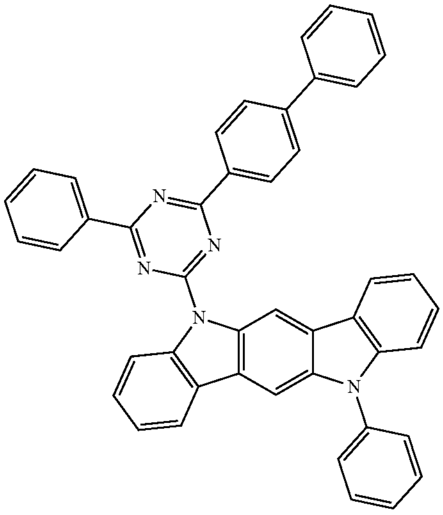
-continued
H-91
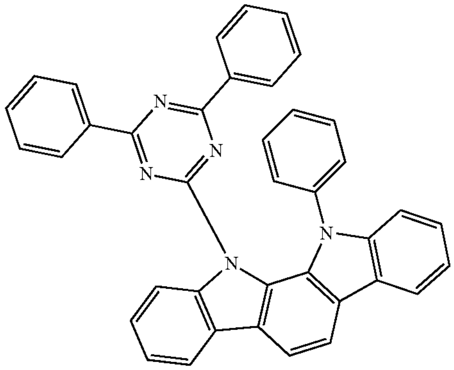
H-92
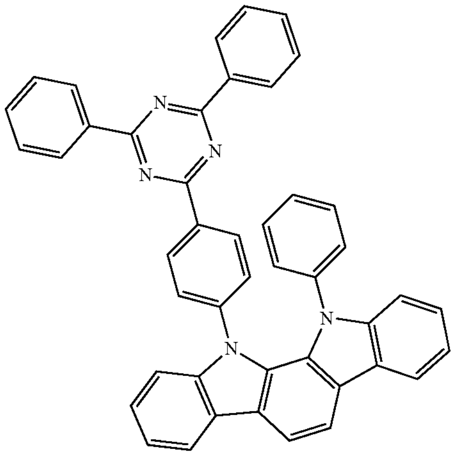
H-93
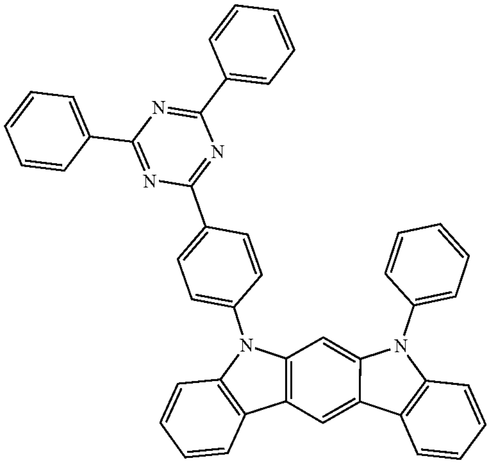

-continued
H-94
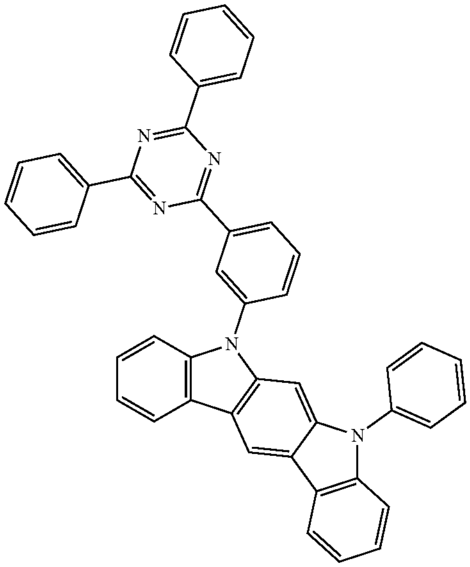
H-95
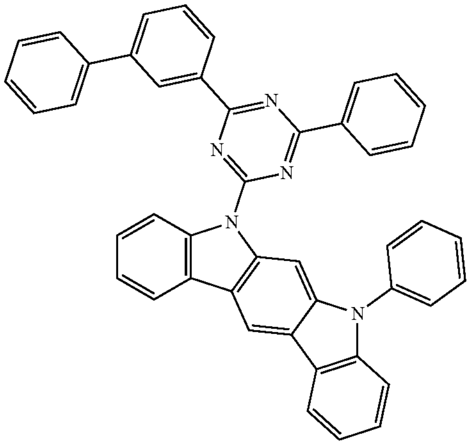
H-96
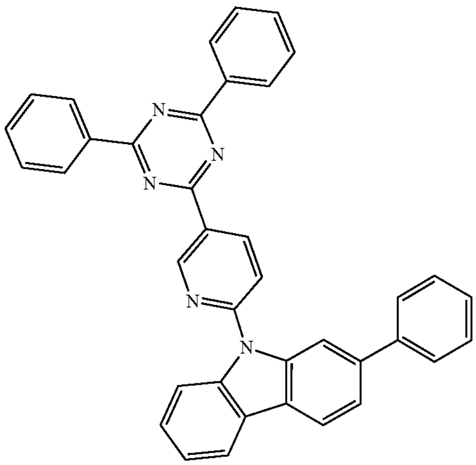
-continued
H-97
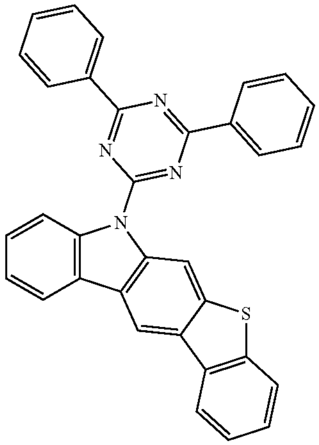
H-98
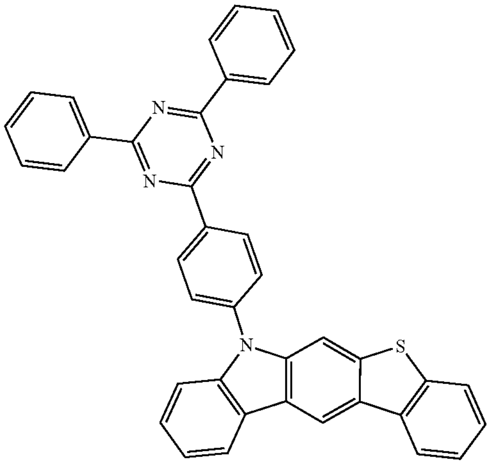
H-99
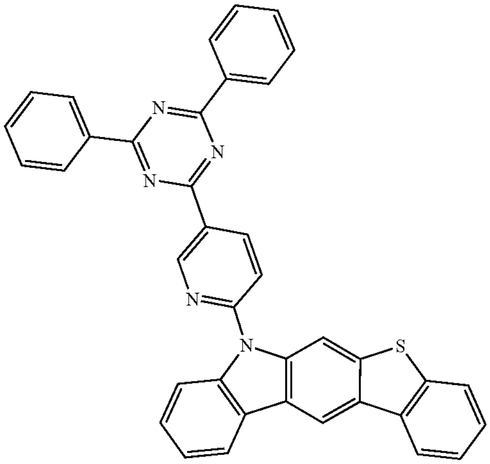

-continued
H-100
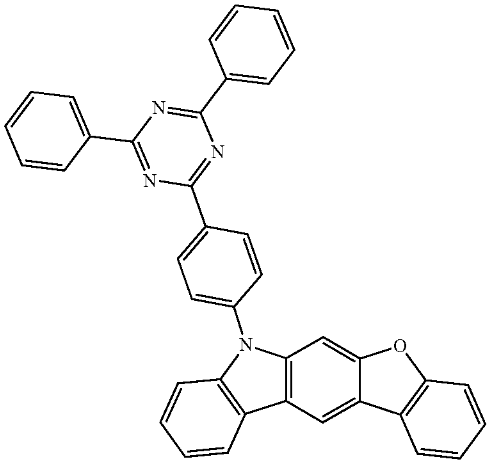
H-101
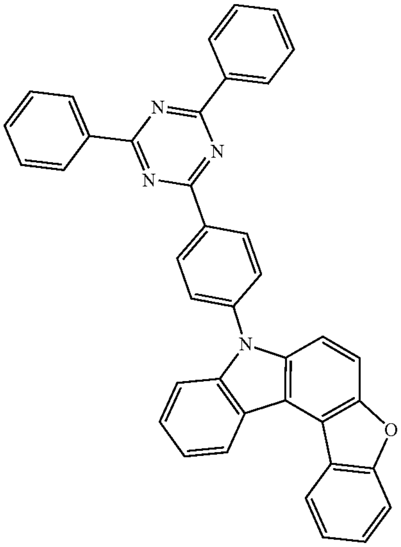
H-102
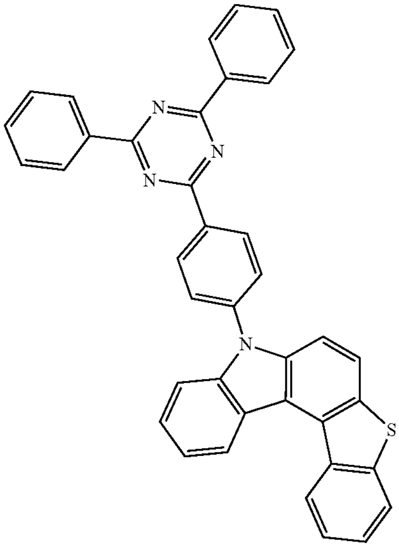
-continued
H-103
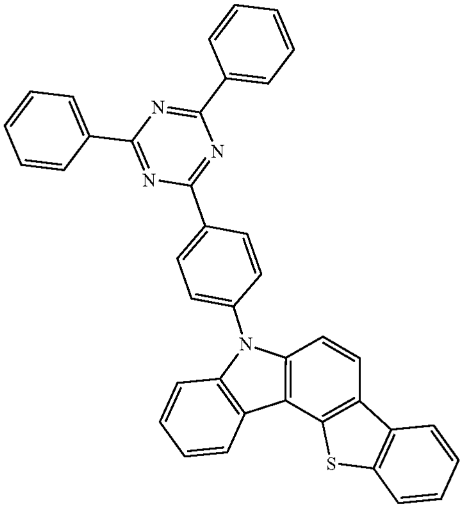
H-104
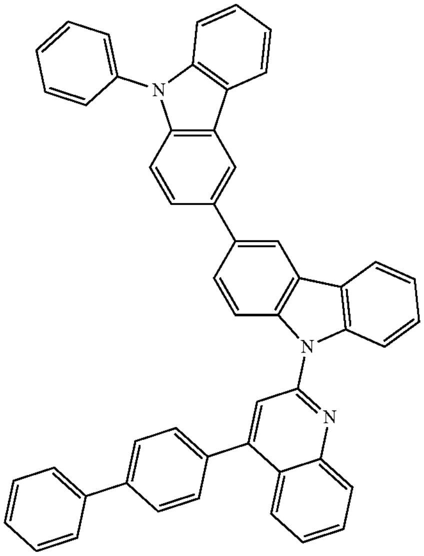
H-105
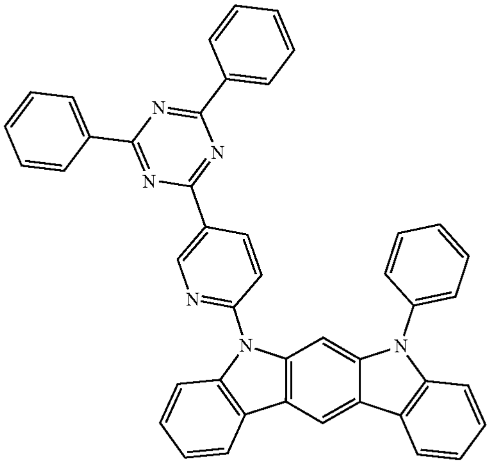

-continued
H-106
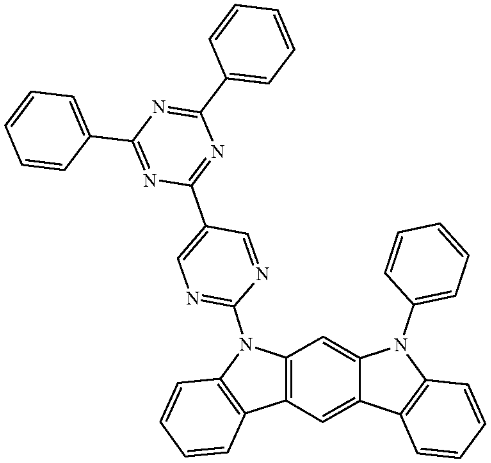
H-107
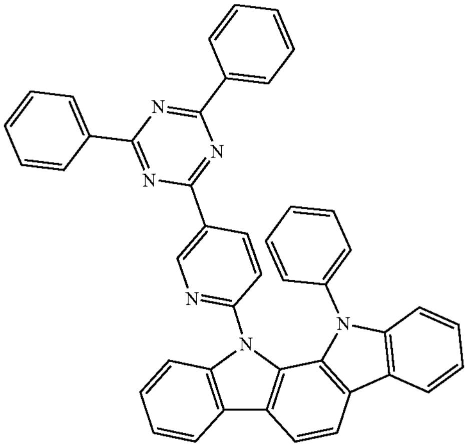
H-108
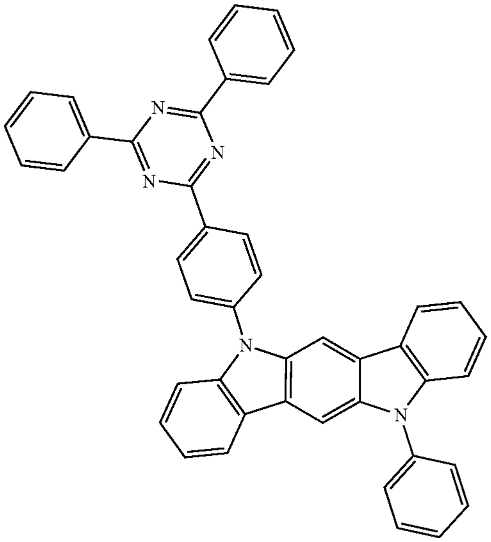
-continued
H-109
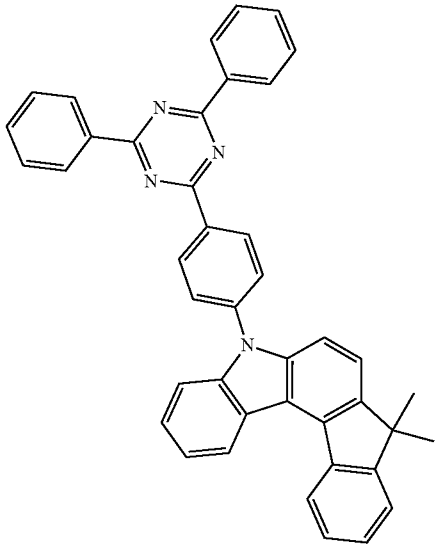
H-110
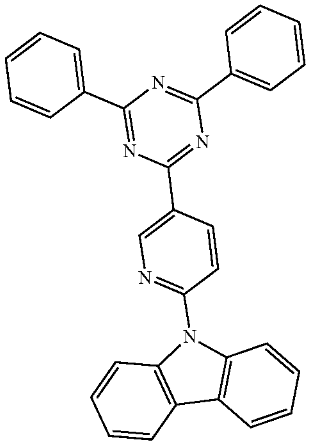
H-111
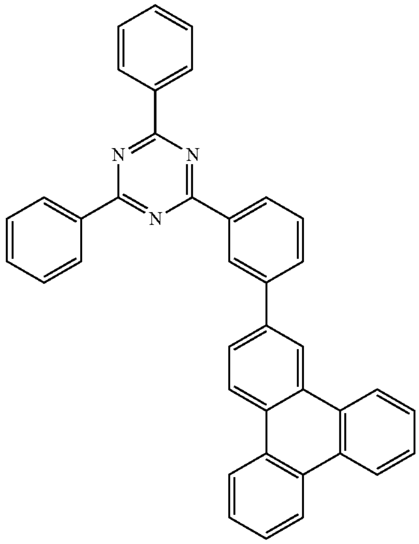

-continued
H-112
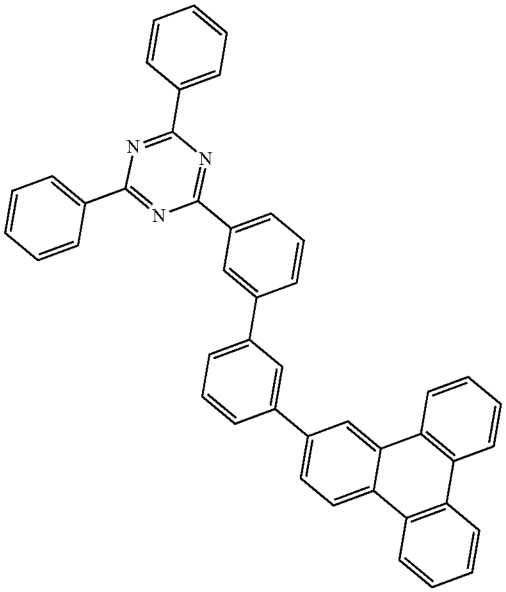
H-113
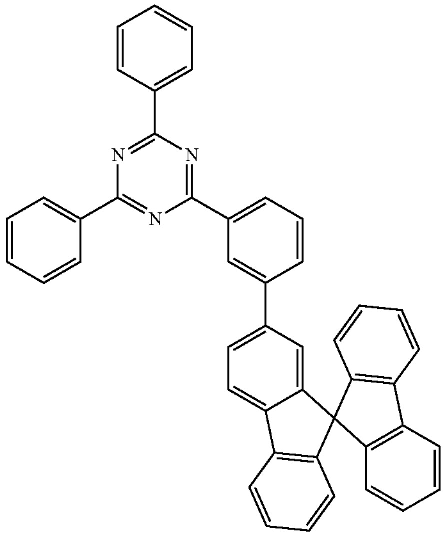
H-114
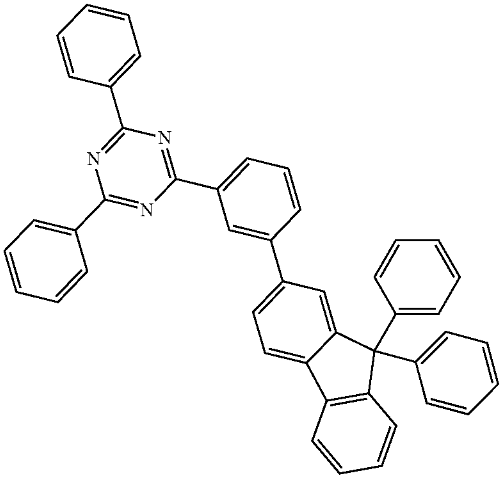
-continued
H-115
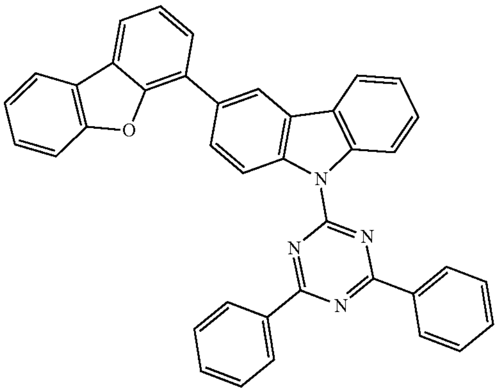
H-116
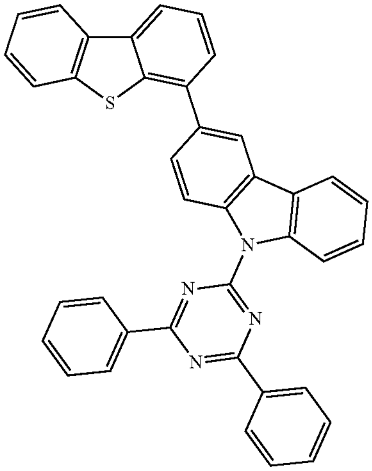
H-117
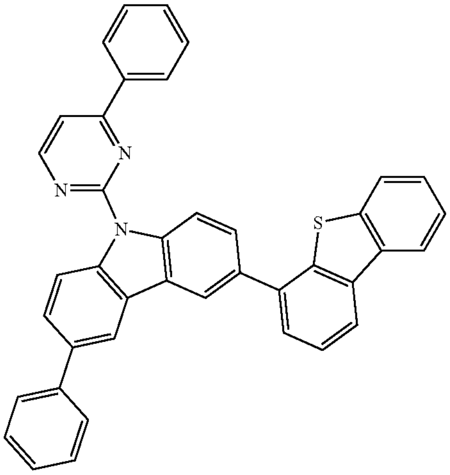

-continued
H-118
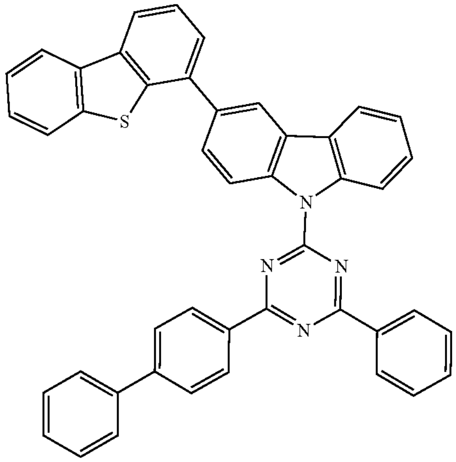
H-119
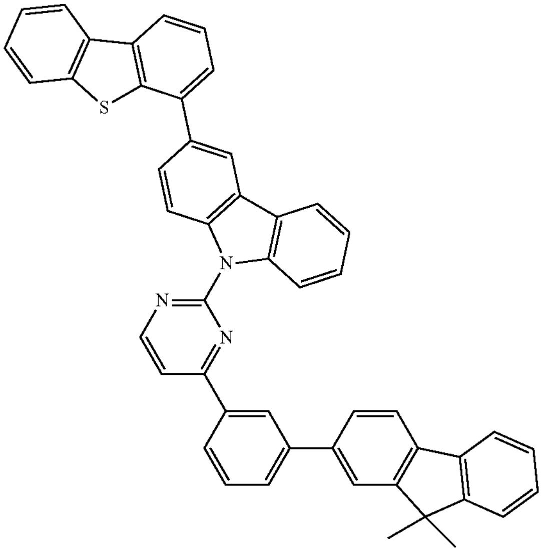
H-120
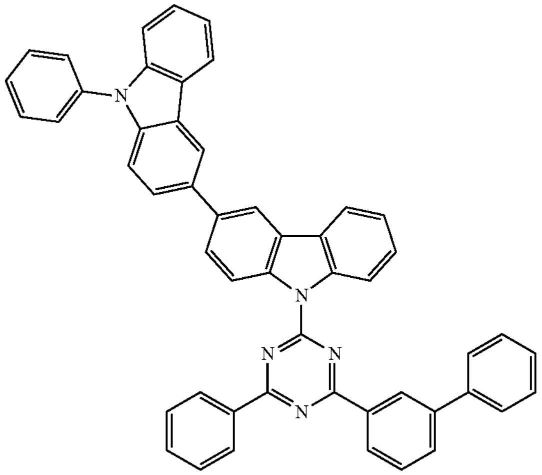
-continued
H-121
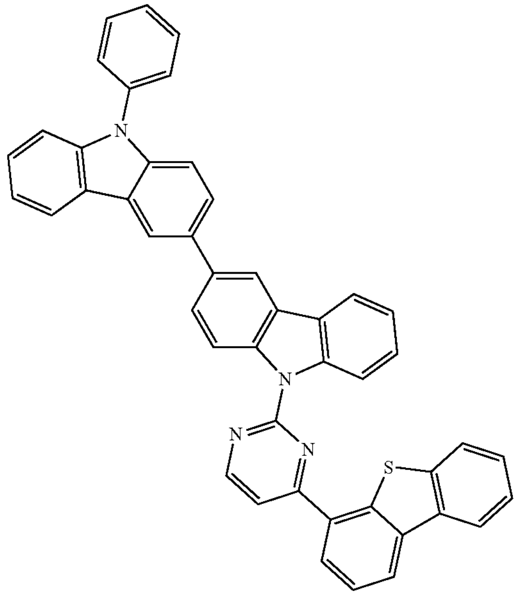
H-122
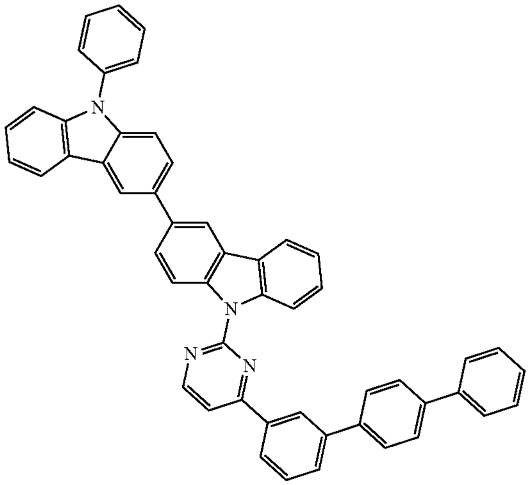

-continued
H-123
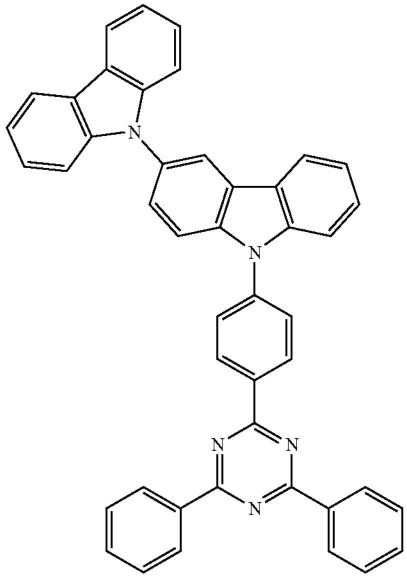
H-124
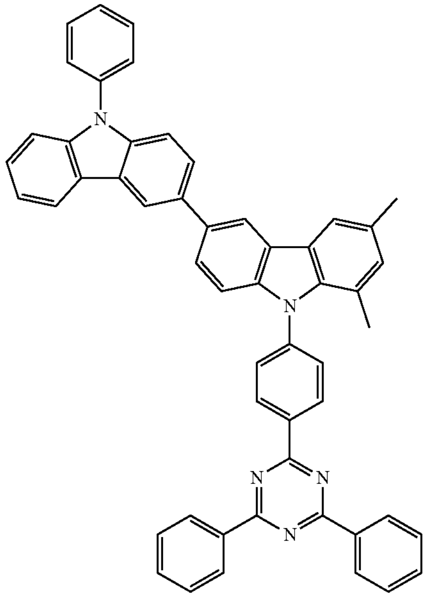
-continued
H-125
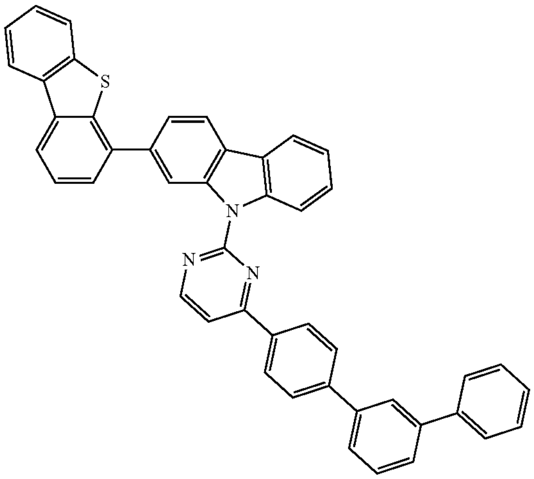
H-126
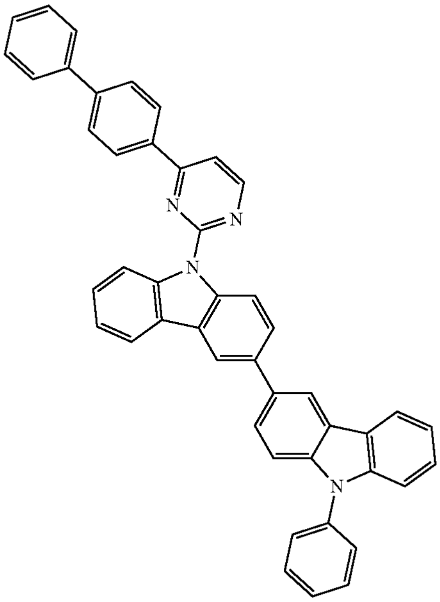

-continued
H-127
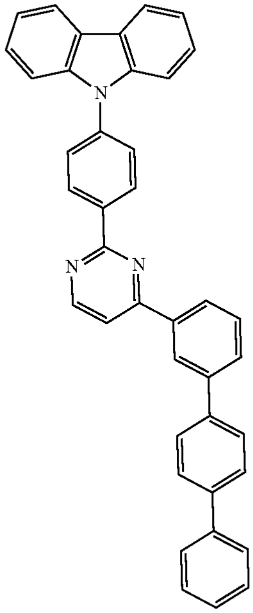
H-128
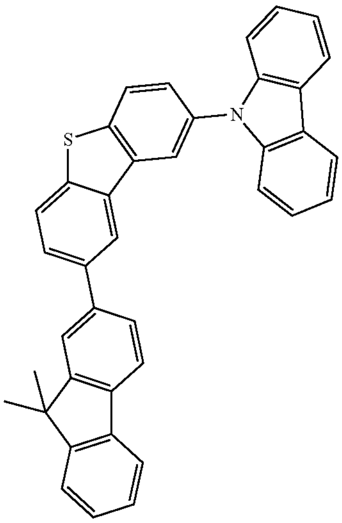
-continued
H-129
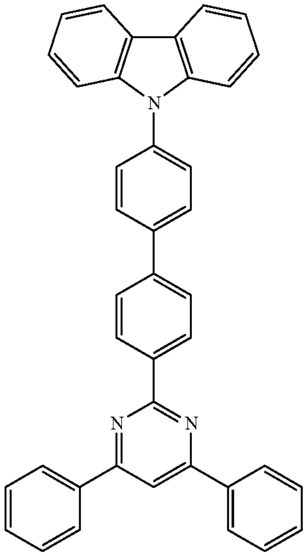
H-130
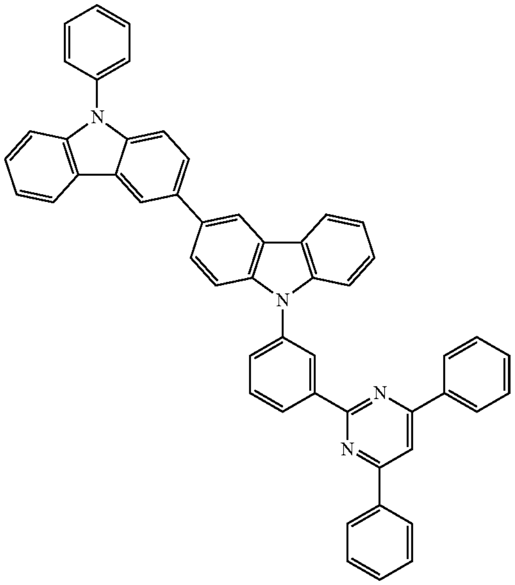

-continued
H-131
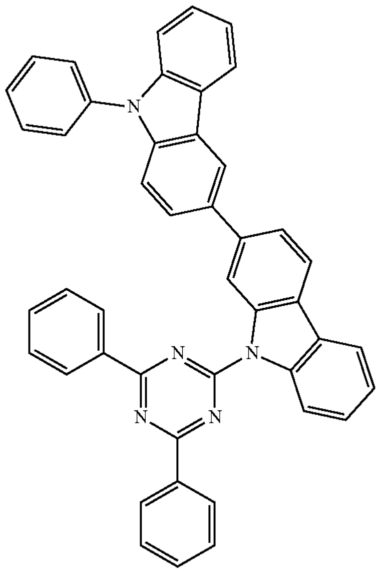
H-132
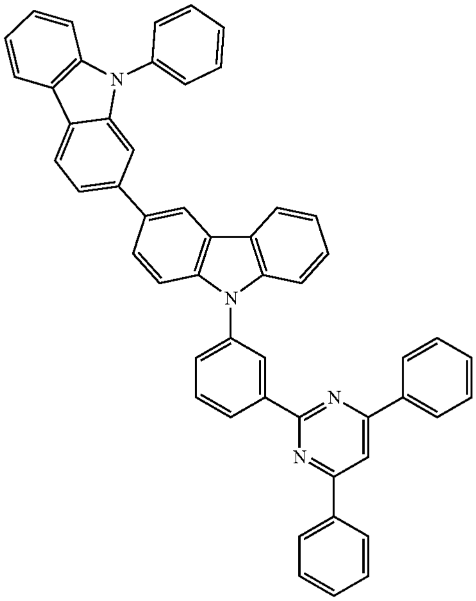
-continued
H-133
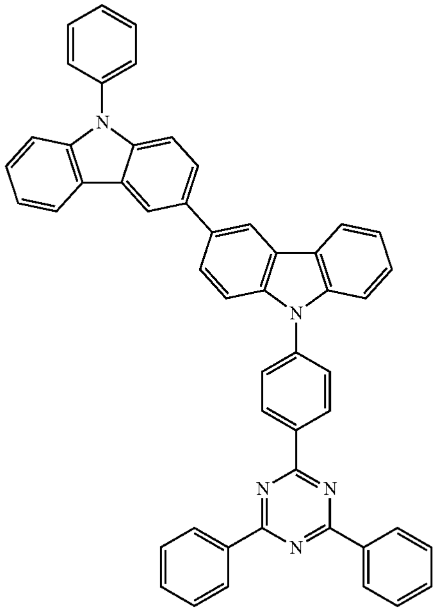
H-134
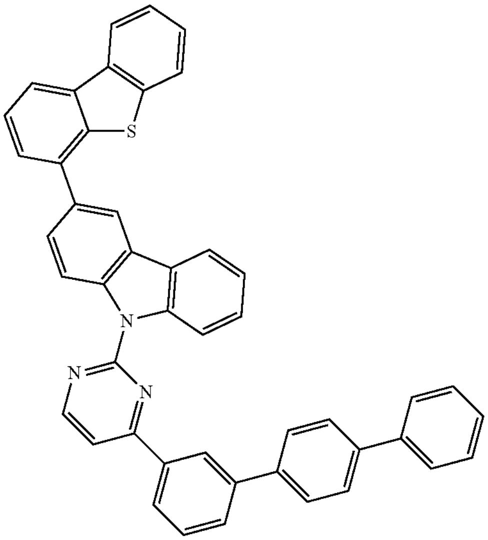

-continued
H-135
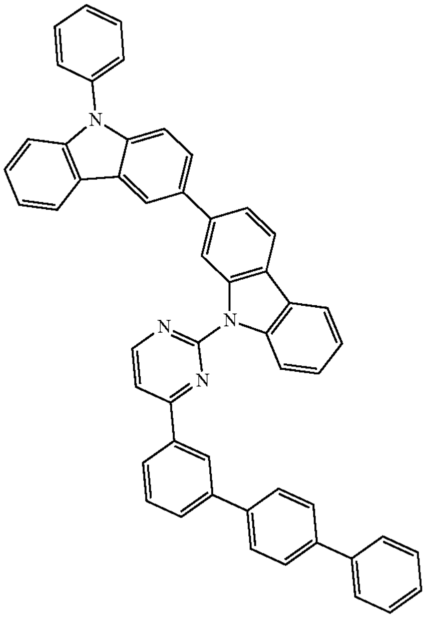
H-136
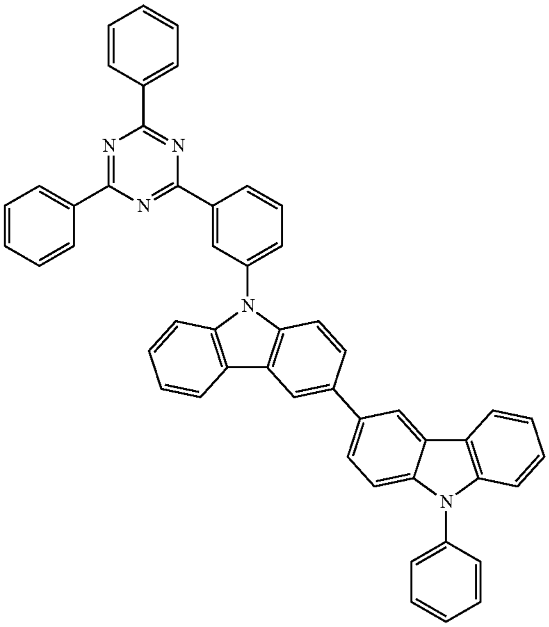
-continued
H-137
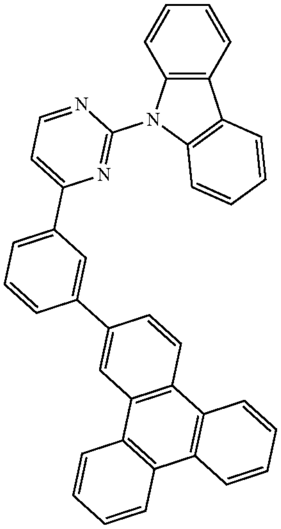
H-138
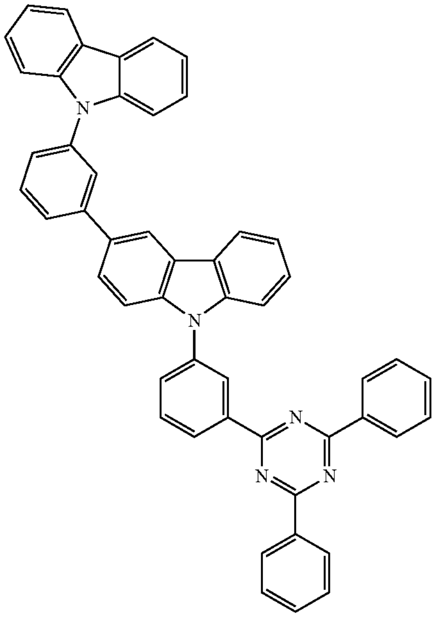

H-139
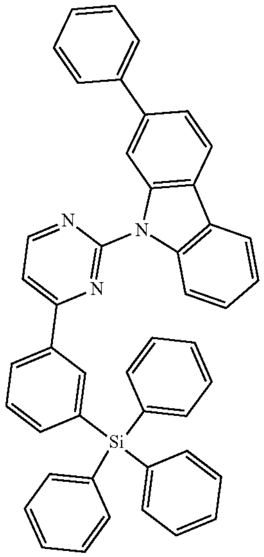
H-140
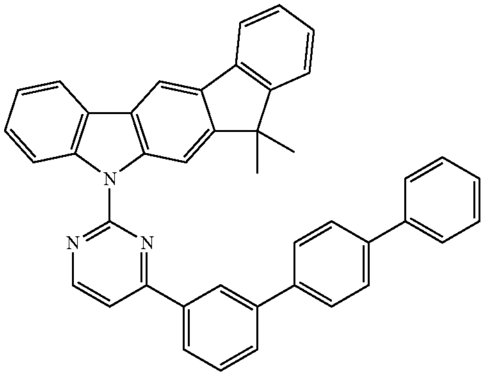
H-141
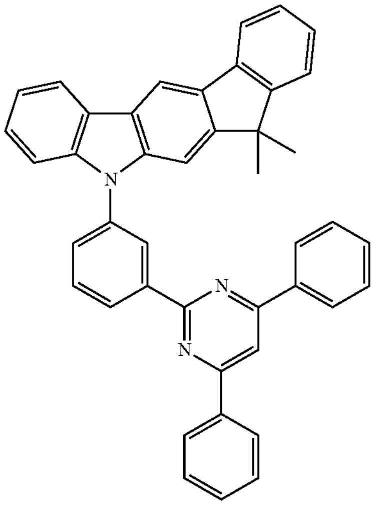
H-142
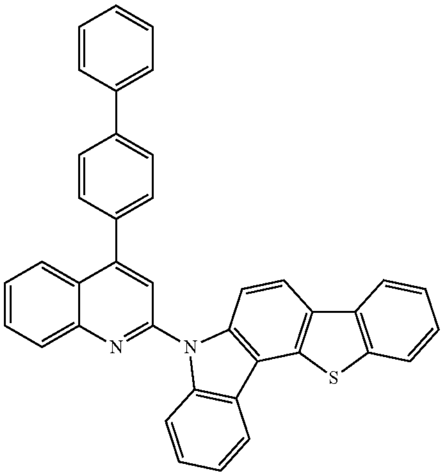
H-143
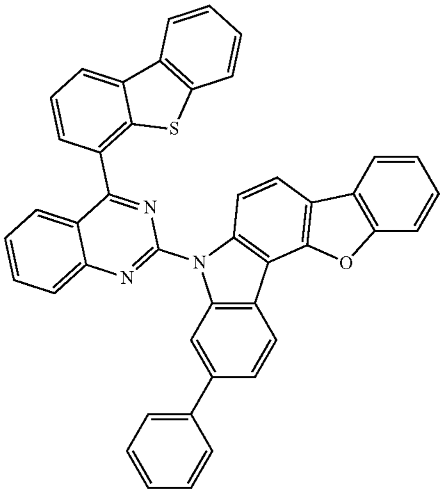
H-144
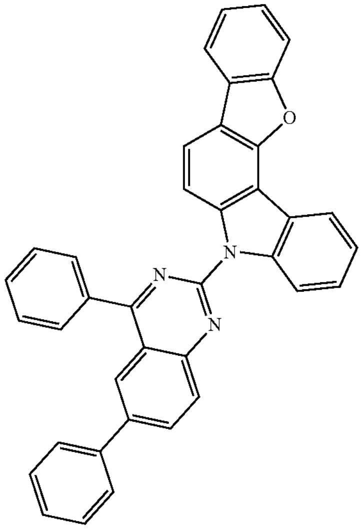

-continued
H-145
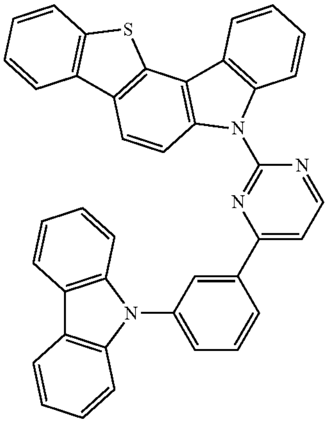
H-146
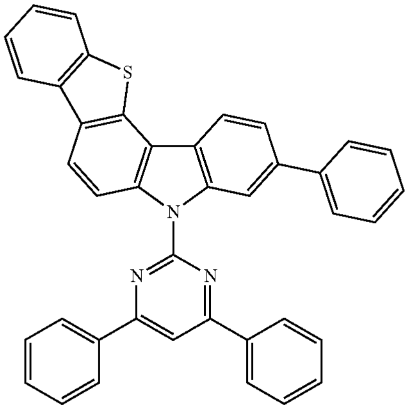
H-147
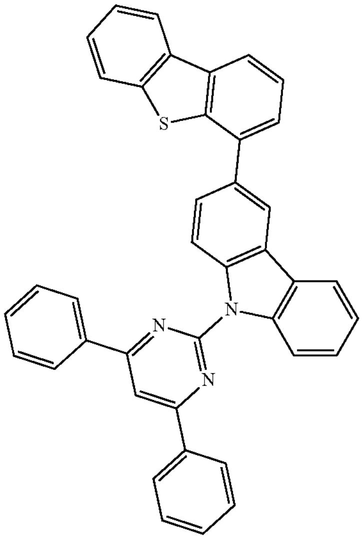
-continued
H-148
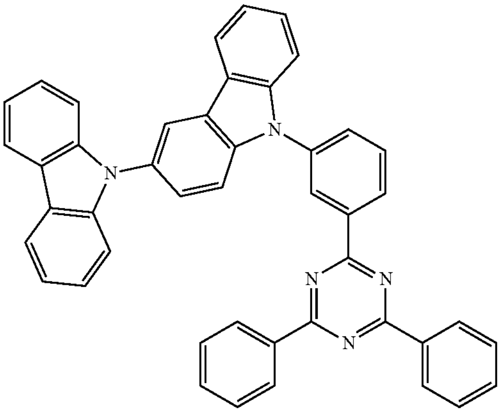
H-149
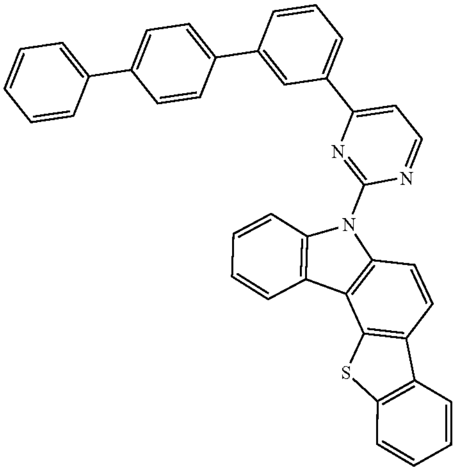
H-150
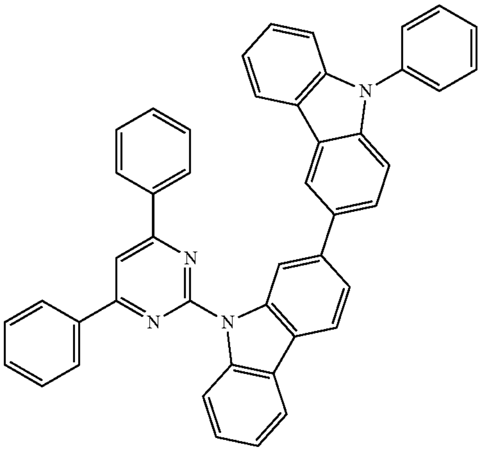

-continued
H-151
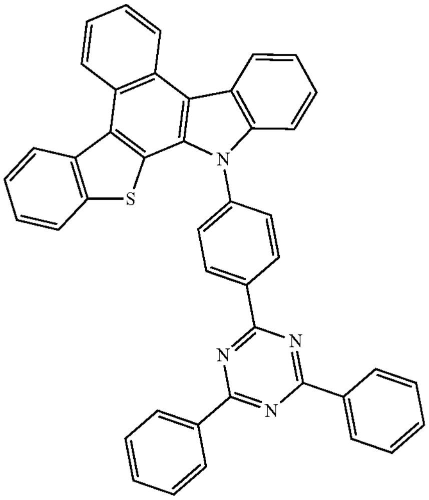
H-152
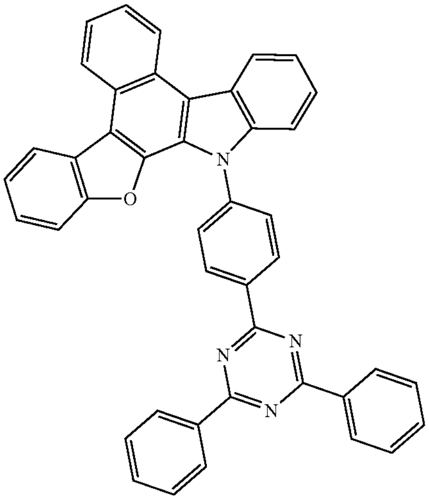
H-153
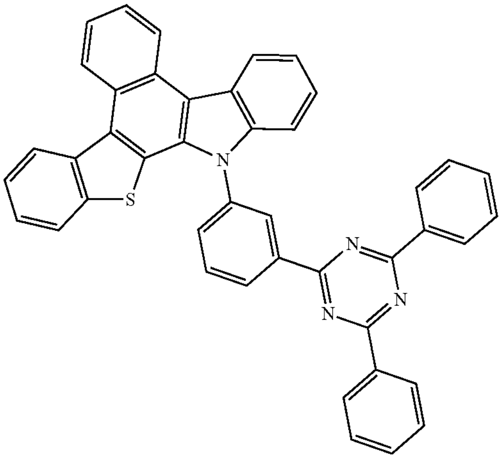
-continued
H-154
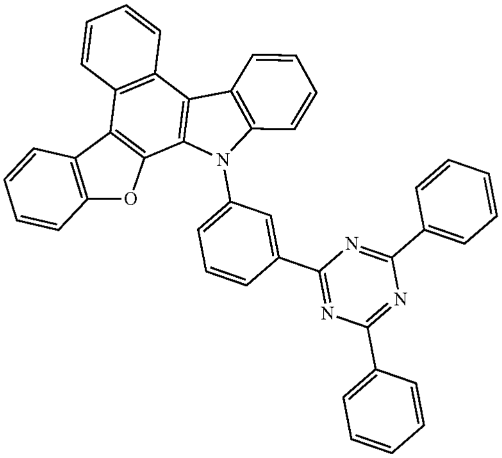
H-155
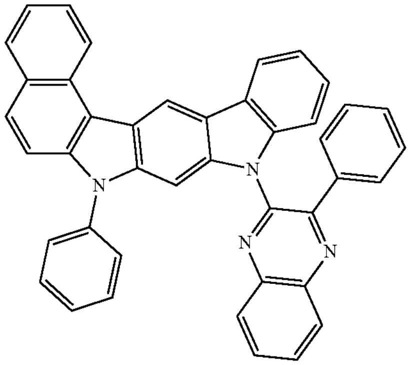
H-156
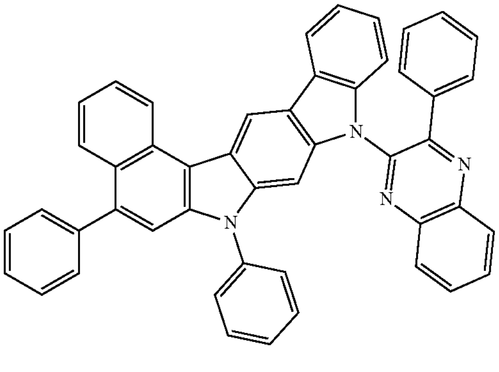
H-157
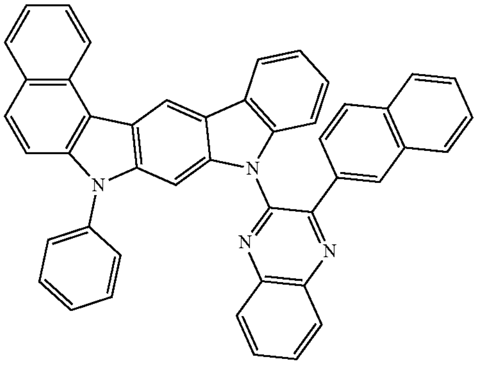

-continued
H-158
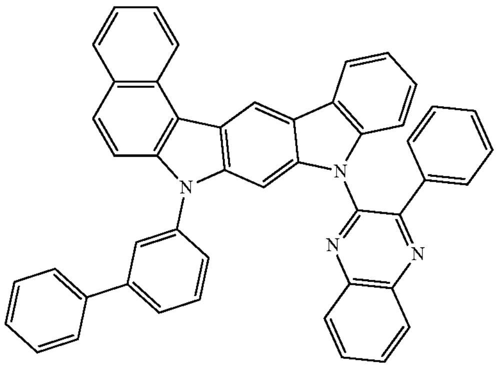
H-159
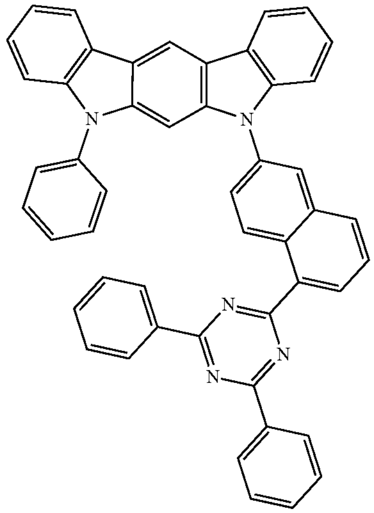
H-160
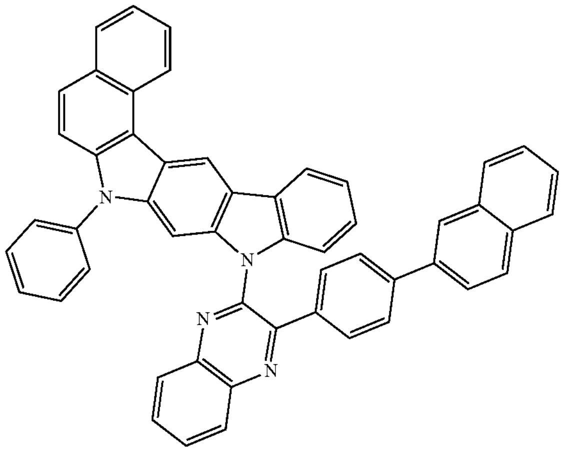
-continued
H-161
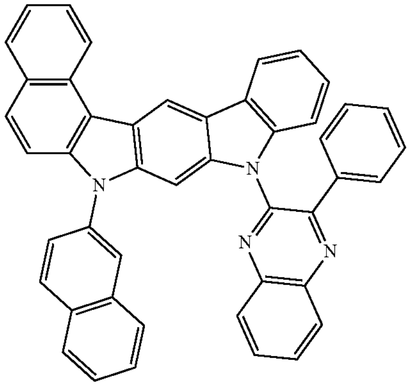
H-162
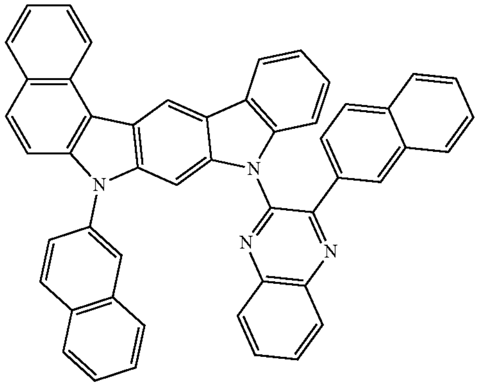
H-163
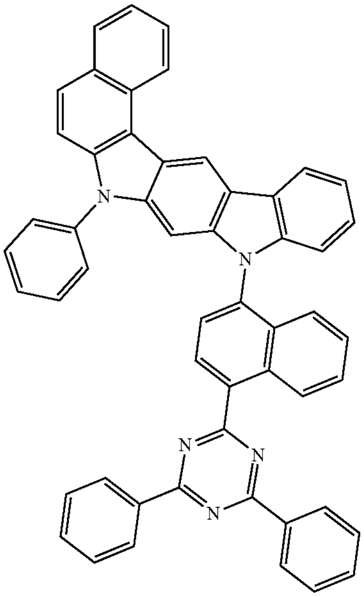

-continued
H-164
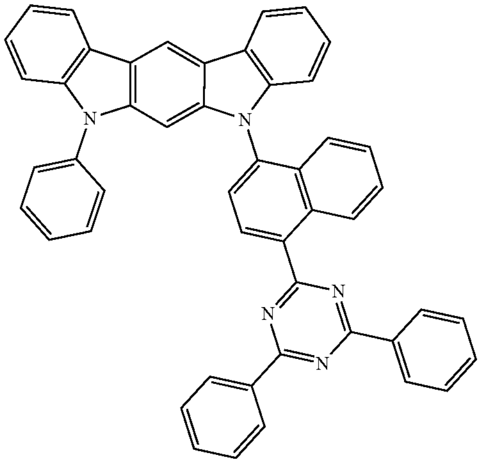
H-165
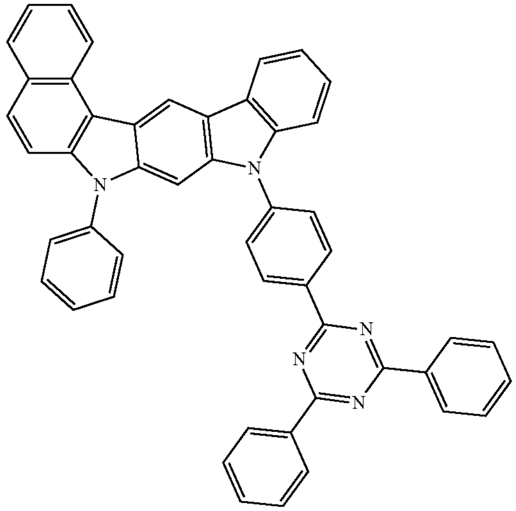
H-166
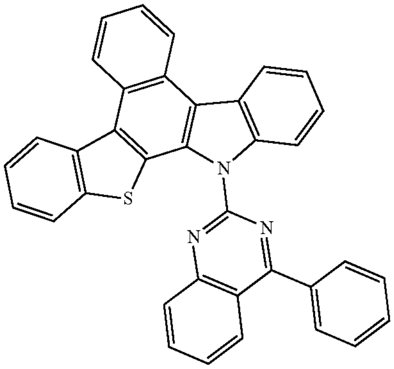
-continued
H-167
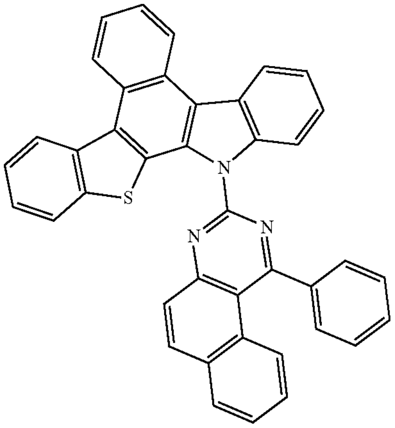
H-168
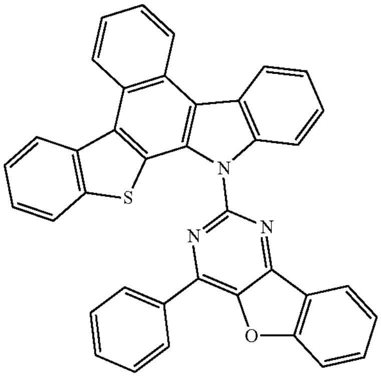
H-169
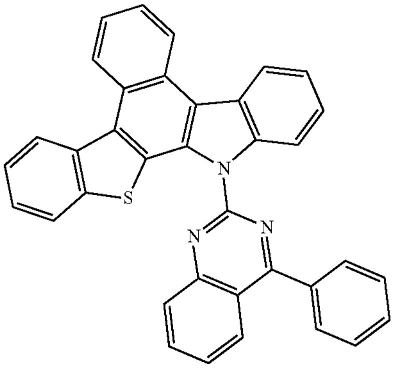
H-170
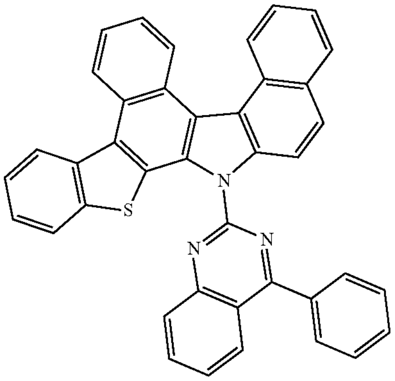

-continued
H-171
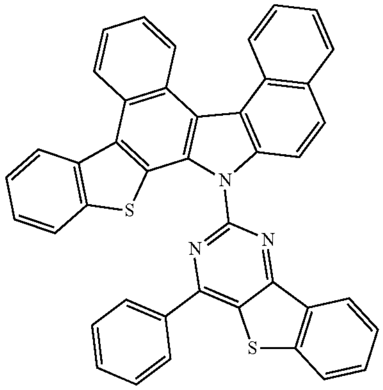
H-172
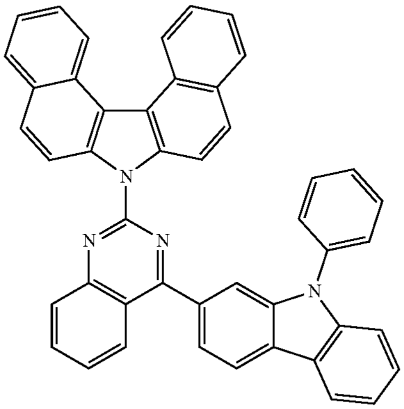
H-173
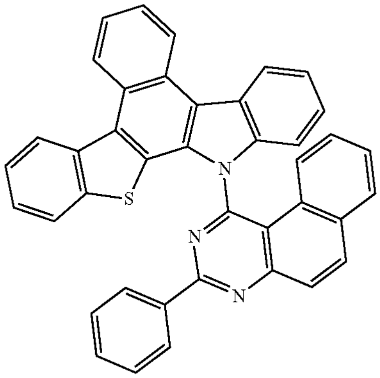
H-174
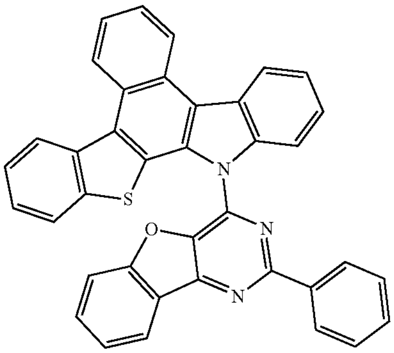
-continued
H-175
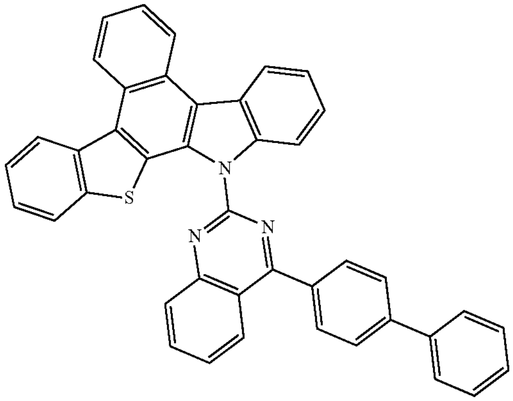
H-176
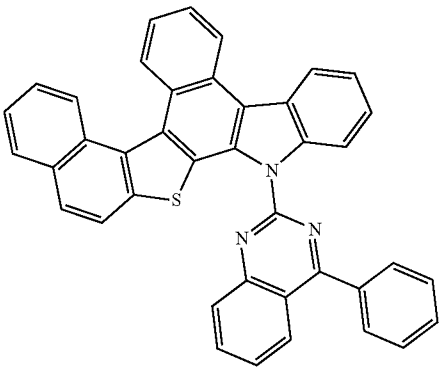
H-177
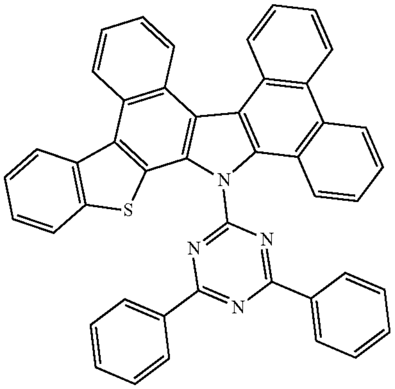
H-178
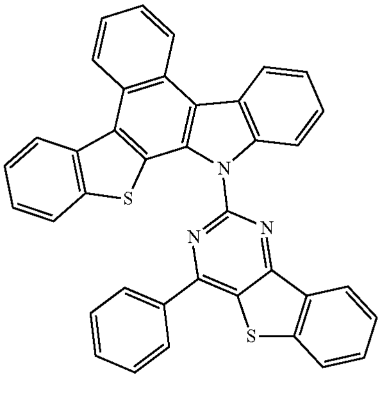

H-179
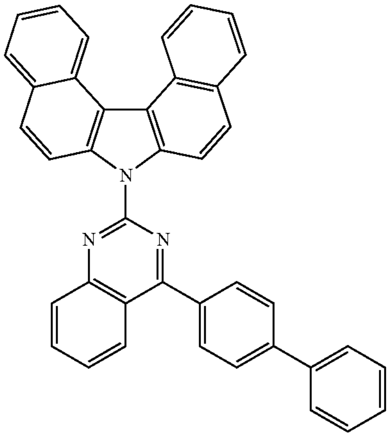
H-180
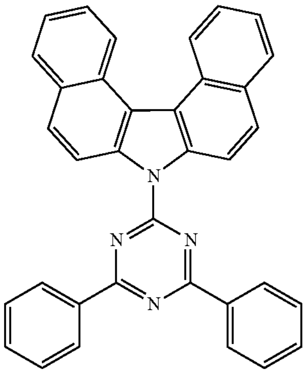
H-181
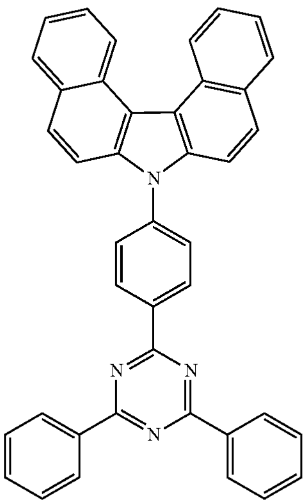
H-182
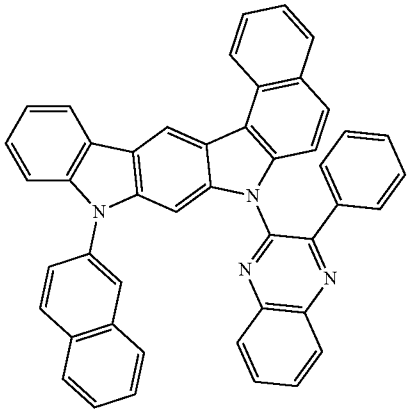
H-183
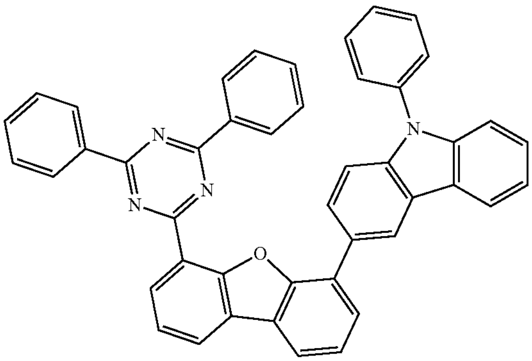
H-184
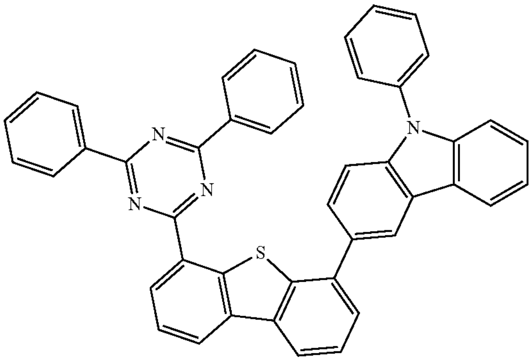

H-185
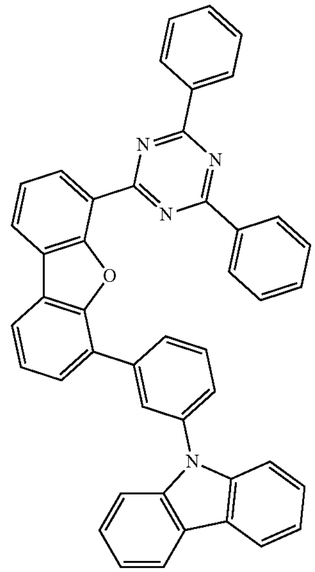
H-186
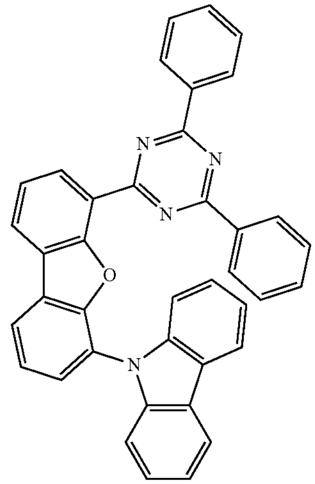
H-187
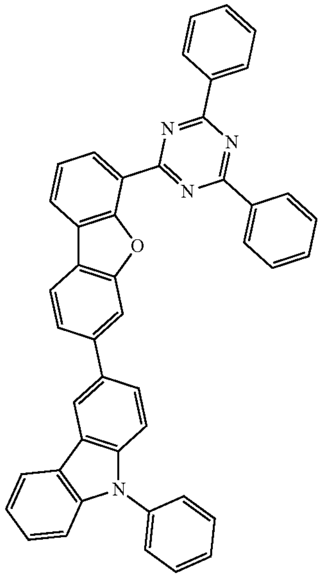
H-188
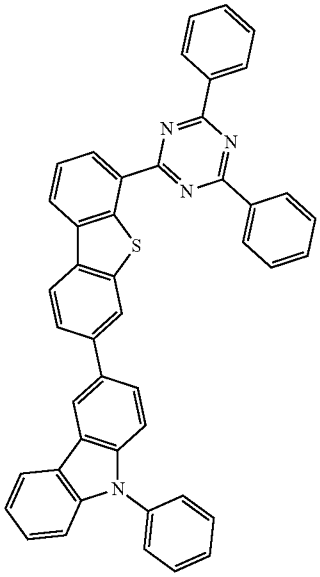
H-189
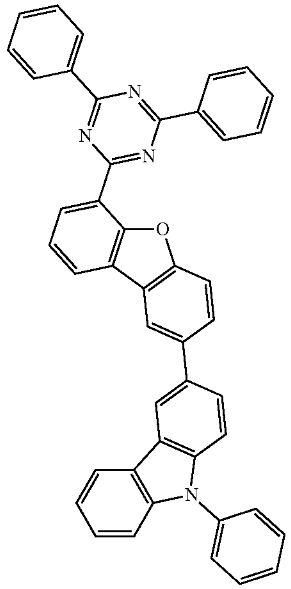

-continued
H-190
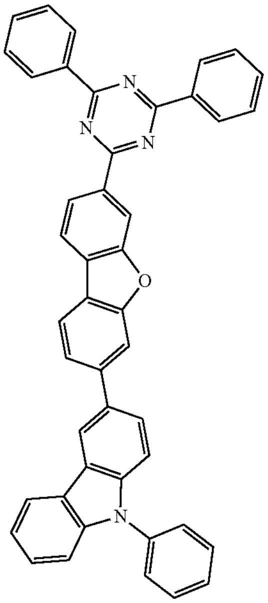
H-191
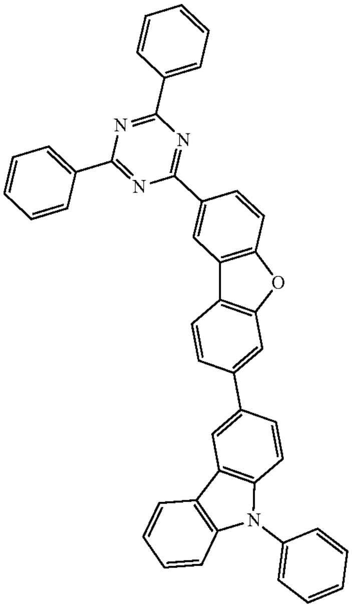
-continued
H-192
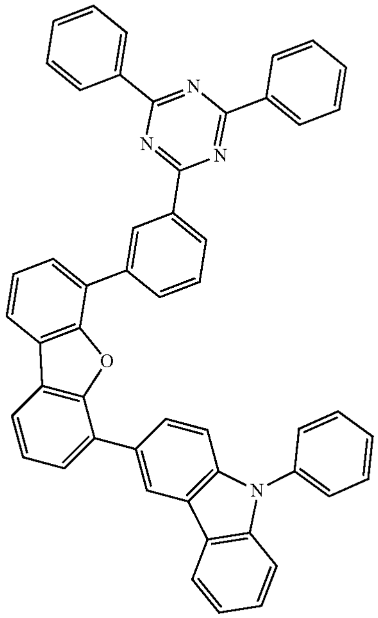
H-193
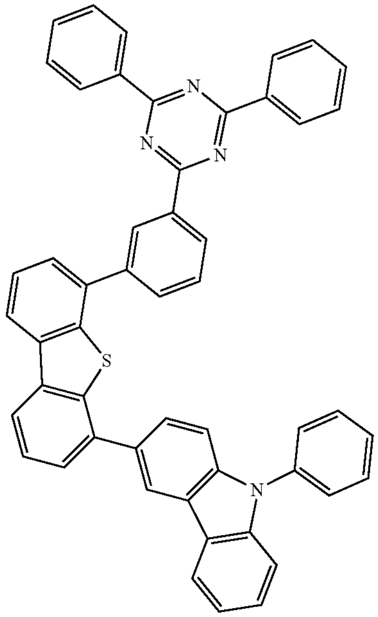

-continued
H-194
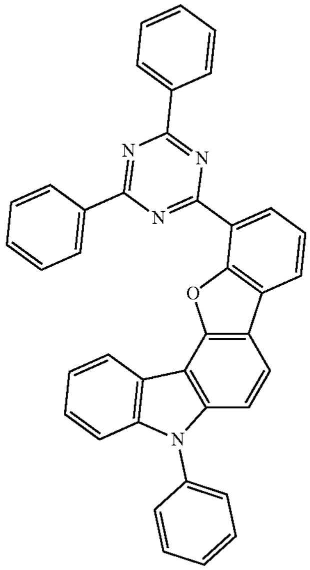
H-195
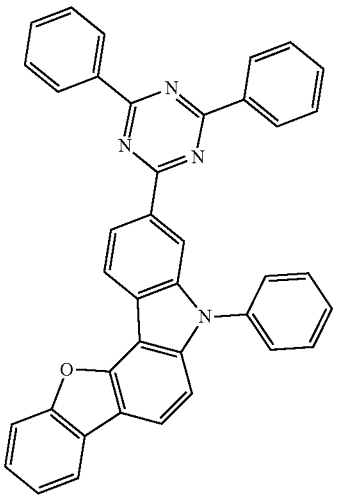
-continued
H-196
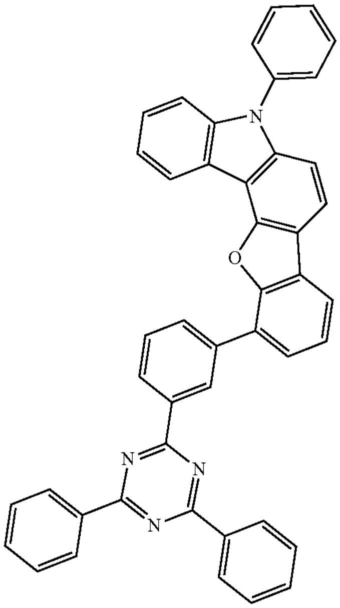
H-197
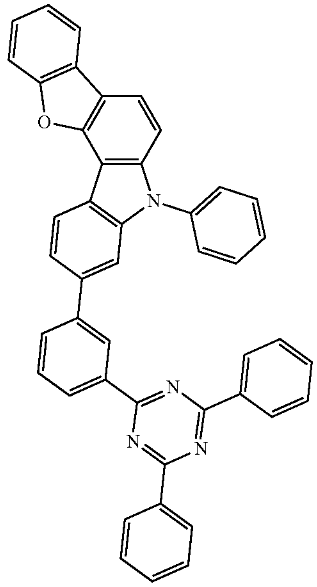

-continued
H-198
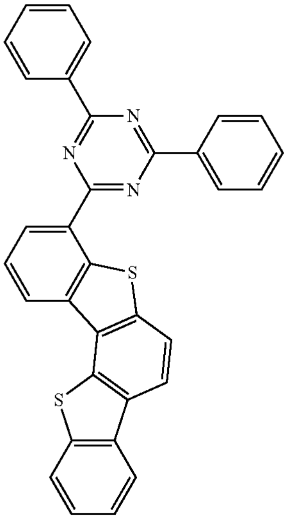
H-199
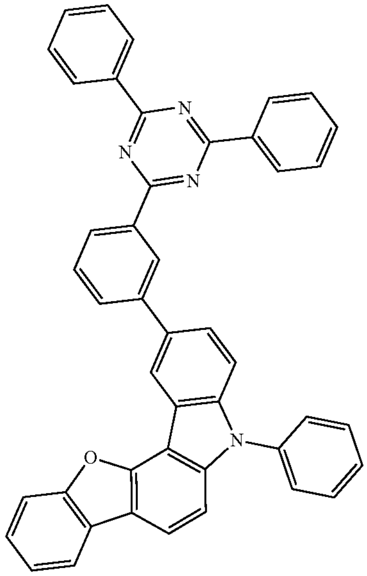
-continued
H-200
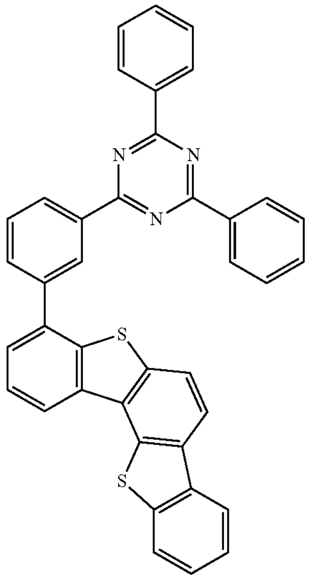
H-201
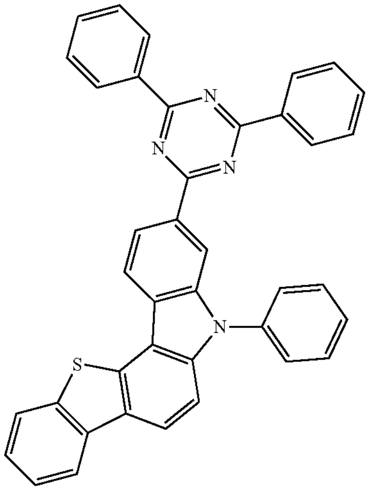
H-202
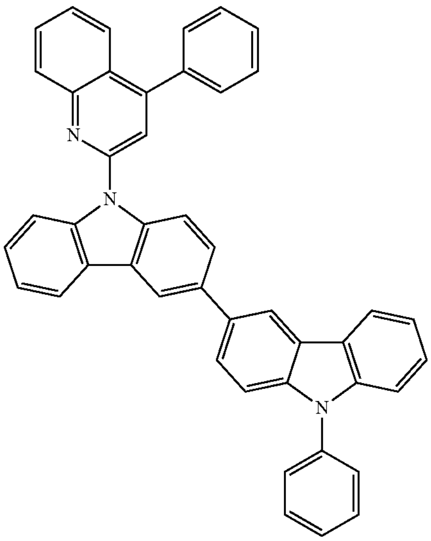

-continued
H-203
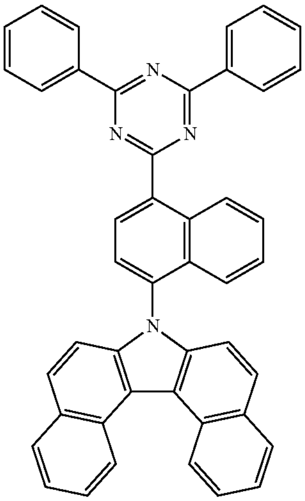
H-204
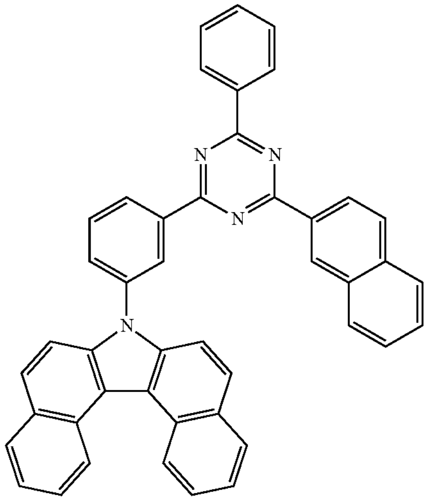
H-205
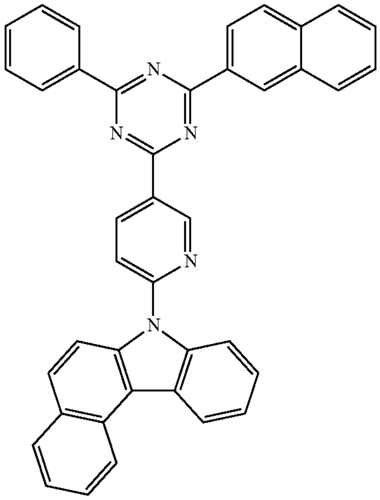
-continued
H-206
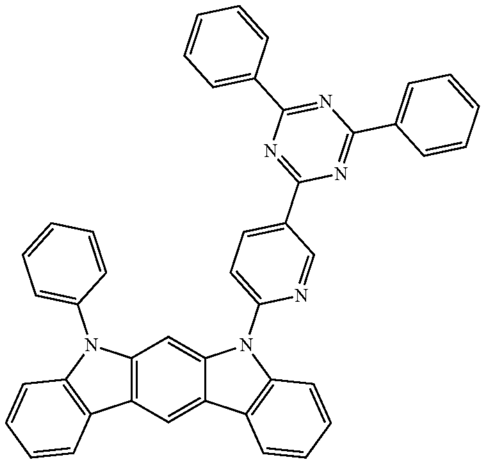
H-207
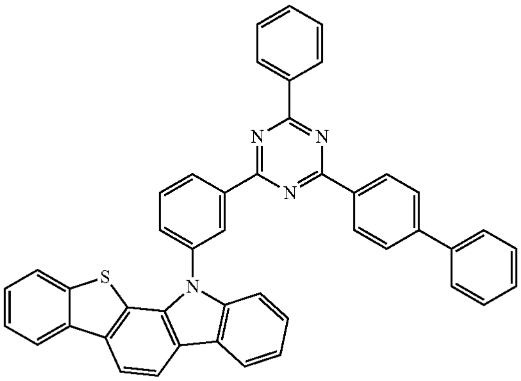
H-208
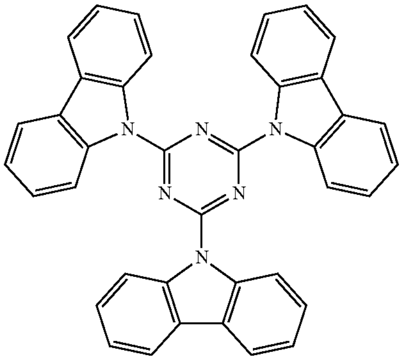

-continued

H-209

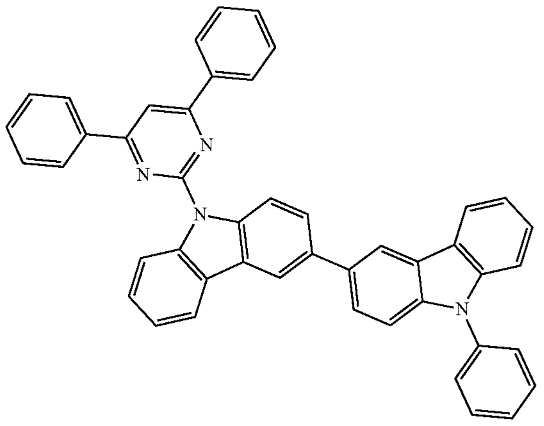

H-210

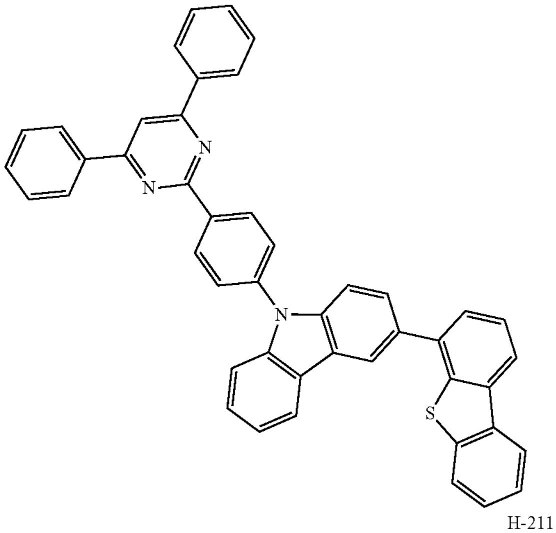

H-211

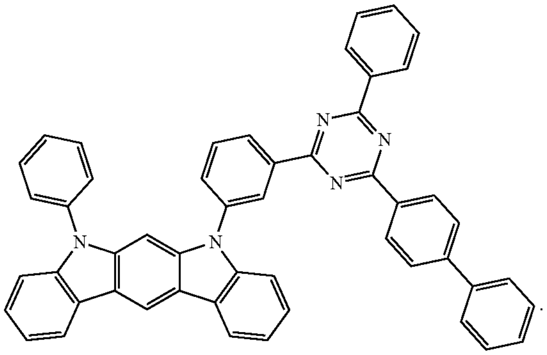

[Wherein, TPS represents a triphenylsiyl group]

The dopant comprised in the organic electroluminescent device of the present disclosure may be at least one phosphorescent or fluorescent dopant, preferably phosphorescent may be the phosphorescent dopant material applied to the organic electroluminescent device of the present disclosure and is not particularly limited, but may be preferably a metallated complex compound(s) of a metal atom(s) selected from iridium (Ir), osmium (Os), copper (Cu), and platinum (Pt), more preferably an ortho-metallated complex compound(s) of a metal atom(s) selected from iridium (Ir), osmium (Os), copper (Cu), and platinum (Pt), and even more preferably an ortho-metallated iridium complex compound(s).

The dopant comprised in the organic electroluminescent device of the present disclosure may use the compound represented by the following formula 101, but is not limited thereto:

(101)

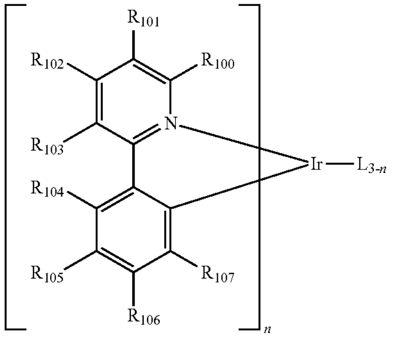

In formula 101, wherein, L is selected from the following structure 1 or 2:

structure (1)

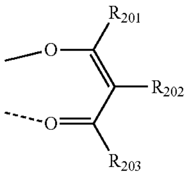

structure (2)

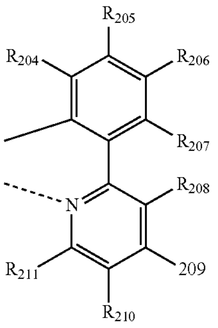

$R_{100}$ to $R_{103}$ each independently represent hydrogen, deuterium, halogen, halogen-substituted or unsubstituted (C1-C30)alkyl, a substituted or unsubstituted (C3-C30) cycloalkyl, a substituted or unsubstituted (C6-C30)aryl, cyano, a substituted or unsubstituted (3- to 30-membered)heteroaryl, or a substituted or unsubstituted (C1-C30)alkoxy; or $R_{100}$ to $R_{103}$ may be linked to adjacent substituents to form a substituted or unsubstituted fused ring, e.g., a substituted or unsubstituted quinoline, a substituted or unsubstituted isoquinoline, a substituted or unsubstituted benzofuropyridine, a substituted or unsubstituted benzothienopyridine, a substituted or unsubstituted indenopyridine, a substituted or unsubstituted benzofuroquinoline, a substituted or unsubstituted benzothienoquinoline, or a substituted or unsubstituted indenoquinoline;

$R_{104}$ to $R_{107}$ each independently represent hydrogen, deuterium, halogen, halogen-substituted or unsubstituted (C1-C30)alkyl, a substituted or unsubstituted (C3-C30) cycloalkyl, a substituted or unsubstituted (C6-C30)aryl, a substituted or unsubstituted (3- to 30-membered) heteroaryl, cyano, or a substituted or unsubstituted (C1-C30)alkoxy; or $R_{104}$ to $R_{107}$ may be linked to adjacent substituents to form a substituted or unsubstituted fused ring with benzene, e.g., a substituted or unsubstituted naphthyl, a substituted or unsubstituted fluorene, a substituted or unsubstituted dibenzothiophene, a substituted or unsubstituted dibenzofuran, a substituted or unsubstituted indenopyridine, a substituted or unsubstituted benzofuropyridine, or a substituted or unsubstituted benzothienopyridine;

$R_{201}$ to $R_{211}$ each independently represent hydrogen, deuterium, halogen, halogen-substituted or unsubstituted (C1-C30)alkyl, a substituted or unsubstituted (C3-C30) cycloalkyl, or a substituted or unsubstituted (C6-C30) aryl; or $R_{201}$ to $R_{211}$ may be linked to adjacent substituents to form a substituted or unsubstituted fused ring; and n represents an integer of 1 to 3.

The specific examples of the dopant compound include the following, but is not limited thereto:

D-1

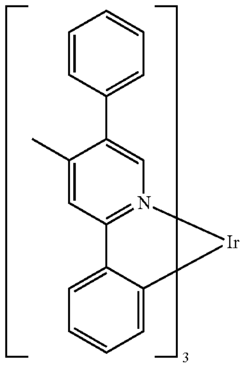

D-2

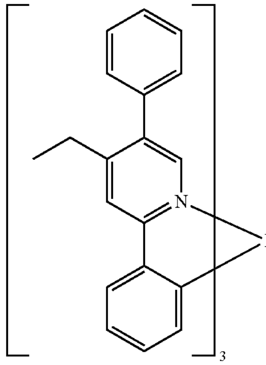

-continued

D-3

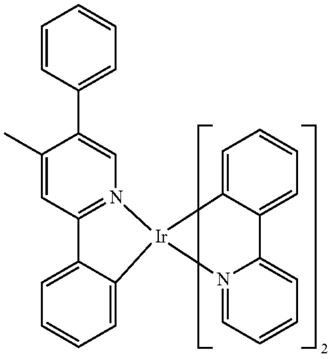

D-4

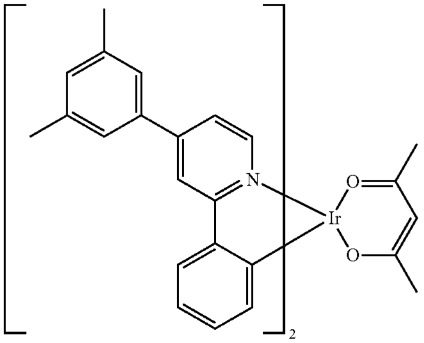

D-5

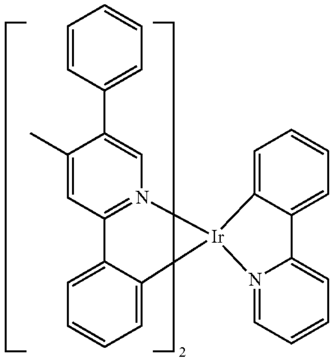

D-6

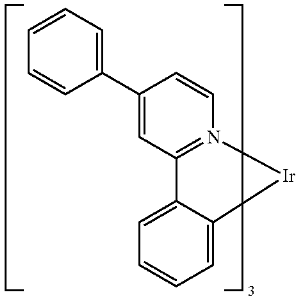

D-7
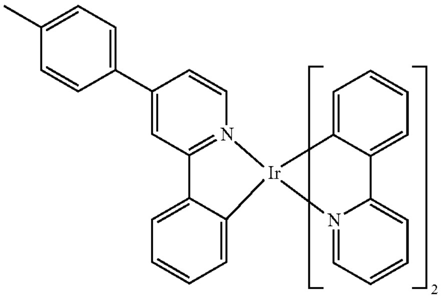
D-8
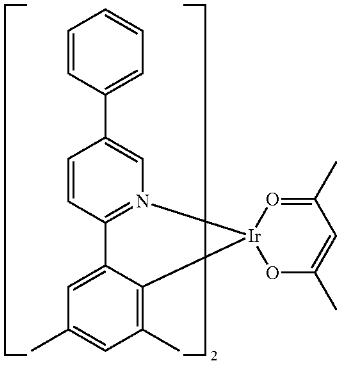
D-9
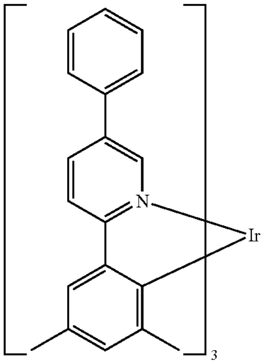
D-10
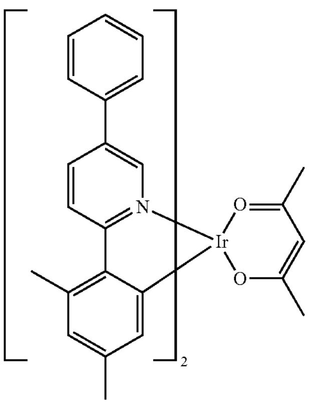
D-11
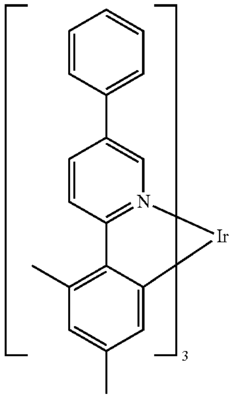
D-12
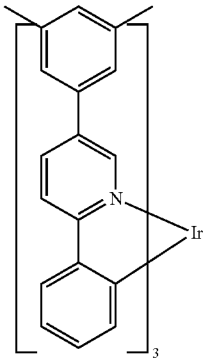
D-13
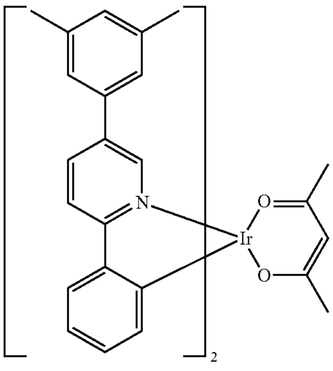
D-14
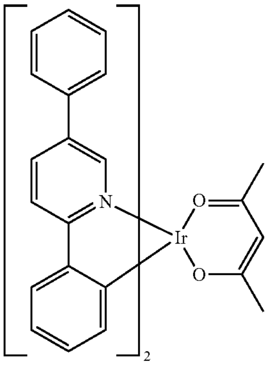

-continued
D-15
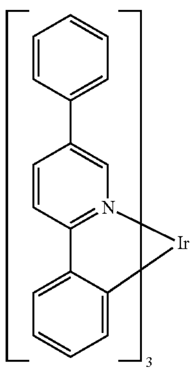
D-16
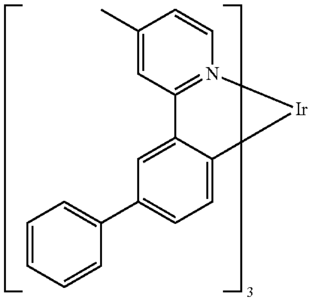
D-17
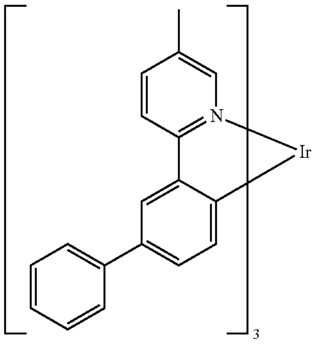
D-18
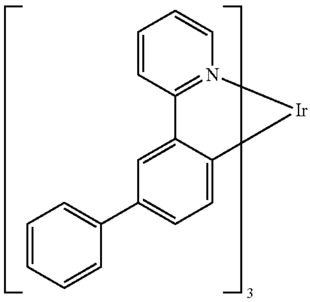
-continued
D-19
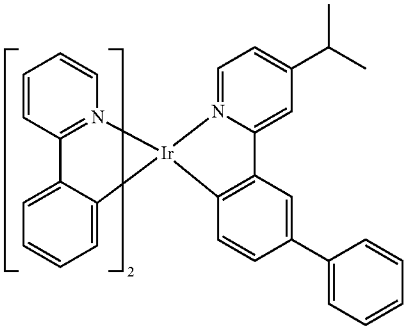
D-20
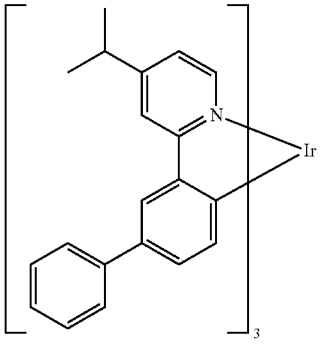
D-21
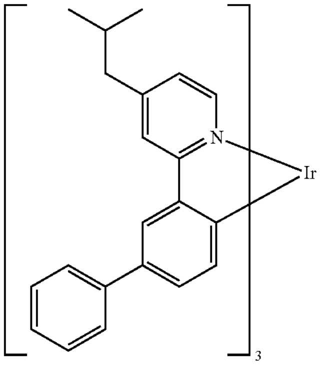
D-22
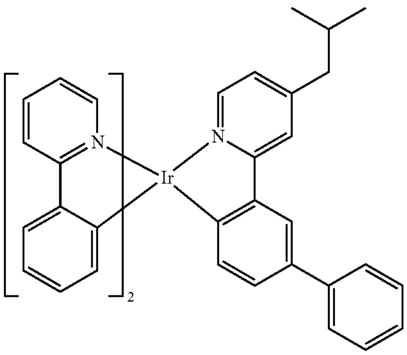

-continued
D-23
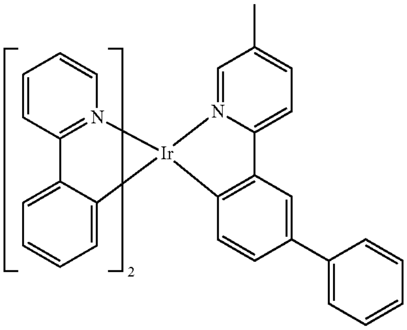
D-24
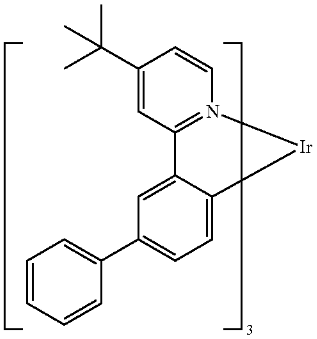
D-25
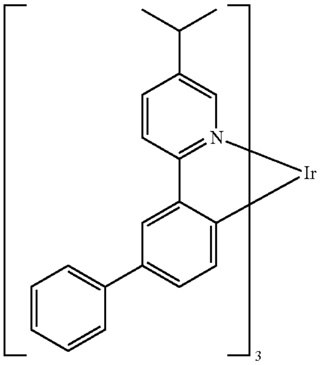
D-26
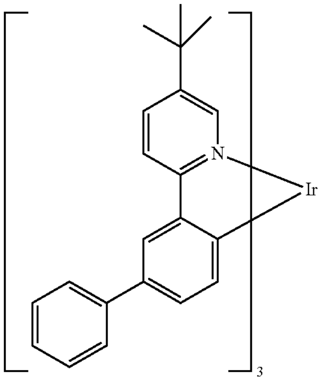
-continued
D-27
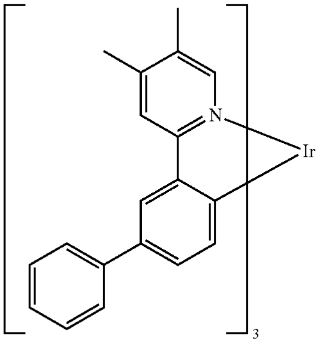
D-28
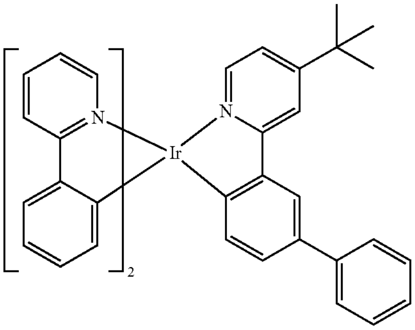
D-29
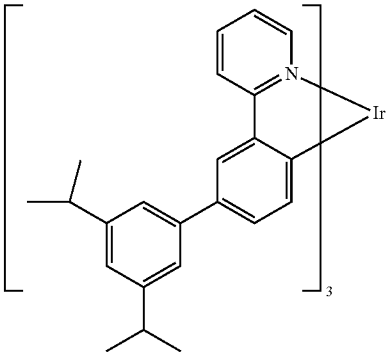
D-30
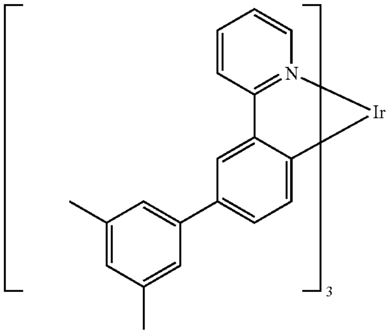

D-31
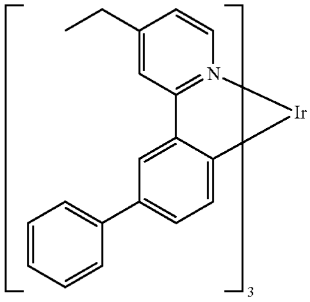
D-32
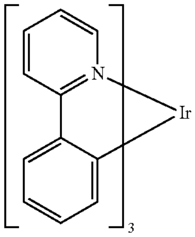
D-33
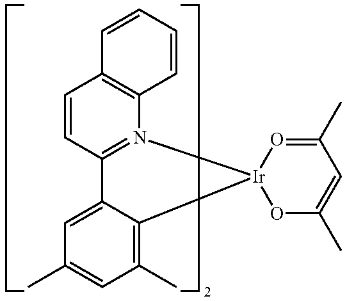
D-34
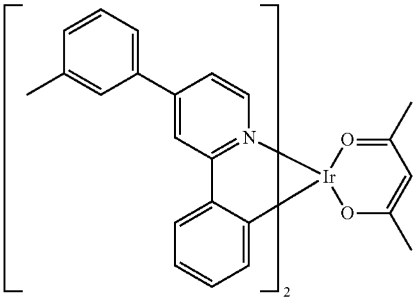
D-35
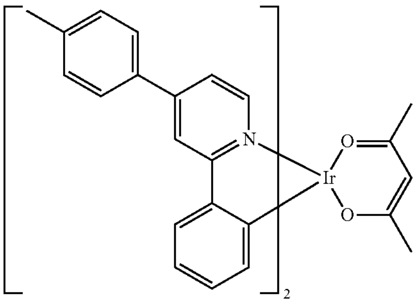
D-36
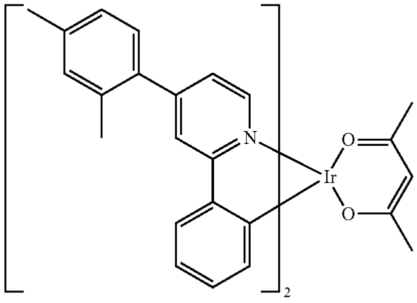
D-37
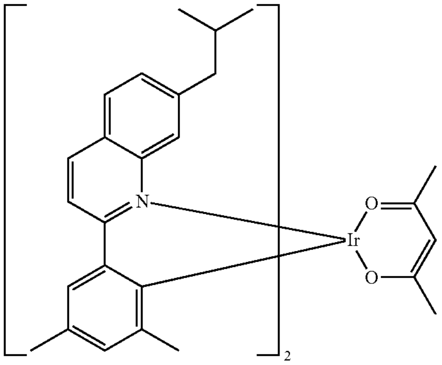
D-38
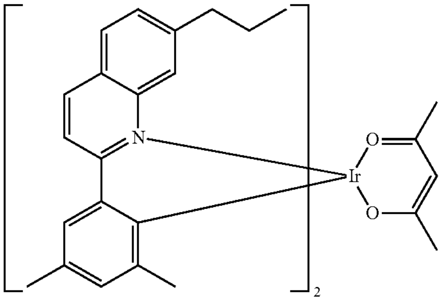
D-39
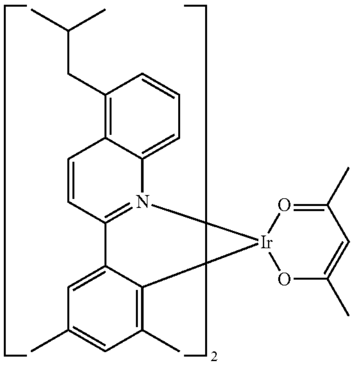

-continued
D-40
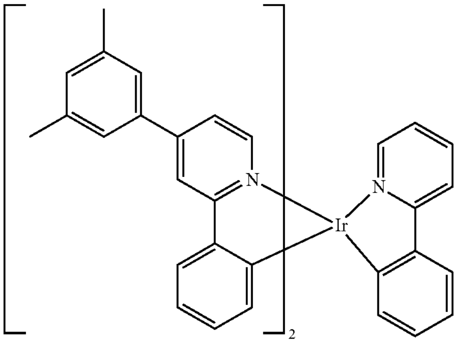
D-41
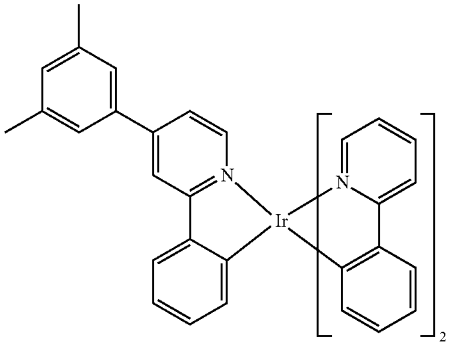
D-42
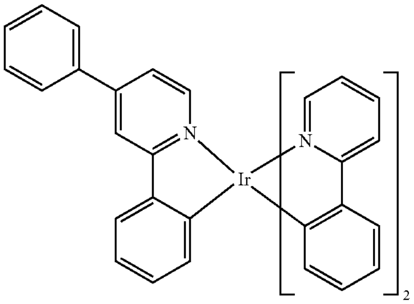
D-43
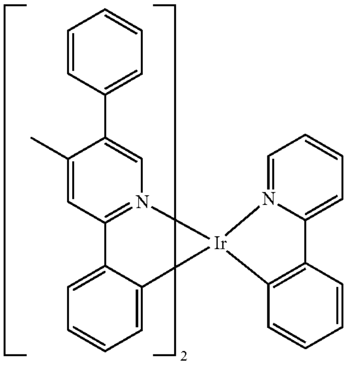
-continued
D-44
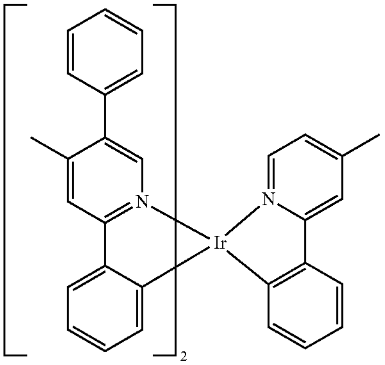
D-45
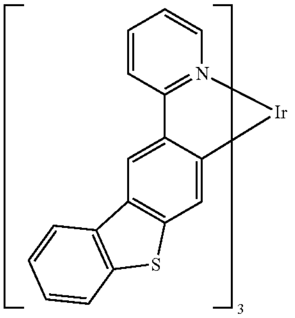
D-46
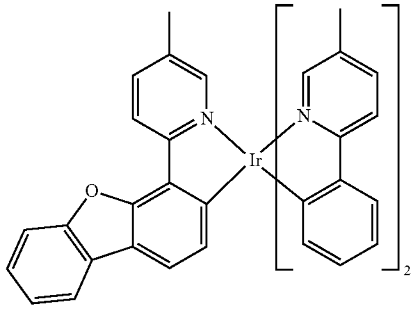
D-47
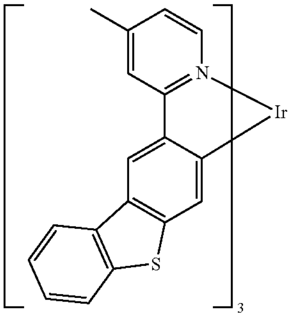
D-48
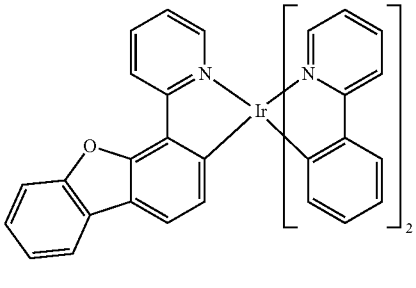

-continued
D-49
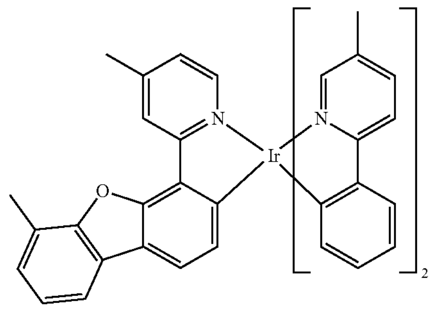
D-50
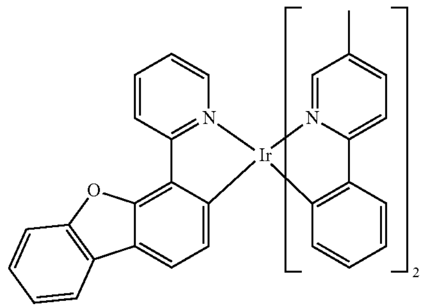
D-51
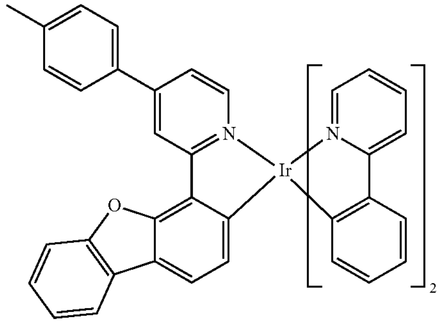
D-52
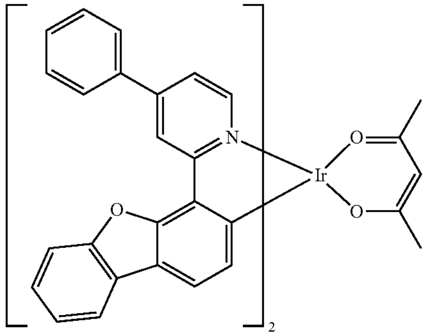
D-53
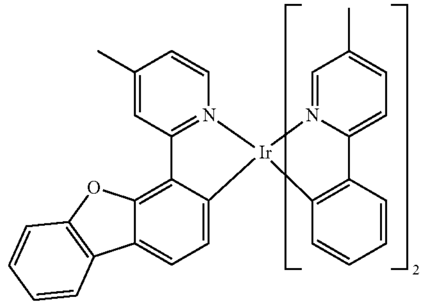
-continued
D-54
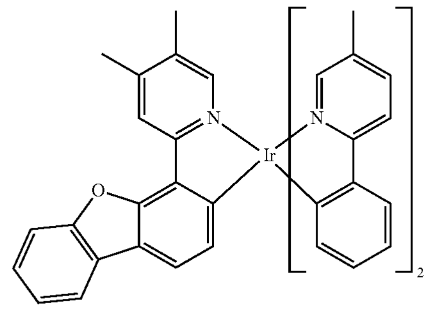
D-55
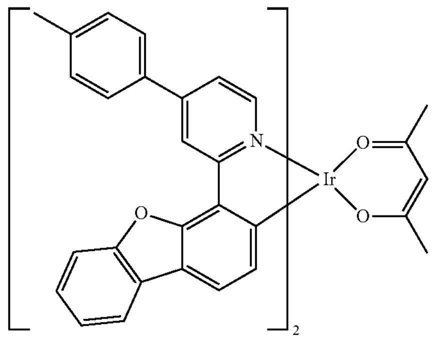
D-56
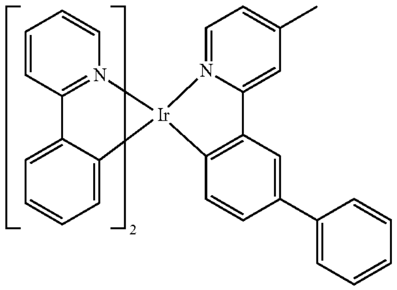
D-57
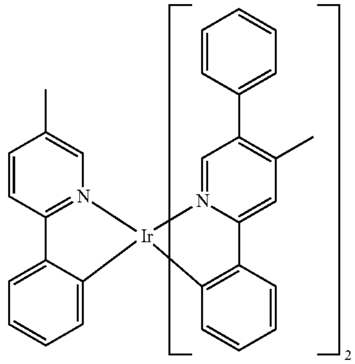

-continued
D-58
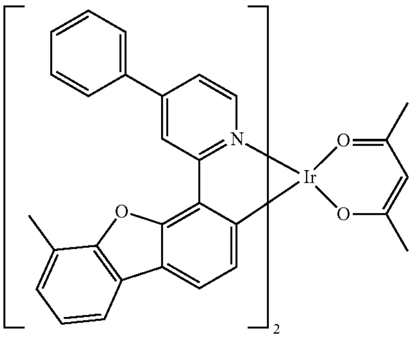
D-59
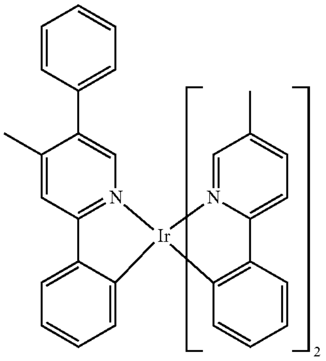
D-60
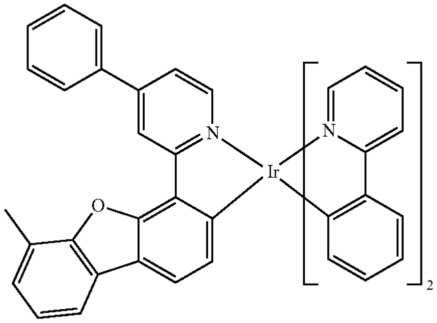
D-61
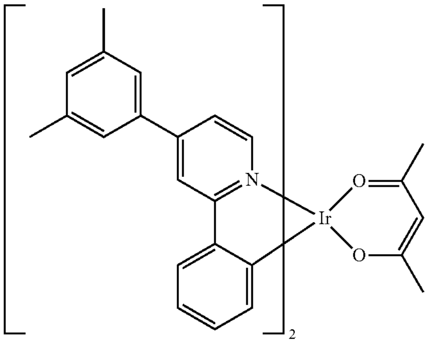
-continued
D-62
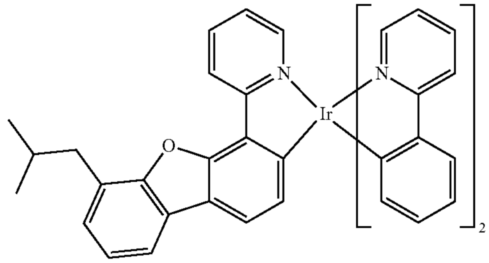
D-63
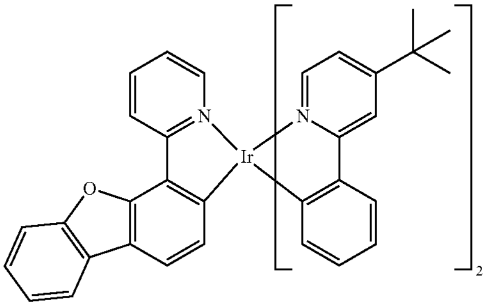
D-64
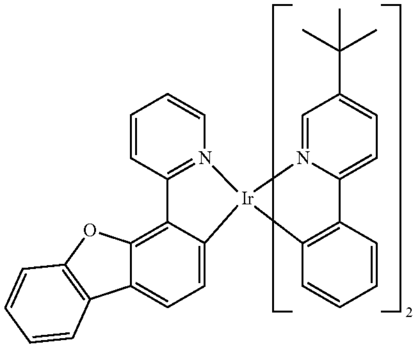
D-65
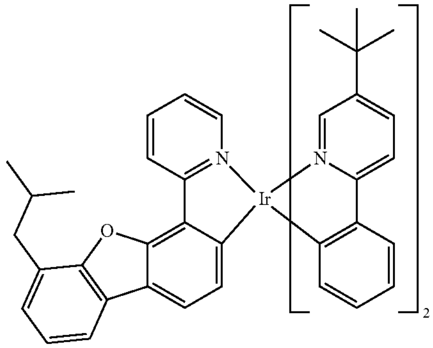
D-66
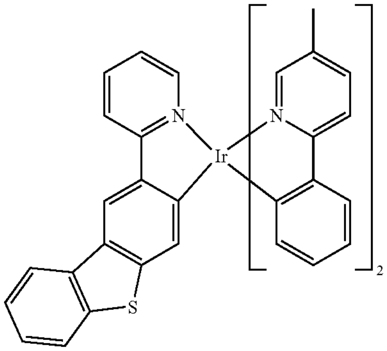

-continued
D-67
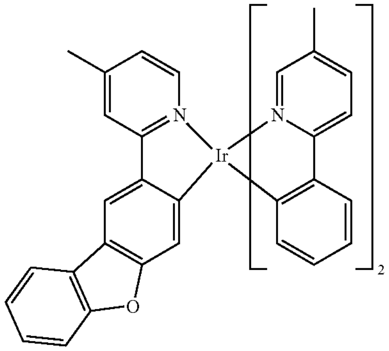
D-68
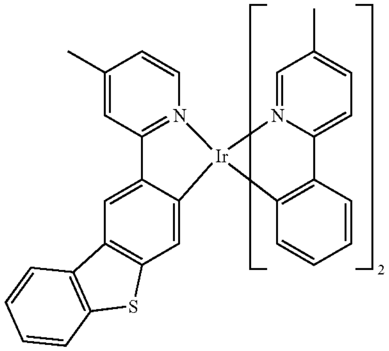
D-69
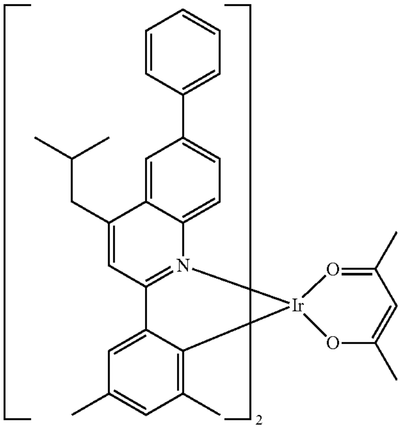
D-70
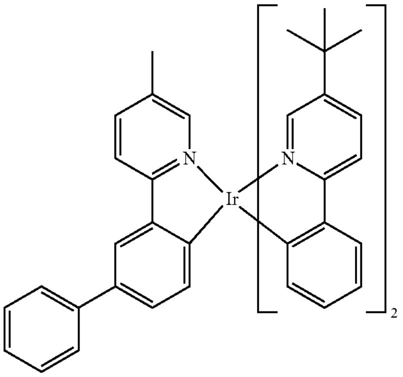
-continued
D-71
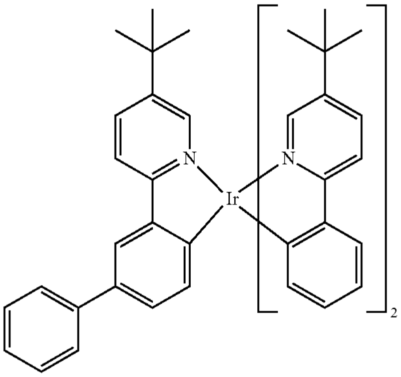
D-72
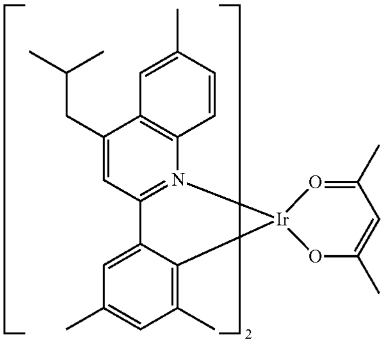
D-73
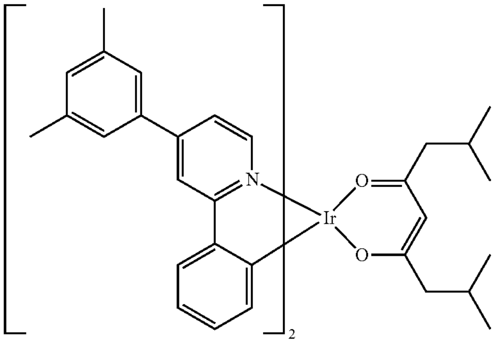
D-74
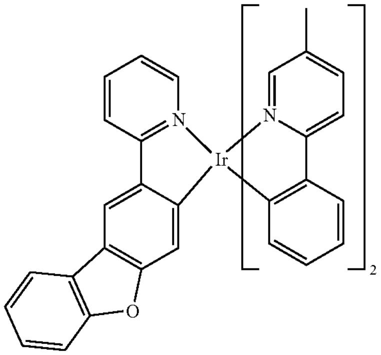

-continued
D-75
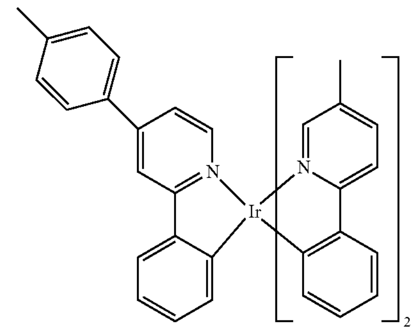
D-76
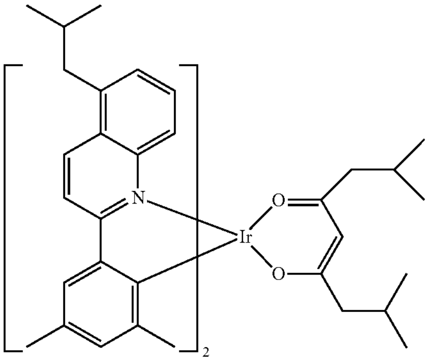
D-77
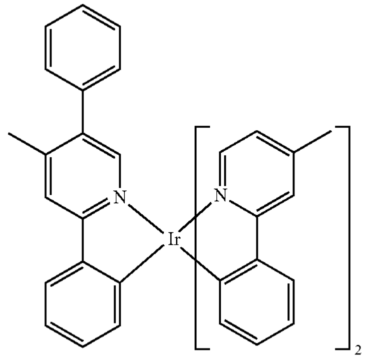
D-78
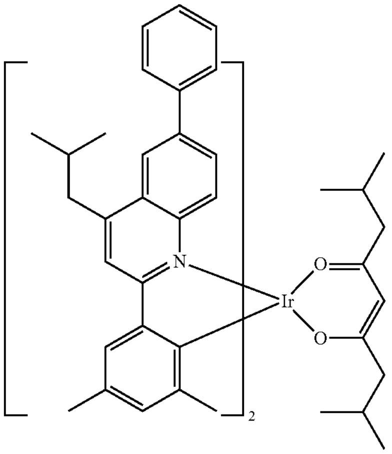
-continued
D-79
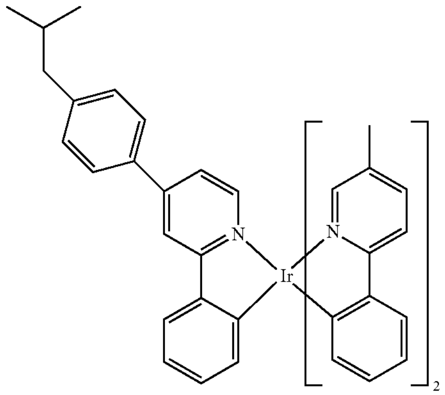
D-80
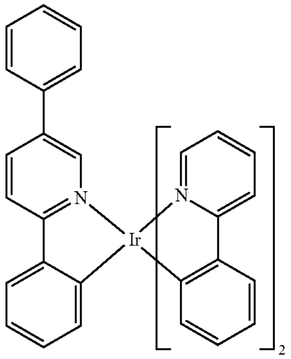
D-81
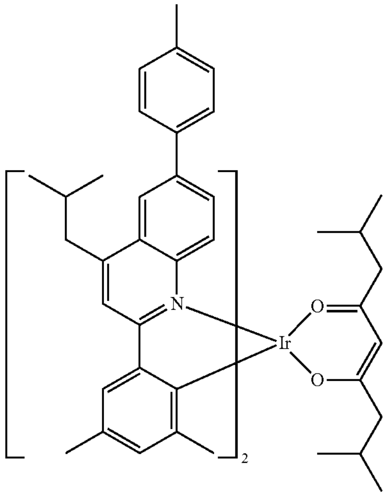

-continued
D-82
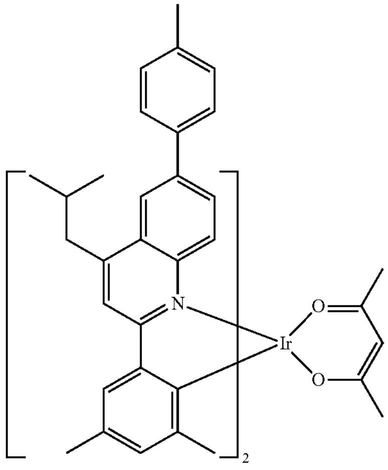
D-83
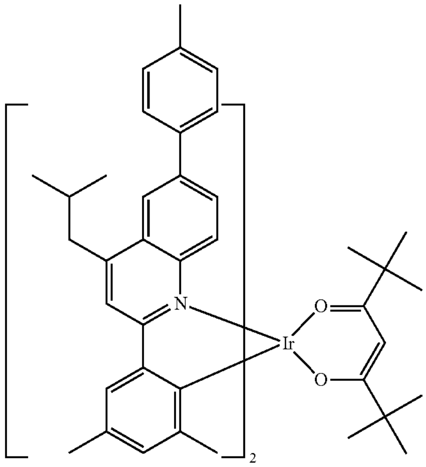
D-84
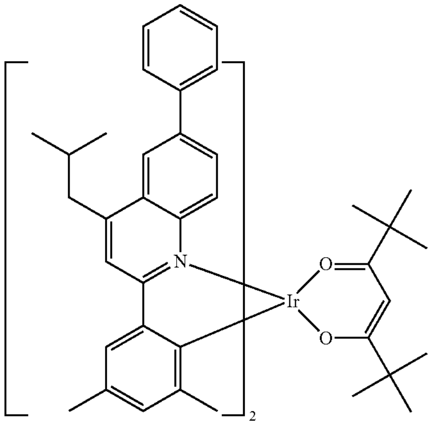
-continued
D-85
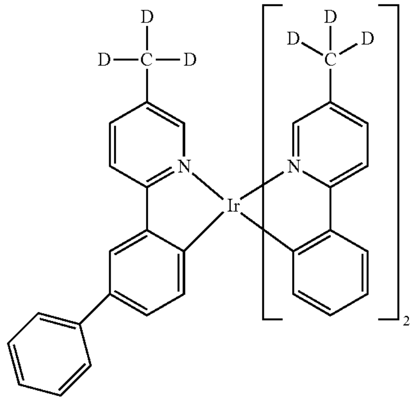
D-86
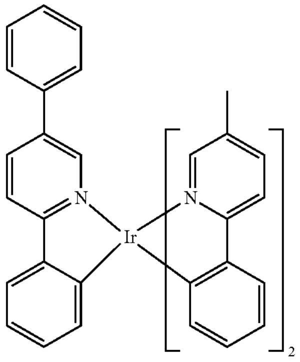
D-87
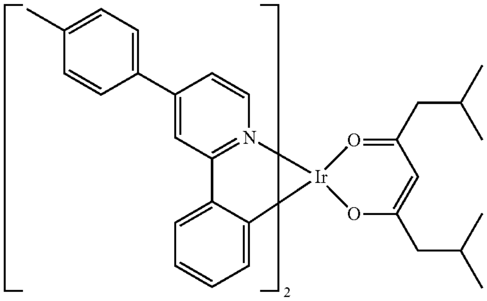
D-88
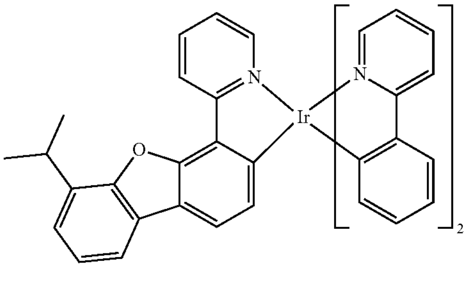
D-89
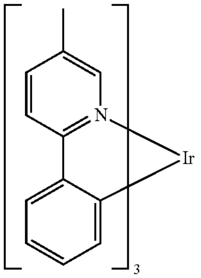

-continued
D-90
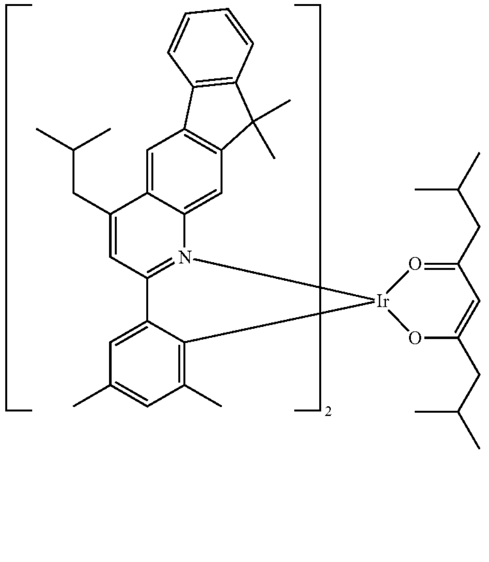
D-91
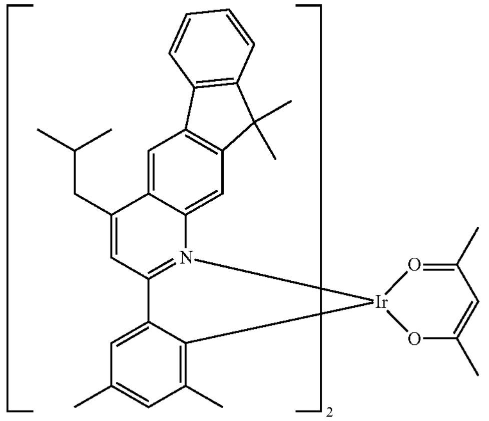
D-92
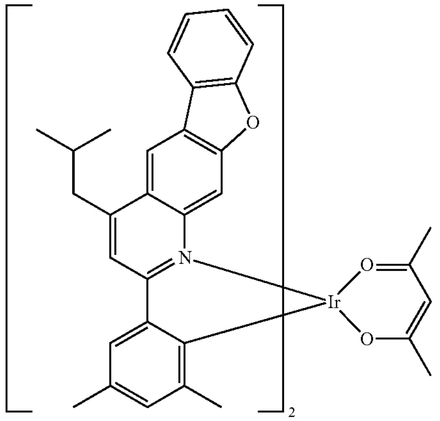
-continued
D-93
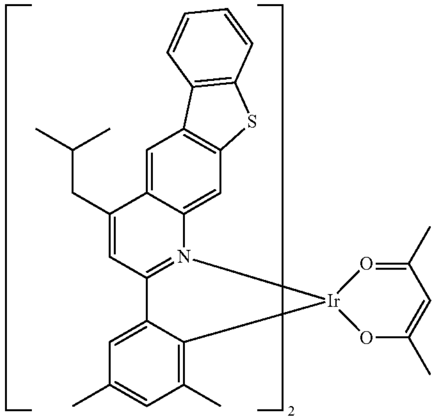
D-94
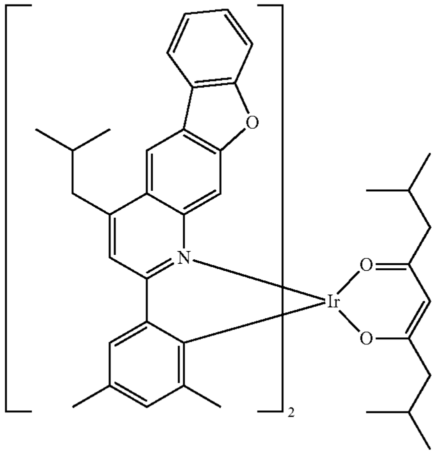
D-95
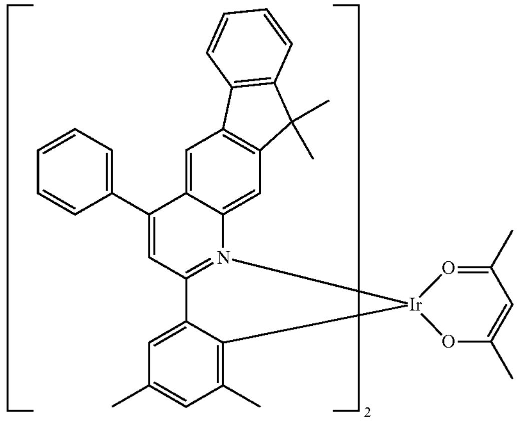

-continued
D-96
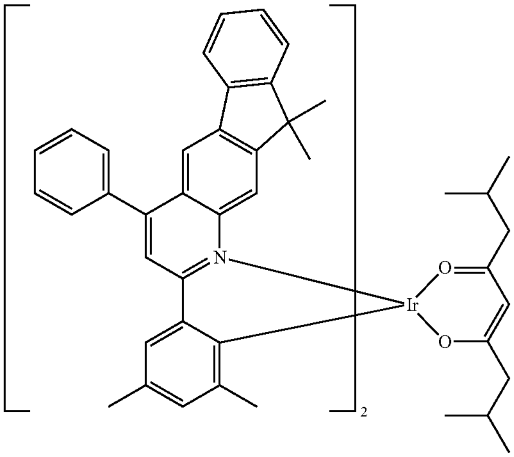
D-97
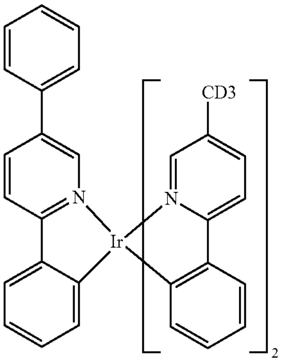
D-98
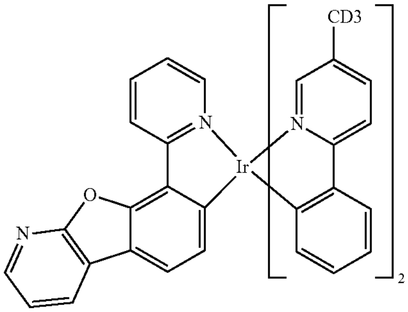
D-99
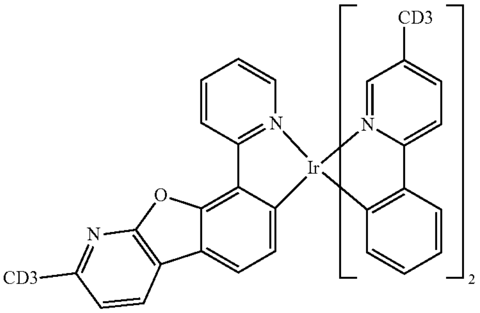
-continued
D-100
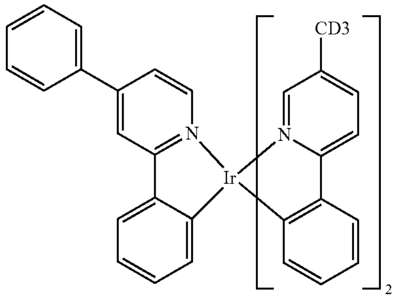
D-101
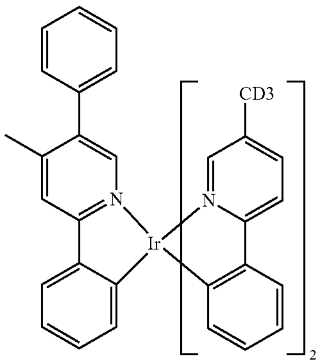
D-102
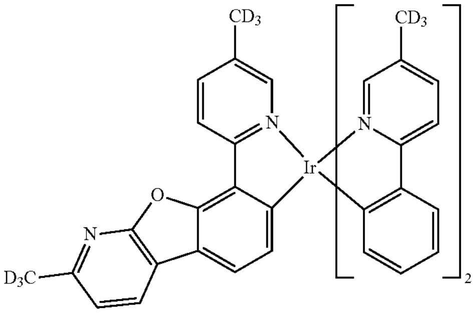
D-103
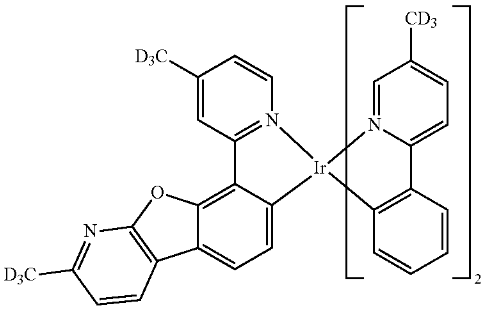
D-104
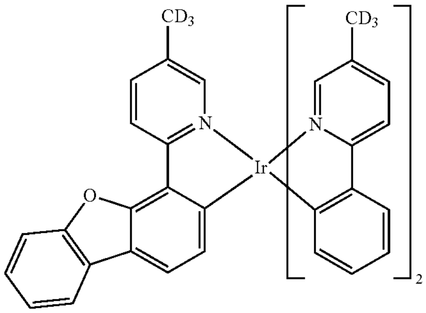

-continued
D-105
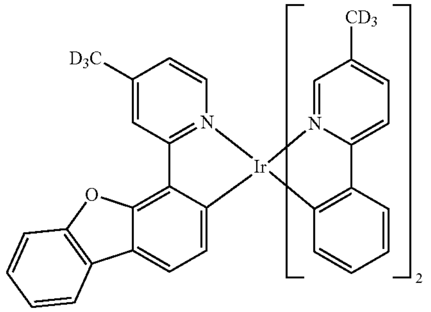
D-106
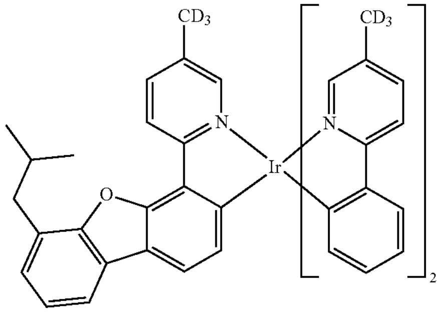
D-107
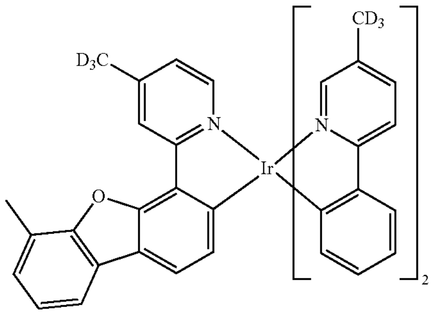
D-108
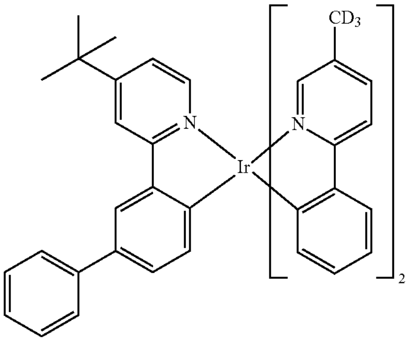
-continued
D-109
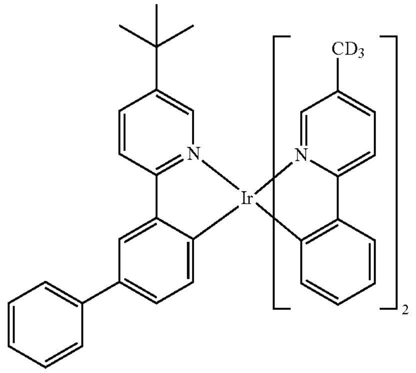
D-110
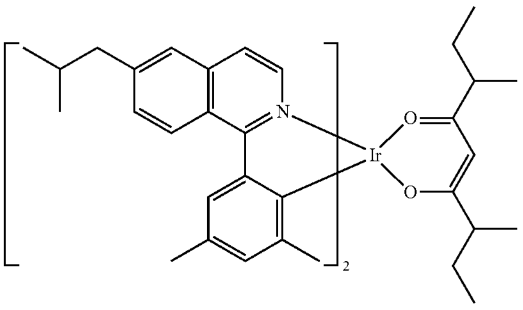
D-111
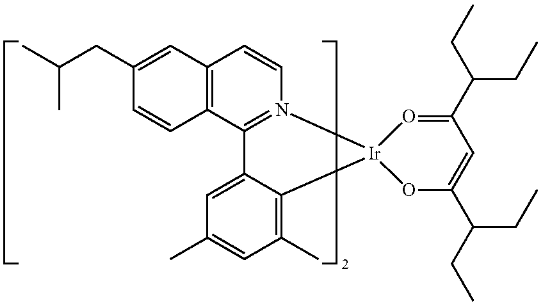
D-112
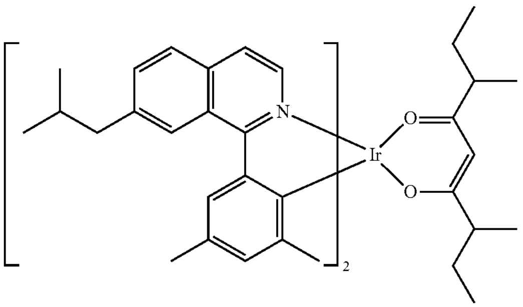

-continued

D-113

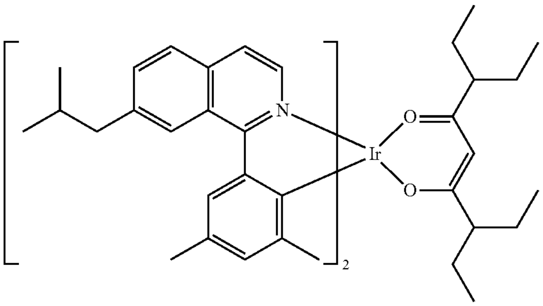

D-114

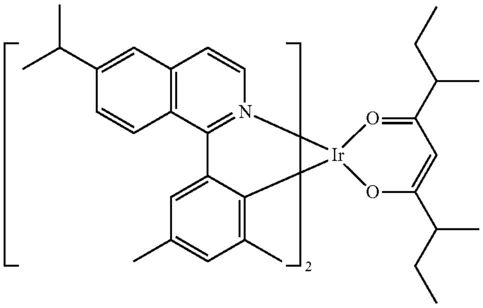

D-115

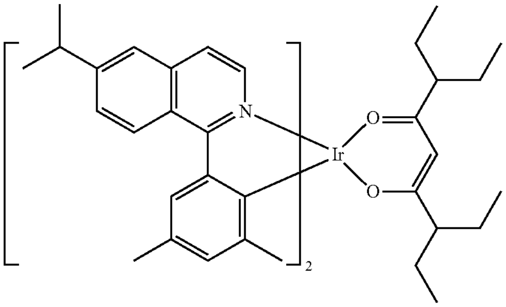

D-116

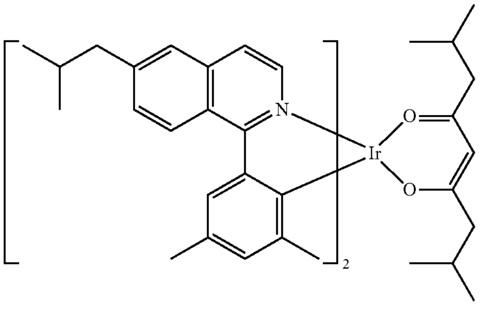

D-117

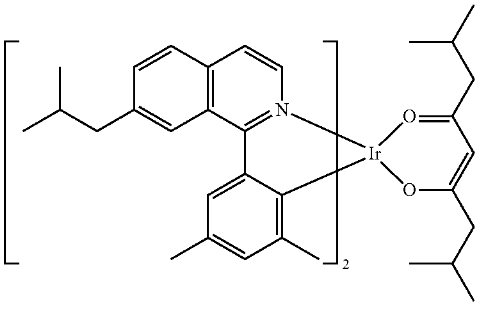

-continued

D-118

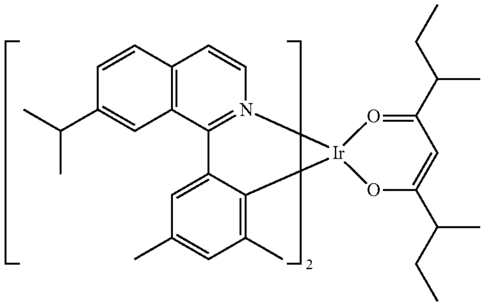

D-119

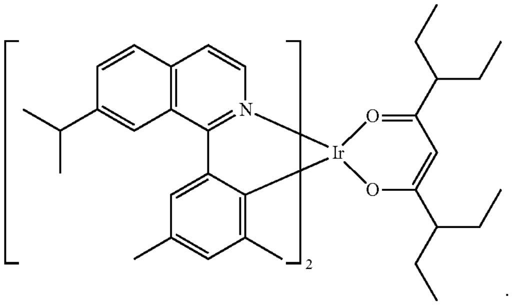

Further, the organic electroluminescent device of the present disclosure further comprises at least one light-emitting layer comprising a blue, red or green light-emitting compound known in the art in addition to the compound of the present disclosure, so that it may emit white light. Further, if necessary, it may further include a yellow or orange light-emitting layer. In the organic electroluminescent device of the present disclosure, preferably, at least one layer (hereinafter, "a surface layer") selected from a chalcogenide layer, a halogenated metal layer, and a metal oxide layer may be placed on an inner surface(s) of one or both electrode(s). Specifically, a chalcogenide (including oxides) layer of silicon and aluminum is preferably placed on an anode surface of an electroluminescent medium layer, and a halogenated metal layer or a metal oxide layer is preferably placed on a cathode surface of an electroluminescent medium layer. The operation stability for the organic electroluminescent device may be obtained by the surface layer. Preferably, the chalcogenide includes $SiO_X$ ($1 \leq X \leq 2$), $AlO_X$ ($1 \leq X \leq 1.5$), SiON, SiAlON, etc.; the halogenated metal includes LiF, $MgF_2$, $CaF_2$, a rare earth metal fluoride, etc.; and the metal oxide includes $Cs_2O$, $Li_2O$, MgO, SrO, BaO, CaO, etc.

A hole injection layer, a hole transport layer, an electron blocking layer, or a combination thereof can be used between the anode and the light-emitting layer. The hole injection layer may be multi-layers in order to lower the hole injection barrier (or hole injection voltage) from the anode to the hole transport layer or the electron blocking layer, wherein each of the multi-layers may use two compounds simultaneously. The hole transport layer or the electron blocking layer may be multi-layers. Also, the hole injection layer may be doped as a p-dopant.

An electron buffer layer, a hole blocking layer, an electron transport layer, an electron injection layer, or a combination thereof can be used between the light-emitting layer and the cathode. The electron buffer layer may be multi-layers in order to control the injection of the electron and improve the interfacial properties between the light-emitting layer and the electron injection layer, wherein each of the multi-layers may use two compounds simultaneously. The hole blocking layer or the electron transport layer may also be multi-layers, wherein each layer may use a plurality of compounds. Also, the electron injection layer may be doped as an n-dopant.

The light-emitting auxiliary layer may be placed between the anode and the light-emitting layer, or between the cathode and the light-emitting layer. When the light-emitting auxiliary layer is placed between the anode and the light-emitting layer, it can be used for promoting the hole injection and/or the hole transport, or for preventing the overflow of electrons. When the light-emitting auxiliary layer is placed between the cathode and the light-emitting layer, it can be used for promoting the electron injection and/or the electron transport, or for preventing the overflow of holes. In addition, the hole auxiliary layer may be placed between the hole transport layer (or hole injection layer) and the light-emitting layer, and may be effective to promote or block the hole transport rate (or the hole injection rate), thereby enabling the charge balance to be controlled. When an organic electroluminescent device includes two or more hole transport layers, the hole transport layer, which is further included, may be used as the hole auxiliary layer or the electron blocking layer. The light-emitting auxiliary layer, the hole auxiliary layer, or the electron blocking layer may have an effect of improving the efficiency and/or the lifespan of the organic electroluminescent device.

In the organic electroluminescent device of the present disclosure, a mixed region of an electron transport compound and a reductive dopant, or a mixed region of a hole transport compound and an oxidative dopant may be placed on at least one surface of a pair of electrodes. In this case, the electron transport compound is reduced to an anion, and thus it becomes easier to inject and transport electrons from the mixed region to an electroluminescent medium. Furthermore, the hole transport compound is oxidized to a cation, and thus it becomes easier to inject and transport holes from the mixed region to the electroluminescent medium. Preferably, the oxidative dopant includes various Lewis acids and acceptor compounds, and the reductive dopant includes alkali metals, alkali metal compounds, alkaline earth metals, rare-earth metals, and mixtures thereof. A reductive dopant layer may be employed as a charge generating layer to prepare an organic electroluminescent device having two or more light-emitting layers and emitting white light.

In order to form each layer of the organic electroluminescent device of the present disclosure, dry film-forming methods such as vacuum evaporation, sputtering, plasma, ion plating methods, etc., or wet film-forming methods such as spin coating, dip coating, flow coating methods, etc., can be used. When forming a layer by the first and the second host compounds of the present disclosure, co-evaporation or mixture-evaporation may be used.

When using a wet film-forming method, a thin film may be formed by dissolving or diffusing materials forming each layer into any suitable solvent such as ethanol, chloroform, tetrahydrofuran, dioxane, etc. The solvent may be any solvent where the materials forming each layer can be dissolved or diffused, and where there are no problems in film-formation capability.

Also, the organic electroluminescent device of the present disclosure can be used for the manufacture of display devices such as smartphones, tablets, notebooks, PCs, TVs, or display devices for vehicles, or lighting devices such as outdoor or indoor lighting.

Hereinafter, the preparation method of a host compound according to the present disclosure, and the properties of the device comprising the same will be explained in detail with reference to the representative compounds of the present disclosure in order to understand the present disclosure in detail.

[Example 1] Preparation of Compound A-21

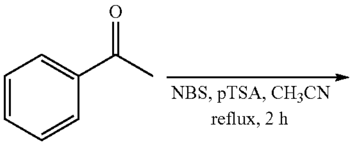

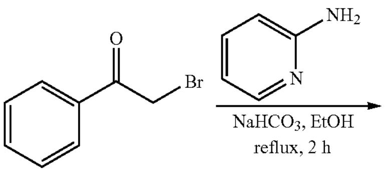

1

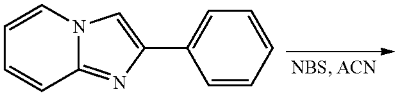

2

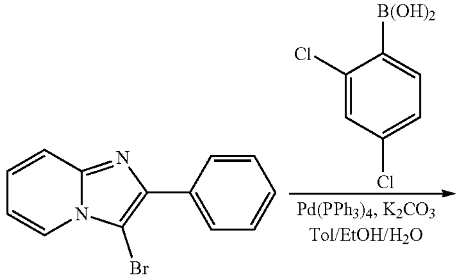

3

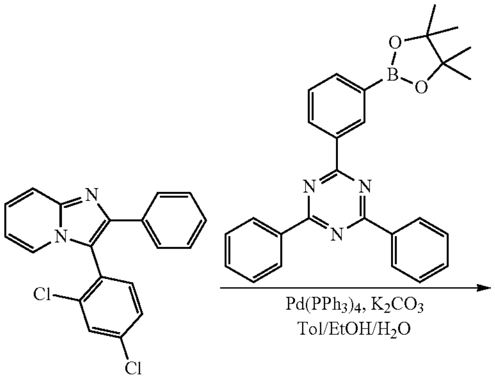

4

-continued

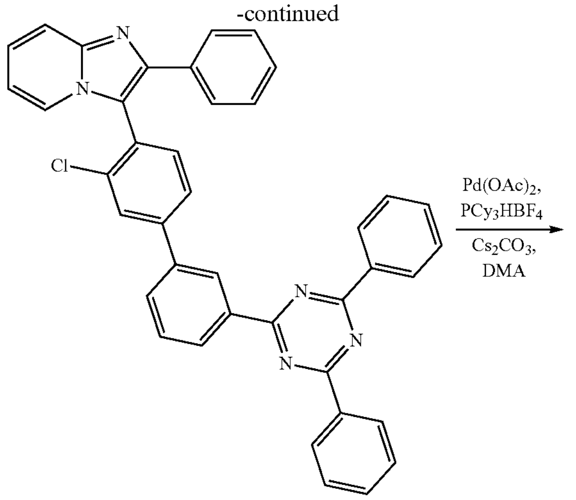

5

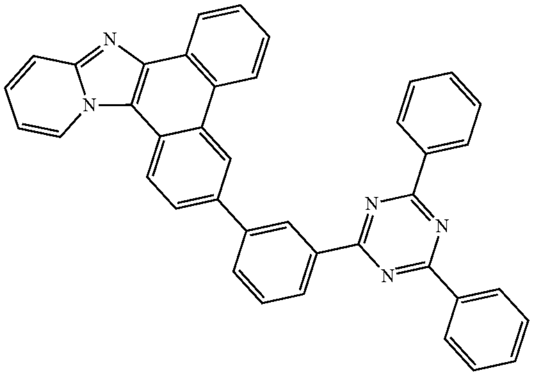

A-21

1) Preparation of Compound 1

Benzaldehyde (80 g, 666 mmol), N-bromosuccinimide (118.5 g, 666 mmol), para-toluenesulfonic acid monohydrate (190 g, 999 mmol), and 1000 mL of acetonitrile were added to a flask and dissolved, and thereafter were refluxed at 130° C. for 2 hours. After completion of the reaction, the organic layer was extracted with ethyl acetate. The residual water was removed with magnesium sulfate followed by drying, and thereafter purified by column chromatography to obtain compound 1 (120 g, yield: 91%).

2) Preparation of Compound 2

Compound 1 (120 g, 603 mmol), 2-aminopyridine (58 g, 904 mmol), sodium bicarbonate (50 g, 603 mmol) and 2,000 mL of ethanol were added to a flask and dissolved, and thereafter were refluxed for 2 hours. After completion of the reaction, the organic layer was extracted with ethyl acetate. The residual water was removed with magnesium sulfate followed by drying, and thereafter purified by column chromatography to obtain compound 2 (81.3 g, yield: 56%).

3) Preparation of Compound 3

Compound 2 (81.3 g, 419 mmol), N-bromosuccinimide (89.4 g, 502 mmol) and 1,100 mL of acetonitrile were added to a flask and refluxed at room-temperature for 3 hours. After completion of the reaction, the organic layer was extracted with ethyl acetate. The residual water was removed with magnesium sulfate followed by drying, and thereafter purified by column chromatography to obtain compound 3 (110 g, yield: 96%).

4) Preparation of Compound 4

Compound 3 (110 g, 403 mmol), 2,4-dichlorophenyl boronic acid (92 g, 483 mmol), tetrakis(triphenylphosphine) palladium(0) (23 g, 20 mmol), potassium carbonate (139 g, 1007 mmol), 1,800 mL of toluene, 710 mL of ethanol, and 710 mL of water were added to a flask and dissolved, and thereafter were refluxed at 120° C. for 12 hours. After completion of the reaction, the organic layer was extracted with ethyl acetate. The residual water was removed with magnesium sulfate followed by drying, and thereafter purified by column chromatography to obtain compound 4 (109.5 g, yield: 56%).

5) Preparation of Compound 5

Compound 4 (30 g, 88 mmol), 2,4-dimethyl-6-[3-(4,4,5,5-tetramethyl-1,3,2-dioxaborolan-2-yl)phenyl]1,3,5-triazine (46 g, 106 mmol), tetrakis(triphenylphosphine)palladium(0) (5 g, 4 mmol), potassium carbonate (31 g, 138 mmol), 440 mL of toluene, 110 mL of ethanol, and 110 mL of water were added to a flask and dissolved, and thereafter were refluxed at 120° C. for 12 hours. After completion of the reaction, the organic layer was extracted with ethyl acetate. The residual water was removed with magnesium sulfate followed by drying, and thereafter purified by column chromatography to obtain compound 5 (7.8 g, yield: 14%).

6) Preparation of Compound A-21

Compound 5 (7.6 g, 12 mmol), palladium acetate (11) (0.56 g, 2 mmol), tricyclohexylphosphine tetrafluoroborate (1.8 g, 5 mmol), cesium carbonate (12 g, 37 mmol), and 60 mL of dimethylacetamide(DMA) were added to a flask and dissolved, and thereafter were refluxed 130° C. for 12 hours. After completion of the reaction, the solvent was removed, and thereafter purified by column chromatography to obtain compound A-21 (3.5 g, yield: 49%).

| Compound | MW | M.P. |
|---|---|---|
| A-21 | 575.68 | 298° C. |

[Example 2] Preparation of Compound A-19

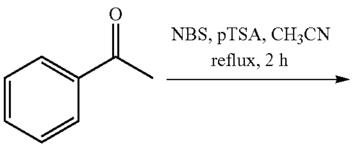

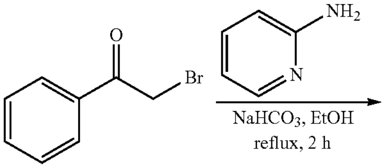

1

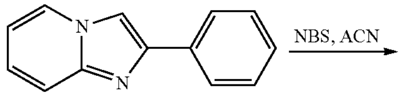

2

-continued

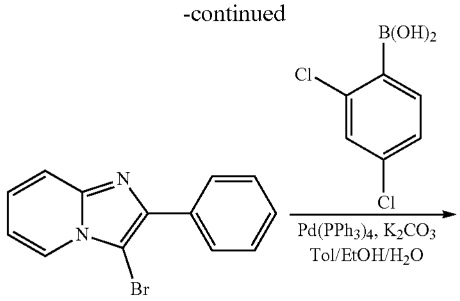

3

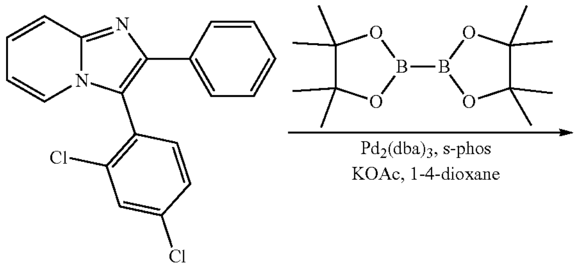

4

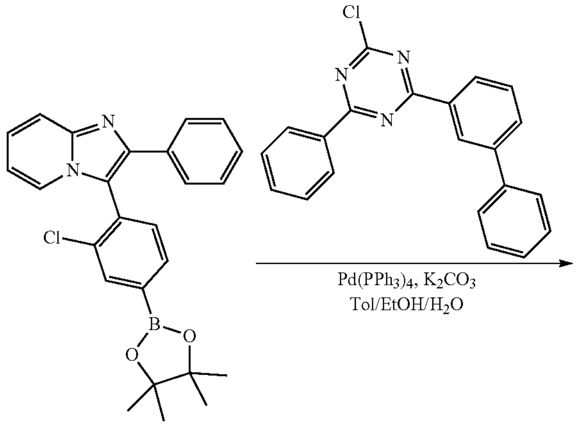

6

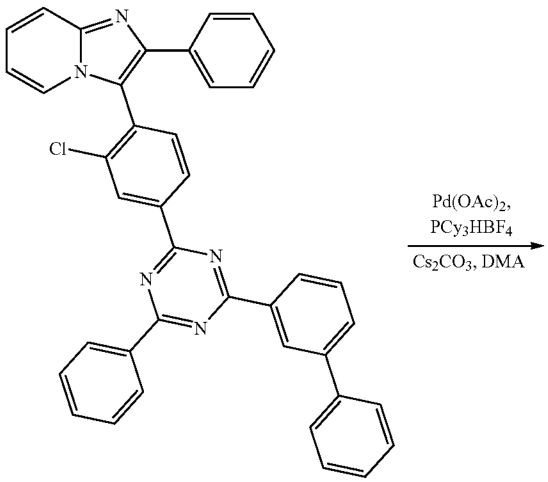

7

-continued

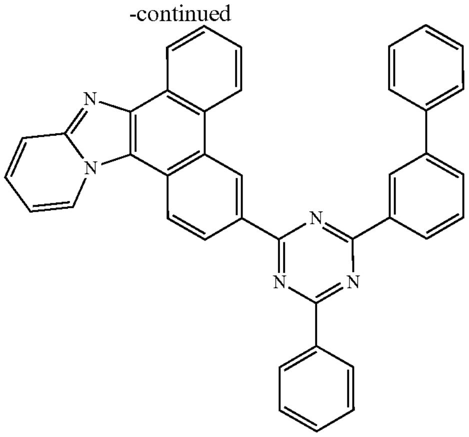

A-19

1) Preparation of Compounds 1 to 4

The same as Example 1.

2) Preparation of Compound 6

Compound 4 (30 g, 88 mmol), 4,4,4',4',5,5,5',5'-octamethyl-2,2-bi(1,3,2-dioxaborolane) (27 g, 106 mmol), tris (dibenzylideneacetone)dipalladium(0) (4 g, 4 mmol), 2-dicyclohexylphosphino-2',6'-dimethoxybiphenyl (s-phos) (3.6 g, 9 mmol), potassium acetate (22 g, 221 mmol), and 440 mL of 1,4-dioxane were added to a flask and refluxed at 120° C. for 12 hours. After completion of the reaction, the organic layer was extracted with ethyl acetate. The residual water was removed with magnesium sulfate followed by drying, and thereafter purified by column chromatography to obtain compound 6 (36.1 g, yield: 95%).

3) Preparation of Compound 7

Compound 6 (35.5 g, 82 mmol), 1-([1,1'-biphenyl]3-yl) 4-chloro-6-phenyl-1,3,5-triazine (23.6 g, 69 mmol), tetrakis (triphenylphosphine)palladium(0) (4 g, 3.4 mmol), potassium carbonate (24 g, 172 mmol), 340 mL of toluene, 86 mL of ethanol, and 86 mL of water were added to a flask and were refluxed at 120° C. for 12 hours. After completion of the reaction, the organic layer was extracted with ethyl acetate. The residual water was removed with magnesium sulfate followed by drying, and thereafter purified by column chromatography to obtain compound 7 (10.3 g, yield: 25%).

4) Preparation of Compound A-19

Compound 7 (9.8 g, 16 mmol), palladium acetate (II) (0.72 g, 3 mmol), tricyclohexylphosphine tetrafluoroborate (2.4 g, 6 mmol), cesium carbonate (15.7 g, 48 mmol), and 80 mL of DMA were added to a flask and dissolved, and thereafter were refluxed at 130° C. at 12 hours. After completion of the reaction, the solvent was removed, and thereafter purified by column chromatography to obtain compound A-19 (1.7 g, yield: 18%).

| Compound | MW | M.P. |
|---|---|---|
| A-19 | 575.68 | 275° C. |

[Device Example 1] Producing a Blue Light-Emitting Organic Electroluminescent Device According to the Present Disclosure An OLED device comprising the compound of the present disclosure was produced. First, a transparent electrode indium tin oxide (ITO) thin film (10 Ω/sq) on a glass substrate for an OLED device (GEOMATEC CO., LTD., Japan) was subjected to an ultrasonic washing with acetone and isopropanol, sequentially, and then was stored in isopropanol. The ITO substrate was then mounted on a substrate holder of a vacuum vapor deposition apparatus. Compound HI-1 was introduced into a cell of the vacuum vapor deposition apparatus, and then the pressure in the chamber of the apparatus was controlled to $10^{-7}$ torr. Thereafter, an electric current was applied to the cell to evaporate the above-introduced material, thereby forming a first hole injection layer having a thickness of 60 nm on the ITO substrate. Next, compound HI-2 was introduced into another cell of the vacuum vapor deposition apparatus, and was evaporated by applying an electric current to the cell, thereby forming a second hole injection layer having a thickness of 5 nm on the first hole injection layer. Compound HT-1 was then introduced into another cell of the vacuum vapor deposition apparatus, and was evaporated by applying an electric current to the cell, thereby forming a first hole transport layer having a thickness of 20 nm on the second hole injection layer. Compound HT-2 was then introduced into another cell of the vacuum vapor deposition apparatus, and was evaporated by applying an electric current to the cell, thereby forming a second hole transport layer having a thickness of 5 nm on the first hole transport layer. After forming the hole injection layers and the hole transport layers, a light-emitting layer was formed thereon as follows: Compound BH-1 was introduced into one cell of the vacuum vapor depositing apparatus as a host, and compound BD-1 was introduced into another cell as a dopant. The two materials were evaporated at a different rate and the dopant was deposited in a doping amount of 2 wt %, based on the total weight of the host and dopant, to form a light-emitting layer having a thickness of 20 nm on the second hole transport layer. Next, as electron transport materials, compound A-21 was introduced into one cell and compound EIL-1 was introduced into another cell, and A-21 and EIL-1 were evaporated at a rate of 1:1, and were deposited to form an electron transport layer having a thickness of 35 nm on the light-emitting layer. After depositing compound EIL-1 as an electron injection layer having a thickness of 2 nm on the electron transport layer, an A cathode having a thickness of 80 nm was deposited on the electron injection layer by another vacuum vapor deposition apparatus. Thus, an OLED device was produced. All the materials used for producing the OLED device were purified by vacuum sublimation at $10^{-6}$ torr.

The driving voltage, efficiency, and color coordinates at a luminance of 1,000 nits of the produced OLED device above are provided in Table 1 below.

[Comparative Example 1] Producing a Blue Light-Emitting Organic Electroluminescent Device Comprising a Conventional Organic Electroluminescent Compound An OLED device was produced in the same manner as in Device Example 1, except that the electron material listed in the following Table 1 was used as the electron transport material instead of compound A-21. The estimate results of the organic electroluminescent device of Comparative Example 1 are shown in the following Table 1.

TABLE 1

| | Electron Transport Material | Driving Voltage (V) | Efficiency (cd/A) | Color Coordinates (x, y) |
|---|---|---|---|---|
| Device Example 1 | A-21 | 4.1 | 5.5 | 0.140, 0.090 |
| Comparative Example 1 | Ref. | 4.7 | 3.6 | 0.140, 0.087 |

It can be confirmed that the performance of Device Example 1 is better than that of Comparative Example 1. The polarizability of the main core in the compound of the present disclosure is larger than that of the conventional compound (disclosure in Korean Patent No. 1052973). The polarizability of the main core can help pi-pi stacking in the vacuum deposition layer, thereby resulting in faster charge mobility (not limited as theory).

Figure 2:
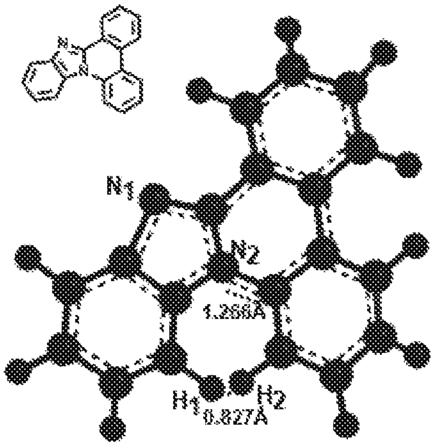
FIG. 2 shows the molecular structure of a main core of the conventional compound in 3D form.

Referring to FIG. 2, in the main core of the conventional compound, one of two nitrogen atoms ($N_2$) is contained in phenanthrene, resulting in distortion due to steric hindrance between hydrogen atoms of $H_1$ and $H_2$ (computer-calculated polarization ratio: 240.030). In contrast, the main core of the present compound has a fused azaindolizine structure as shown in FIG. 1, thereby reducing the steric hindrance (computer-calculated polarization ratio: 247.080). Accordingly, the present compound can have structural and thermal stability.

[Device Example 2] Producing an Organic Electroluminescent Device in which the Compound According to the Present Disclosure is Co-Deposited as a Host An OLED device comprising the compound of the present disclosure was produced. First, a transparent electrode indium tin oxide (ITO) thin film (10 Ω/sq) on a glass substrate for an OLED device (GEOMATEC CO., LTD., Japan) was subjected to an ultrasonic washing with acetone, ethanol, and distilled water, sequentially, and then was stored in isopropanol. The ITO substrate was then mounted on a substrate holder of a vacuum vapor deposition apparatus. Compound HI-1 was introduced into a cell of the vacuum vapor deposition apparatus, and then the pressure in the chamber of the apparatus was controlled to $10^{-6}$ torr. Thereafter, an electric current was applied to the cell to evaporate the above-introduced material, thereby forming a first hole injection layer having a thickness of 80 nm on the ITO substrate. Next, compound HI-2 was introduced into another cell of the vacuum vapor deposition apparatus, and was evaporated by applying an electric current to the cell, thereby forming a second hole injection layer having a thickness of 5 nm on the first hole injection layer. Compound HT-1 was then introduced into another cell of the vacuum vapor deposition apparatus, and was evaporated by applying an electric current to the cell, thereby forming a first hole transport layer having a thickness of 10 nm on the second hole injection layer. Compound HT-3 was then introduced into another cell of the vacuum vapor deposition apparatus, and was evaporated by applying an electric current to the cell, thereby forming a second hole transport layer having a thickness of 30 nm on the first hole transport layer. After forming the hole injection layers and the hole transport layers, a light-emitting layer was formed thereon as follows: Compounds H-8 and A-21 were introduced into one cell of the vacuum vapor depositing apparatus as a host, and compound D-50 was introduced into another cell as a dopant. The two host materials were evaporated at a different rate of 2:1 and the dopant was deposited in a doping amount of 10 wt %, based on the total weight of the host and dopant, to form a light-emitting layer having a thickness of 40 nm on the second hole transport layer. Next, as electron transport materials, compound ETL-1 was introduced into one cell and compound EIL-1 was introduced into another cell, and ETL-1 and EIL-1 were evaporated at a rate of 4:6, and were deposited to form an electron transport layer having a thickness of 35 nm on the light-emitting layer. After depositing compound EIL-1 as an electron injection layer having a thickness of 2 nm on the electron transport layer, an Al cathode having a thickness of 80 nm was deposited on the electron injection layer by another vacuum vapor deposition apparatus. Thus, an OLED device was produced.

As a result, 60.7 cd/A of an efficiency at 2.9 V of a driving voltage, and 1000 nits of green luminescence can be confirmed.

[Comparative Example 2] Producing an Organic Electroluminescent Device in which the Conventional Compound is Co-Deposited as a Host An OLED device was produced in the same manner as in Device Example 2, except that as light-emitting materials, a light-emitting layer having a thickness of 40 nm was deposited on the second hole transport layer by using compound CBP as a host and compound D-50 as a dopant; BAlq as a hole blocking layer having a thickness of 10 nm was deposited. Next, ETL-1 and EIL-1 were evaporated at a rate of 4:6, and were deposited to form an electron transport layer having a thickness of 25 nm on the hole blocking layer.

As a result, 43.2 cd/A of an efficiency at 5.5 V of a driving voltage, and 1000 nits of green luminescence can be confirmed.

The compounds used in the Device Examples and Comparative Examples are shown in Table 2 below.

TABLE 2

| | |
|---|---|
| Hole Injection Layer/ Hole Transport Layer | 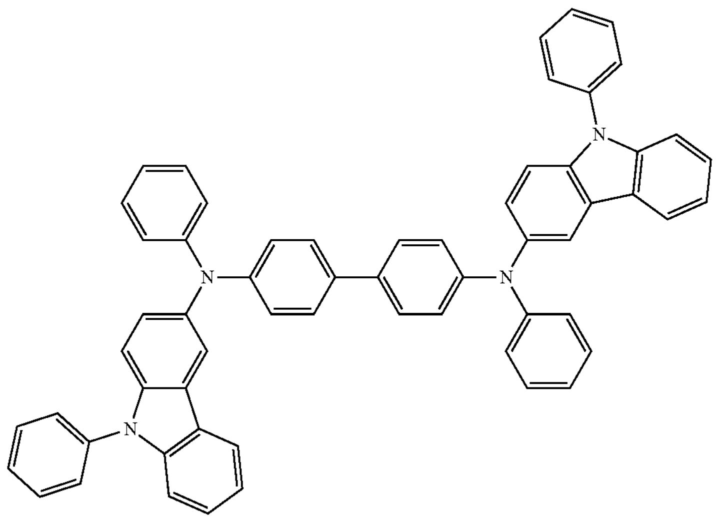 HI-1 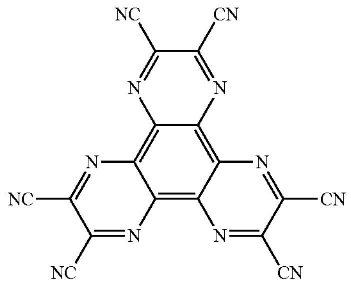 HI-2 |

TABLE 2-continued
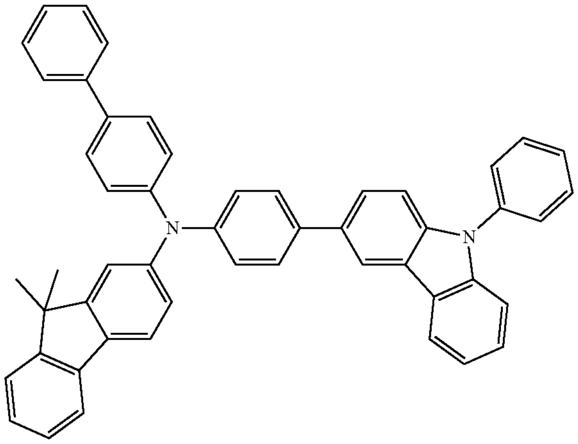 [SMILES: CC1(C)c2ccccc2-c2ccc(N(c3ccc(-c4ccccc4)cc3)c3ccc(-c4ccc5c(c4)c4ccccc4n5-c4ccccc4)cc3)cc21]
HT-1
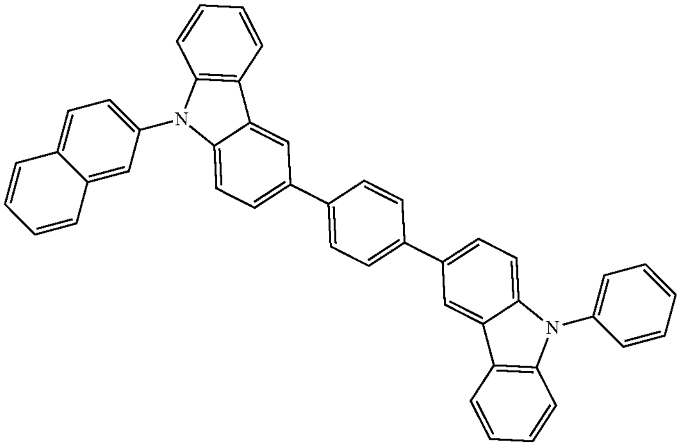 [SMILES: c1ccc(-n2c3ccccc3c3cc(-c4ccc(-c5ccc6c(c5)c5ccccc5n6-c5ccc6ccccc6c5)cc4)ccc32)cc1]
HT-2
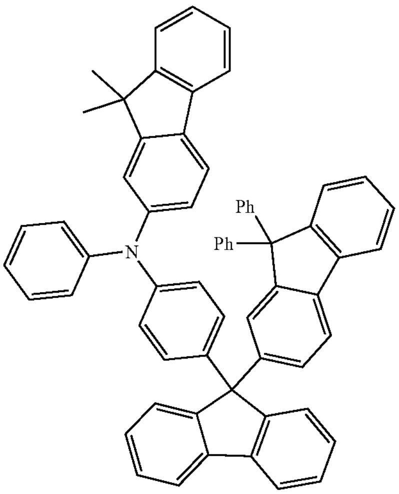 [SMILES: CC1(C)c2ccccc2-c2ccc(N(c3ccccc3)c3ccc(C4(c5ccc6c(c5)C(c5ccccc5)(c5ccccc5)c5ccccc5-6)c5ccccc5-c5ccccc54)cc3)cc21]
HT-3

TABLE 2-continued
Light-Emitting Layer
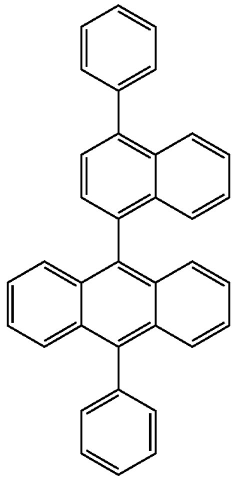
BH-1
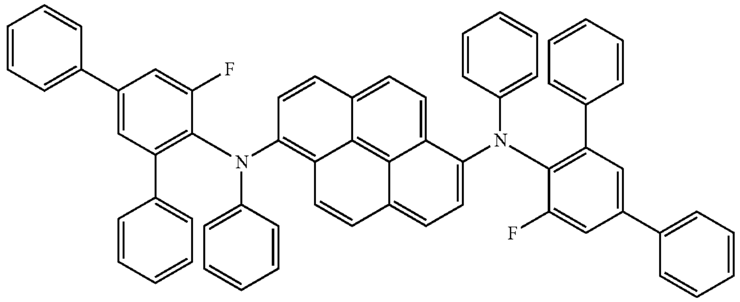
BD-1
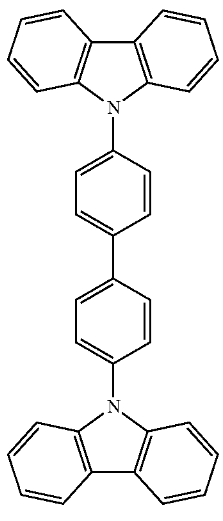
CBP TABLE 2-continued

| | |
|---|---|
| Hole Blocking Layer | 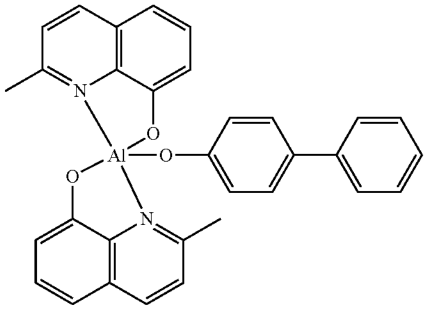<br>BAlq |
| Electron Transport Layer/ Electron Injection Layer | Ref.<br>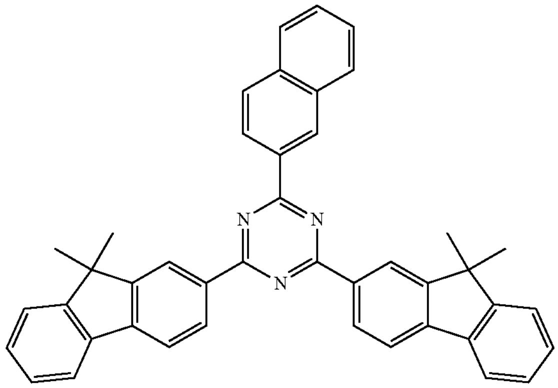<br>ETL-1<br>A-21<br>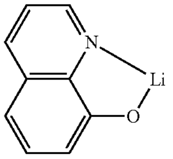<br>EIL-1 |

The invention claimed is:

1. An organic electroluminescent compound represented by the following formula 1:

(1)

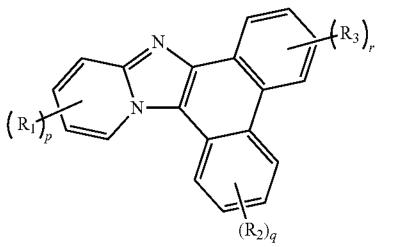

wherein, at least one of $R_1$, $R_2$ and $R_3$ is represented by the following formula 2;

(2)

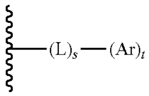

wherein,

L represents a single bond, a substituted or unsubstituted (C6-C30)arylene, a substituted or unsubstituted (3- to 30-membered)heteroarylene, or a substituted or unsubstituted (C3-C30)cycloalkylene;

Ar represents hydrogen, deuterium, halogen, cyano, a substituted or unsubstituted (C1-C30)alkyl, a substituted or unsubstituted (C6-C30)aryl, a substituted or unsubstituted (3- to 30-membered)heteroaryl, a substituted or unsubstituted (C3-C30)cycloalkyl, a substituted or unsubstituted (C1-C30)alkoxy, a substituted or unsubstituted tri(C1-C30)alkylsilyl, a substituted or unsubstituted di(C1-C30)alkyl(C6-C30)arylsilyl, a substituted or unsubstituted (C1-C30)alkyldi(C6-C30)arylsilyl, or a substituted or unsubstituted tri(C6-C30)

arylsilyl, a substituted or unsubstituted mono- or di-(C1-C30)alkylamino, a substituted or unsubstituted mono- or di-(C6-C30)arylamino, or a substituted or unsubstituted (C1-C30)alkyl(C6-C30)arylamino, provided that when R1 and R3 are hydrogen and at least one of R as is formula 2, Ar represents a substituted or unsubstituted (3- to 30-membered)heteroaryl, a substituted or unsubstituted (C3-C30)cycloalkyl, a substituted or unsubstituted tri(C1-C30)alkylsilyl, a substituted or unsubstituted di(C1-C30)alkyl(C6-C30)arylsilyl, a substituted or unsubstituted (C1-C30)alkyldi(C6-C30)arylsilyl, or a substituted or unsubstituted tri(C6-C30)arylsilyl, a substituted or unsubstituted mono- or di-(C1-C30)alkylamino, a substituted or unsubstituted mono- or di-(C6-C30)arylamino, or a substituted or unsubstituted (C1-C30)alkyl(C6-C30)arylamino;

$R_1$ is represented by formula 2, or represent hydrogen, deuterium, halogen, cyano, a substituted or unsubstituted (C1-C30)alkyl, a substituted or unsubstituted (C6-C30)aryl, a substituted or unsubstituted (3- to 30-membered)heteroaryl, a substituted or unsubstituted (C3-C30)cycloalkyl, a substituted or unsubstituted (C1-C30)alkoxy, a substituted or unsubstituted tri(C1-C30)alkylsilyl, a substituted or unsubstituted di(C1-C30)alkyl(C6-C30)arylsilyl, a substituted or unsubstituted (C1-C30)alkyldi(C6-C30)arylsilyl, or a substituted or unsubstituted tri(C6-C30)arylsilyl, a substituted or unsubstituted mono- or di-(C1-C30)alkylamino, a substituted or unsubstituted mono- or di-(C6-C30)arylamino, or a substituted or unsubstituted (C1-C30)alkyl(C6-C30)arylamino;

$R_2$ and $R_3$ each independently, are represented by formula 2, or represent hydrogen, deuterium, halogen, cyano, a substituted or unsubstituted (C1-C30)alkyl, a substituted or unsubstituted (C6-C30)aryl, a substituted or unsubstituted (3- to 30-membered)heteroaryl, a substituted or unsubstituted (C3-C30)cycloalkyl, a substituted or unsubstituted (C1-C30)alkoxy, a substituted or unsubstituted tri(C1-C30)alkylsilyl, a substituted or unsubstituted di(C1-C30)alkyl(C6-C30)arylsilyl, a substituted or unsubstituted (C1-C30)alkyldi(C6-C30)arylsilyl, or a substituted or unsubstituted tri(C6-C30)arylsilyl, a substituted or unsubstituted mono- or di-(C1-C30)alkylamino, a substituted or unsubstituted mono- or di-(C6-C30)arylamino, or a substituted or unsubstituted (C1-C30)alkyl(C6-C30)arylamino; or may be linked to adjacent substituents to form a ring; with the proviso that when R1 and R3=hydrogen then R2 cannot be cyano, alkyl, or alkoxy;

p to r each independently represent an integer of 1 to 4;

s and t each independently represent an integer of 1 to 3; and when p to t are 2 or more, each of $R_1$, each of $R_2$, each of $R_3$, each of L or each of Ar may be the same or different.

2. The organic electroluminescent compound according to claim 1, wherein the formula 1 is represented by any one of the following formulae 1-1 to 1-3:

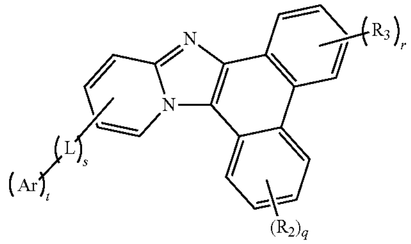

(1-1)

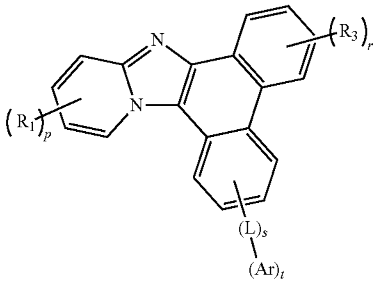

(1-2)

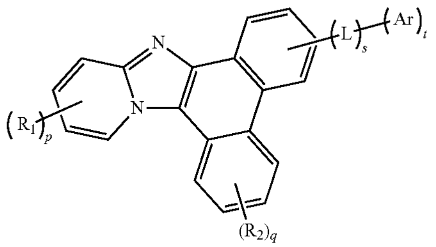

(1-3)

wherein,

L, Ar, $R_1$ to $R_3$, and p to t are as defined in claim 1.

3. An organic electroluminescent compound represented by the following formula 1:

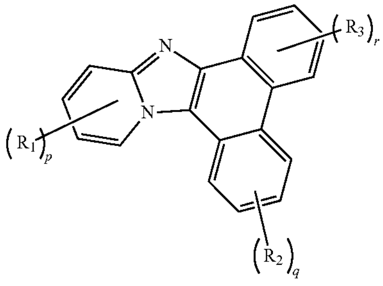

(1)

wherein, at least one of $R_1$, $R_2$ and $R_3$ is represented by the following formula 2;

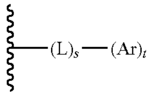

(2)

wherein,

L represents a single bond, a substituted or unsubstituted (C6-C30)arylene, a substituted or unsubstituted (3- to 30-membered)heteroarylene, or a substituted or unsubstituted (C3-C30)cycloalkylene;

Ar represents hydrogen, deuterium, halogen, cyano, a substituted or unsubstituted (C1-C30)alkyl, a substituted or unsubstituted (C6-C30)aryl, a substituted or unsubstituted (3- to 30-membered)heteroaryl, a substituted or unsubstituted (C3-C30)cycloalkyl, a substituted or unsubstituted (C1-C30)alkoxy, a substituted or unsubstituted tri(C1-C30)alkylsilyl, a substituted or unsubstituted di(C1-C30)alkyl(C6-C30)arylsilyl, a substituted or unsubstituted (C1-C30)alkyldi(C6-C30) arylsilyl, or a substituted or unsubstituted tri(C6-C30) arylsilyl, a substituted or unsubstituted mono- or di-(C1-C30)alkylamino, a substituted or unsubstituted mono- or di-(C6-C30)arylamino, or a substituted or unsubstituted (C1-C30)alkyl(C6-C30)arylamino, provided that when $R_1$ and $R_3$ are hydrogen and at least one of $R_2$ is formula 2, Ar represents cyano, a substituted or unsubstituted (C1-C30)alkyl, a substituted or unsubstituted (3- to 30-membered)heteroaryl, a substituted or unsubstituted (C3-C30)cycloalkyl, a substituted or unsubstituted (C1-C30)alkoxy, a substituted or unsubstituted tri(C1-C30)alkylsilyl, a substituted or unsubstituted di(C1-C30)alkyl(C6-C30)arylsilyl, a substituted or unsubstituted (C1-C30)alkyldi(C6-C30) arylsilyl, or a substituted or unsubstituted tri(C6-C30) arylsilyl, a substituted or unsubstituted mono- or di-(C1-C30)alkylamino, a substituted or unsubstituted mono- or di-(C6-C30)arylamino, or a substituted or unsubstituted (C1-C30)alkyl(C6-C30)arylamino;

$R_1$ is represented by formula 2, or represent hydrogen, deuterium, halogen, cyano, a substituted or unsubstituted (C1-C30)alkyl, a substituted or unsubstituted (C6-C30)aryl, a substituted or unsubstituted (3- to 30-membered)heteroaryl, a substituted or unsubstituted (C3-C30)cycloalkyl, a substituted or unsubstituted (C1-C30)alkoxy, a substituted or unsubstituted tri(C1-C30)alkylsilyl, a substituted or unsubstituted di(C1-C30)alkyl(C6-C30)arylsilyl, a substituted or unsubstituted (C1-C30)alkyldi(C6-C30)arylsilyl, or a substituted or unsubstituted tri(C6-C30)arylsilyl, a substituted or unsubstituted mono- or di-(C1-C30)alkylamino, a substituted or unsubstituted mono- or di-(C6-C30)arylamino, or a substituted or unsubstituted (C1-C30)alkyl(C6-C30)arylamino;

$R_2$ and $R_3$ each independently, are represented by formula 2, or represent hydrogen, deuterium, halogen, cyano, a substituted or unsubstituted (C1-C30)alkyl, a substituted or unsubstituted (C6-C30)aryl, a substituted or unsubstituted (3- to 30-membered)heteroaryl, a substituted or unsubstituted (C3-C30)cycloalkyl, a substituted or unsubstituted (C1-C30)alkoxy, a substituted or unsubstituted tri(C1-C30)alkylsilyl, a substituted or unsubstituted di(C1-C30)alkyl(C6-C30)arylsilyl, a substituted or unsubstituted (C1-C30)alkyldi(C6-C30) arylsilyl, or a substituted or unsubstituted tri(C6-C30) arylsilyl, a substituted or unsubstituted mono- or di-(C1-C30)alkylamino, a substituted or unsubstituted mono- or di-(C6-C30)arylamino, or a substituted or unsubstituted (C1-C30)alkyl(C6-C30)arylamino; or may be linked to adjacent substituents to form a ring;

when the adjacent substituents among at least one of $R_2$ and $R_3$ are linked to form a ring, which are at least one ring represented by the following formulae 3 to 7:

(3)

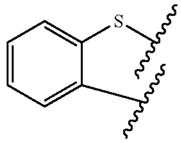

(4)

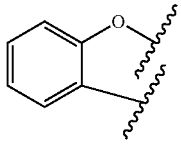

(5)

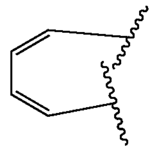

(6)

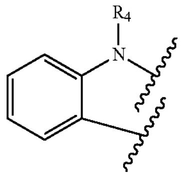

(7)

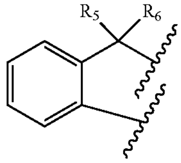

wherein, $R_4$ to $R_6$ each independently represent hydrogen, deuterium, a substituted or unsubstituted (C1-C30)alkyl, a substituted or unsubstituted (C6-C30)aryl, or a substituted or unsubstituted (3- to 30-membered)heteroaryl; and $R_5$ and $R_6$ may be linked to each other to form a ring-;

p to r each independently represent an integer of 1 to 4;

s and t each independently represent an integer of 1 to 3; and when p to t are 2 or more, each of $R_1$, each of $R_2$, each of $R_3$, each of L or each of Ar may be the same or different.

4. The organic electroluminescent compound according to claim 1, wherein Ar is a substituted or unsubstituted phenyl, a substituted or unsubstituted naphthyl, a substituted or unsubstituted biphenyl, a substituted or unsubstituted terphenyl, a substituted or unsubstituted naphthylphenyl, a substituted or unsubstituted fluorenyl, a substituted or unsubstituted fluoranthenyl, a substituted or unsubstituted triazinyl, a substituted or unsubstituted pyridyl, a substituted or unsubstituted pyrimidinyl, a substituted or unsubstituted benzothienopyrimidinyl, a substituted or unsubstituted acenaphthopyrimidinyl, a substituted or unsubstituted quinazolinyl, a substituted or unsubstituted benzoquinazolinyl, a substituted or unsubstituted quinoxalinyl, a substituted or unsubstituted benzoquinoxalinyl, a substituted or unsubstituted dibenzoquinoxalinyl, a substituted or unsubstituted quinolyl, a substituted or unsubstituted benzoquinolyl, a substituted or unsubstituted isoquinolyl, a substituted or unsubstituted benzoisoquinolyl, a substituted or unsubstituted benzothienoquinolyl, a substituted or unsubstituted benzofuroquinolyl, a substituted or unsubstituted triazolyl, a substituted or unsubstituted pyrazolyl, a substituted or unsubstituted carbazolyl, a substituted or unsubstituted dibenzothiophenyl, a substituted or unsubstituted benzothiophenyl, a substituted or unsubstituted dibenzofuranyl, a substituted or unsubstituted benzofuranyl, a substituted or unsubstituted naphthyridinyl, a substituted or unsubstituted benzothiazolinyl, a substituted or unsubstituted phenanthroidimidazolyl, a substituted or unsubstituted diphenylamino, a substituted or unsubstituted phenylbiphenylamino, a substituted or unsubstituted fluorenylphenylamino, a substituted or unsubstituted dibenzothiophenylphenylamino, or a substituted or unsubstituted dibenzofuranylphenylamino.

5. The organic electroluminescent compound according to claim 1, wherein the substituents of the substituted (C1-C30)alkyl, the substituted (C6-C30)aryl(ene), the substituted (3- to 30-membered)heteroaryl(ene), the substituted (C3-C30)cycloalkyl(ene), the substituted (C1-C30)alkoxy, the substituted tri(C1-C30)alkylsilyl, the substituted di(C1-C30)alkyl(C6-C30)arylsilyl, the substituted (C1-C30)alkyldi(C6-C30)arylsilyl, the substituted tri(C6-C30)arylsilyl, the substituted mono- or di-(C1-C30)alkylamino, the substituted mono- or di-(C6-C30)arylamino, and the substituted (C1-C30)alkyl(C6-C30)arylamino in L, Ar, $R_1$ to $R_3$ each independently represent at least one selected from the group consisting of deuterium, halogen, cyano, carboxyl, nitro, hydroxyl, (C1-C30)alkyl, halo (C1-C30)alkyl, (C2-C30)alkenyl, (C2-C30)alkynyl, (C1-C30)alkoxy, (C1-C30)alkylthio, (C3-C30)cycloalkyl, (C3-C30)cycloalkenyl, (3- to 7-membered) heterocycloalkyl, (C6-C30)aryloxy, (C6-C30) arylthio, (C6-C30)aryl-substituted or unsubstituted (3- to 30-membered)heteroaryl, (3- to 30-membered)heteroaryl-substituted or unsubstituted (C6-C30)aryl, tri(C1-C30)alkylsilyl, tri(C6-C30)arylsilyl, di(C1-C30)alkyl(C6-C30)arylsilyl, (C1-C30)alkyldi(C6-C30)arylsilyl, amino, mono- or di-(C1-C30)alkylamino, (C1-C30)alkyl-substituted or unsubstituted mono- or di-(C6-C30)arylamino, (C1-C30) alkyl(C6-C30)arylamino, (C1-C30)alkylcarbonyl, (C1-C30) alkoxycarbonyl, (C6-C30)arylcarbonyl, di(C6-C30)arylboronyl, di(C1-C30)alkylboronyl, (C1-C30)alkyl(C6-C30) arylboronyl, (C6-C30)ar(C1-C30)alkyl, and (C1-C30)alkyl (C6-C30)aryl.

6. An organic electroluminescent compound selected from the group consisting of:

A-6

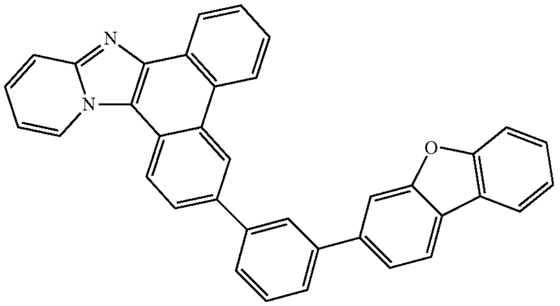

-continued

A-7

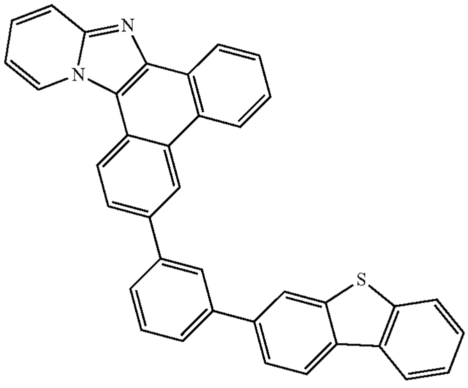

A-8

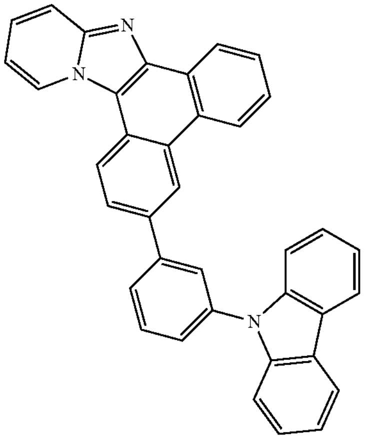

A-9

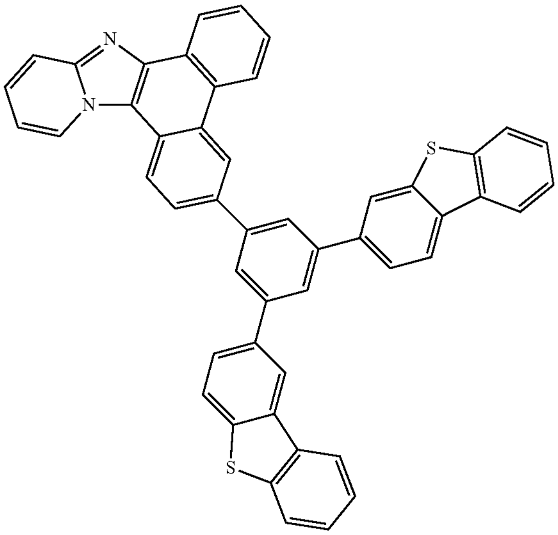

-continued
A-10
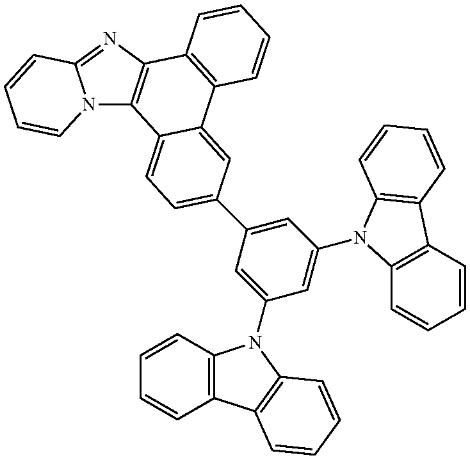
A-11
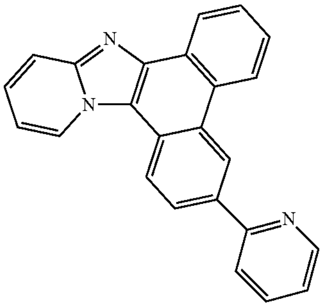
A-12
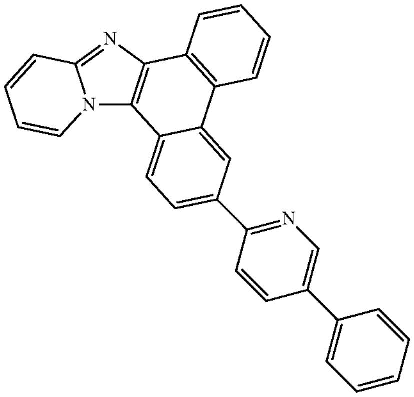
A-13
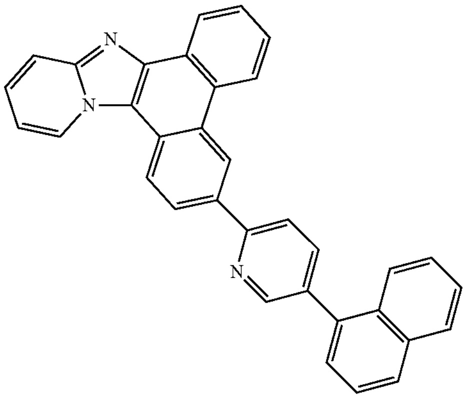
-continued
A-14
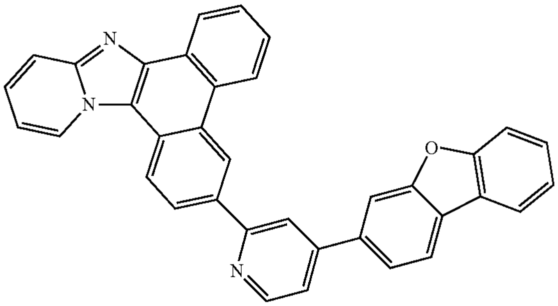
A-15
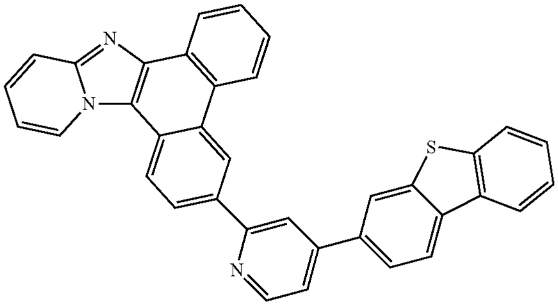
A-16
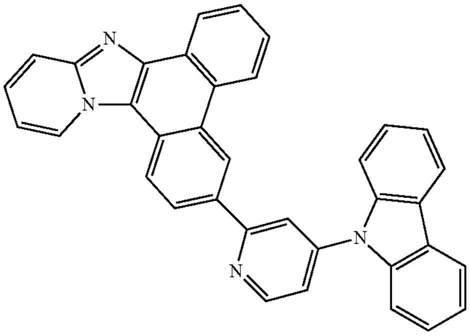
A-17
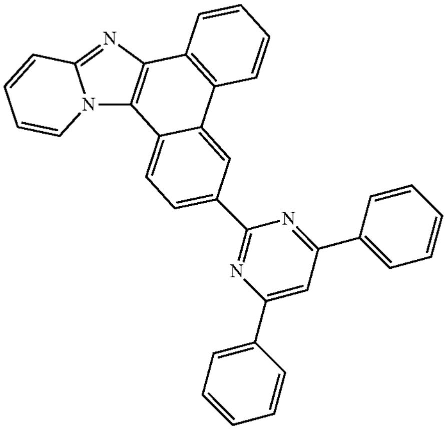

A-18
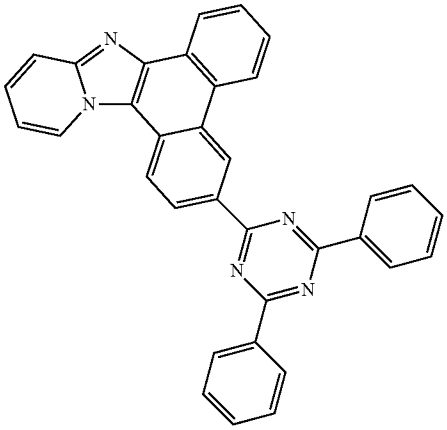
A-19
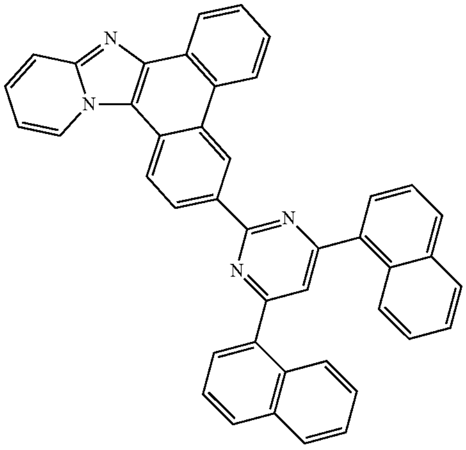
A-20
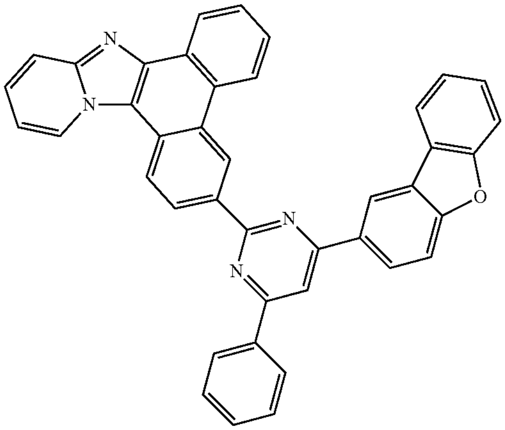
A-21
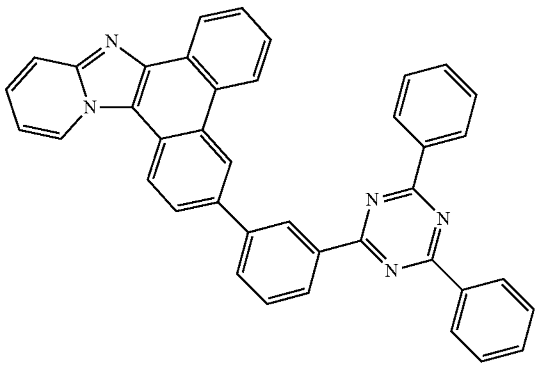
A-22
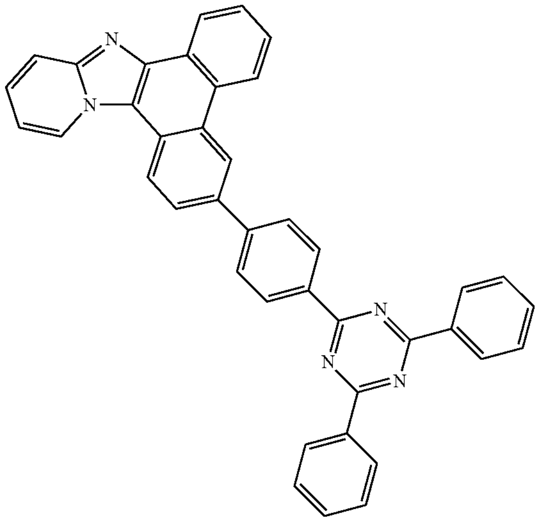
A-23
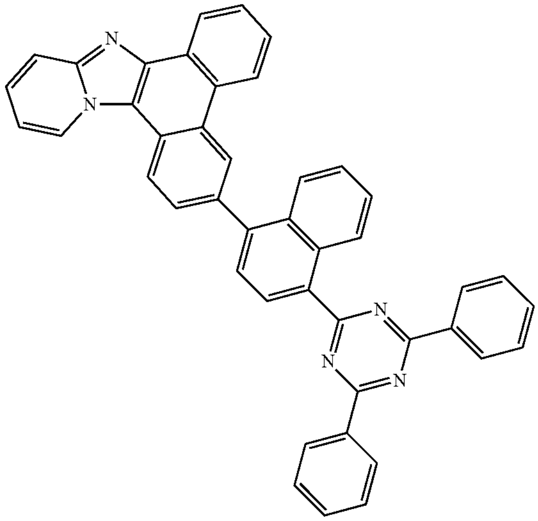

-continued
A-24
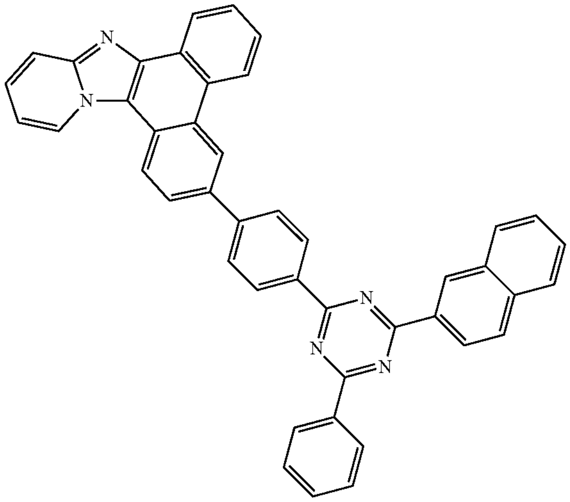
A-25
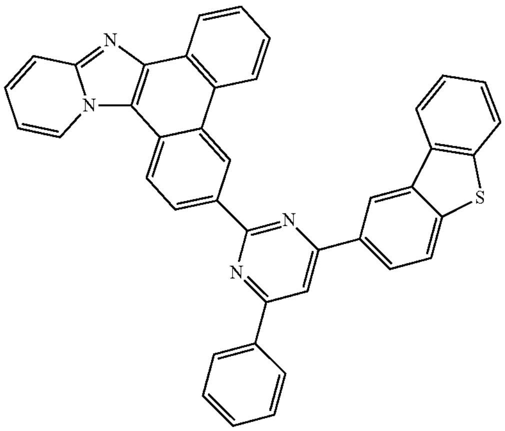
A-26
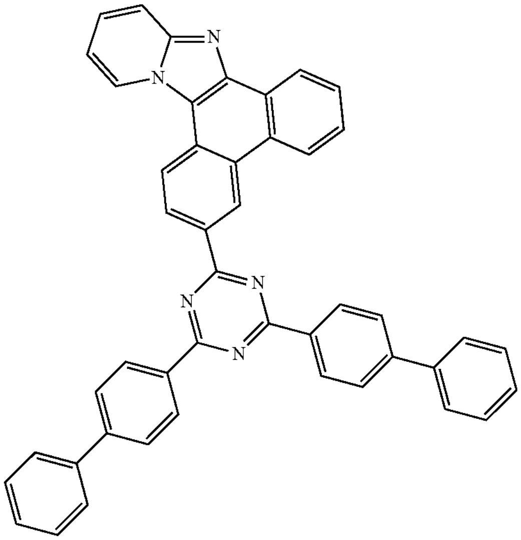
-continued
A-27
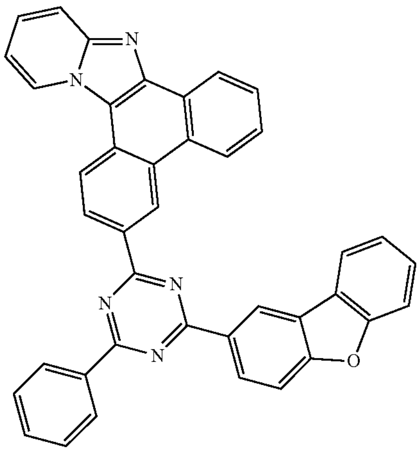
A-28
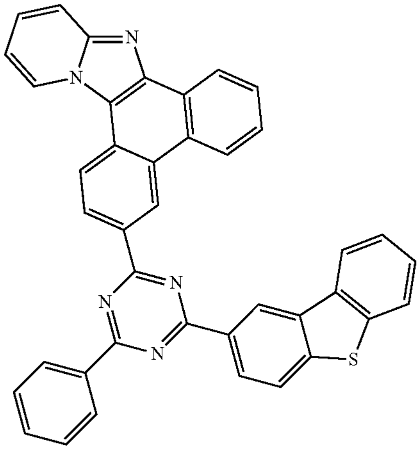
A-29
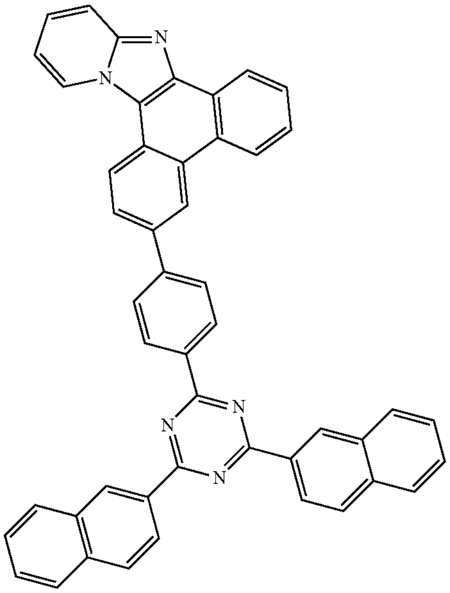

-continued
A-30
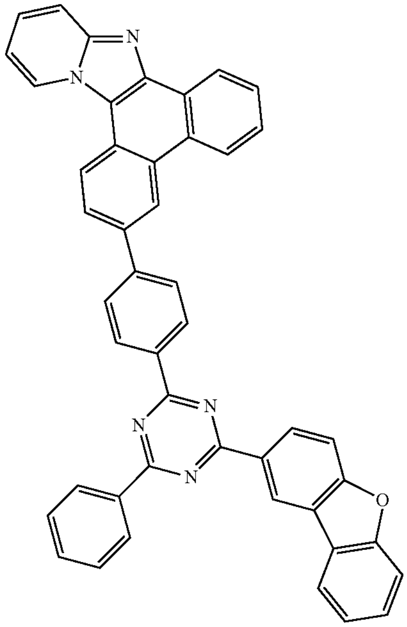
A-31
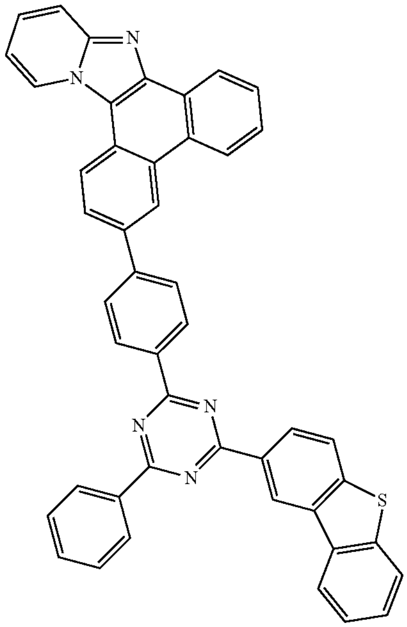
-continued
A-32
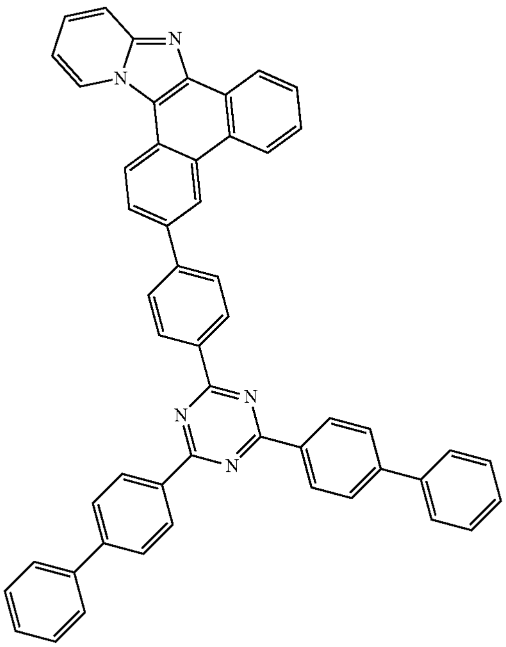
A-33
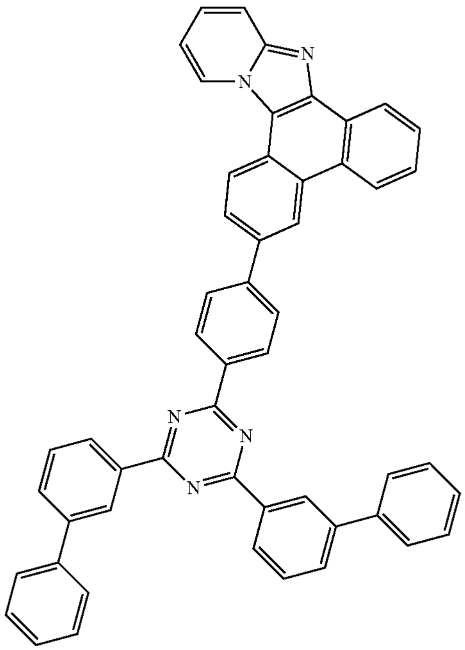

-continued
A-34
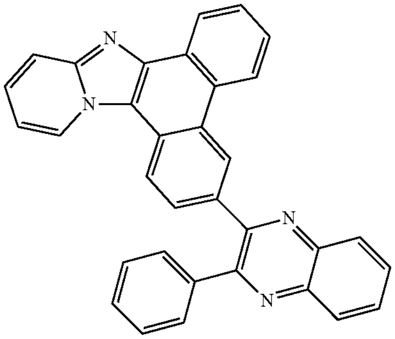
A-35
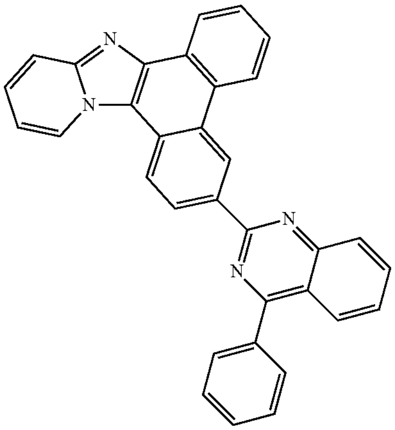
A-36
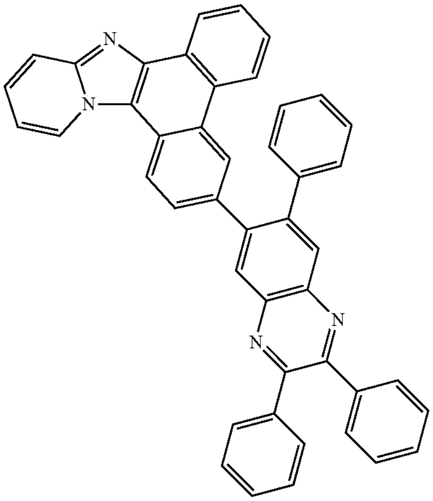
-continued
A-37
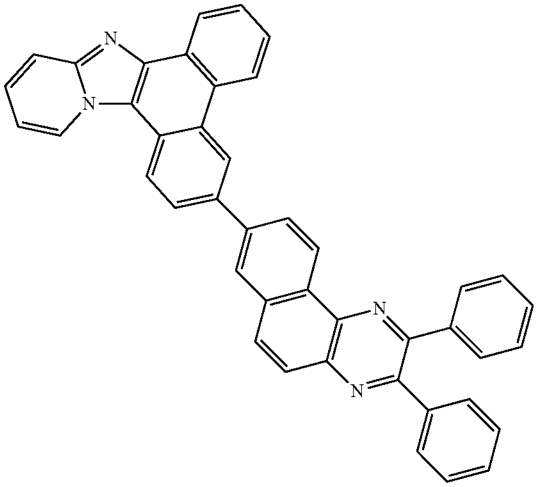
A-38
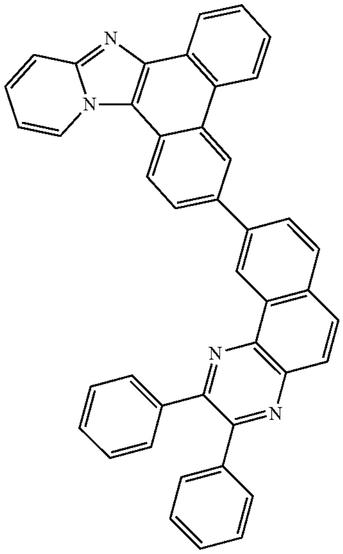
A-39
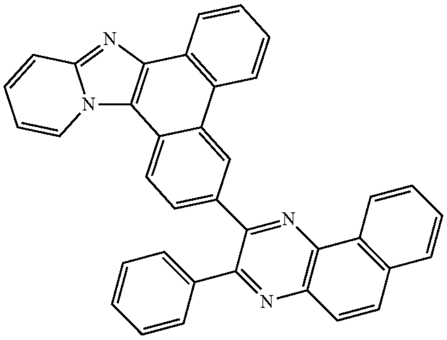

-continued
A-40
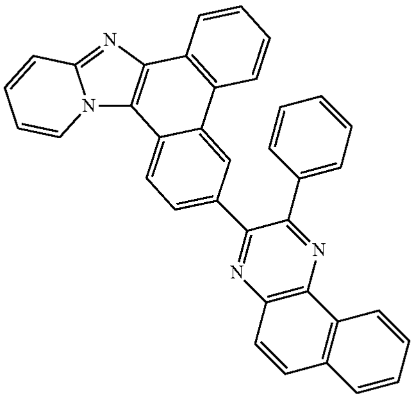
A-41
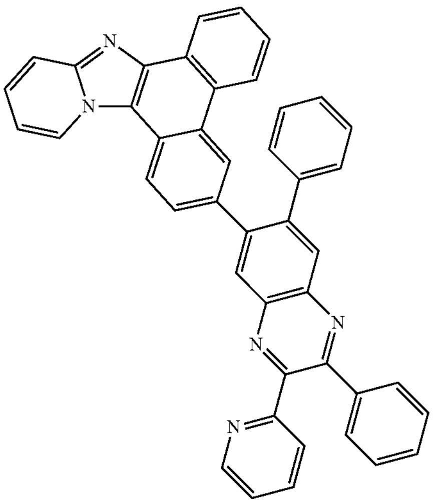
A-42
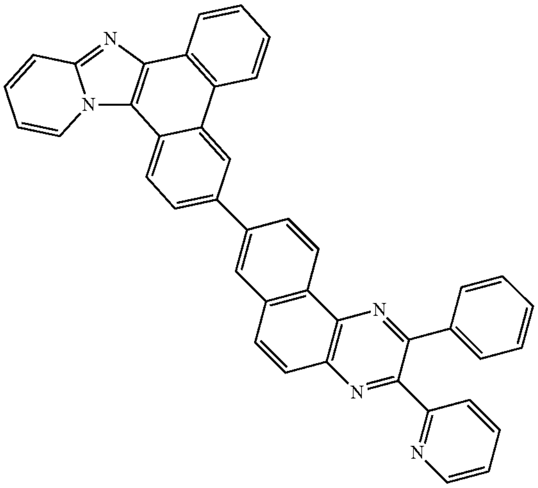
-continued
A-43
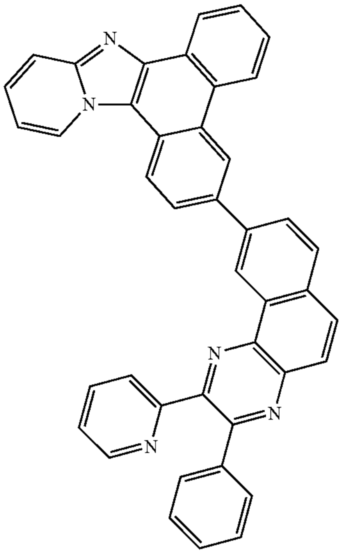
A-44
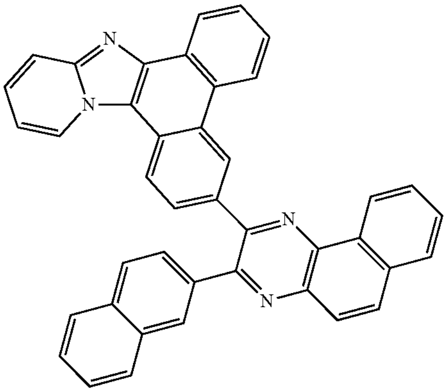
A-45
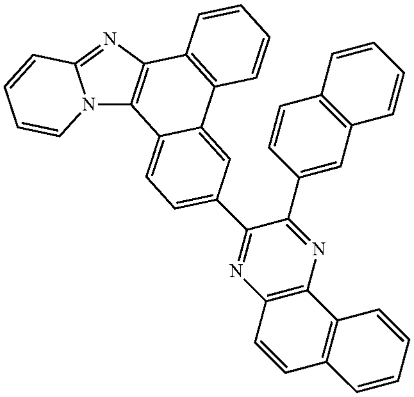

-continued
A-46
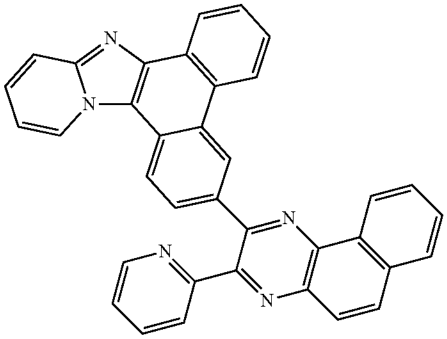
A-47
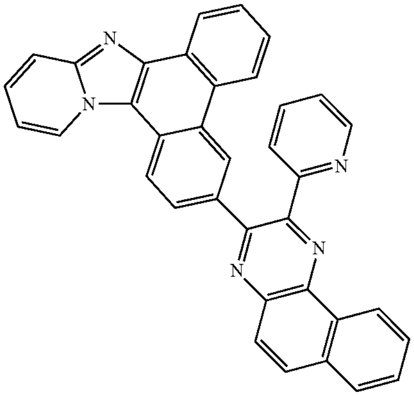
A-48
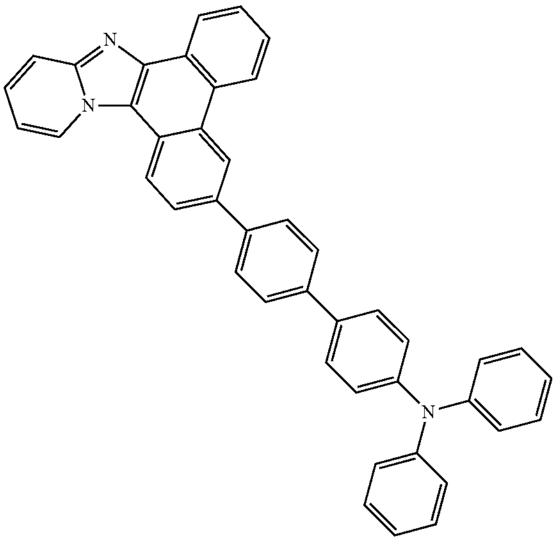
-continued
A-49
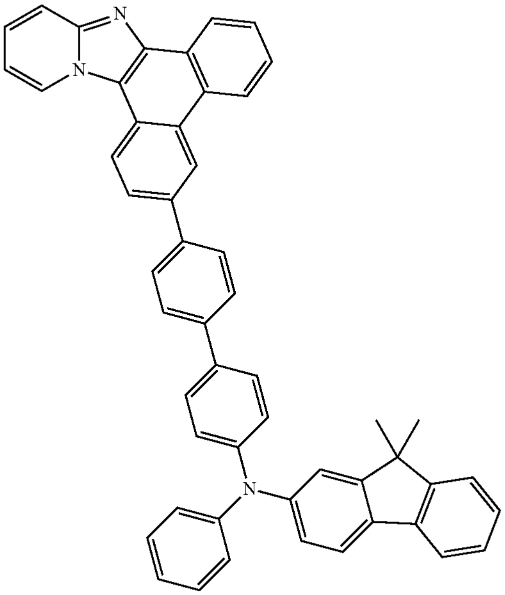
A-50
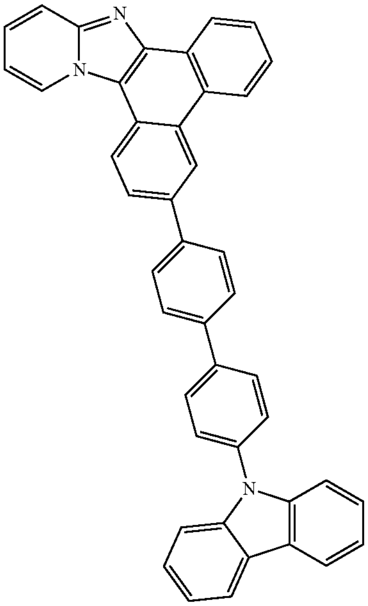
A-51
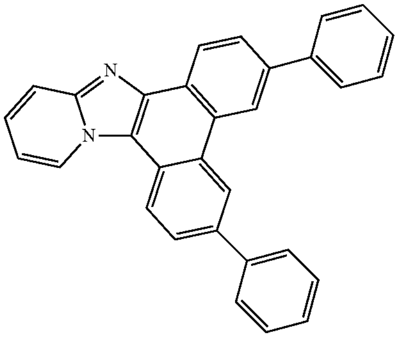

-continued
A-52
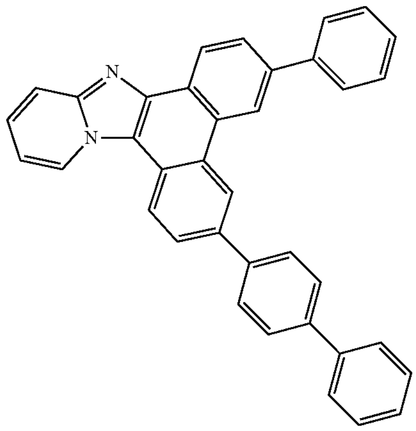
A-53
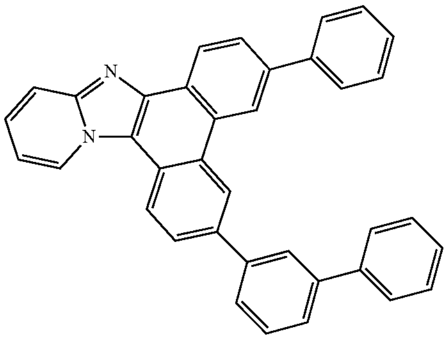
A-54
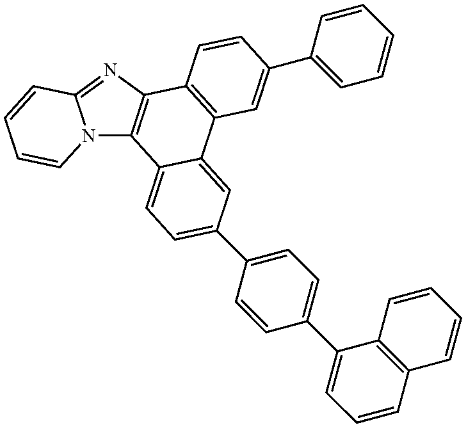
-continued
A-55
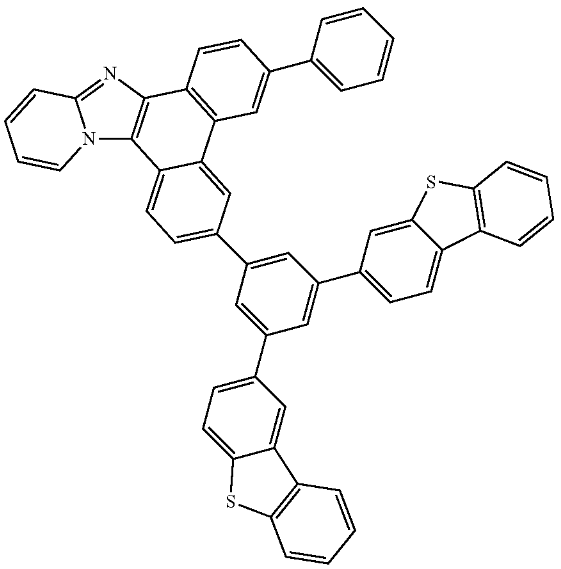
A-56
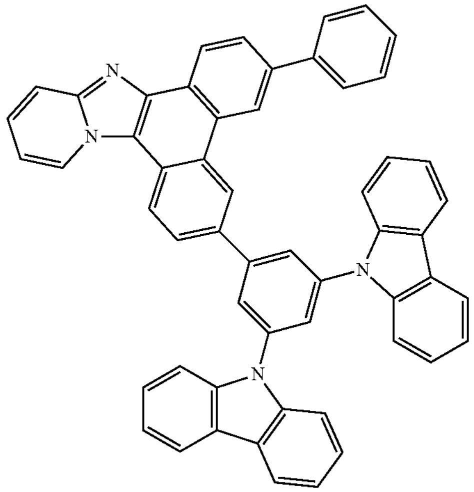
A-57
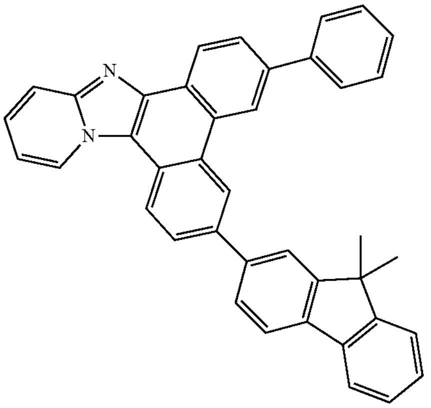

-continued
A-58
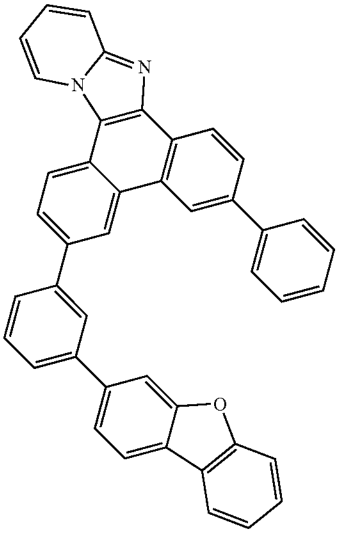
A-59
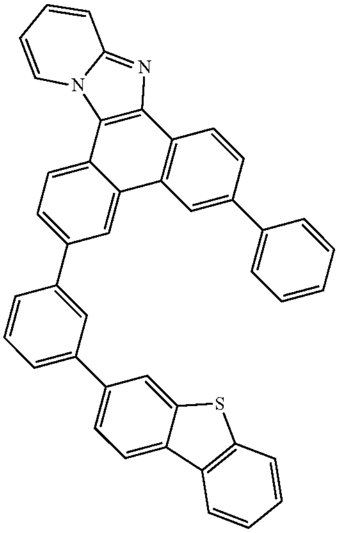
A-60
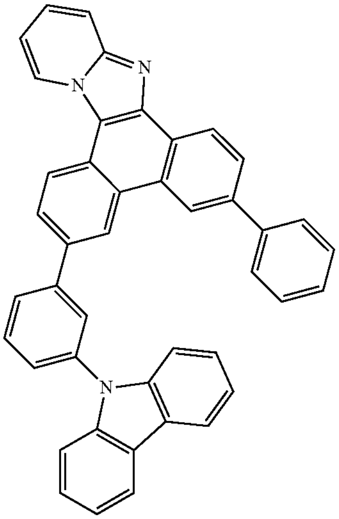
-continued
A-61
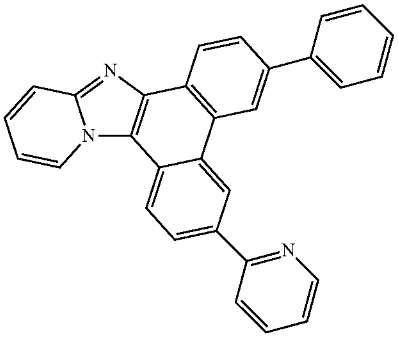
A-62
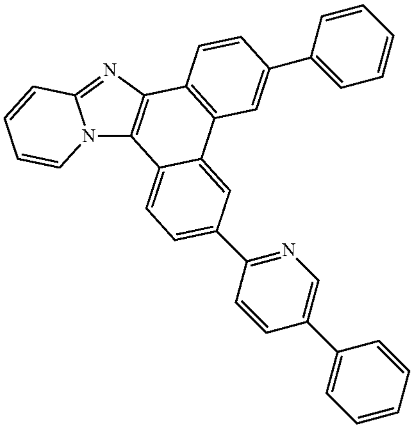
A-63
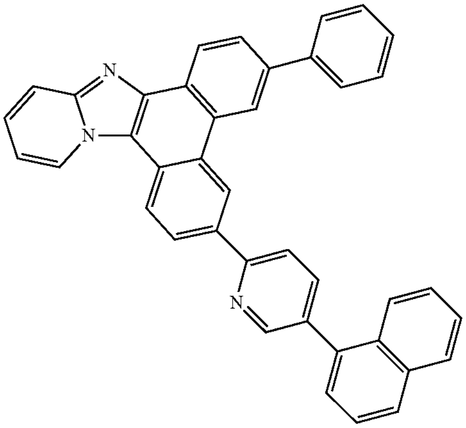
A-64
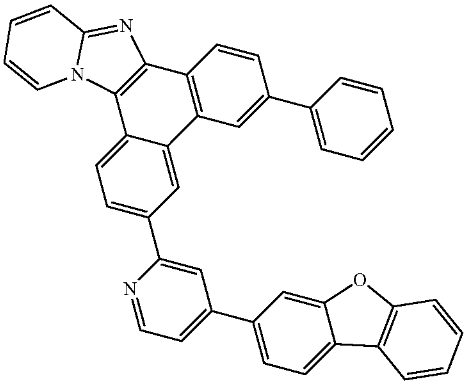

-continued
A-65
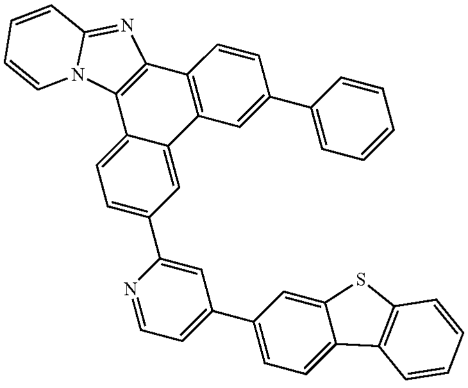
A-66
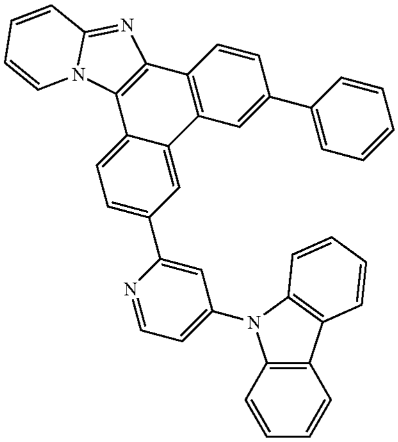
A-67
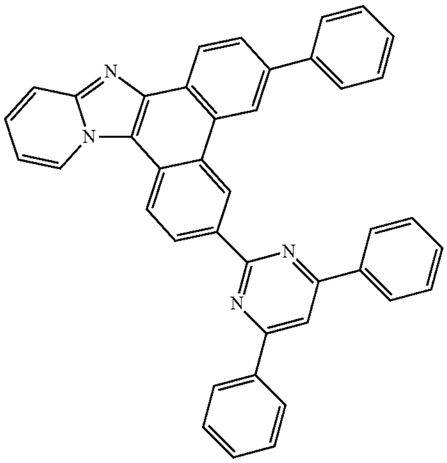
-continued
A-68
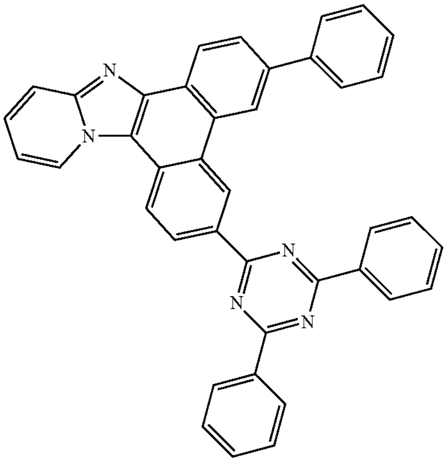
A-69
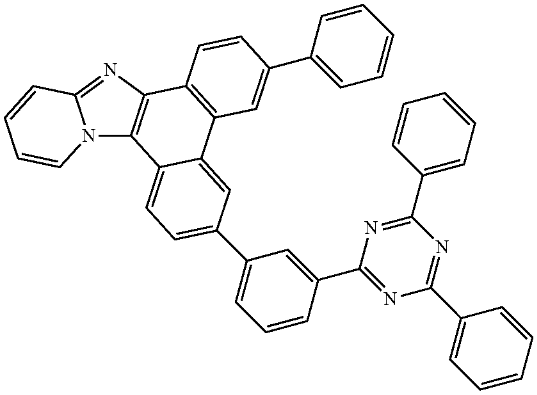
A-70
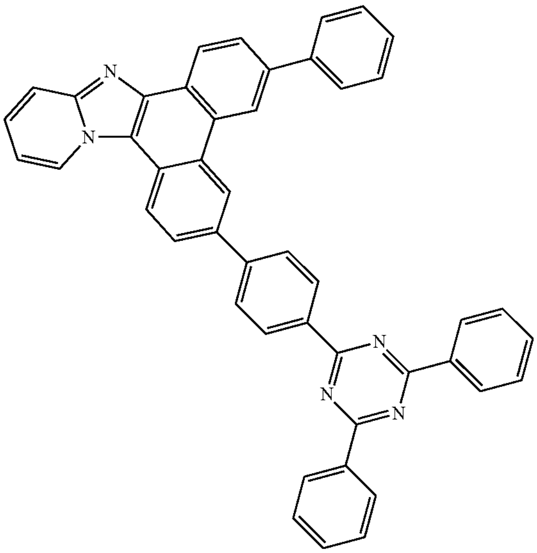

-continued
A-71
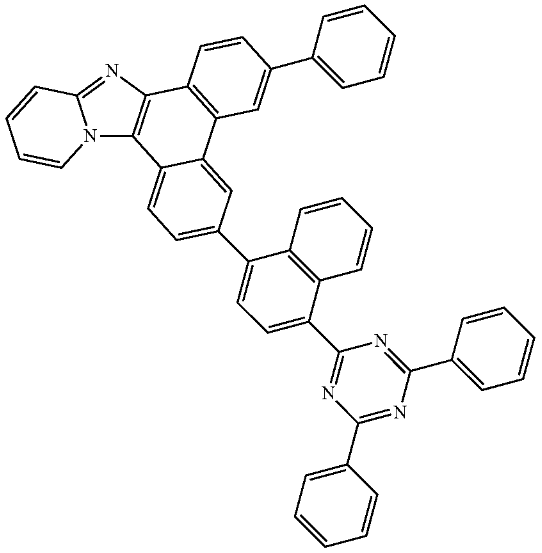
A-72
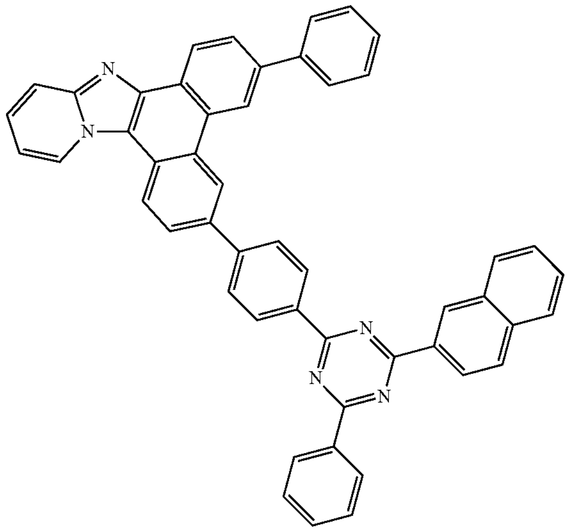
A-73
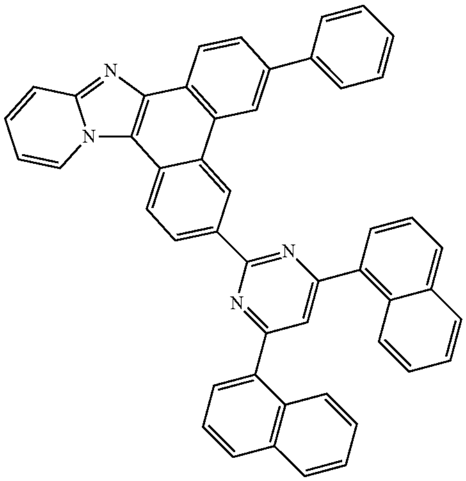
-continued
A-74
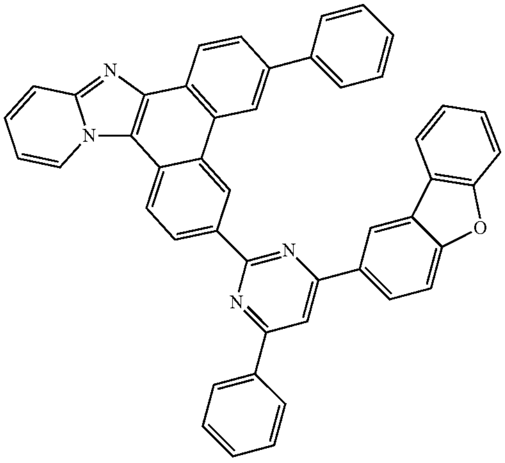
A-75
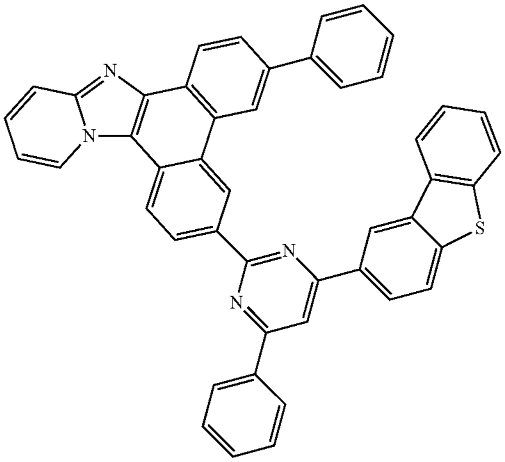
A-76
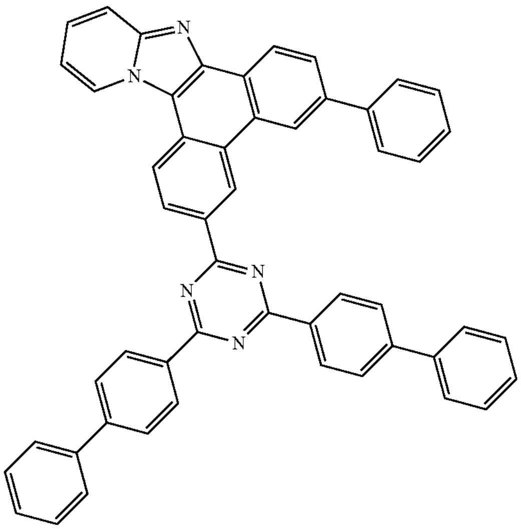

-continued
A-77
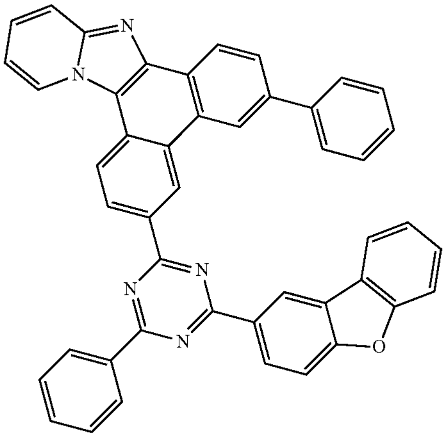
A-78
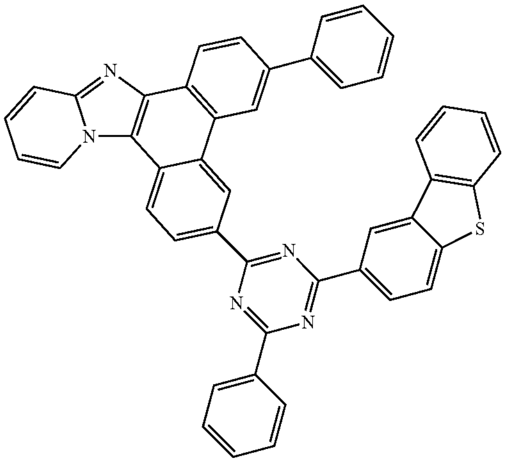
A-79
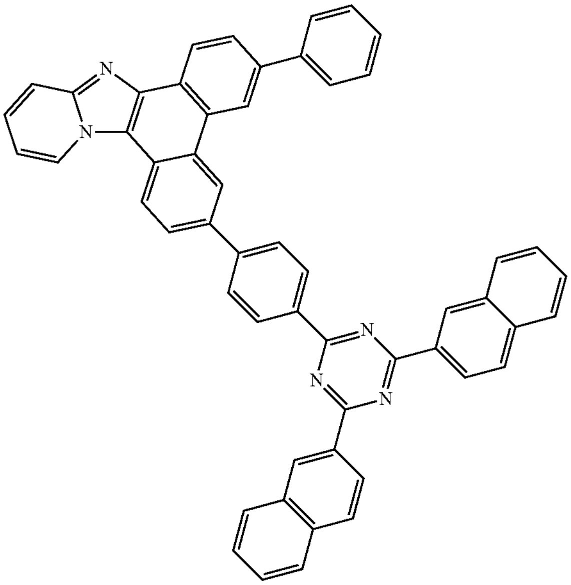
-continued
A-80
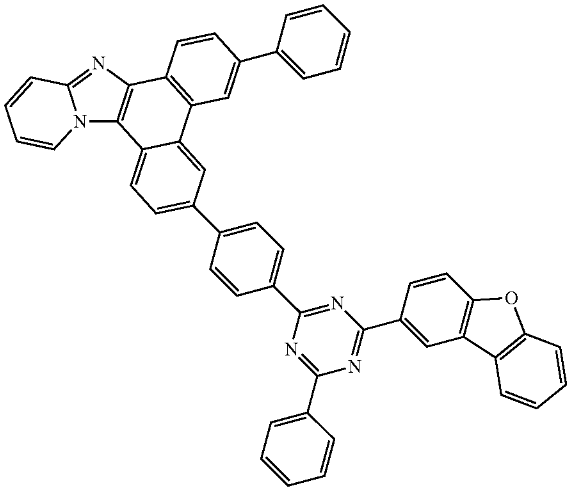
A-81
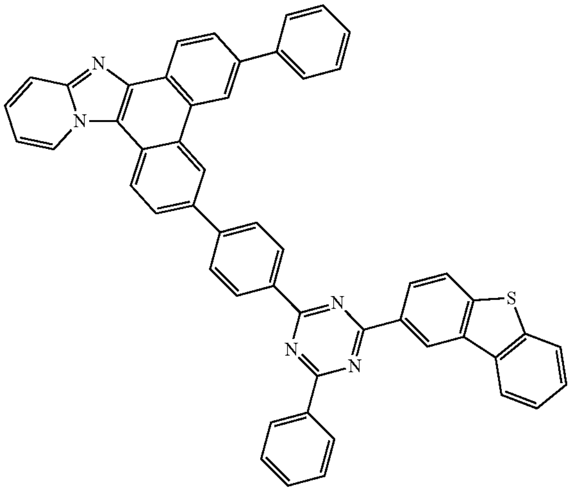
A-82
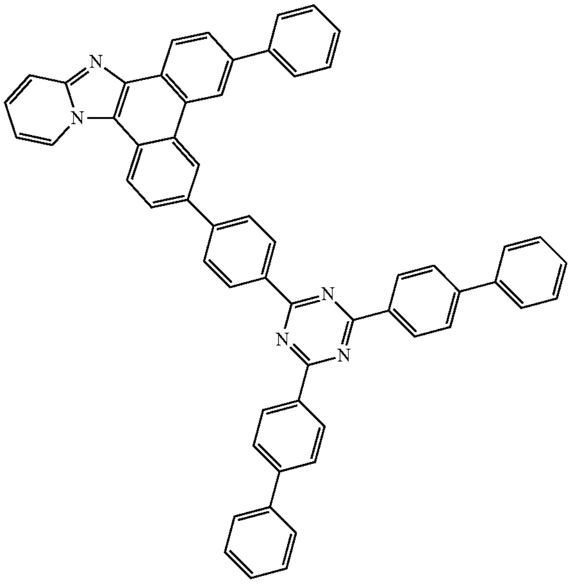

-continued
A-83
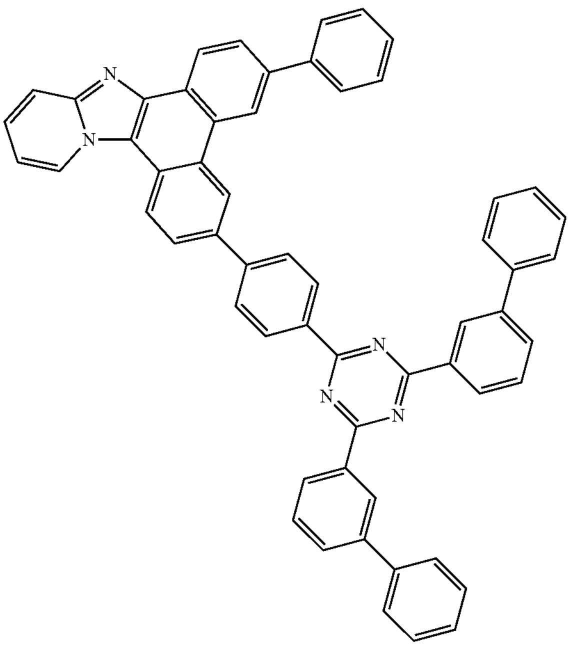
A-84
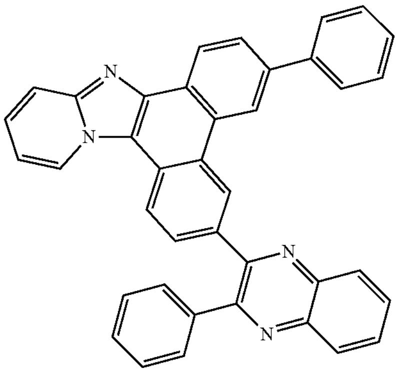
A-85
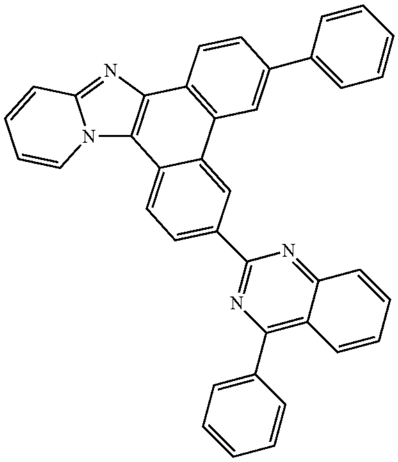
-continued
A-86
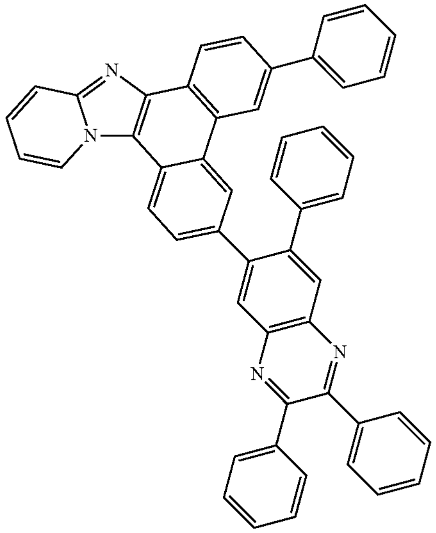
A-87
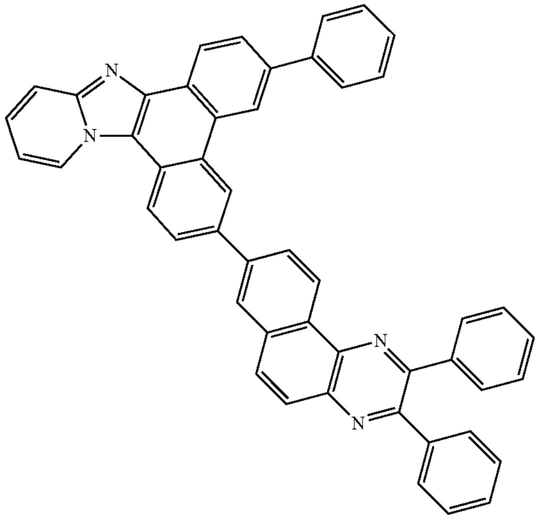
A-88
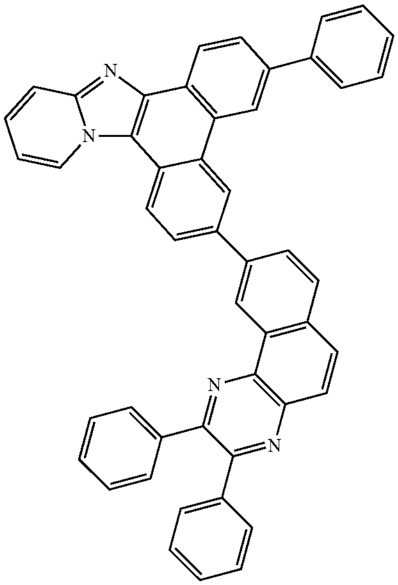

-continued
A-89
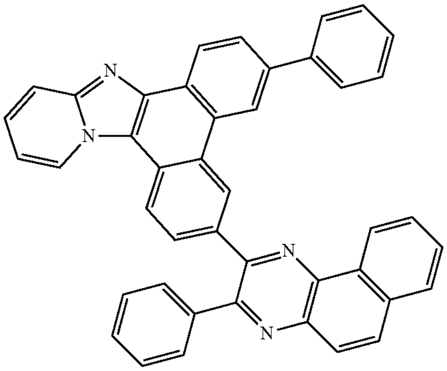
A-90
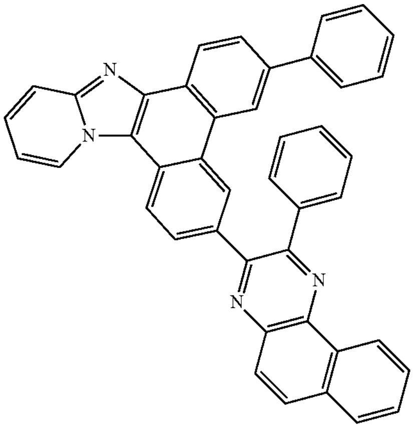
A-91
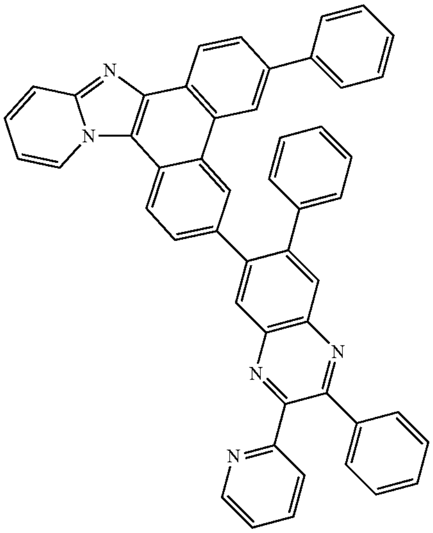
-continued
A-92
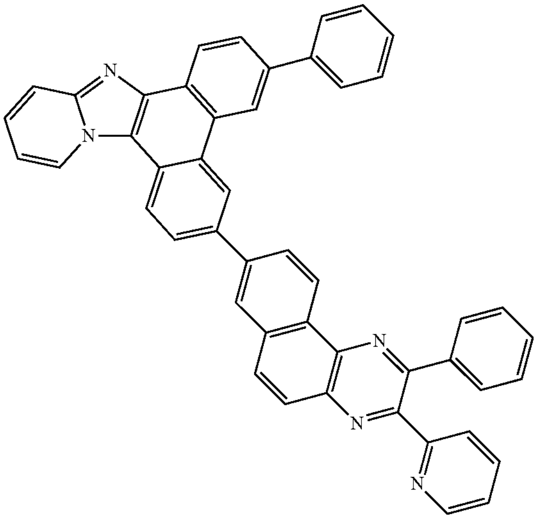
A-93
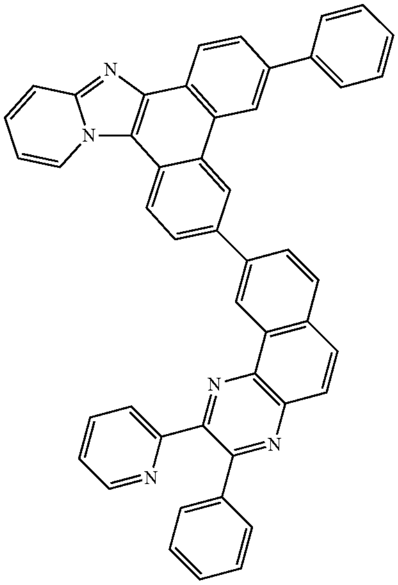
A-94
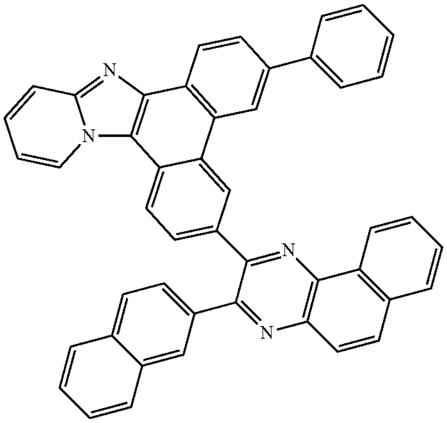

-continued
A-95
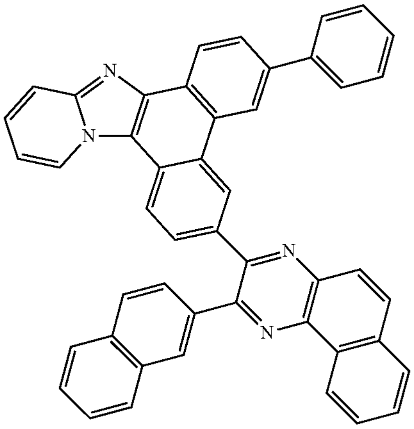
A-96
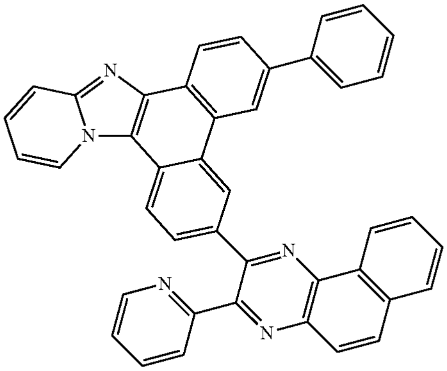
A-97
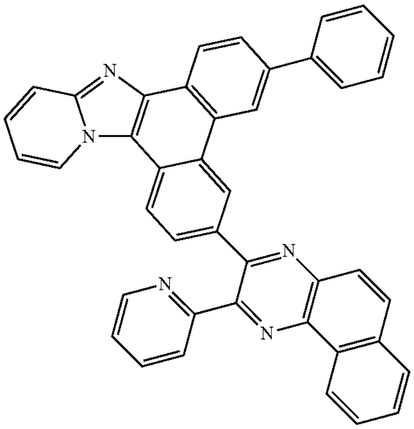
-continued
A-98
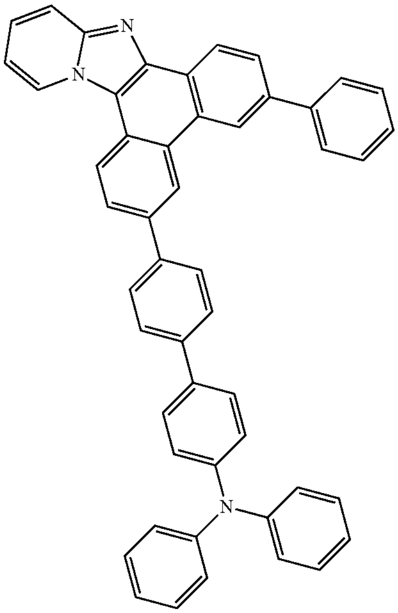
A-99
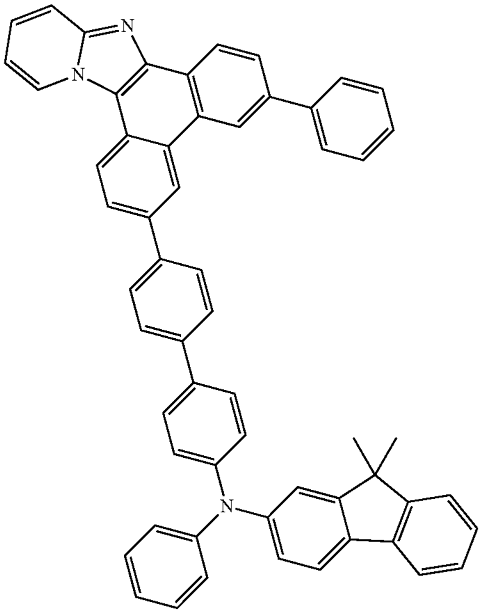

-continued
A-100
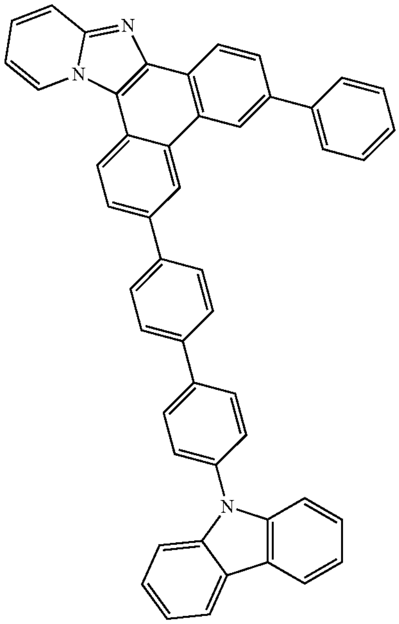
A-101
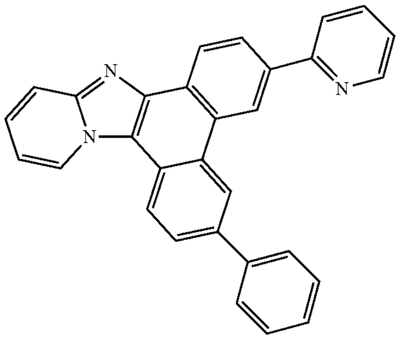
A-102
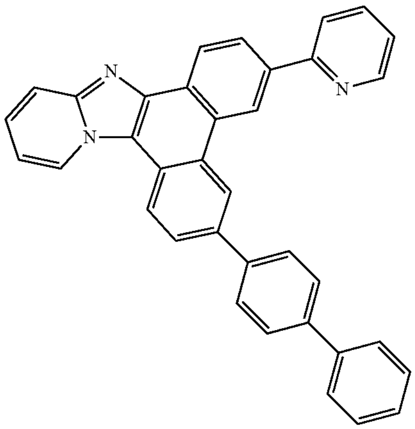
-continued
A-103
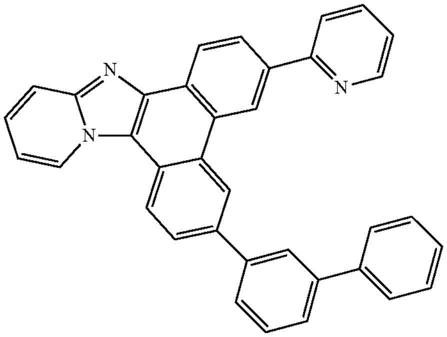
A-104
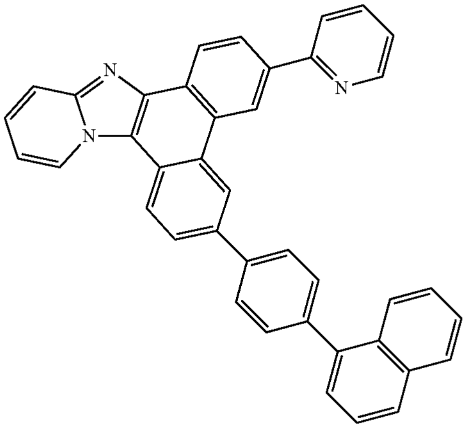
A-105
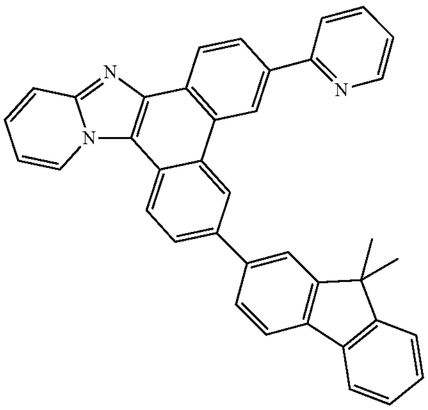
A-106
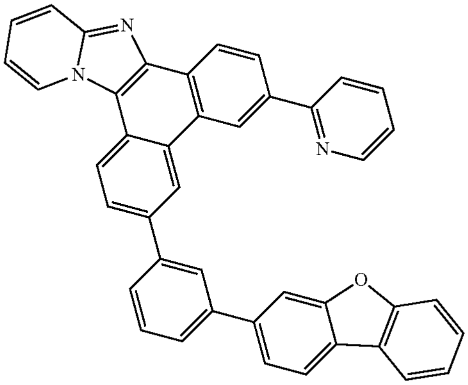

-continued
A-107
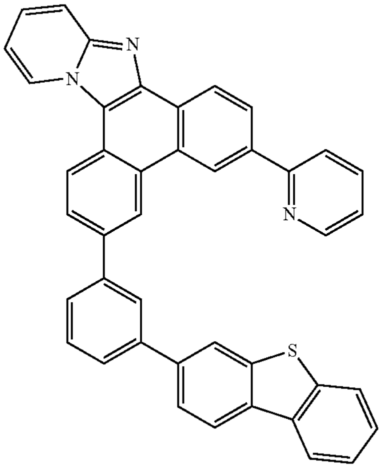
A-108
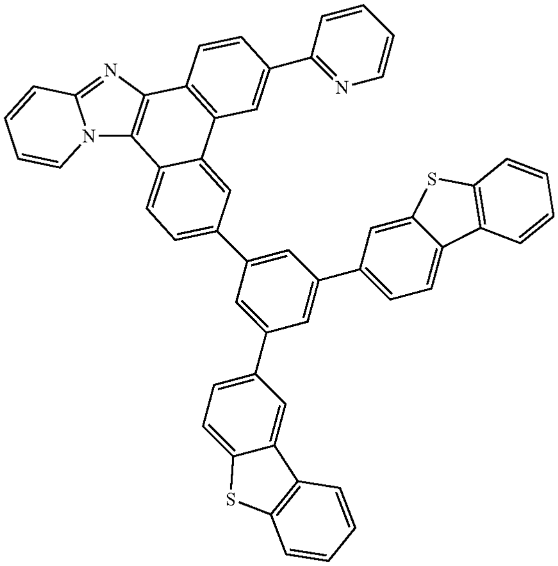
A-109
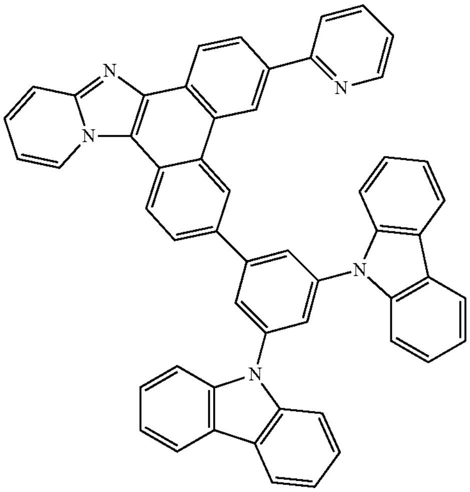
-continued
A-110
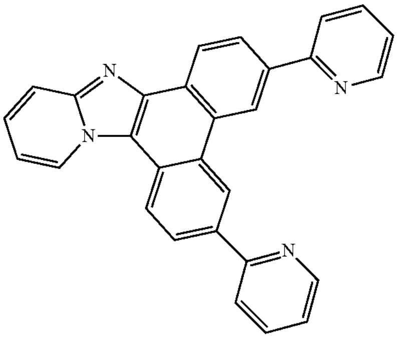
A-111
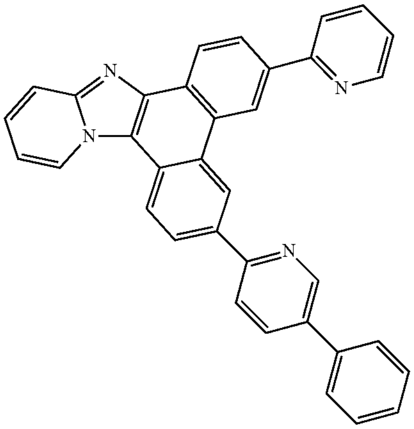
A-112
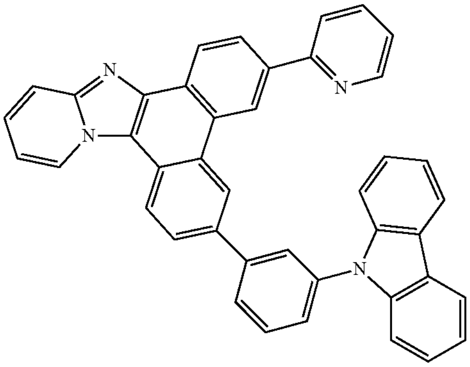
A-113
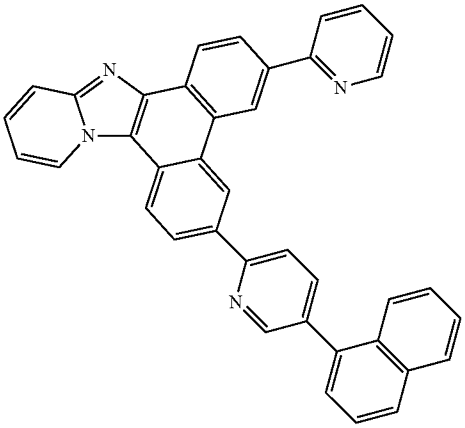

-continued
A-114
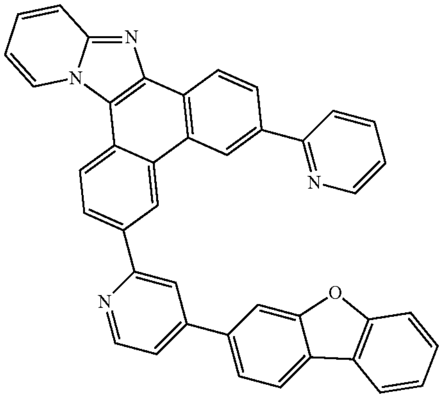
A-115
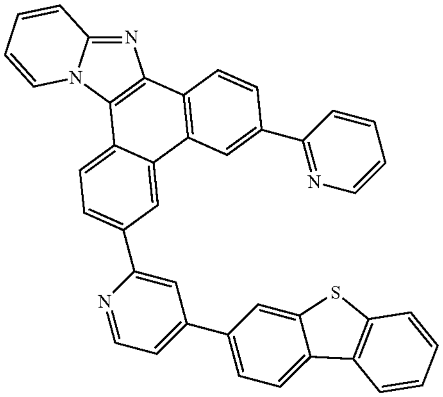
A-116
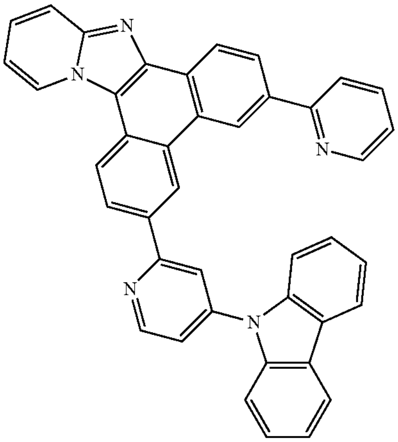
-continued
A-117
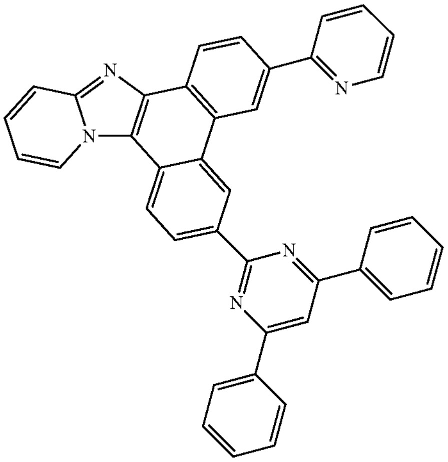
A-118
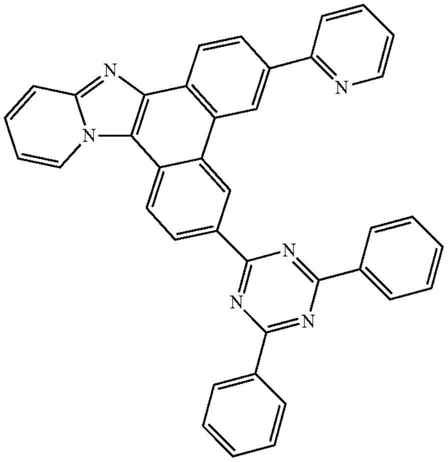
A-119
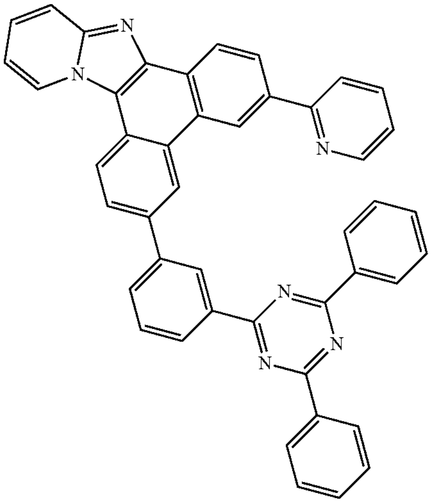

-continued
A-120
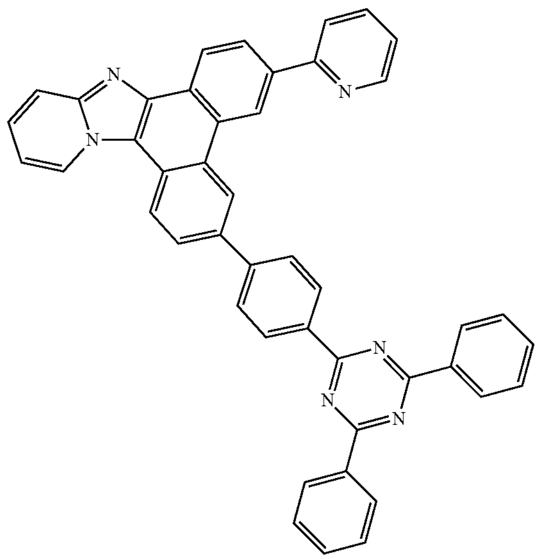
A-121
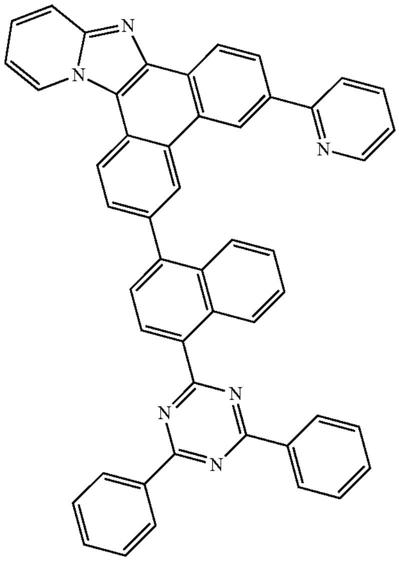
-continued
A-122
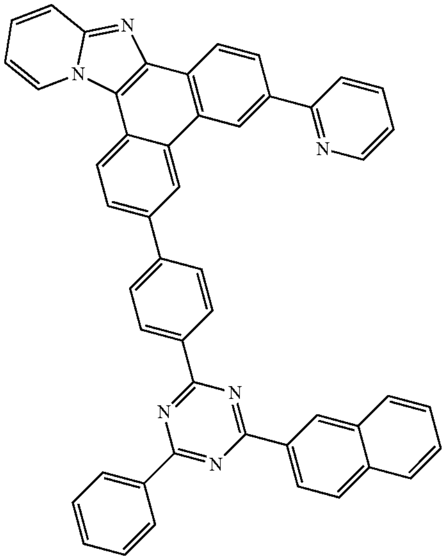
A-123
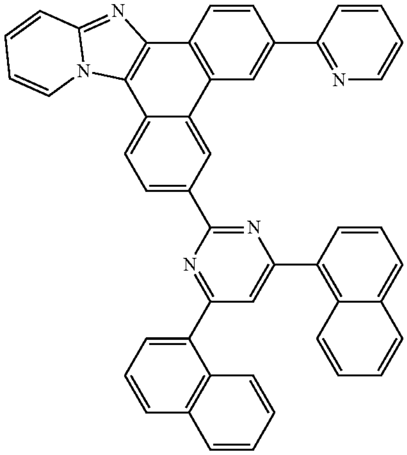
A-124
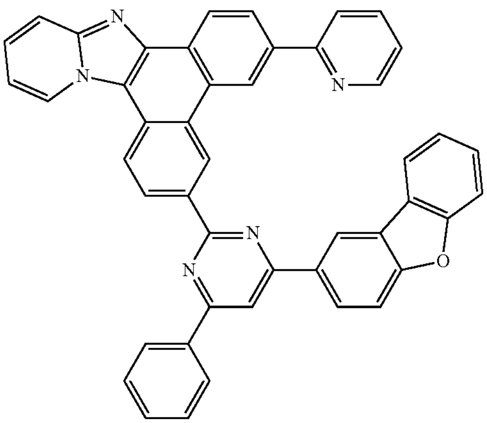

-continued
A-125
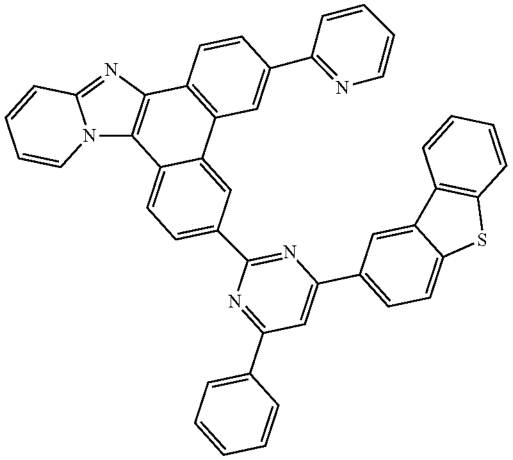
A-126
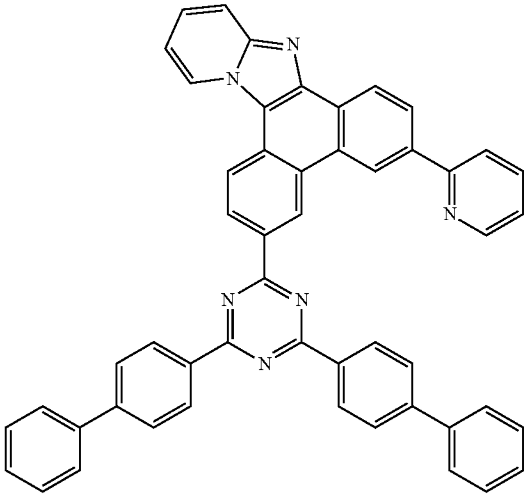
A-127
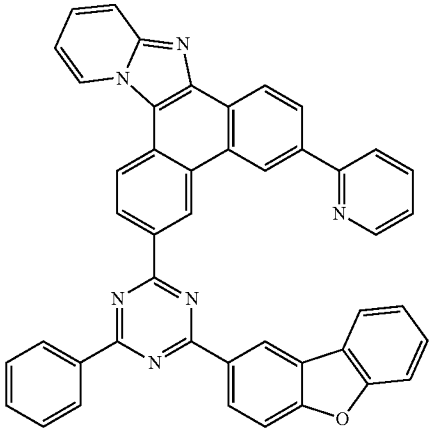
-continued
A-128
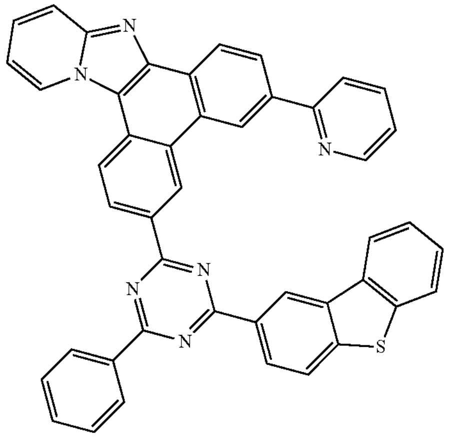
A-129
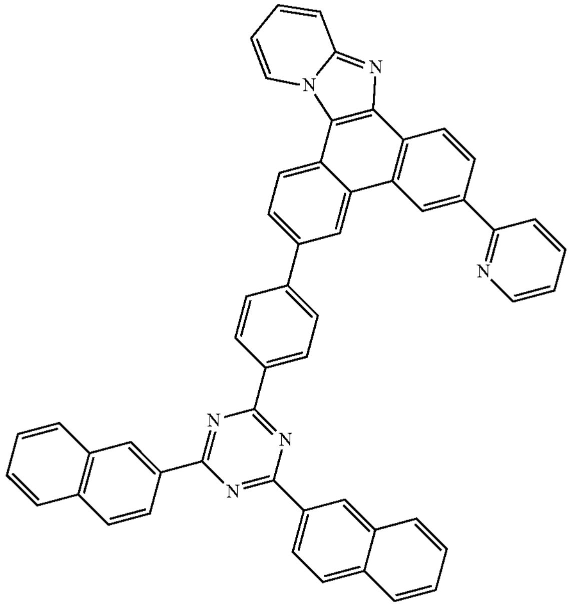

-continued
A-130
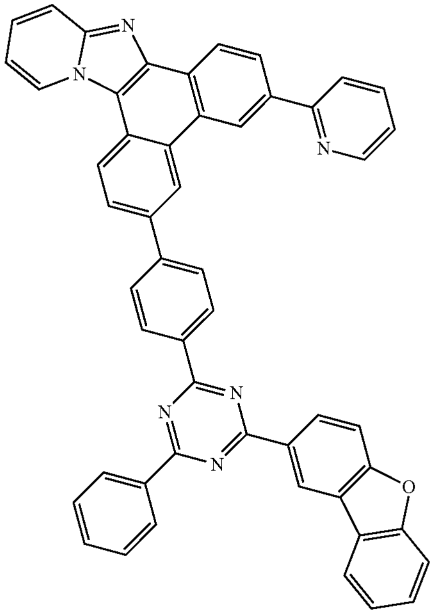
A-131
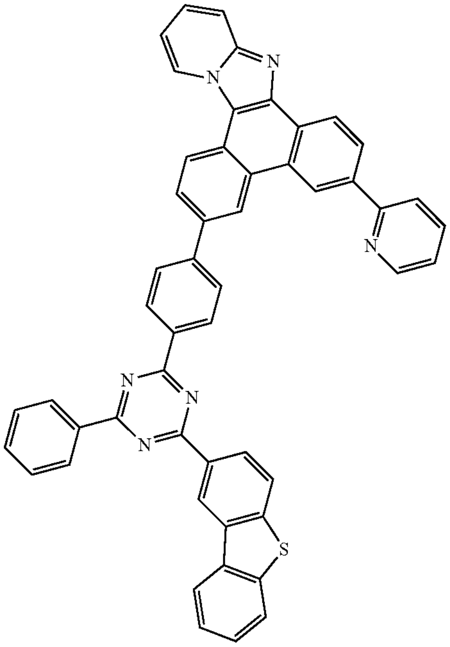
-continued
A-132
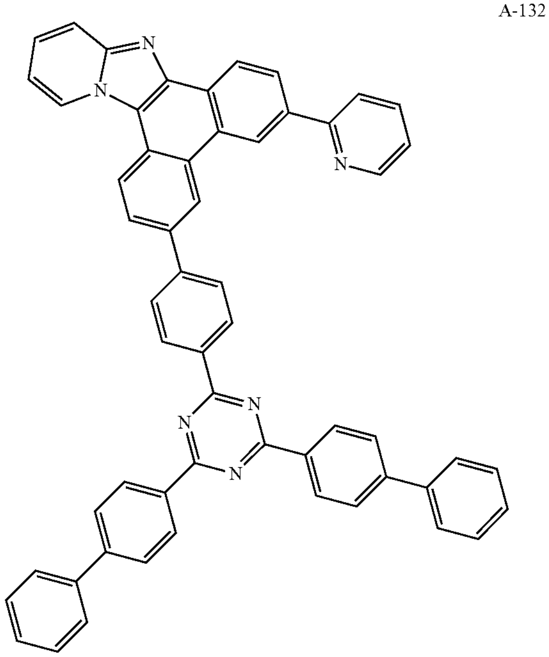
A-133
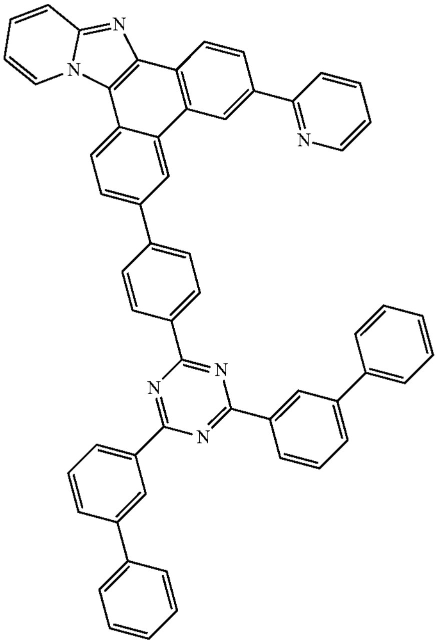

-continued
A-134
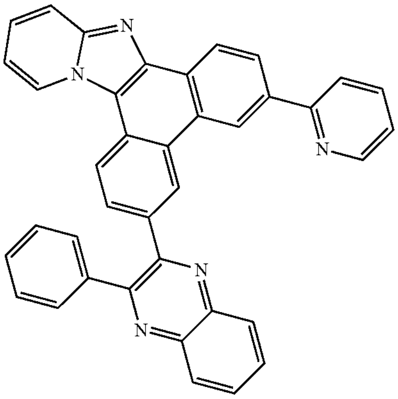
A-135
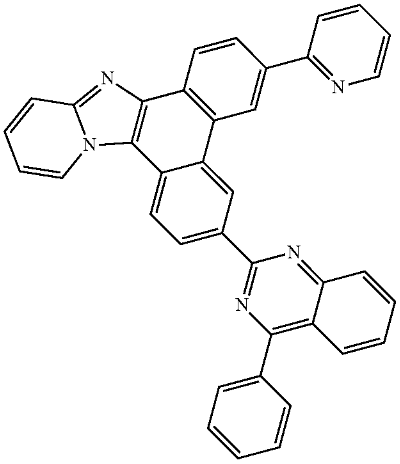
A-136
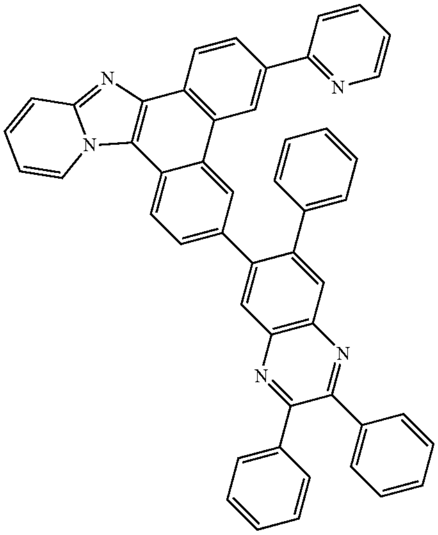
-continued
A-137
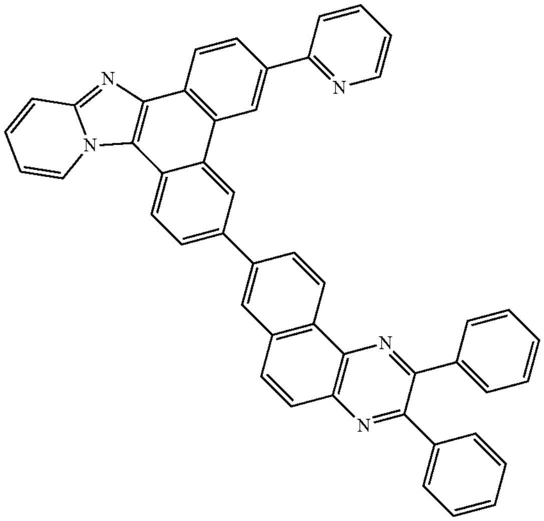
A-138
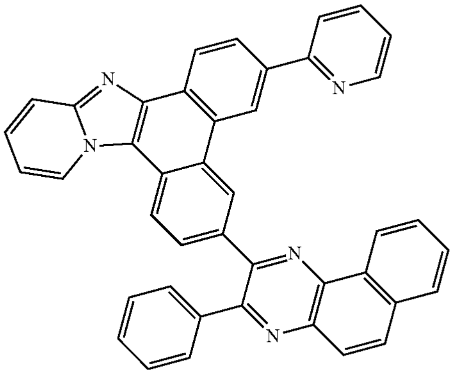
A-139
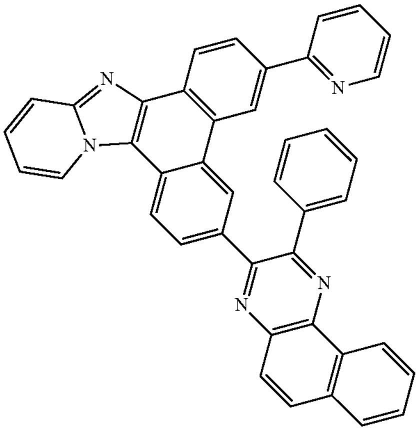

-continued
A-140
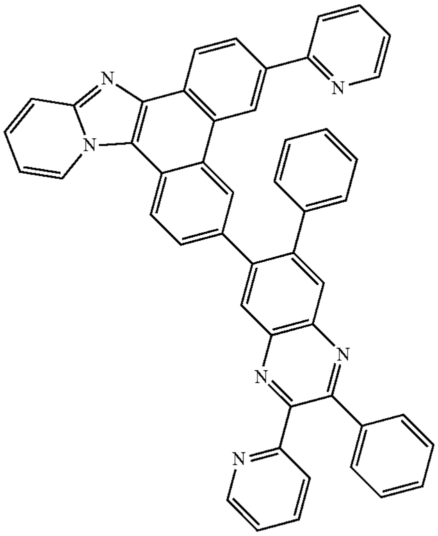
A-141
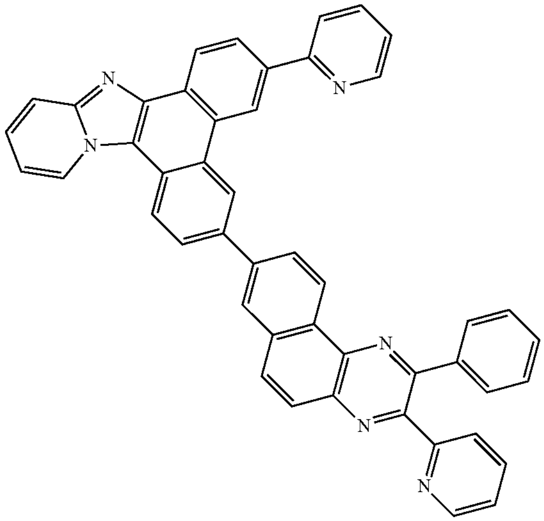
A-142
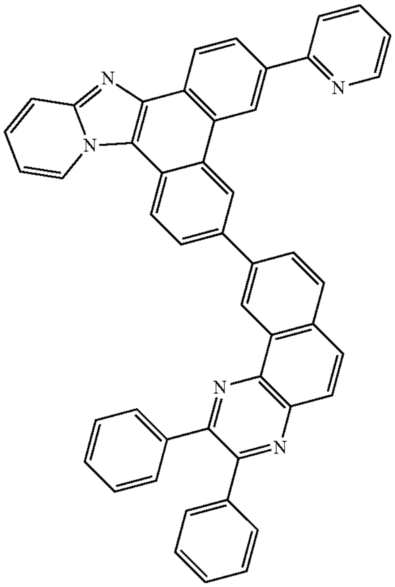
-continued
A-143
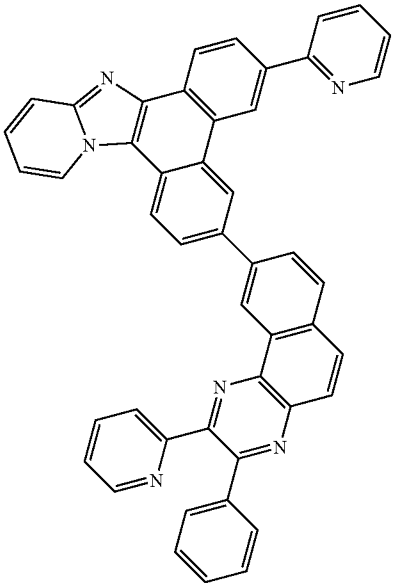
A-144
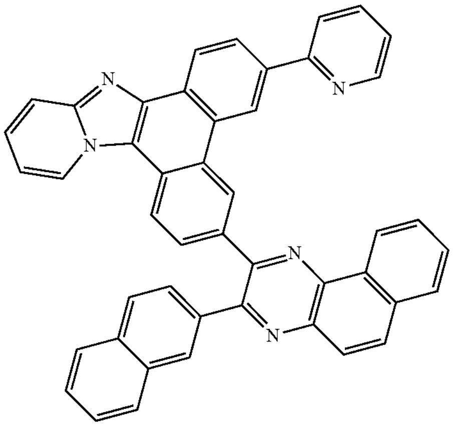
A-145
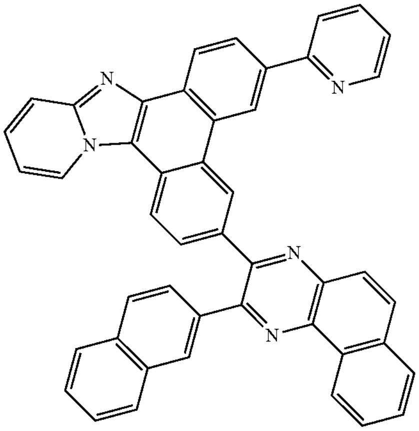

-continued
A-146
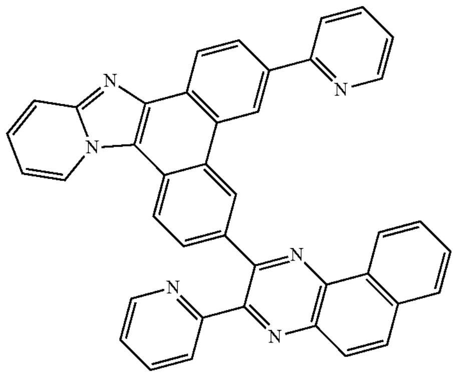
A-147
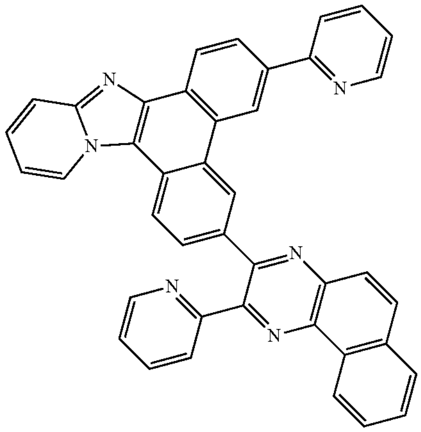
A-148
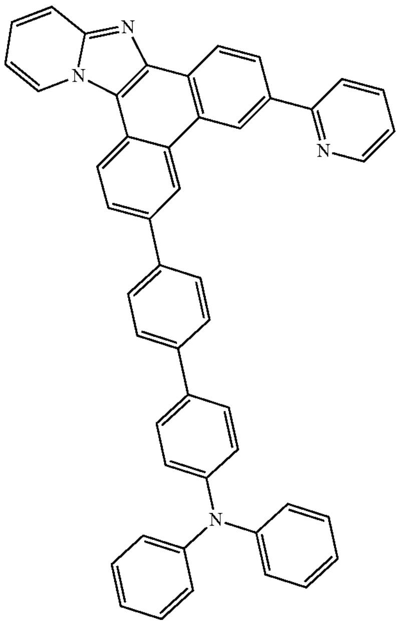
-continued
A-149
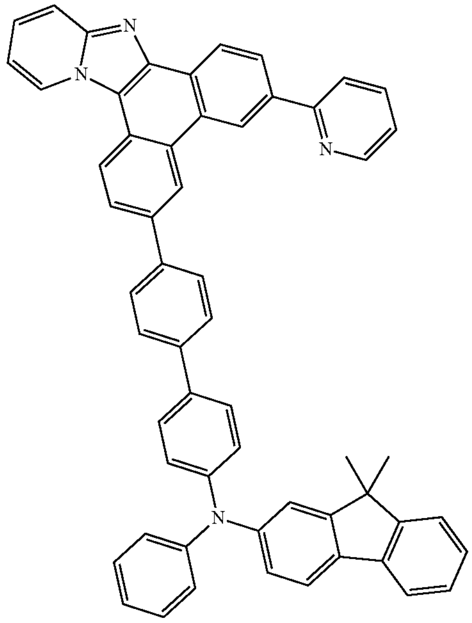
A-150
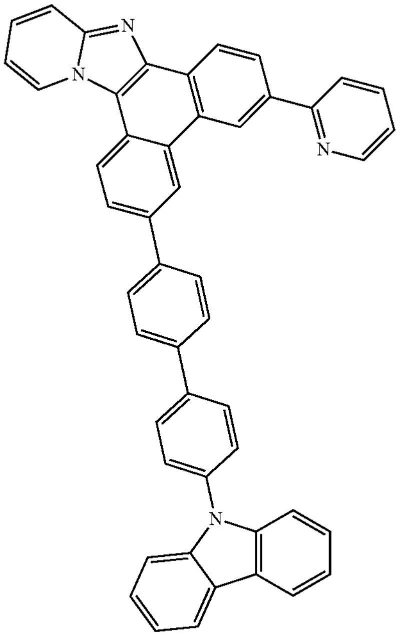

-continued
A-151
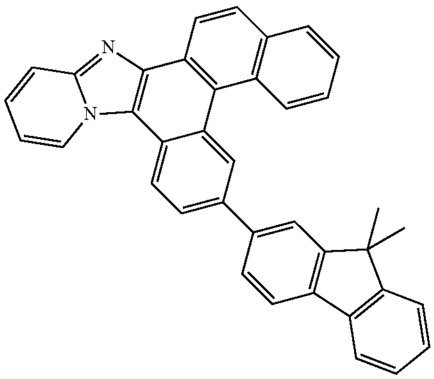
A-152
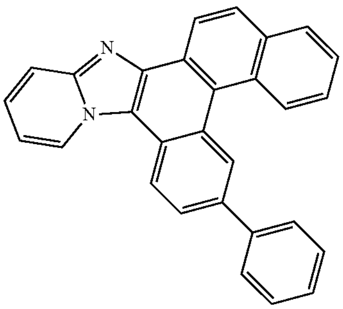
A-153
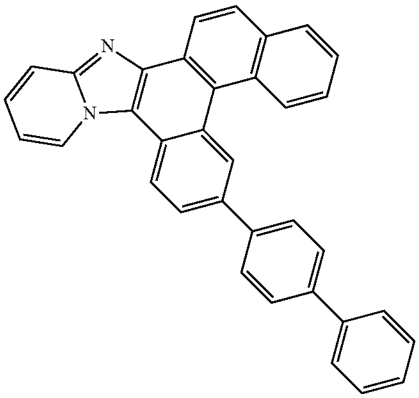
A-154
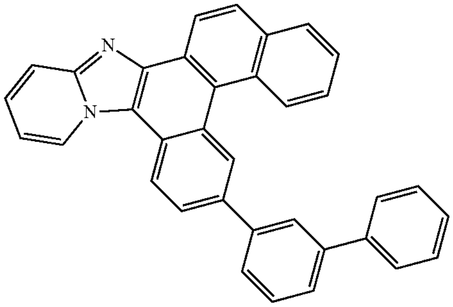
-continued
A-155
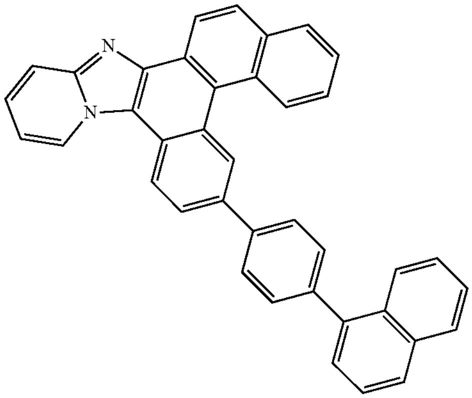
A-156
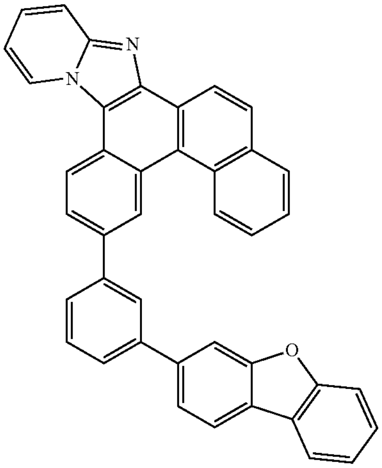
A-157
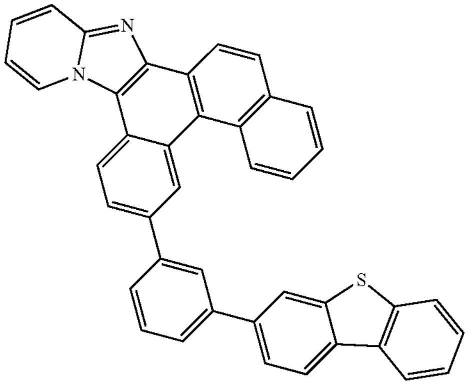

-continued
A-158
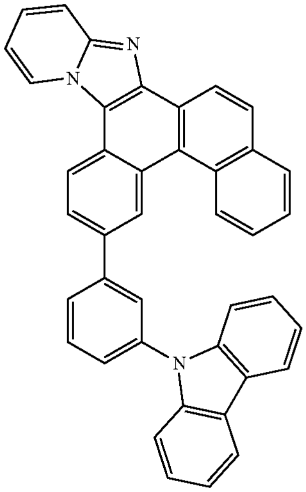
A-159
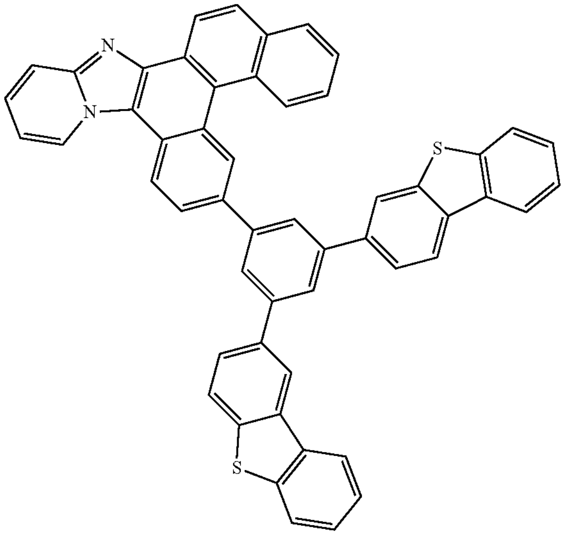
A-160
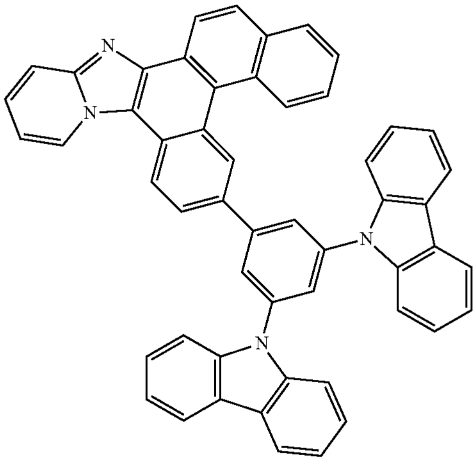
-continued
A-161
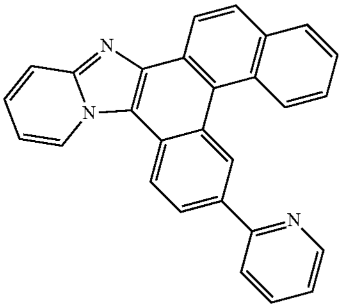
A-162
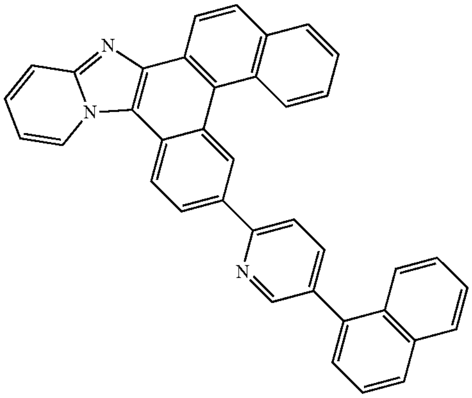
A-163
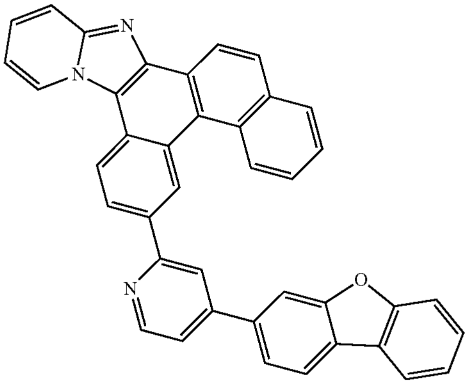
A-164
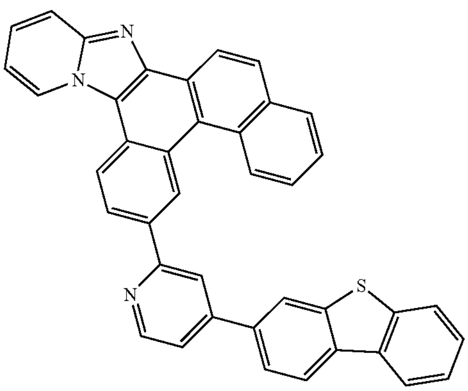

-continued
A-165
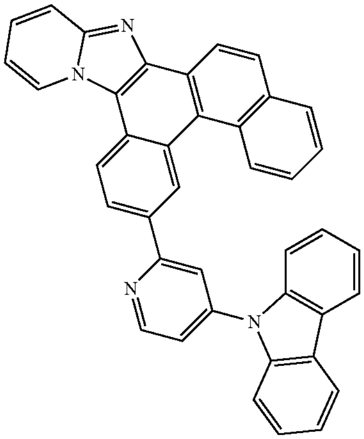
A-166
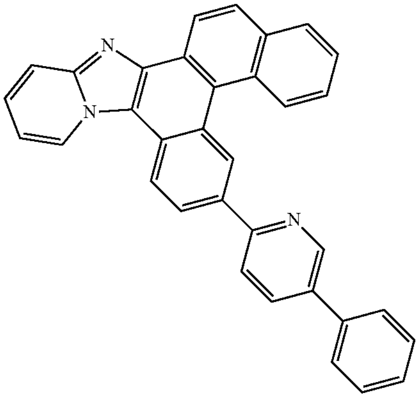
A-167
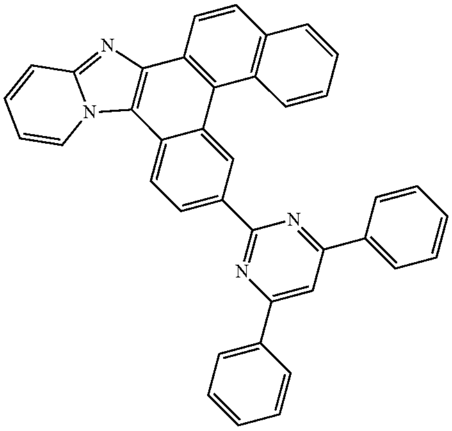
-continued
A-168
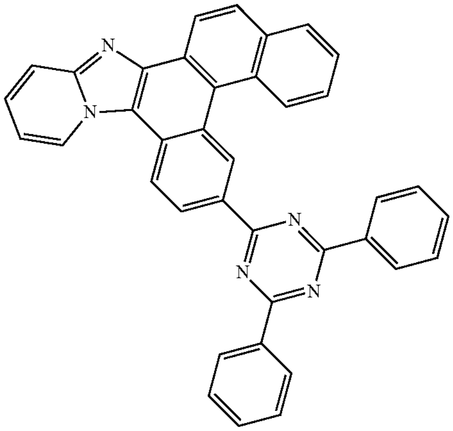
A-169
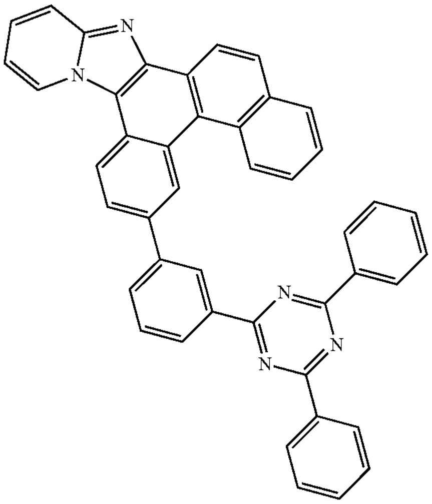
A-170
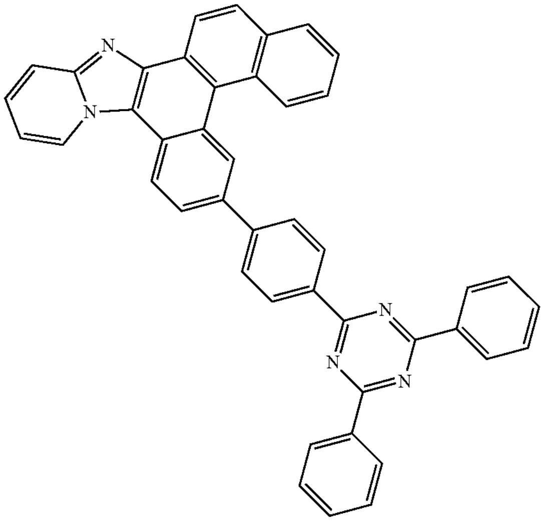

-continued
A-171
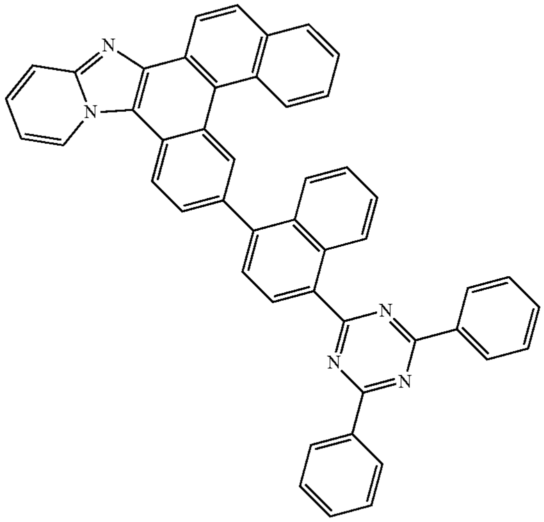
A-172
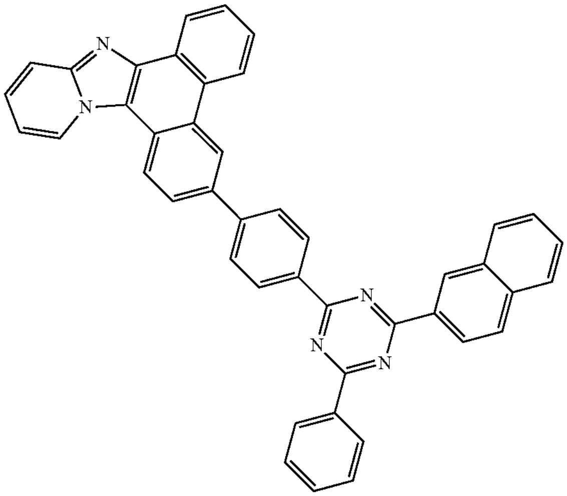
A-173
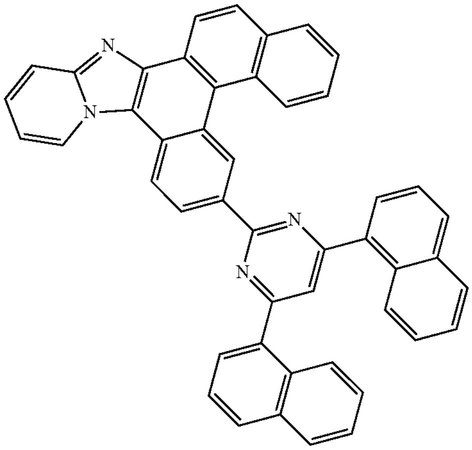
A-174
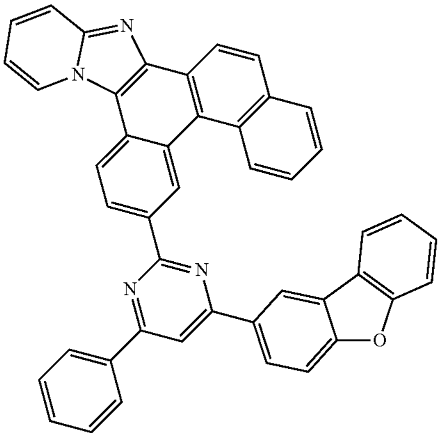
A-175
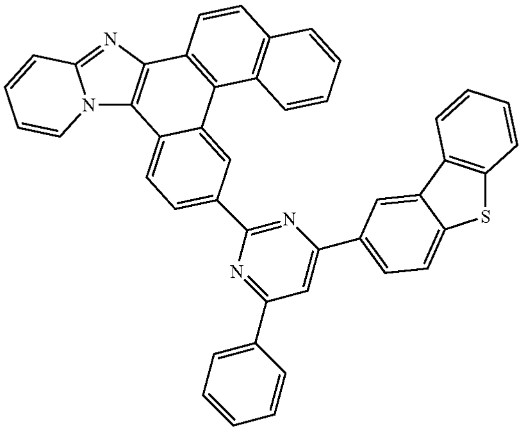
A-176
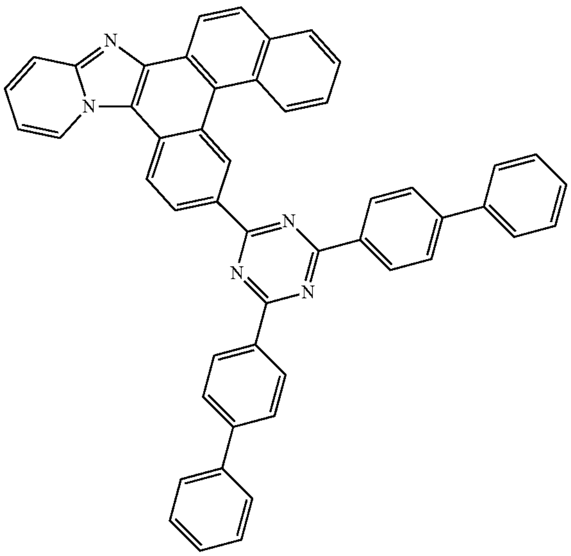

A-177
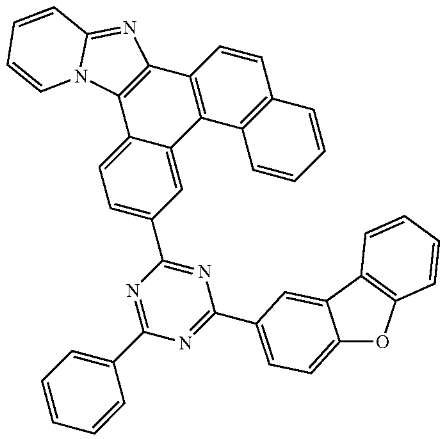
A-178
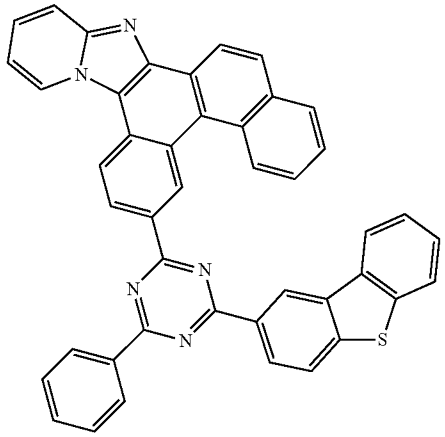
A-179
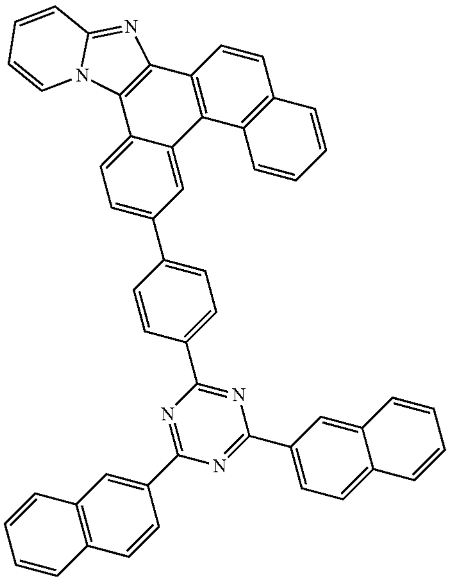
A-180
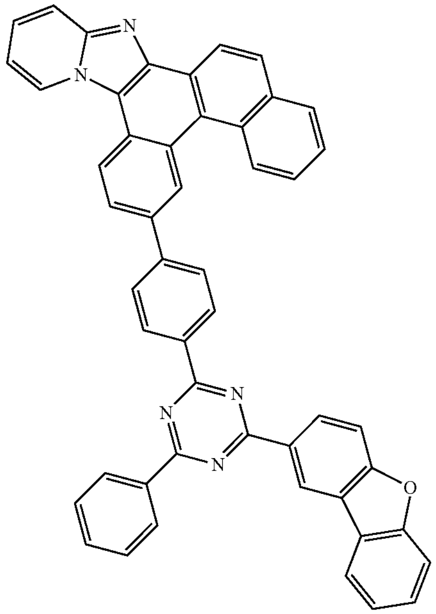
A-181
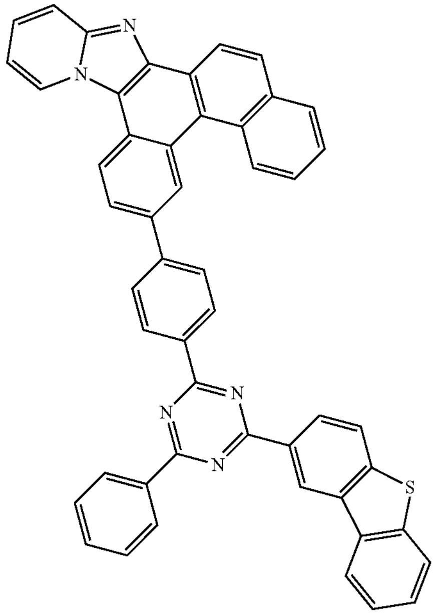

-continued
A-182
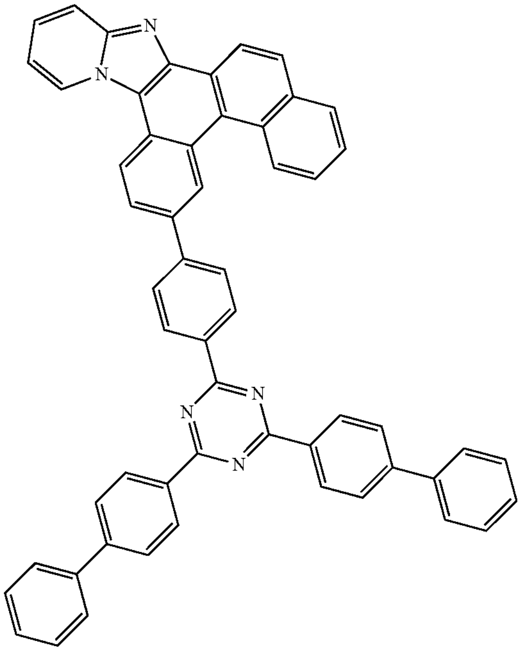
A-183
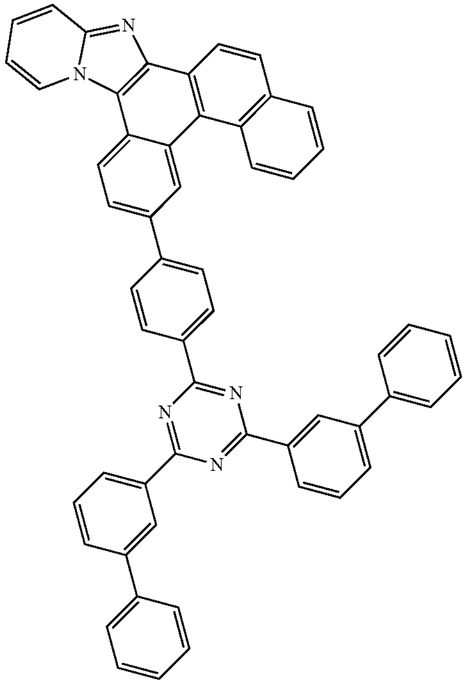
-continued
A-184
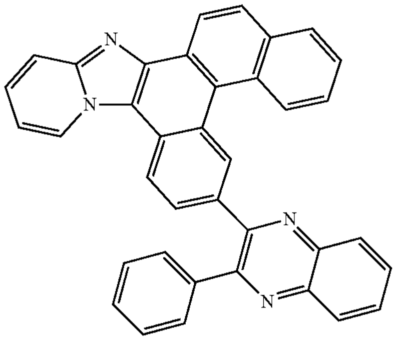
A-185
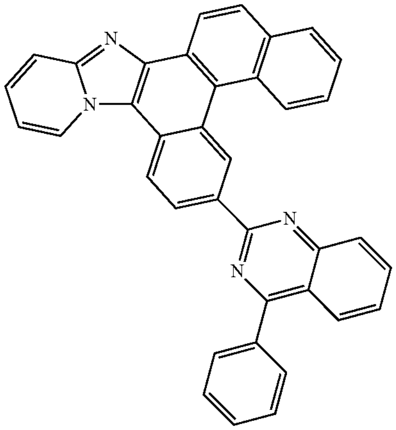
A-186
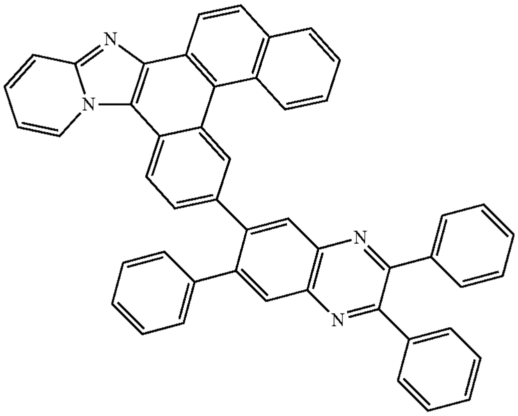

-continued
A-187
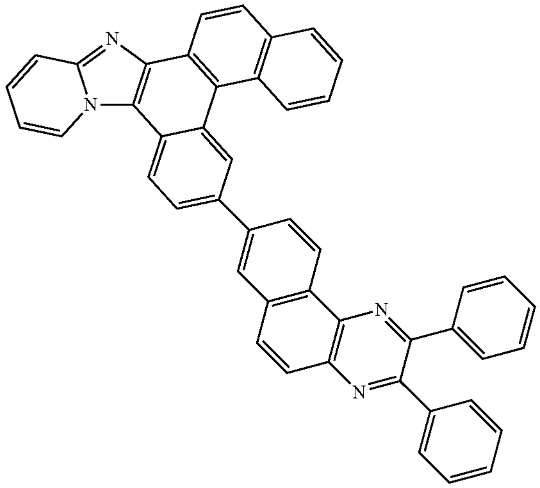
A-188
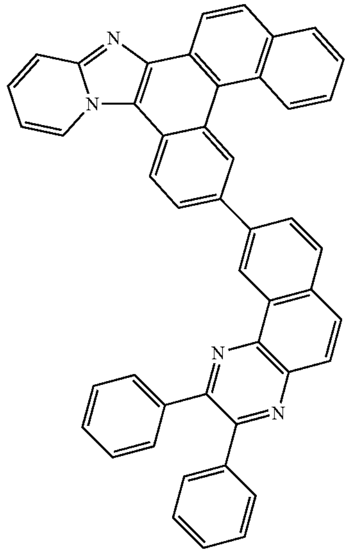
A-189
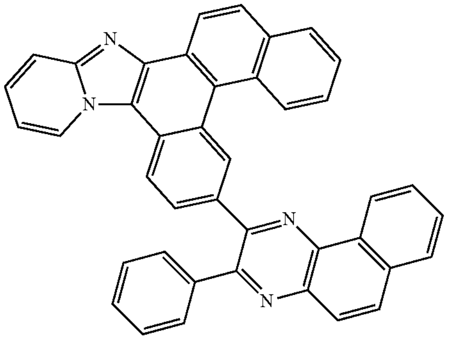
-continued
A-190
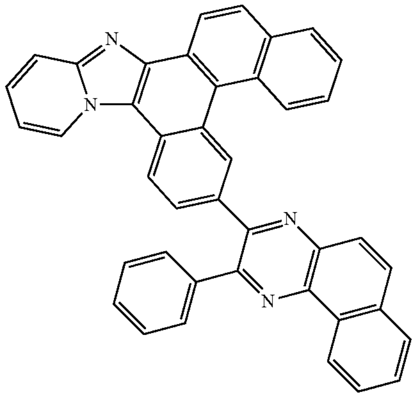
A-191
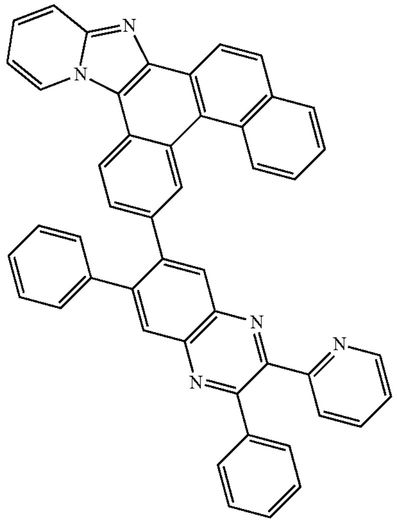
A-192
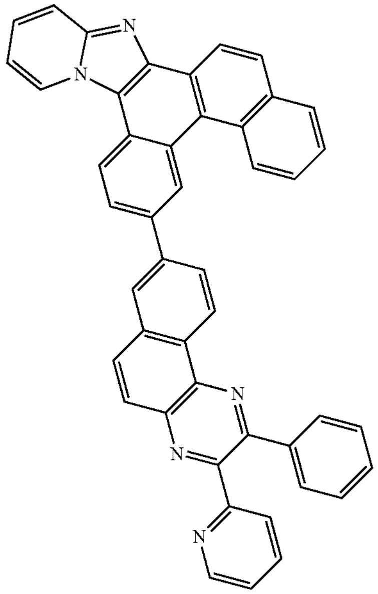

-continued
A-193
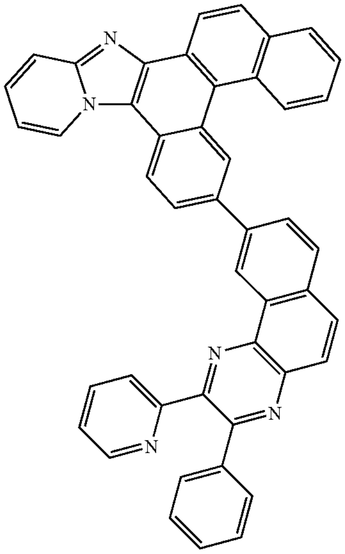
A-194
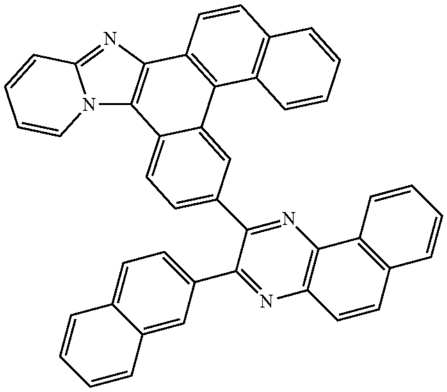
A-195
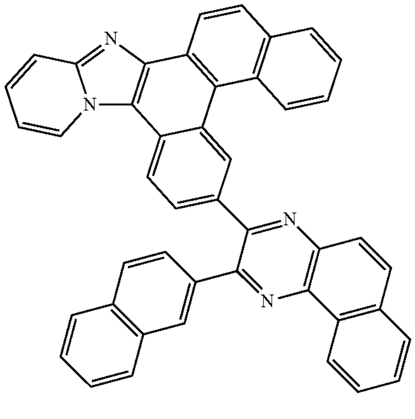
-continued
A-196
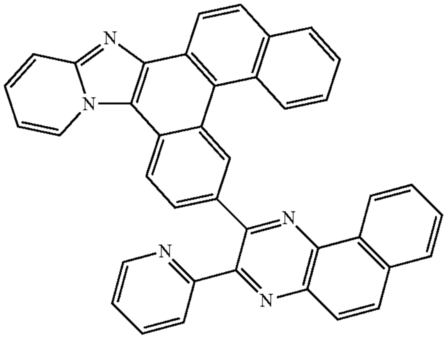
A-197
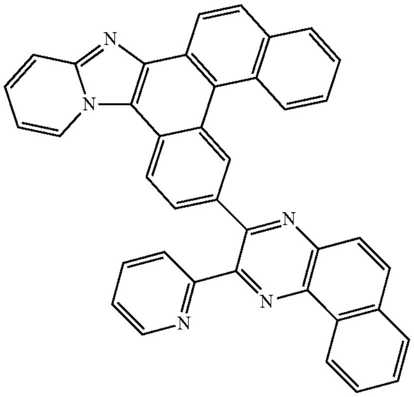
A-198
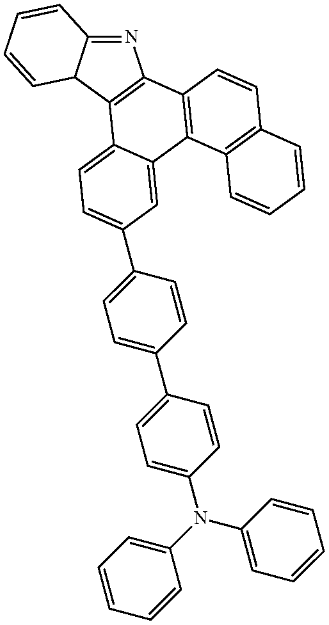

-continued
A-199
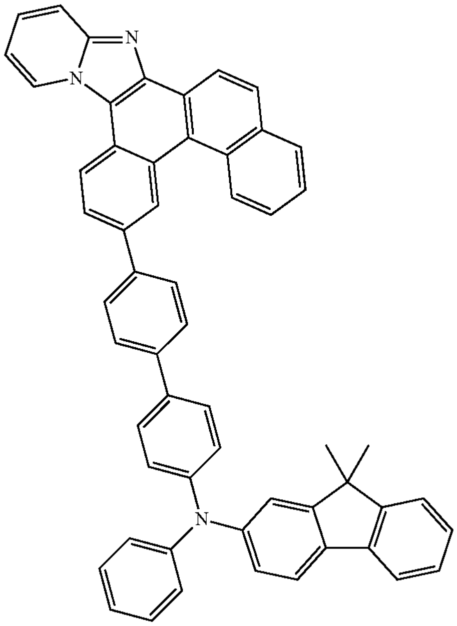
A-200
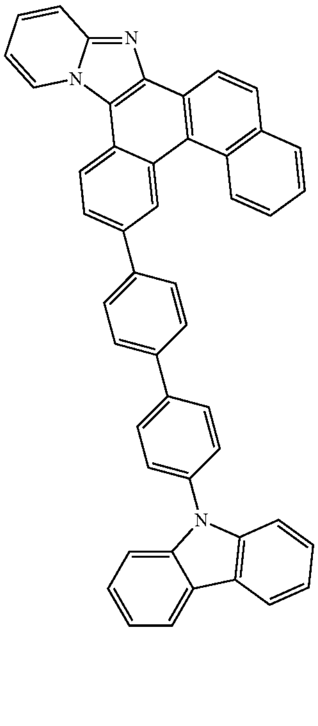
-continued
A-249
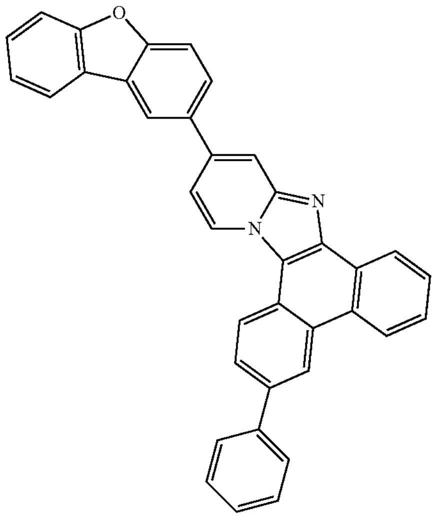
A-250
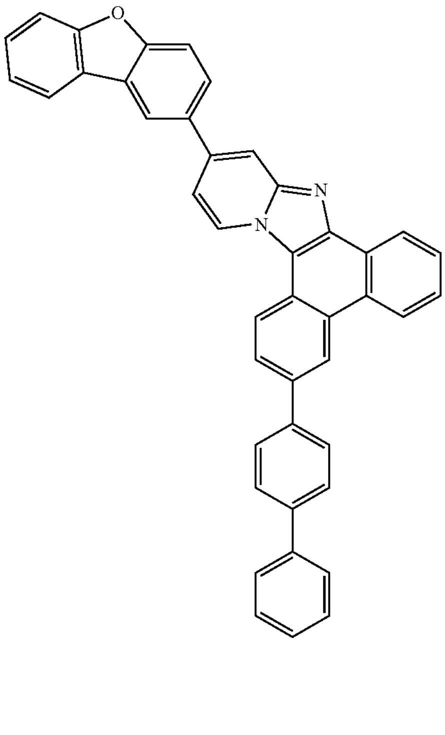

-continued
A-251
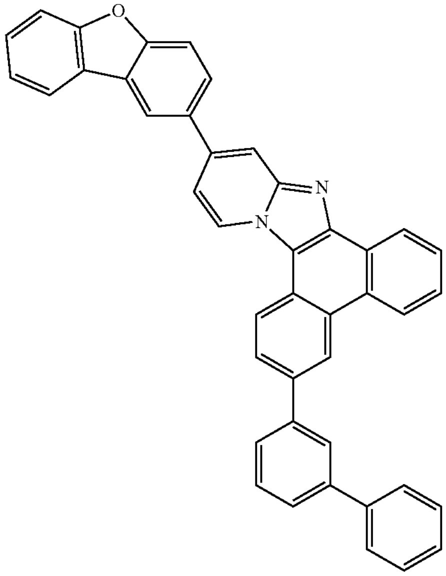
A-252
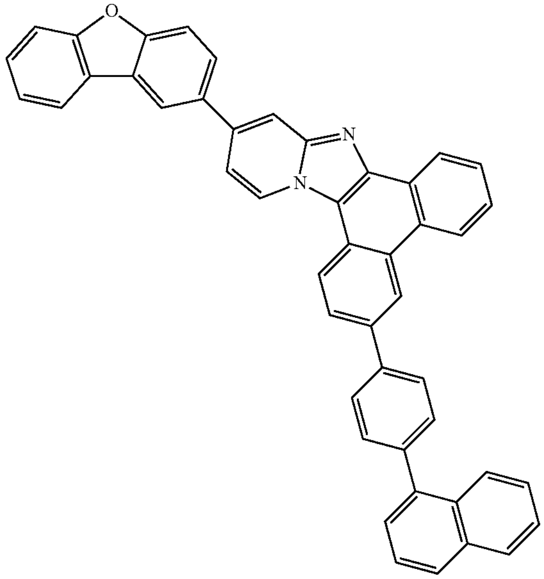
-continued
A-253
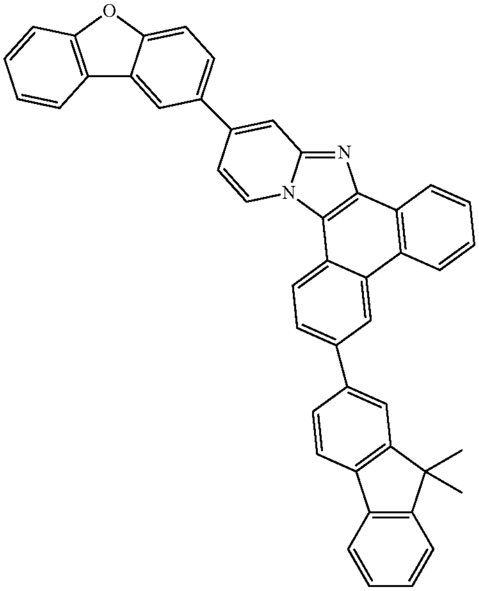
A-254
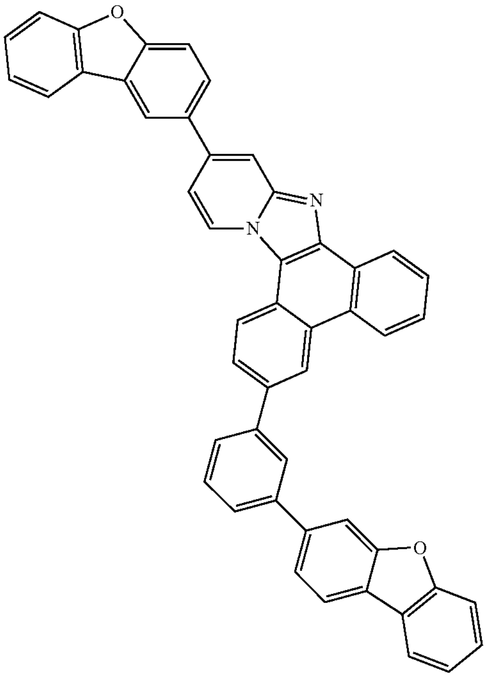

-continued
A-255
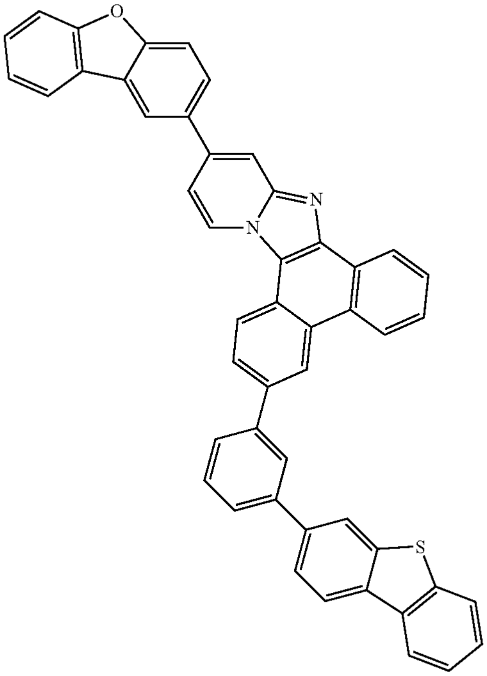
A-256
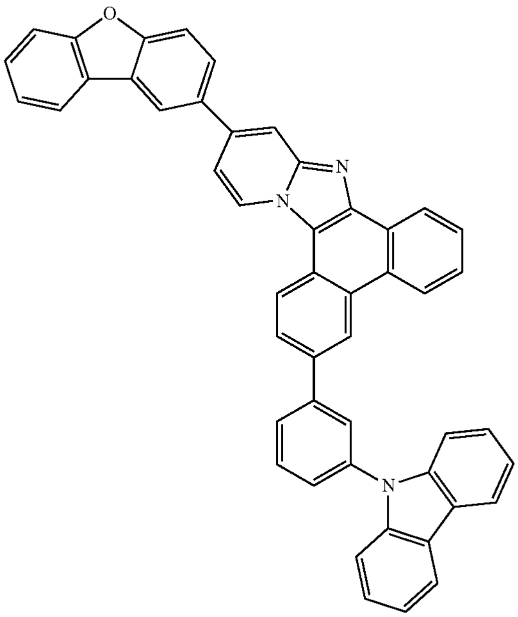
-continued
A-257
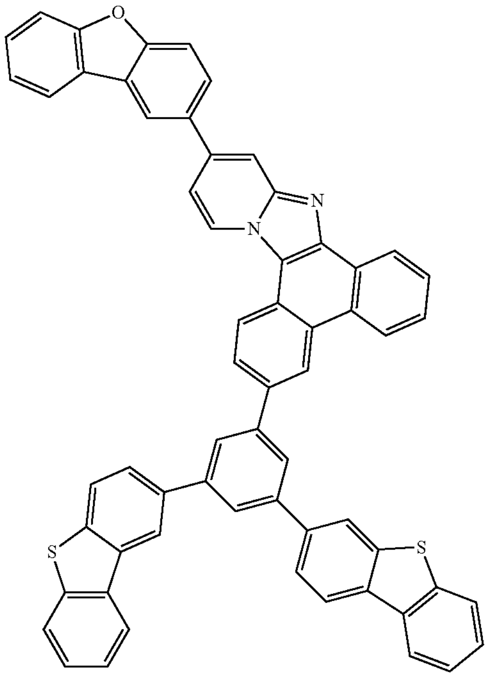
A-258
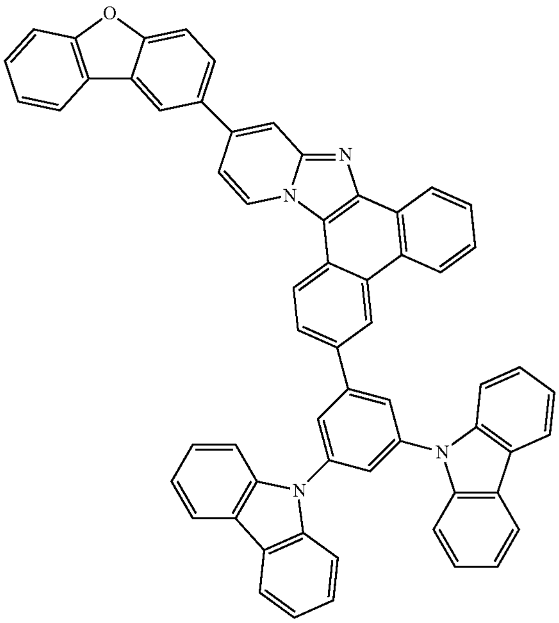

-continued
A-259
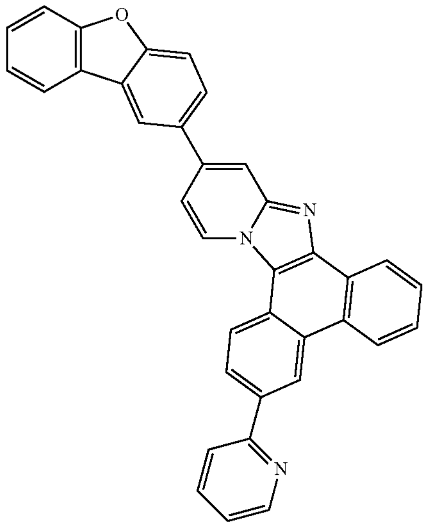
A-260
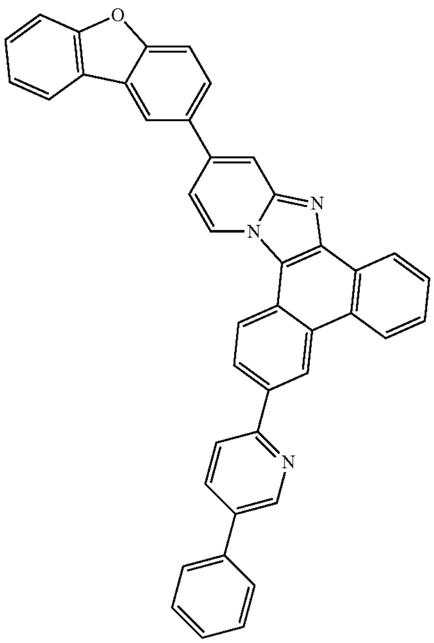
-continued
A-261
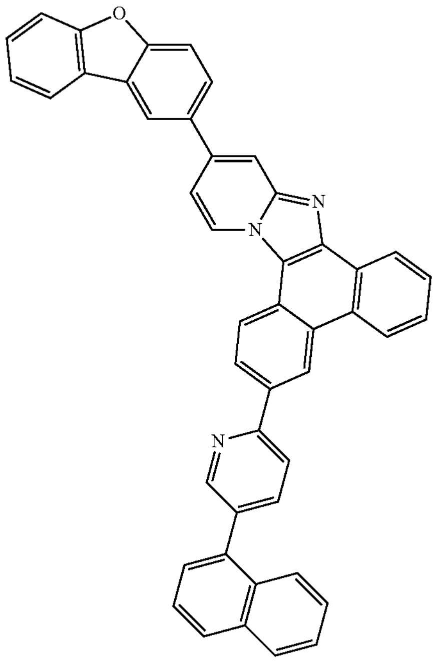
A-262
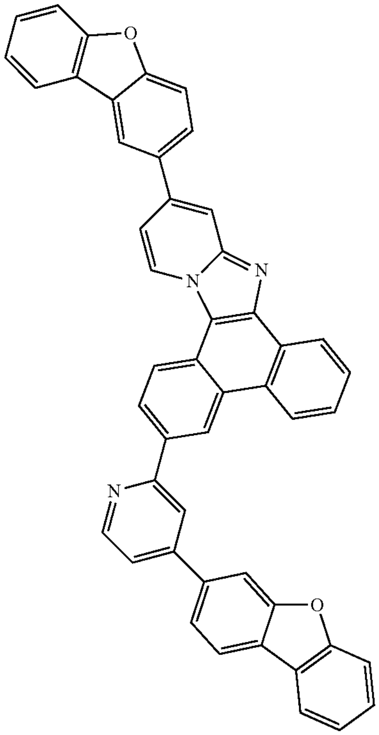

-continued
A-263
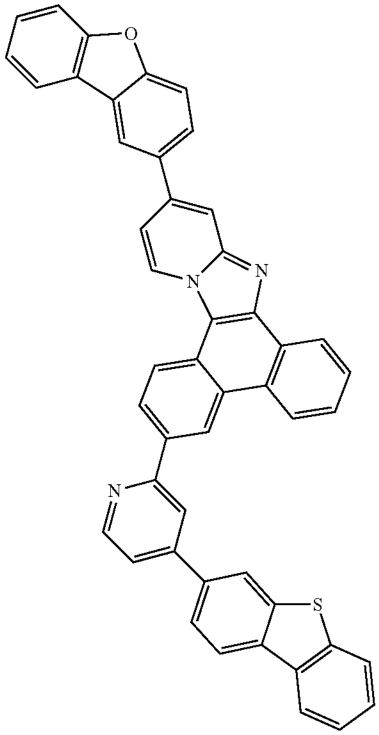
A-264
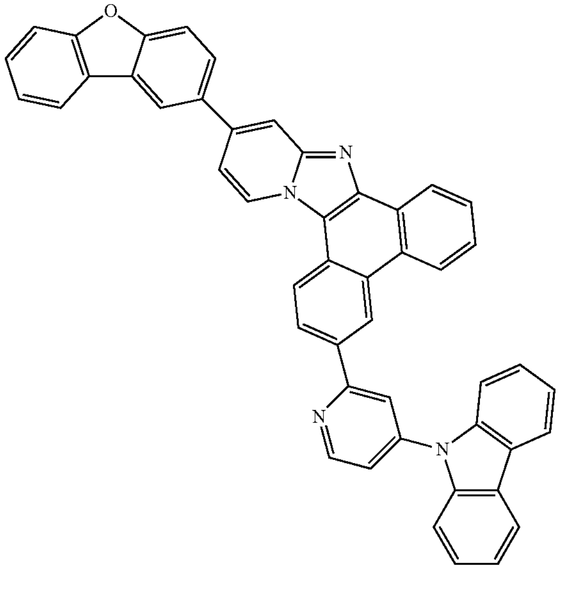
-continued
A-265
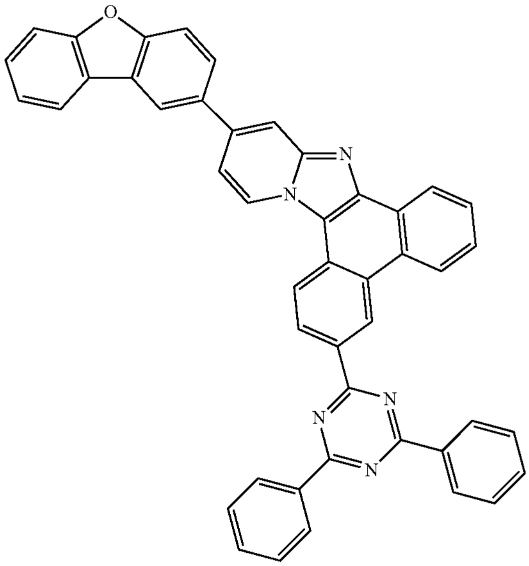
A-266
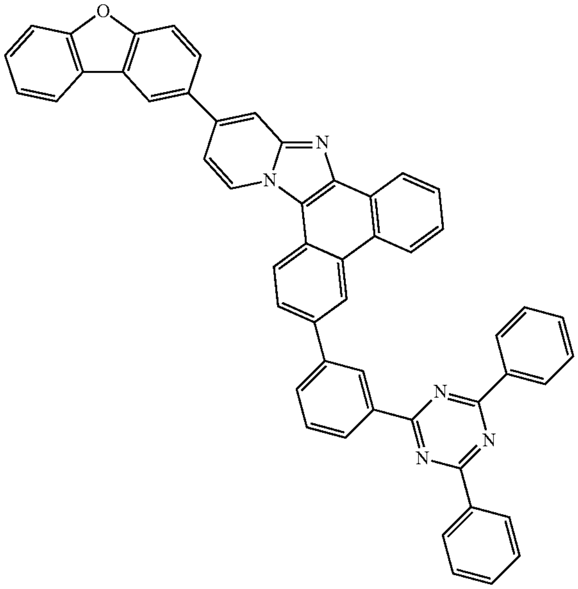

-continued
A-267
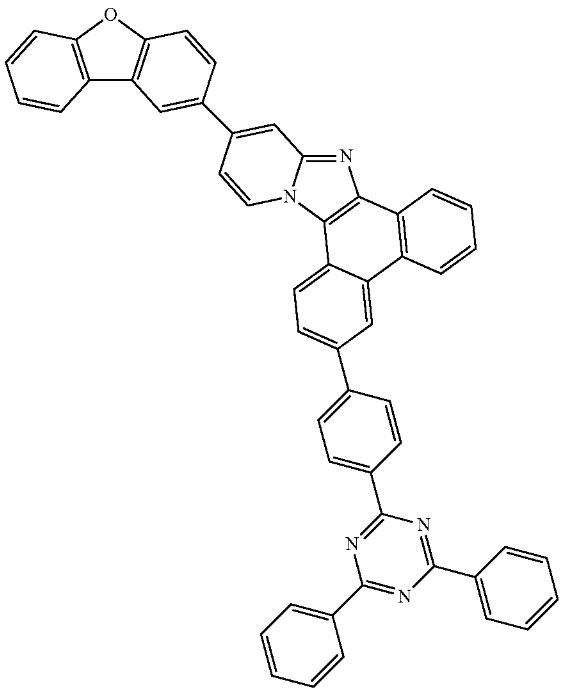
A-268
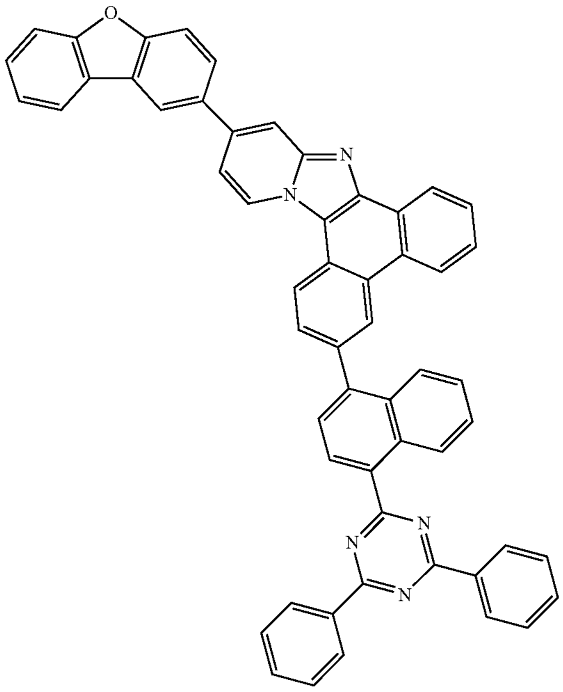
-continued
A-269
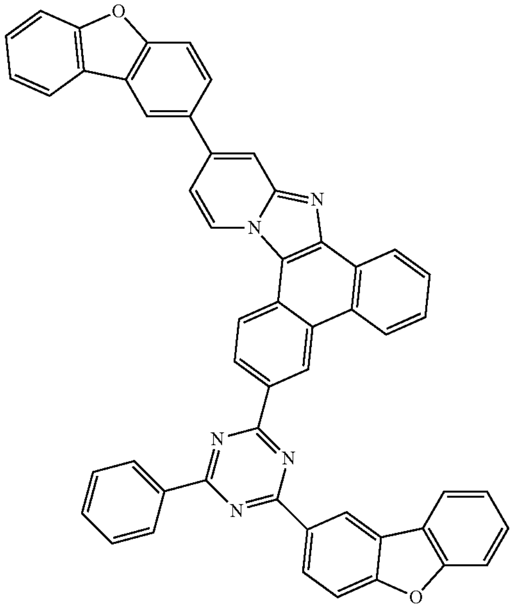
A-270
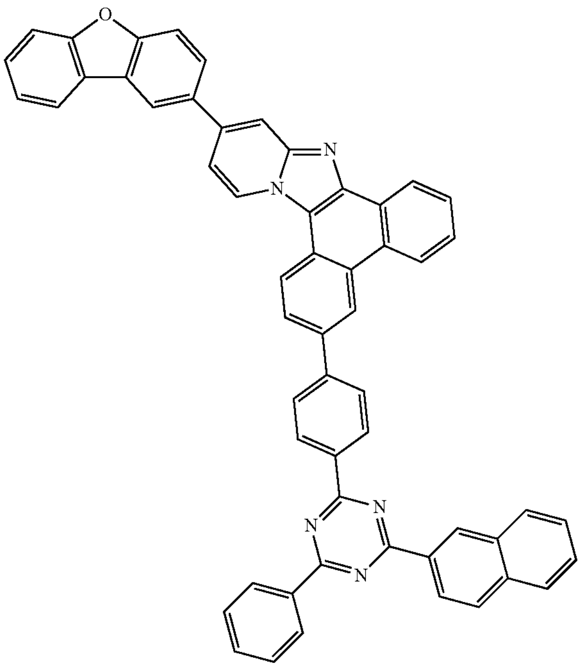

-continued
A-271
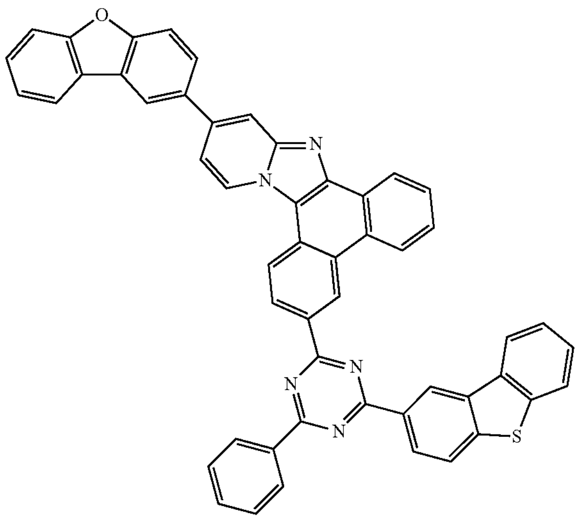
A-272
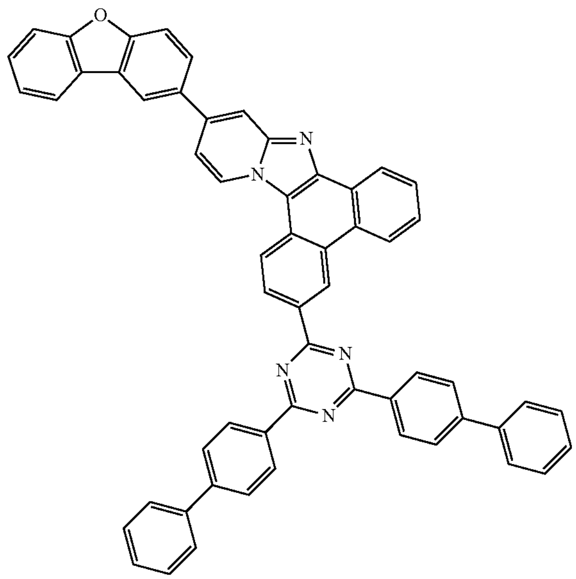
A-273
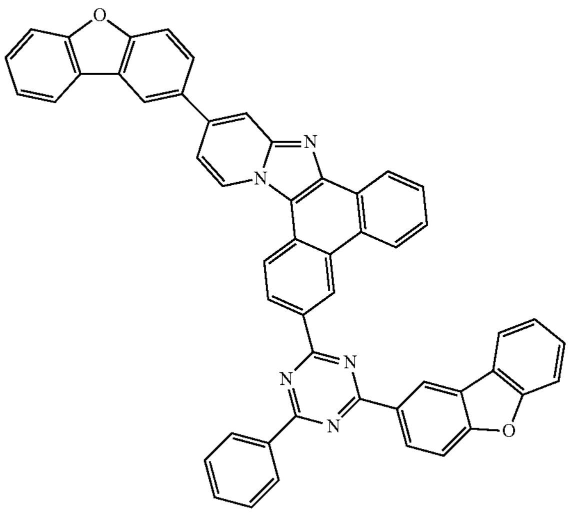
-continued
A-274
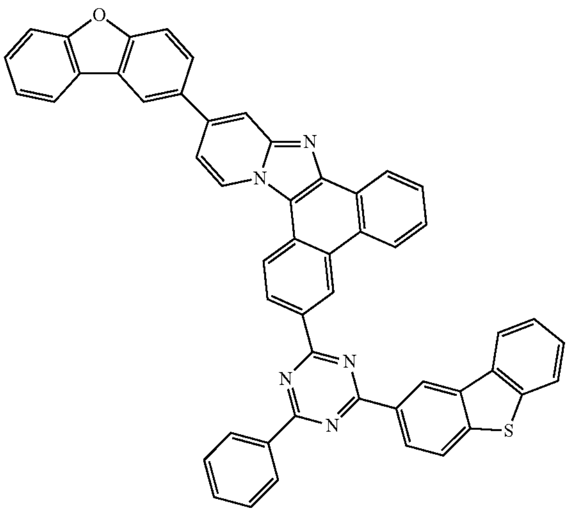
A-275
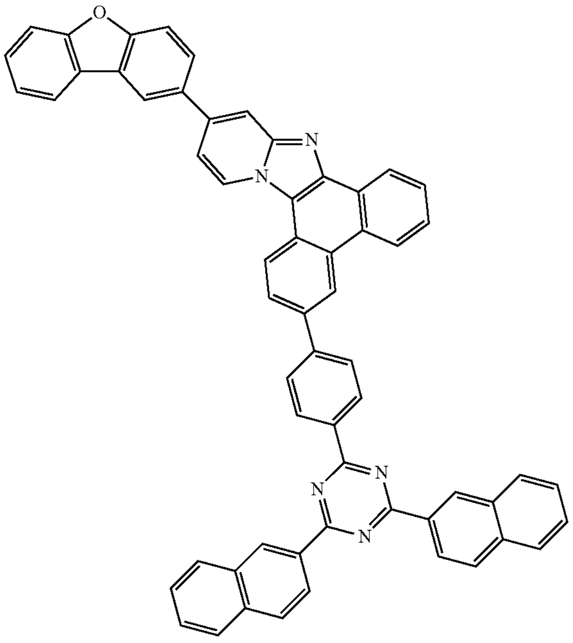

-continued
A-276
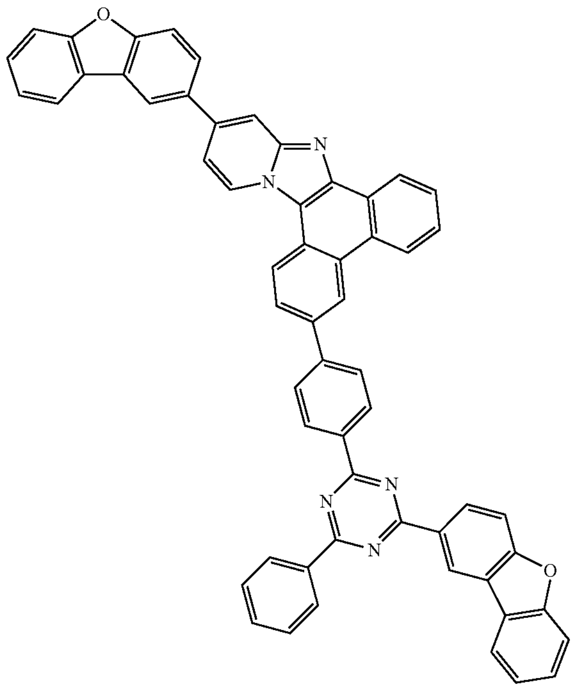
A-277
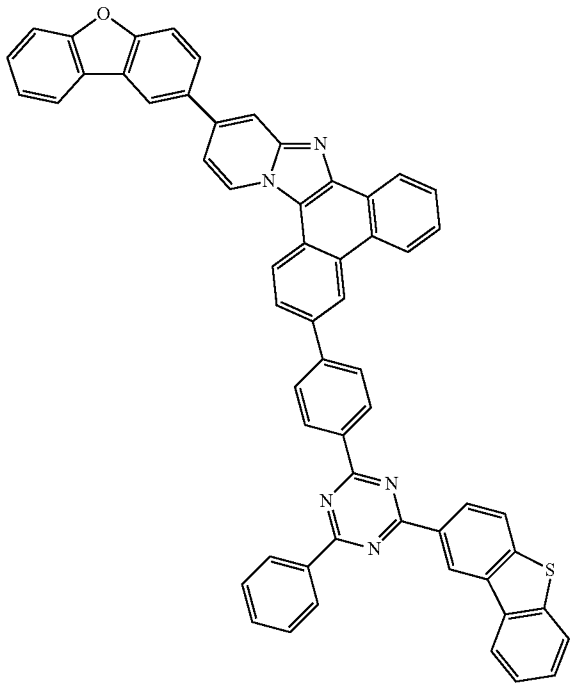
-continued
A-278
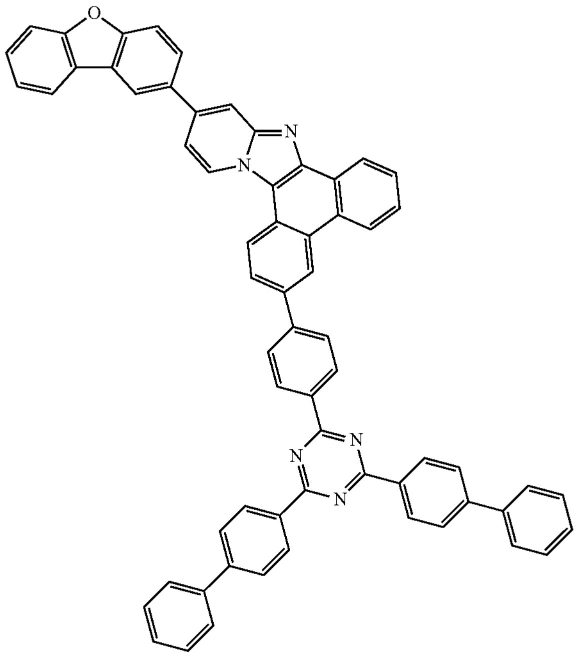
A-279
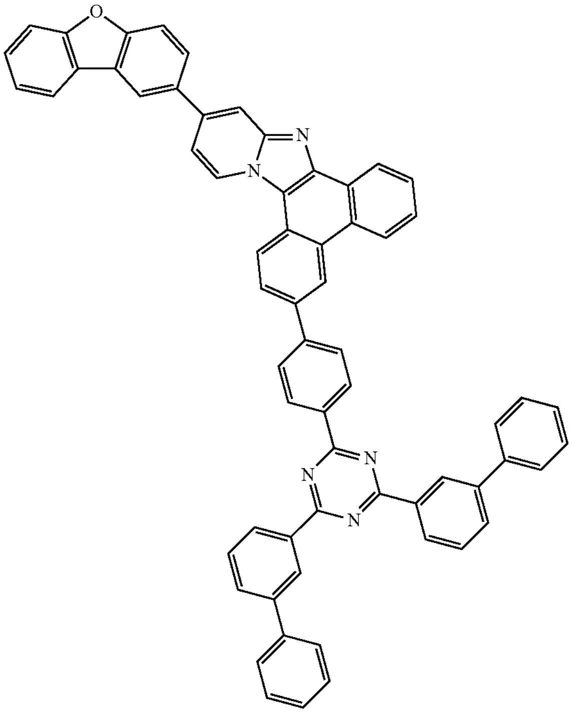

-continued
A-280
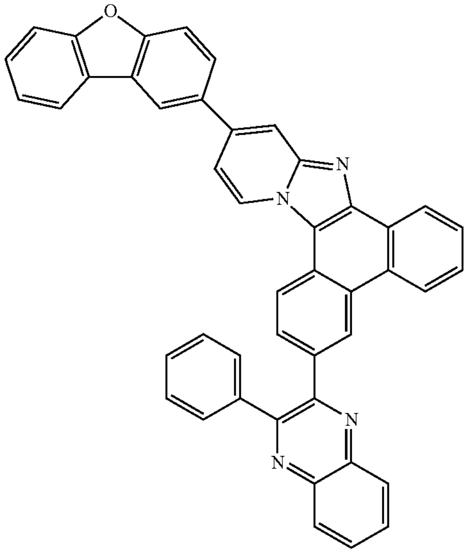
A-281
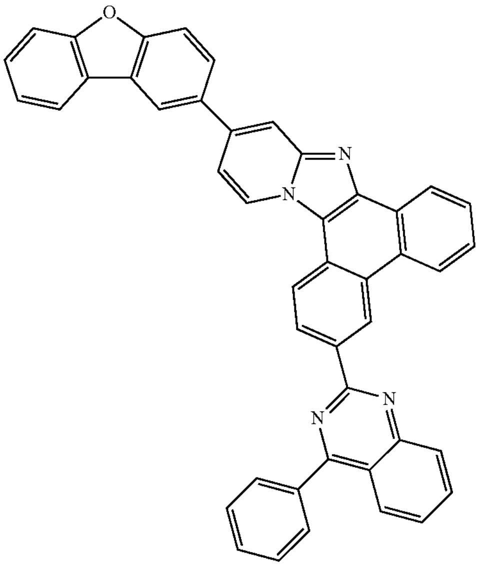
-continued
A-282
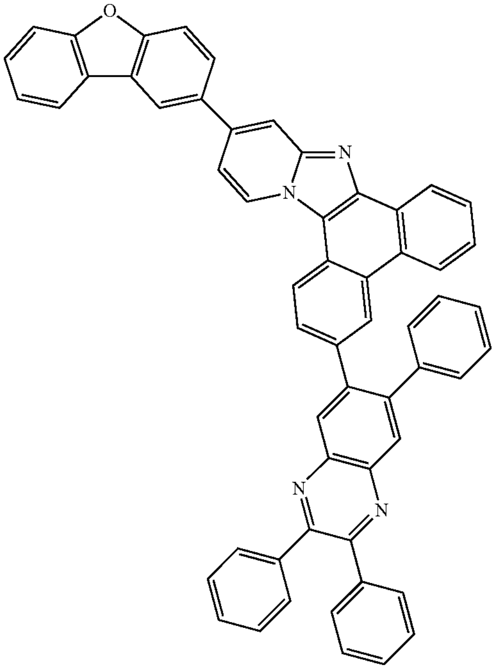
A-283
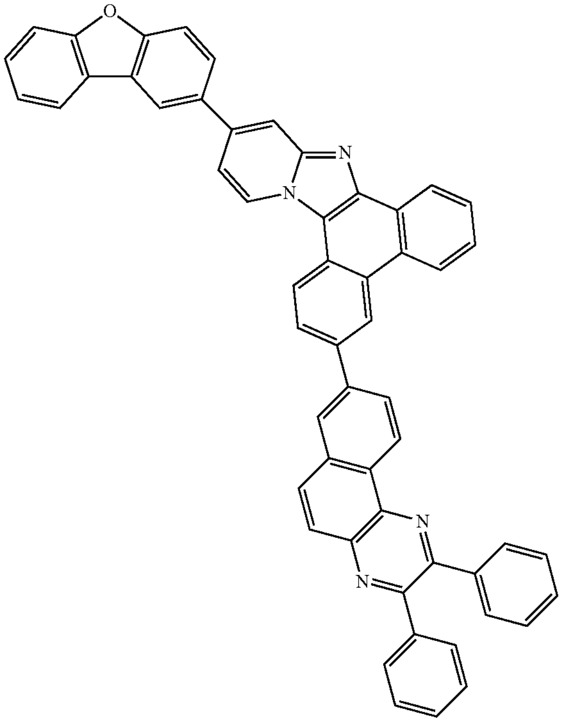

-continued
A-284
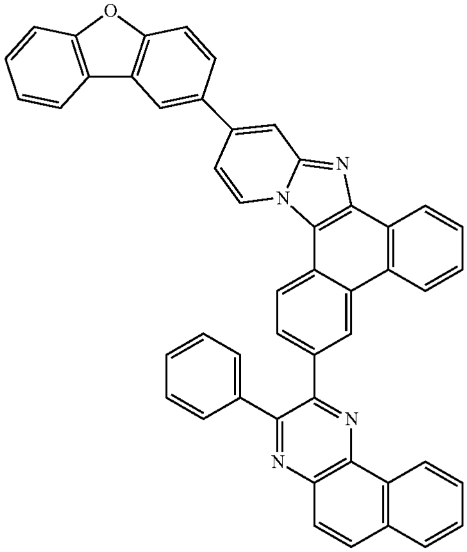
A-285
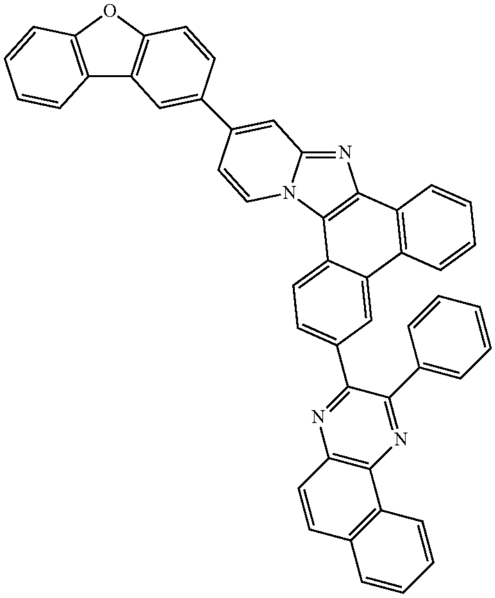
-continued
A-286
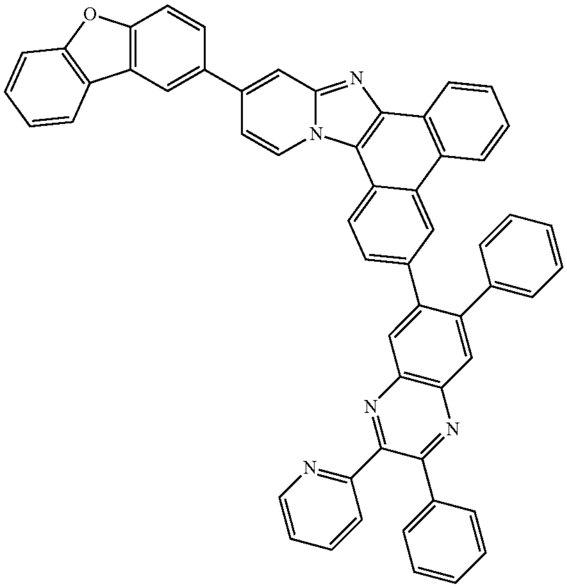
A-287
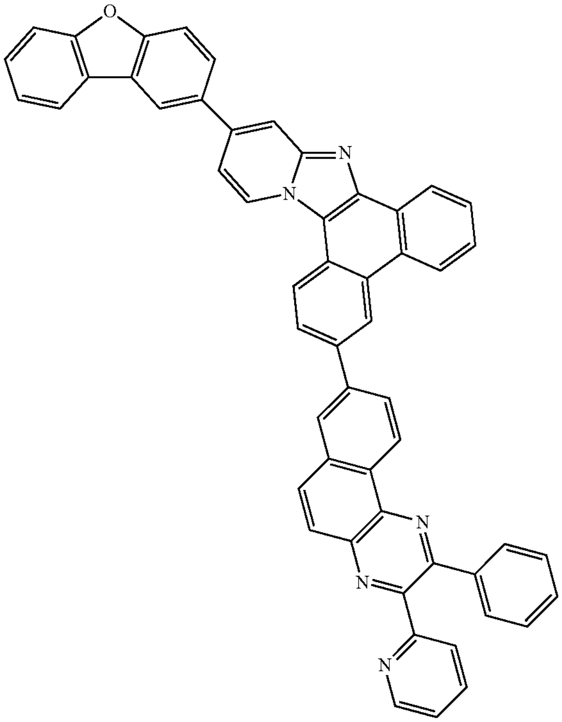

-continued
A-288
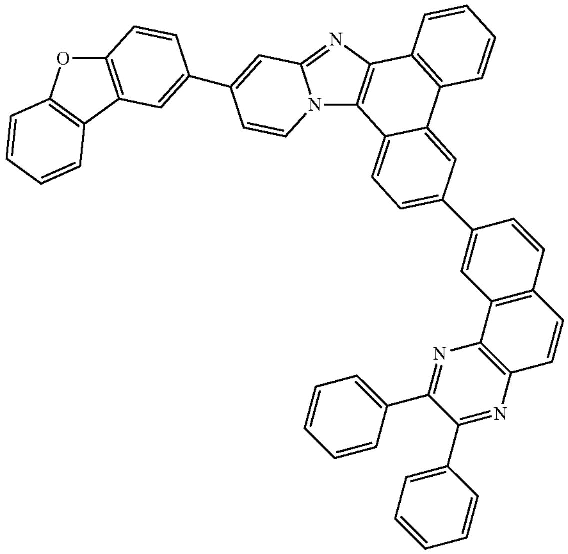
A-289
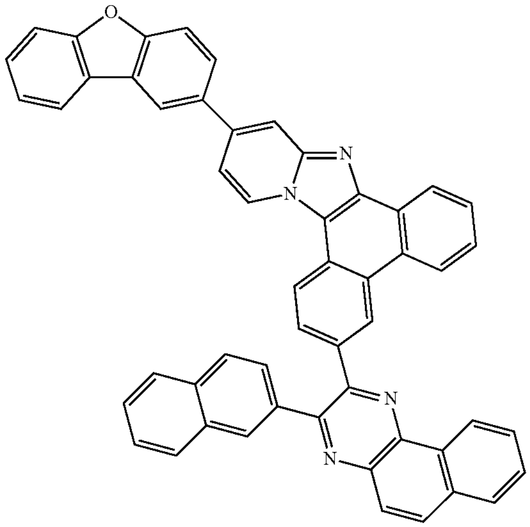
A-290
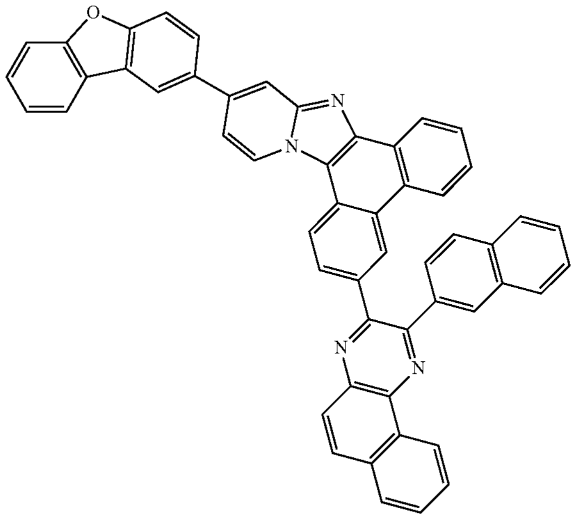
-continued
A-291
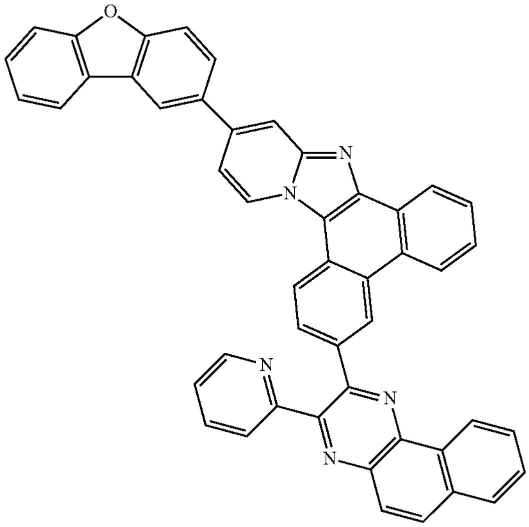
A-292
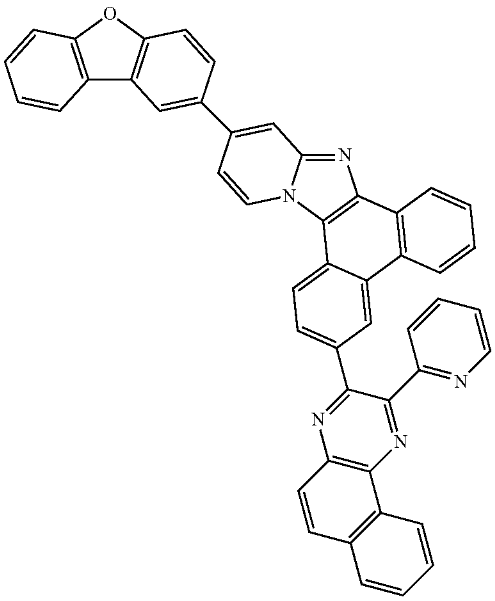

-continued
A-293
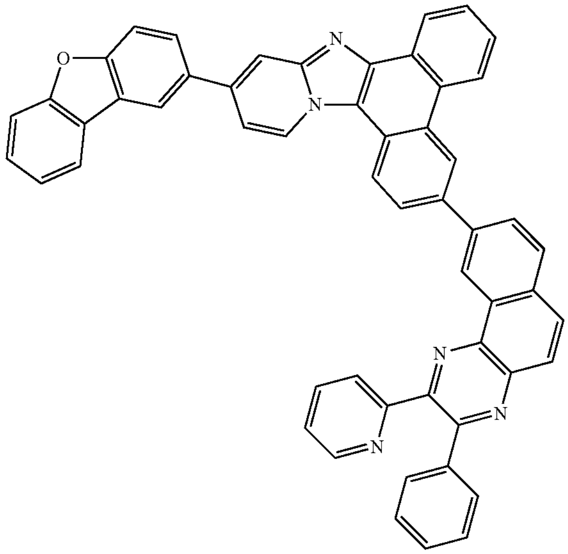
A-294
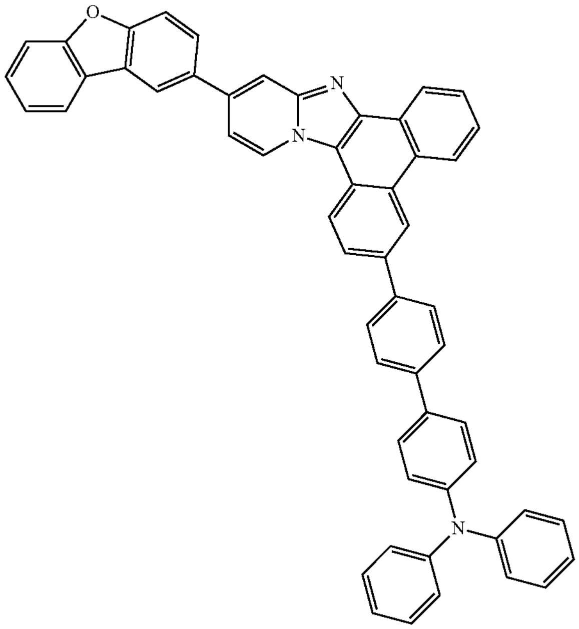
-continued
A-295
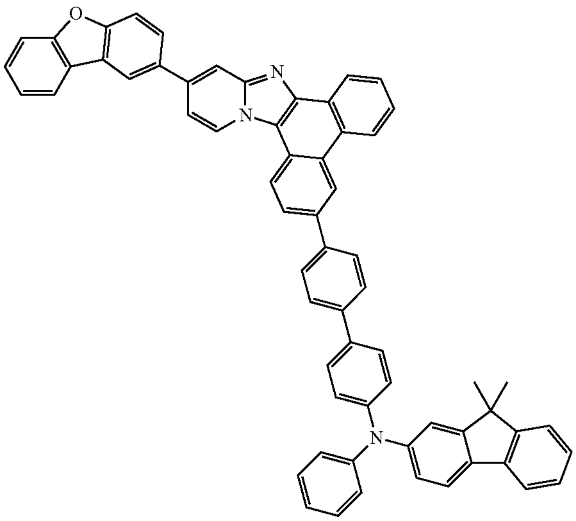
A-296
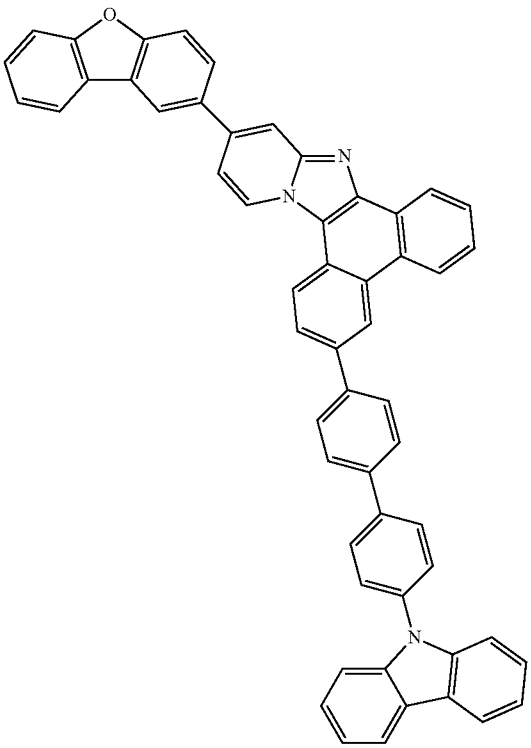

-continued

A-297

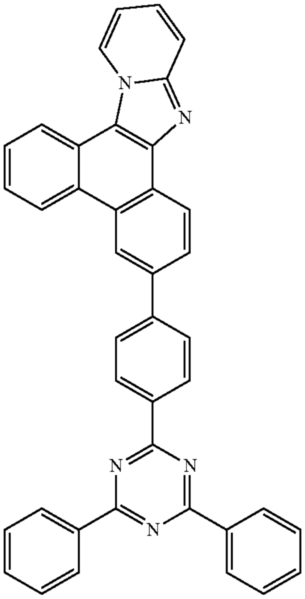

and

A-298

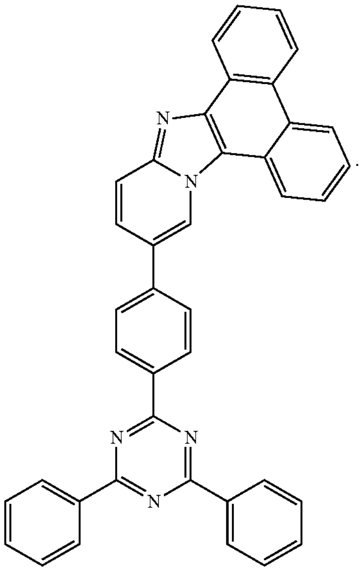

7. An organic electroluminescent device comprising the organic electroluminescent compound according to claim 1.

8. The organic electroluminescent device according to claim 7, wherein the organic electroluminescent compound is contained in at least one layer of a light-emitting layer and an electron transport layer.

9. The organic electroluminescent compound according to claim 3, wherein Ar is a substituted or unsubstituted phenyl, a substituted or unsubstituted naphthyl, a substituted or unsubstituted biphenyl, a substituted or unsubstituted terphenyl, a substituted or unsubstituted naphthylphenyl, a substituted or unsubstituted fluorenyl, a substituted or unsubstituted fluoranthenyl, a substituted or unsubstituted triazinyl, a substituted or unsubstituted pyridyl, a substituted or unsubstituted pyrimidinyl, a substituted or unsubstituted benzothienopyrimidinyl, a substituted or unsubstituted acenaphthopyrimidinyl, a substituted or unsubstituted quinazolinyl, a substituted or unsubstituted benzoquinazolinyl, a substituted or unsubstituted quinoxalinyl, a substituted or unsubstituted benzoquinoxalinyl, a substituted or unsubstituted dibenzoquinoxalinyl, a substituted or unsubstituted quinolyl, a substituted or unsubstituted benzoquinolyl, a substituted or unsubstituted isoquinolyl, a substituted or unsubstituted benzoisoquinolyl, a substituted or unsubstituted benzothienoquinolyl, a substituted or unsubstituted benzofuroquinolyl, a substituted or unsubstituted triazolyl, a substituted or unsubstituted pyrazolyl, a substituted or unsubstituted carbazolyl, a substituted or unsubstituted dibenzothiophenyl, a substituted or unsubstituted benzothiophenyl, a substituted or unsubstituted dibenzofuranyl, a substituted or unsubstituted benzofuranyl, a substituted or unsubstituted naphthyridinyl, a substituted or unsubstituted benzothiazolinyl, a substituted or unsubstituted phenanthroidimidazolyl, a substituted or unsubstituted diphenylamino, a substituted or unsubstituted phenylbiphenylamino, a substituted or unsubstituted fluorenylphenylamino, a substituted or unsubstituted dibenzothiophenylphenylamino, or a substituted or unsubstituted dibenzofuranylphenylamino.

10. The organic electroluminescent compound according to claim 3, wherein the substituents of the substituted (C1-C30)alkyl, the substituted (C6-C30)aryl(ene), the substituted (3- to 30-membered)heteroaryl (ene), the substituted (C3-C30)cycloalkyl(ene), the substituted (C1-C30)alkoxy, the substituted tri(C1-C30)alkylsilyl, the substituted di(C1-C30)alkyl(C6-C30)arylsilyl, the substituted (C1-C30)alkyldi(C6-C30)arylsilyl, the substituted tri(C6-C30)arylsilyl, the substituted mono- or di-(C1-C30)alkylamino, the substituted mono- or di-(C6-C30)arylamino, and the substituted (C1-C30)alkyl(C6-C30)arylamino in L, Ar, and $R_1$ to $R_6$ each independently represent at least one selected from the group consisting of deuterium, halogen, cyano, carboxyl, nitro, hydroxyl, (C1-C30)alkyl, halo (C1-C30)alkyl, (C2-C30)alkenyl, (C2-C30)alkynyl, (C1-C30)alkoxy, (C1-C30) alkylthio, (C3-C30)cycloalkyl, (C3-C30)cycloalkenyl, (3- to 7-membered) heterocycloalkyl, (C6-C30)aryloxy, (C6-C30) arylthio, (C6-C30)aryl-substituted or unsubstituted (3- to 30-membered)heteroaryl, (3- to 30-membered)heteroaryl-substituted or unsubstituted (C6-C30)aryl, tri(C1-C30)alkylsilyl, tri(C6-C30)arylsilyl, di(C1-C30)alkyl(C6-C30)arylsilyl, (C1-C30)alkyldi(C6-C30)arylsilyl, amino, mono- or di-(C1-C30)alkylamino, (C1-C30)alkyl-substituted or unsubstituted mono- or di-(C6-C30)arylamino, (C1-C30) alkyl(C6-C30)arylamino, (C1-C30)alkylcarbonyl, (C1-C30) alkoxycarbonyl, (C6-C30)arylcarbonyl, di(C6-C30)arylboronyl, di(C1-C30)alkylboronyl, (C1-C30)alkyl(C6-C30) arylboronyl, (C6-C30)ar(C1-C30)alkyl, and (C1-C30)alkyl (C6-C30)aryl.

* * * * *